US012433954B2

(12) United States Patent
Irvine et al.

(10) Patent No.: US 12,433,954 B2
(45) Date of Patent: Oct. 7, 2025

(54) METHODS OF ACTIVATING ANTI-CD19 CHIMERIC ANTIGEN RECEPTOR (CAR) T CELLS USING AMPHIPHILIC LIGAND CONJUGATES COMPRISING CAR-TARGETING PROTEIN SEQUENCE MOTIFS

(71) Applicant: Massachusetts Institute of Technology, Cambridge, MA (US)

(72) Inventors: Darrell J. Irvine, Arlington, MA (US); Karl Dane Wittrup, Boston, MA (US); Naveen Mehta, Somerville, MA (US); Leyuan Ma, Brookline, MA (US); Benjamin Cossette, Durham, NC (US)

(73) Assignee: Massachusetts Institute of Technology, Cambridge, MA (US)

( * ) Notice: Subject to any disclaimer, the term of this patent is extended or adjusted under 35 U.S.C. 154(b) by 837 days.

(21) Appl. No.: 17/188,813

(22) Filed: Mar. 1, 2021

(65) Prior Publication Data

US 2021/0338833 A1 Nov. 4, 2021

Related U.S. Application Data

(60) Provisional application No. 63/019,053, filed on May 1, 2020.

(51) Int. Cl.

*A61K 47/68* (2017.01)
*A61K 40/11* (2025.01)

(Continued)

(52) U.S. Cl.

CPC .......... *A61K 47/6889* (2017.08); *A61K 40/11* (2025.01); *A61K 40/31* (2025.01); *A61K 40/4211* (2025.01); *A61K 47/543* (2017.08); *A61P 37/04* (2018.01); *C07K 16/2803* (2013.01); *A61K 2239/31* (2023.05); *A61K 2239/38* (2023.05); *A61K 2239/48* (2023.05);

(Continued)

(58) Field of Classification Search

CPC .............................. C07K 7/00; A61K 51/0404
See application file for complete search history.

(56) References Cited

U.S. PATENT DOCUMENTS

| | | | |
|---|---|---|---|
| 5,498,530 | A | 3/1996 | Schatz et al. |
| 2003/0186223 | A1 | 10/2003 | Ladner |

(Continued)

FOREIGN PATENT DOCUMENTS

| | | | |
|---|---|---|---|
| WO | 2015/179635 | A2 | 11/2015 |
| WO | 2019060425 | A1 | 3/2019 |

OTHER PUBLICATIONS

Davey, A. S., et al., 2021, The influence of chimeric antigen receptor structural domains on clinical outcomes and associated toxicities, Cancers 13, 38, pp. 1-16.*

(Continued)

*Primary Examiner* — Jeffrey S Parkin
(74) *Attorney, Agent, or Firm* — McCarter & English, LLP; Jill Ann Mello

(57) ABSTRACT

The disclosure features chimeric antigen receptor (CAR) ligands, methods for making the same, and immunomodulatory compositions comprising the CAR ligands. The disclosure also features compositions and methods of using the immunomodulatory compositions, for example, to stimulate activation of CAR expressing cells.

23 Claims, 15 Drawing Sheets

Specification includes a Sequence Listing.

(51) Int. Cl.

| | |
|---|---|
| ***A61K 40/31*** | (2025.01) |
| ***A61K 40/42*** | (2025.01) |
| ***A61K 47/54*** | (2017.01) |
| ***A61P 37/04*** | (2006.01) |
| ***C07K 16/28*** | (2006.01) |

(52) U.S. Cl.

CPC .... *C07K 2317/622* (2013.01); *C07K 2317/92* (2013.01); *C07K 2319/74* (2013.01)

(56) References Cited

U.S. PATENT DOCUMENTS

| | | | |
|---|---|---|---|
| 2017/0216403 | A1 | 8/2017 | Wittrup et al. |
| 2019/0324030 | A1 | 10/2019 | Tareen et al. |
| 2019/0382500 | A1 | 12/2019 | Abujoub et al. |
| 2020/0010527 | A1 | 1/2020 | Gee et al. |
| 2021/0340524 | A1 | 11/2021 | Irvine et al. |

OTHER PUBLICATIONS

Labanieh, L., and C. L. Mackall, Feb. 2023, CAR immune cells: design principles, resistance and the next generation, Nature 614:635-648.*

Liu, H., Mar. 2014, Structure-based programming of lymph-node targeting in molecular vaccines, Nature 507:519-533.*

Ying, Z., et al., Jun. 2019, A safe and potent anti-CD19 Car T cell therapy, Nat. Med. 25:947-953.*

Haipeng Liu et al: "Structure-based programming of lymph-node targeting in molecular vaccines", Nature, vol. 507, No. 7493, Feb. 16, 2014 (Feb. 16, 2014), pp. 519-522.

International Invitation to Pay Additional fees and Partial Search Report, PCT/US2021/020302, dated Jul. 16, 2021, 18 pages.

Katharina Reinhard et al: "An RNA vaccine drives expansion and efficacy of claudin-CAR-T cells against solid tumors", Science, vol. 367, No. 6476, Jan. 24, 2020 (Jan. 24, 2020), pp. 446-453.

Leyuan Ma et al: "Enhanced CAR-T cell activity against solid tumors by vaccine boosting through the chimeric receptor", Science, vol. 365, Jul. 12, 2019 (Jul. 12, 2019), pp. 162-168.

International Search Report and Written Opinion, PCT/US2021/020302, dated Sep. 8, 2021, 23 pages.

Bentzen et al., T-cell-receptor cross-recognition and strategies to select safe T-cell receptors for clinical translation. Immunooncol Technol. Sep. 2019;2:1-10.

Foight et al., Enriching Peptide Libraries for Binding Affinity and Specificity Through Computationally Directed Library Design. Methods Mol Biol. 2017;1561:213-232.

Lim et al., Dual display of proteins on the yeast cell surface simplifies quantification of binding interactions and enzymatic bioconjugation reactions. Biotechnol J. May 2017;12(5):10.1002/biot.201600696, 17 pages.

Linciano et al., Molecular evolution of peptides by yeast surface display technology. Medchemcomm. Jul. 10, 2019;10(9):1569-1580.

International Search Report and Written Opinion for Application No. PCT/US2021/020304, dated Jul. 16, 2021, 16 pages.

U.S. Appl. No. 17/188,861, filed Mar. 1, 2021, 2021-0340524, Published.

* cited by examiner

| Affinity | Mimotope |
|---|---|
| High | RHCPWNCSLL |
| Low | RICPWSCRAP |

↓

Pattern-fixed library:
RXCPWXCXXX

↓

New library size
(1.5x10⁸)

FIG. 12
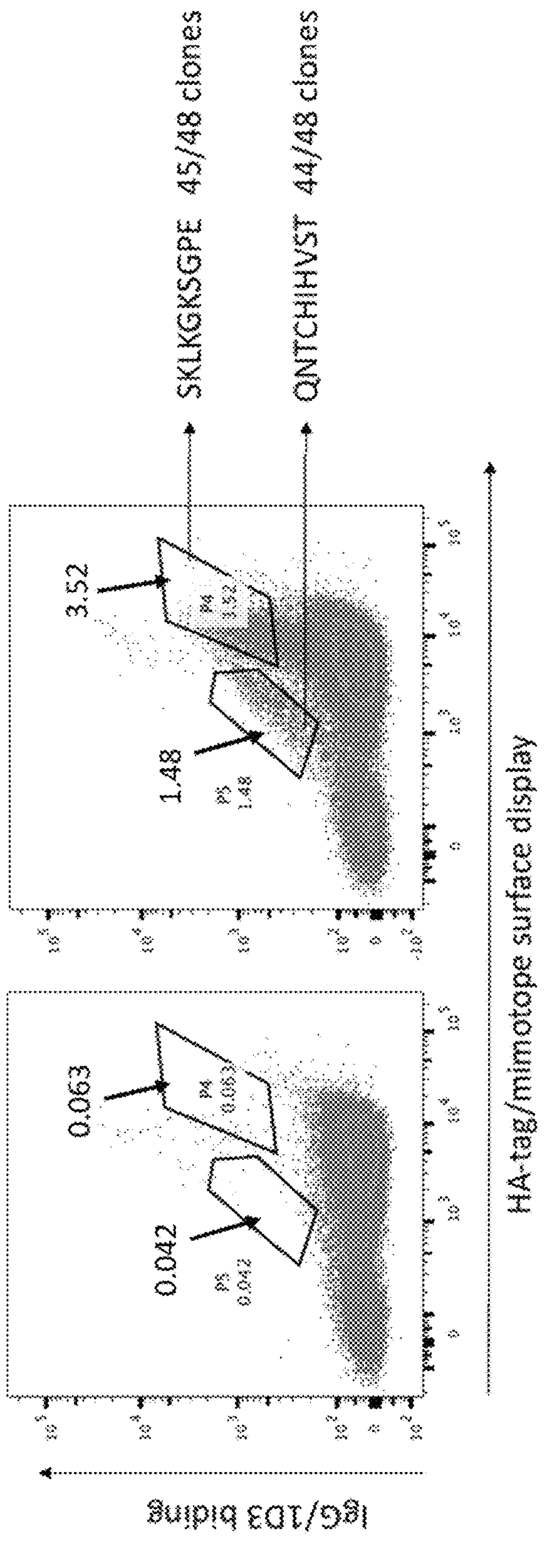
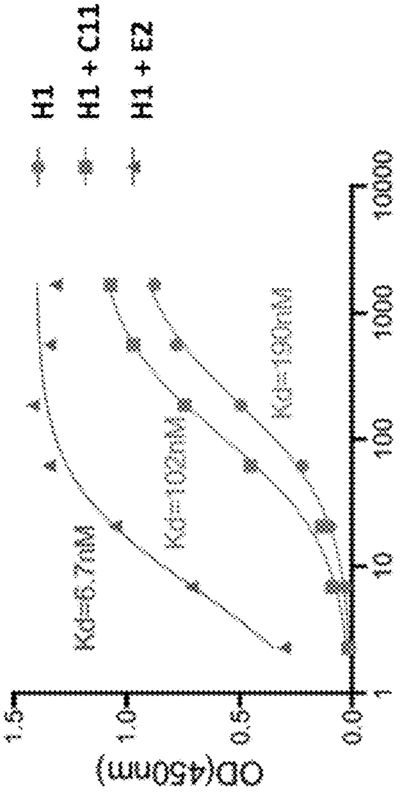
FIG. 13

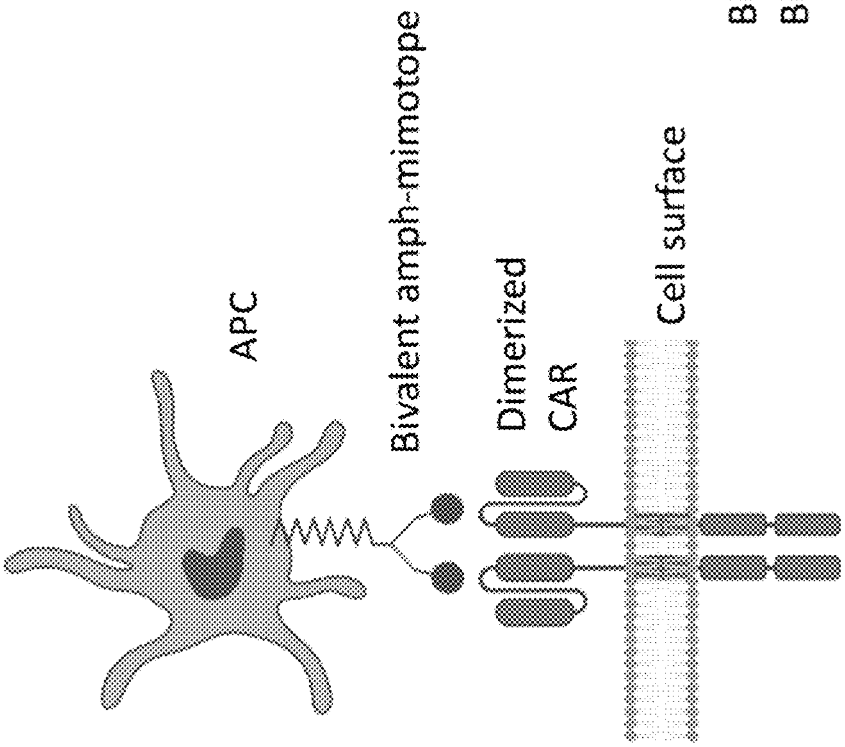
FIG. 17A
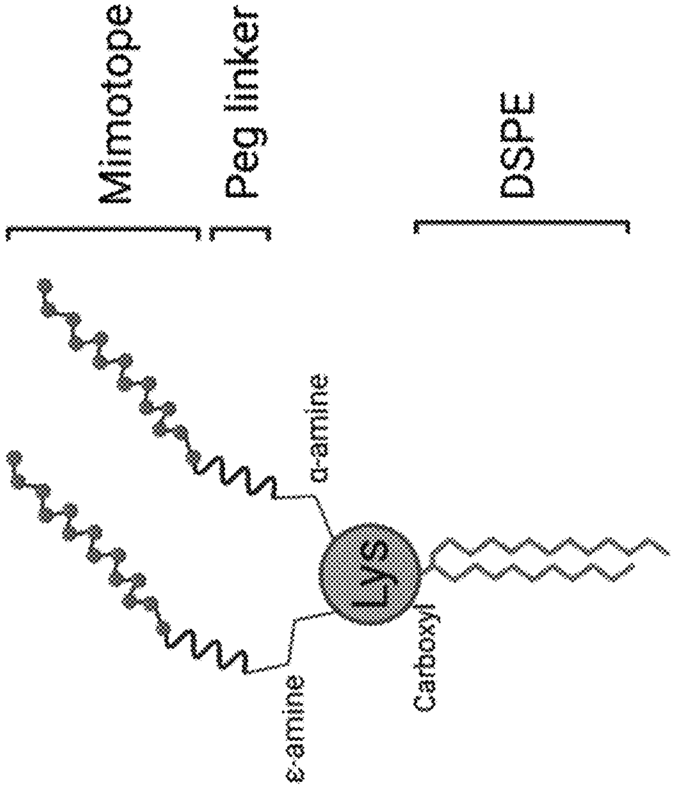
FIG. 17B
Bi-F12-Peg8: (GGGSASRICPWNCKEL(PEG8))$_2$-Lys-DSPE
Bi-F12-Peg4: (GGGSASRICPWNCKEL(PEG4))$_2$-Lys-DSPE
FIG. 17C

METHODS OF ACTIVATING ANTI-CD19 CHIMERIC ANTIGEN RECEPTOR (CAR) T CELLS USING AMPHIPHILIC LIGAND CONJUGATES COMPRISING CAR-TARGETING PROTEIN SEQUENCE MOTIFS

CROSS-REFERENCE TO RELATED APPLICATIONS

This application claims the benefit of U.S. Provisional Patent Application Ser. No. 63/019,053, filed May 1, 2020, the entire contents of which is incorporated herein by reference.

GOVERNMENT FUNDING

This invention was made with Government support under Grant No. R01 EB022433 awarded by the National Institutes of Health (NIH). The Government has certain rights in the invention.

REFERENCE TO SEQUENCE LISTING

The instant application contains a Sequence Listing which has been electronically submitted in ASCII format via EFS-Web and is hereby incorporated by reference in its entirety. Said ASCII copy, created on May 11, 2021, is name "MITN-059_ST25.txt" and is 69,139 bytes in size.

BACKGROUND

Adoptive cell therapy using Chimeric Antigen Receptor T cells (CAR T cells or CAR-T) has revolutionized cancer therapy. CAR T cells are typically prepared by isolating a patient's T cells (i.e., autologous T cells) and transducing the cells with a synthetic antigen receptor, formed by fusing an antigen-binding domain to the CD3 signaling chain of the T cell receptor, and a costimulatory domain from one of multiple co-receptors known to support signals for T cell activation. CAR-T cells have shown dramatic complete responses in hematologic malignancies. Indeed, the FDA recently approved two anti-CD19 CAR T cell products for the treatment of relapsed and refractory CD19-positive lymphoma and leukemia.

However, CAR-T therapies suffer from a number of limitations. For example, a significant portion of patients receiving anti-CD19 CAR-T therapy relapse following initial response owing to poor functional persistence of CAR T cells and/or failure of the CAR T cells to engraft. Loss of CAR T cell functional activity against tumor cells can also contribute to relapse, and is often a result of down-regulation or mutation of tumor antigens targeted by the CAR that allow tumor cells to evade detection. Additionally, CAR-T therapies to date have proven ineffectual for treatment of solid tumors.

Furthermore, there are several limitations to the generalized clinical application of CAR T cells. For example, as there is no single tumor antigen universally expressed by all cancer types, each antigen-recognition domain in a CAR needs to be engineered with specificity for the desired tumor antigen.

Accordingly, there exists a need for strategies to improve the efficacy and generalized application of CAR-T therapy.

SUMMARY

In some aspects, the disclosure provides an immunomodulatory composition comprising: a chimeric antigen receptor (CAR) ligand, wherein the CAR ligand comprises a peptide comprising a sequence motif of 5-20 amino acid residues, wherein the sequence motif binds a CAR antigen recognition domain, wherein the CAR antigen recognition domain binds an epitope on a disease-associated antigen, wherein binding of the sequence motif to the CAR antigen recognition domain activates a cell expressing a CAR comprising the CAR antigen recognition domain. In some aspects, the cell expressing a CAR is a CAR T cell. In some aspects, the cell expressing a CAR is a CAR NK cell. In some aspects, the cell expressing a CAR is a CAR macrophage. In some aspects, the cell expressing a CAR is a CAR NKT cell.

In some aspects, the disclosure provides an immunomodulatory composition comprising: a chimeric antigen receptor (CAR) ligand, wherein the CAR ligand comprises a peptide comprising a sequence motif of 5-20 amino acid residues, wherein the sequence motif binds a CAR antigen recognition domain, wherein the CAR antigen recognition domain binds an epitope on a disease-associated antigen, wherein binding of the sequence motif to the CAR antigen recognition domain activates a T cell expressing a CAR comprising the CAR antigen recognition domain.

In any of the foregoing or related aspects, the CAR ligand binds to the CAR antigen recognition domain with a binding affinity ($K_D$) of at least 5 μM. In some aspects, the $K_D$ is about 1 nM, about 2 nM, about 3 nM, about 4 nM, about 5 nM, about 6 nM, about 7 nM, about 8 nM, about 9 nM, about 10 nM, about 20 nM, about 30 nM, about 40 nM, about 50 nM, about 60 nM, about 70 nM, about 80 nM, about 90 nM, about 100 nM, about 200 nM, about 300 nM, about 400 nM, about 500 nM, about 600 nM, about 700 nM, about 800 nM, about 900 nM, about 1 μM, about 2 μM, about 3 μM, about 4 μM, or about 5 μM.

In any of the foregoing or related aspects, the CAR ligand binds to the CAR antigen recognition domain with a binding affinity that is lower than the binding affinity of the CAR antigen recognition domain for the disease-associated antigen.

In any of the foregoing or related aspects, the CAR ligand binds to the CAR antigen recognition domain with a binding affinity sufficient to activate the T cell expressing the CAR antigen recognition domain without inducing exhaustion.

In any of the foregoing or related aspects, the CAR antigen recognition domain recognizes a conformational epitope on the disease-associated antigen.

In any of the foregoing or related aspects, the CAR antigen recognition domain comprises an anti-CD19 antigen recognition domain, an anti-BCMA antigen recognition domain, an anti-EGFR antigen recognition domain, or an anti-Her2 antigen recognition domain. In some aspects, the CAR antigen recognition domain comprises an anti-CD19 antigen recognition domain.

In any of the foregoing or related aspects, the immunomodulatory composition comprises a CAR ligand described herein, wherein the CAR ligand is operably-linked to a lipid. In some aspects, the CAR ligand is a fusion protein.

In any of the foregoing or related aspects, the immunomodulatory composition comprises the peptide operably-linked to a lipid. In some aspects, the immunomodulatory composition comprises the peptide as a fusion protein.

In other aspects, the disclosure provides an amphiphilic ligand conjugate comprising:

an anti-CD19 CAR ligand; and a lipid operably linked to the ligand, wherein the anti-CD19 CAR ligand comprises a peptide comprising a sequence motif of 5-20 amino acid residues, wherein the sequence motif binds an anti-CD19 CAR antigen recognition domain, wherein the anti-CD19 CAR antigen recognition domain binds an epitope on human CD19, wherein binding of the sequence motif to the anti-CD19 CAR antigen recognition domain activates a cell expressing a CAR comprising the anti-CD19 CAR antigen recognition domain. In some aspects, the cell expressing an anti-CD19 CAR is a CAR T cell. In some aspects, the cell expressing an anti-CD19 CAR is a CAR NK cell. In some aspects, the cell expressing an anti-CD19 CAR is a CAR macrophage. In some aspects, the cell expressing an anti-CD19 CAR is a CAR NKT cell.

In yet other aspects, the disclosure provides an amphiphilic ligand conjugate comprising:

an anti-CD19 CAR ligand; and a lipid operably linked to the ligand, wherein the anti-CD19 CAR ligand comprises a peptide comprising a sequence motif of 5-20 amino acid residues, wherein the sequence motif binds an anti-CD19 CAR antigen recognition domain, wherein the anti-CD19 CAR antigen recognition domain binds an epitope on human CD19, wherein binding of the sequence motif to the anti-CD19 CAR antigen recognition domain activates a T cell expressing a CAR comprising the anti-CD19 CAR antigen recognition domain.

In some aspects, the disclosure provides an amphiphilic ligand conjugate comprising: a multimer of an anti-CD19 CAR ligand; and a lipid operably linked to the multimer, wherein the anti-CD19 CAR ligand comprises a peptide comprising a sequence motif of 5-20 amino acid residues, wherein the sequence motif binds an anti-CD19 CAR antigen recognition domain, wherein the anti-CD19 CAR antigen recognition domain binds an epitope on human CD19, wherein binding of the sequence motif to the anti-CD19 CAR antigen recognition domain activates a cell expressing a CAR comprising the anti-CD19 CAR antigen recognition domain. In some aspects, the cell expressing an anti-CD19 CAR is a CAR T cell. In some aspects, the cell expressing an anti-CD19 CAR is a CAR NK cell. In some aspects, the cell expressing an anti-CD19 CAR is a CAR macrophage. In some aspects, the cell expressing an anti-CD19 CAR is a CAR NKT cell.

In some aspects, the disclosure provides an amphiphilic ligand conjugate comprising: a multimer of an anti-CD19 CAR ligand; and a lipid operably linked to the multimer, wherein the anti-CD19 CAR ligand comprises a peptide comprising a sequence motif of 5-20 amino acid residues, wherein the sequence motif binds an anti-CD19 CAR antigen recognition domain, wherein the anti-CD19 CAR antigen recognition domain binds an epitope on human CD19, wherein binding of the sequence motif to the anti-CD19 CAR antigen recognition domain activates a T cell expressing a CAR comprising the anti-CD19 CAR antigen recognition domain.

In any of the foregoing or related aspects, the multimer is a dimer, trimer, or tetramer. In some aspects, the multimer is a dimer. In some aspects, the anti-CD19 CAR ligands of the multimer are the same. In some aspects, the anti-CD19 CAR ligands of the multimer are different. In some aspects, the anti-CD19 CAR ligands of the multimer are operably linked to the lipid via a linker.

In some aspects, the disclosure provides an amphiphilic ligand conjugate comprising: a dimer of an anti-CD19 CAR ligand; and a lipid operably linked to the dimer, wherein the anti-CD19 CAR ligand comprises a peptide comprising a sequence motif of 5-20 amino acid residues, wherein the sequence motif binds an anti-CD19 CAR antigen recognition domain, wherein the anti-CD19 CAR antigen recognition domain binds an epitope on human CD19, wherein binding of the sequence motif to the anti-CD19 CAR antigen recognition domain activates a cell expressing a CAR comprising the anti-CD19 CAR antigen recognition domain. In some aspects, the cell expressing an anti-CD19 CAR is a CAR T cell. In some aspects, the cell expressing an anti-CD19 CAR is a CAR NK cell. In some aspects, the cell expressing an anti-CD19 CAR is a CAR macrophage. In some aspects, the cell expressing an anti-CD19 CAR is a CAR NKT cell.

In some aspects, the disclosure provides an amphiphilic ligand conjugate comprising: a dimer of an anti-CD19 CAR ligand; and a lipid operably linked to the dimer, wherein the anti-CD19 CAR ligand comprises a peptide comprising a sequence motif of 5-20 amino acid residues, wherein the sequence motif binds an anti-CD19 CAR antigen recognition domain, wherein the anti-CD19 CAR antigen recognition domain binds an epitope on human CD19, wherein binding of the sequence motif to the anti-CD19 CAR antigen recognition domain activates a T cell expressing a CAR comprising the anti-CD19 CAR antigen recognition domain.

In any of the foregoing or related aspects, the dimer comprises a first anti-CD19 CAR ligand and a second anti-CD19 CAR ligand. In some aspects, the first anti-CD19 CAR ligand and the second anti-CD19 CAR ligand are the same. In some aspects, the first anti-CD19 CAR ligand and the second anti-CD19 CAR ligand are different. In some aspects, the first anti-CD19 CAR ligand is operably linked to the lipid via a first linker; and the second anti-CD19 CAR ligand is operably linked to the lipid via a second linker. In some aspects, the first linker and the second linker are operably linked to the lipid via a heterotrifunctional compound. In some aspects, the heterotrifunctional compound is lysine. In some aspects, the peptide of the first anti-CD19 CAR ligand is operably linked to the lipid at its N-terminus or its C-terminus via the first linker. In some aspects, the peptide of the second anti-CD19 CAR ligand is operably linked to the lipid at its N-terminus or C-terminus via the second linker. In some aspects, the first linker and the second linker are each selected from: a hydrophilic polymer, a string of hydrophilic amino acids, a polysaccharide, or a combination thereof. In some aspects, the first linker and the second linker are the same. In some aspects, the first linker and the second linker are different. In some aspects, the first linker and the second linker each comprise "N" consecutive polyethylene glycol units, wherein N is at least 4, 5, 6, 7, 8, 9, or 10. In some aspects, "N" is up to about 15, 20, 25, 30, 35, 40, 45, or 50. In some aspects, the lipid is 1,2-distearoyl-sn-glycero-3-phosphoethanolamine (DSPE), and the first linker and the second linker are a polyethylene glycol polymer selected from PEG4 and PEG8. In some aspects, the first linker and the second linker are each PEG4. In some aspects, the first linker and the second linker are each PEG8.

In any of the foregoing or related aspects, the anti-CD19 CAR antigen recognition domain recognizes a conformational epitope on CD19. In any of the foregoing or related aspects, the anti-CD19 antigen recognition domain comprises an scFv. In some aspects, the anti-CD19 antigen recognition domain comprises an antigen recognition domain derived from FMC63. In some aspects, the T cell expressing the CAR is derived from Kymriah or Yescarta.

In any of the foregoing or related aspects, the sequence motif is 5, 6, 7, 8, 9, 10, 11, 12, 13, 14, 15, 16, 17, 18, 19 or 20 amino acid residues in length.

In any of the foregoing or related aspects, the sequence motif comprises at least two cysteine residues. In some aspects, the at least two cysteine residues are three amino acids apart. In some aspects, the at least two cysteine residues are capable of forming an intra-peptidyl disulfide bridge. In some aspects, the sequence motif forms a secondary structure comprising a loop.

In any of the foregoing or related aspects, the sequence motif comprises

```
[Xaa1-Xaa2-Cys-Xaa3-Xaa4-Xaa5-Cys-Xaa6-Xaa7-
    Xaa8],
```

- wherein the peptide is capable of forming an intra-peptidyl disulfide bridge;
- wherein Xaa1 is Arg, Xaa3 is Pro, and Xaa4 is Trp;
- wherein Xaa2 and Xaa5 are any amino acid; and
- wherein Xaa6, Xaa7, and Xaa8 are each any amino acid or are absent. In some aspects, the sequence motif comprises an amino acid sequence selected from: RHCPWNCSLL (SEQ ID NO: 5), RICPWSCRAP (SEQ ID NO: 6), and SEQ ID NOs: 10, 12-15, and 20.

In any of the foregoing or related aspects, the sequence motif comprises

```
                                  (SEQ ID NO: 7)
[Arg-Xaa1-Cys-Pro-Trp-Xaa2-Cys-Xaa3-Xaa4-Xaa5],
```

- wherein the peptide is capable of forming an intra-peptidyl disulfide bridge;
- wherein Xaa1 is selected from Ile, Leu, Met, Val, and Arg;
- wherein Xaa2 is selected from Ala, Glu, His, Ser, Asp, and Asn;
- wherein Xaa3 is selected from Leu, Arg, Ala, Met, Ser, Val, Ile, and Lys;
- wherein Xaa4 is selected from Ser, Val, Gln, Ile, Pro, Lys, Glu, and His; and
- wherein Xaa5 is selected from Leu, Ile, Arg, His, Gln, and Trp. In some aspects, the sequence motif comprises an amino acid sequence selected from: RICPWACLSL (SEQ ID NO: 22); RLCPWECRVL (SEQ ID NO: 23); RLCPWACRQL (SEQ ID NO: 24); RLCPWHCAII (SEQ ID NO: 25); RLCPWSCMPR (SEQ ID NO: 26); RLCPWDCLIL (SEQ ID NO: 27); RMCPWSCRPH (SEQ ID NO: 9); RICPWNCSKL (SEQ ID NO: 28); RVCPWSCVEQ (SEQ ID NO: 29); RLCPWNCIHW (SEQ ID NO: 30); or RRCPWSCKKQ (SEQ ID NO: 11). In some aspects, the sequence motif binds the CAR antigen-recognition domain with a binding affinity ($K_D$) of at least 5 μM, or of about 0.5 μM, about 0.6 μM, about 0.7 μM, about 0.8 μM, about 0.9 μM, about 1 μM, about 2 μM, about 3 μM, about 4 μM, or about 5 μM.

In any of the foregoing or related aspects, sequence motif comprises

```
                                  (SEQ ID NO: 131)
[Arg-Xaa1-Cys-Pro-Trp-Xaa2-Cys-Xaa3-Xaa4-Xaa5],
```

- wherein the peptide is capable of forming an intra-peptidyl disulfide bridge;
- wherein Xaa1 is selected from Leu, Ile, and Val;
- wherein Xaa2 is Ser or Lys;
- wherein Xaa3 is selected from Arg, Ile, Val, and Met;
- wherein Xaa4 is selected from Glu, Lys, and Pro; and
- wherein Xaa5 is selected from Leu, Gln, Phe, and Ile. In some aspects, the sequence motif comprises an amino acid sequence selected from: RLCPWKCREL (SEQ ID NO: 31); RLCPWSCIKL (SEQ ID NO: 32); RLCPWSCVEQ (SEQ ID NO: 33); RICPWSCRPL (SEQ ID NO: 34); RLCPWSCIPF (SEQ ID NO: 35); RVCPWSCMPI (SEQ ID NO: 14); and RICPWSCVKQ (SEQ ID NO: 36). In some aspects, the sequence motif binds the CAR antigen-recognition domain with a binding affinity ($K_D$) of about 1 nM to about 5000 nM, or about 1 nM, about 10 nM, about 20 nM, about 30 nM, about 40 nM, about 50 nM, about 60 nM, about 70 nM, about 80 nM, about 90 nM, about 100 nM, about 150 nM, about 200 nM, about 250 nM, about 300 nM, about 350 nM, about 400 nM, about 450 nM, about 500 nM, about 550 nM, about 600 nM, about 650 nM, about 700 nM, about 750 nM, about 800 nM, about 850 nM, about 900 nM, about 950 nM, about 1000 nM, about 1500 nM, about 2000 nM, about 2500 nM, about 3000 nM, about 3500 nM, about 4000 nM, about 4500 nM, or about 5000 nM.

In any of the foregoing or related aspects, the sequence motif comprises

```
                                  (SEQ ID NO: 132)
[Arg-Xaa1-Cys-Pro-Trp-Xaa2-Cys-Xaa3-Xaa4-Xaa5],
```

- wherein the peptide is capable of forming an intra-peptidyl disulfide bridge;
- wherein Xaa1 is selected from Leu, Ile, and Met;
- wherein Xaa2 is selected from Ser, Asn, Asp, and Gly;
- wherein Xaa3 is selected from Leu, Met, Ser, Arg, and Lys;
- wherein Xaa4 is selected from Glu, Gln, and Pro; and
- wherein Xaa5 is Leu or Ile. In some aspects, the sequence motif comprises RLCPWSCLEI (SEQ ID NO: 37); RICPWSCMEL (SEQ ID NO: 38); RLCPWNCSEL (SEQ ID NO: 39); RLCPWNCRQL (SEQ ID NO: 40); RICPWDCKPI (SEQ ID NO: 41) RMCPWNCREL (SEQ ID NO: 42); RLCPWSCREL (SEQ ID NO: 16); or RICPWGCKEL (SEQ ID NO: 43). In some aspects, the sequence motif binds a CAR antigen-recognition domain with a binding affinity ($K_D$) of about 1 nM to about 1000 nM, or about 1 nM, about 5 nM, about 10 nM, about 15 nM, about 20 nM, about 25 nM, about 30 nM, about 35 nM, about 40 nM, about 45 nM, about 50 nM, about 55 nM, about 60 nM, about 65 nM, about 70 nM, about 75 nM, about 80 nM, about 85 nM, about 90 nM, about 95 nM, about 100 nM, about 110 nM, about 120 nM, about 130 nM, about 140 nM, about 150 nM, about 160 nM, about 170 nM, about 180 nM, about 190 nM, about 200 nM, about 250 nM, about 300 nM, about 350 nM, about 400 nM, about 450 nM, about 500 nM, about 550 nM, about 600 nM, about 650 nM, about 700 nM, about 750 nM, about 800 nM, about 850 nM, about 900 nM, about 950 nM, or about 1000 nM.

In any of the foregoing or related aspects, the sequence motif comprises

```
                                  (SEQ ID NO: 133)
[Arg-Xaa1-Cys-Pro-Trp-Xaa2-Cys-Xaa3-Glu-Leu],
```

- wherein the peptide is capable of forming an intra-peptidyl disulfide bridge;
- wherein Xaa1 is Leu or Ile;
- wherein Xaa2 is selected from Ser, Asn, and Asp; and
- wherein Xaa3 is selected from Gln, Ile, Val, Lys, and Arg. In some aspects, the sequence motif comprises RLCPWNCQEL (SEQ ID NO: 44); RICPWSCIEL (SEQ ID NO: 45); RICPWSCVEL (SEQ ID NO: 46); RICPWNCKEL (SEQ ID NO: 18); RLCPWNCREL (SEQ ID NO: 17); RLCPWDCREL (SEQ ID NO: 19);

RICPWSCREL (SEQ ID NO: 21); or RLCPWDCKEL (SEQ ID NO: 47). In some aspects, the sequence motif binds a CAR antigen-recognition domain with a binding affinity ($K_D$) of about 1 nM to about 500 nM, or about 1 nM, about 5 nM, about 10 nM, about 15 nM, about 20 nM, about 25 nM, about 30 nM, about 35 nM, about 40 nM, about 45 nM, about 50 nM, about 55 nM, about 60 nM, about 65 nM, about 70 nM, about 75 nM, about 80 nM, about 85 nM, about 90 nM, about 95 nM, about 100 nM, about 110 nM, about 120 nM, about 130 nM, about 140 nM, about 150 nM, about 160 nM, about 170 nM, about 180 nM, about 190 nM, about 200 nM, about 250 nM, about 300 nM, about 350 nM, about 400 nM, about 450 nM, or about 500 nM.

In any of the foregoing or related aspects, the peptide comprises an amino acid sequence from N-terminus to C-terminus represented by the formula: $[A]_x$-$[M]_y$-$[B]_z$; wherein A, if present, is any amino acid residue, optionally an amino acid residue other than glycine; wherein M is one or more sequence motifs; wherein B, if present, is any amino acid residue, optionally an amino acid residue other than glycine; x and z are each integers from 1-20; y is an integer from 1-5; and wherein either A is present or B is present, or both A and B are present. In some aspects, A is present and x is 1, 2, 3, 4, 5, 6, 7, 8, 9, 10, 11, 12, 13, 14, 15, 16, 17, 18, 19, or 20. In some aspects, A is the same or different amino acid residue, and x is 2-20. In some aspects, M is the same or different sequence motifs, and y is 2, 3, 4 or 5. In some aspects, the sequence motifs are directly fused or joined by a linker. In some aspects, the linker is a peptide linker. In some aspects, A comprises an amino acid sequence selected from: SAS; GGGSAS (SEQ ID NO: 109); GGSGGGGSAS (SEQ ID NO: 110); GSGGGGSGGGGSAS (SEQ ID NO: 111); GGGGSGGGGSGGGGSAS (SEQ ID NO: 112); PRKHSG (SEQ ID NO: 113); GGGSASPRKHSG (SEQ ID NO: 130); PLS; AKRRERDYVG (SEQ ID NO: 114); PPP; AGT; QFQ; and a combination thereof. In some aspects, the peptide binds to the CAR antigen-recognition domain with an increased binding affinity ($K_D$) relative to a peptide without either A and/or B amino acid residues of about 1.1, 1.2, 1.3, 1.4, 1.5, 1.6, 1.7, 1.8, 1.9, or 2-fold. In some aspects, the peptide binds to the CAR antigen-recognition domain with a substantially reduced dissociation rate relative to a peptide without either A and/or B amino acid residues.

In any of the foregoing or related aspects, the peptide comprises an amino acid sequence from N-terminus to C-terminus represented by the formula: $[A]_x$-$[M]_y$-$[B]_z$; wherein A, if present, is any amino acid residue, optionally an amino acid residue other than glycine; wherein M is one or more sequence motifs; wherein B, if present, is any amino acid residue, optionally an amino acid residue other than glycine; x and z are each integers from 1-20; y is an integer from 1-5; and wherein either A is present or B is present, or both A and B are present. In some aspects, B is present and z is 1, 2, 3, 4, 5, 6, 7, 8, 9, 10, 11, 12, 13, 14, 15, 16, 17, 18, 19, or 20. In some aspects, B is the same or different amino acid residues, and z is 2-20. In some aspects, B is present, z is 10. In some aspects, B is present, z is 6. In some aspects, M is the same or different sequence motifs, and y is 2, 3, 4 or 5. In some aspects, the sequence motifs are directly fused or joined by a linker. In some aspects, the linker is a peptide linker. In some aspects, B comprises an amino acid sequence represented by the formula: [Tyr-Trp-Leu-Pro-Xaa3-Xaa4] (SEQ ID NO: 122), wherein Xaa3 is any amino acid residue, optionally D or Q; and wherein Xaa4 is any amino acid residue, optionally E, Q, or R. In some aspects, B comprises an amino acid sequence selected from: YWLPQR (SEQ ID NO: 117), YWLPDE (SEQ ID NO: 119), and YWLPDQ (SEQ ID NO: 123). In some aspects, B comprises an amino acid sequence selected from: DNPPFIFGNR (SEQ ID NO: 115), PTPYMMFDM (SEQ ID NO: 116), HPDTRHRIPV (SEQ ID NO: 118), PLDWPW (SEQ ID NO: 120), PSPPRIFGNR (SEQ ID NO: 121); and a combination thereof. In some aspects, the peptide binds to the CAR antigen-recognition domain with an increased binding affinity ($K_D$) relative to a peptide without either A and/or B amino acid residues of about 1.1, 1.2, 1.3, 1.4, 1.5, 1.6, 1.7, 1.8, 1.9, or 2-fold. In some aspects, the peptide binds to the CAR antigen-recognition domain with a substantially reduced dissociation rate relative to a peptide without either A and/or B amino acid residues.

In any of the foregoing or related aspects, the peptide comprises an amino acid sequence from N-terminus to C-terminus represented by the formula: $[A]_x$-$[M]_y$-$[B]_z$; wherein A, if present, is any amino acid residue, optionally an amino acid residue other than glycine; wherein M is one or more sequence motifs; wherein B, if present, is any amino acid residue, optionally an amino acid residue other than glycine; x and z are each integers from 1-20; y is an integer from 1-5; and wherein either A is present or B is present, or both A and B are present. In some aspects, A is present and x is 1, 2, 3, 4, 5, 6, 7, 8, 9, 10, 11, 12, 13, 14, 15, 16, 17, 18, 19, or 20. In some aspects, A is the same or different amino acid residue, and x is 2-20. In some aspects, B is present and z is 1, 2, 3, 4, 5, 6, 7, 8, 9, 10, 11, 12, 13, 14, 15, 16, 17, 18, 19, or 20. In some aspects, B is the same or different amino acid residues, and z is 2-20. In some aspects, wherein A and B are present, x is 10, and z is 10. In some aspects, A and B are present, x is 6, and z is 10. In some aspects, A and B are present, x is 3, and z is 6. In some aspects, M is the same or different sequence motifs, and y is 2, 3, 4 or 5. In some aspects, the sequence motifs are directly fused or joined by a linker. In some aspects, A comprises an amino acid sequence selected from: PLS, AGT, and QFQ; and B comprises an amino acid sequence represented by the formula: [Tyr-Trp-Leu-Pro-Xaa1-Xaa2] (SEQ ID NO: 124), wherein Xaa1 is any amino acid residue, optionally D or Q; and wherein Xaa2 is any amino acid residue, optionally E, Q, or R. In some aspects, A and B comprise an amino acid sequence of PRKHSG (SEQ ID NO: 113) and DNPPFIFGNR (SEQ ID NO: 115) respectively. In some aspects, A and B comprise an amino acid sequence of GGGSASPRKHSG (SEQ ID NO: 130) and DNPPFIFGNR (SEQ ID NO: 115) respectively. In some aspects, A and B comprise an amino acid sequence of PLS and YWLPQR (SEQ ID NO: 117) respectively. In some aspects, A and B comprise an amino acid sequence of PPP and PLDWPW (SEQ ID NO: 120) respectively. In some aspects, A and B comprise an amino acid sequence of AGT and YWLPDE (SEQ ID NO: 122) respectively. In some aspects, A and B comprise GGGSAS (SEQ ID NO: 109) and PSPPRIFGNR (SEQ ID NO: 121) respectively. In some aspects, A and B comprise an amino acid sequence of QFQ and YWLPDQ (SEQ ID NO: 123) respectively. In some aspects, the peptide comprises an amino acid sequence selected from SEQ ID NOs: 95-108, and 128-129. In some aspects, the peptide binds to the CAR antigen-recognition domain with an increased binding affinity ($K_D$) relative to a peptide without either A and/or and B amino acid residues of about 1.1, 1.2, 1.3, 1.4, 1.5, 1.6, 1.7, 1.8, 1.9, or 2-fold. In some aspects, the peptide binds to the CAR antigen-recognition domain with a substantially reduced dissociation rate relative to a peptide without either A and/or B amino acid residues.

In any of the foregoing or related aspects, the peptide comprises more than one sequence motif, or wherein the peptides comprises at least two, three, four, or five sequence motifs. In some aspects, the peptide comprises (i) at least two, three, four, or five sequence motifs, wherein the sequence motifs are the same; or (ii) at least two, three, four, or five sequence motifs, wherein the sequence motifs are different. In some aspects, the at least two, three, four, or five sequence motifs are directly fused or joined by a linker. In some aspects, the linker is a peptide linker.

In any of the foregoing or related aspects, the peptide is about 5, about 6, about 7, about 8, about 9, about 10, about 15, about 20, about 25, about 30, about 35, about 40, about 45, about 50, about 55, about 60, about 65, about 70, about 75, about 80, about 85, about 90, or about 100 amino acid residues in length.

In some aspects, the disclosure provides an immunomodulatory composition comprising: an anti-CD19 CAR ligand, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a cell expressing the anti-CD19 CAR. In some aspects, the cell expressing a CAR is a CAR T cell. In some aspects, the cell expressing a CAR is a CAR NK cell. In some aspects, the cell expressing a CAR is a CAR macrophage. In some aspects, the cell expressing a CAR is a CAR NKT cell.

In some aspects, the disclosure provides an immunomodulatory composition comprising: an anti-CD19 CAR ligand, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a T cell expressing the anti-CD19 CAR.

In some aspects, the disclosure provides an amphiphilic ligand conjugate comprising: an anti-CD19 CAR ligand; and a lipid operably linked to the ligand, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a cell expressing the anti-CD19 CAR. In some aspects, the cell expressing an anti-CD19 CAR is a CAR NK cell. In some aspects, the cell expressing an anti-CD19 CAR is a CAR macrophage. In some aspects, the cell expressing an anti-CD19 CAR is a CAR NKT cell.

In some aspects, the disclosure provides an amphiphilic ligand conjugate comprising: an anti-CD19 CAR ligand; and a lipid operably linked to the ligand, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a T cell expressing the anti-CD19 CAR.

In some aspects, the disclosure provides an amphiphilic ligand conjugate comprising: a multimer of an anti-CD19 CAR ligand; and a lipid operably linked to the multimer, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a cell expressing the anti-CD19 CAR. In some aspects, the cell expressing an anti-CD19 CAR is a CAR NK cell. In some aspects, the cell expressing an anti-CD19 CAR is a CAR macrophage. In some aspects, the cell expressing an anti-CD19 CAR is a CAR NKT cell.

In some aspects, the disclosure provides an amphiphilic ligand conjugate comprising: a multimer of an anti-CD19 CAR ligand; and a lipid operably linked to the multimer, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a T cell expressing the anti-CD19 CAR.

In any of the foregoing or related aspects, the multimer is a dimer, trimer, or tetramer. In some aspects, the multimer is a dimer. In some aspects, the anti-CD19 CAR ligands of the multimer are the same. In some aspects, the anti-CD19 CAR ligands of the multimer are different. In some aspects, the anti-CD19 CAR ligands of the multimer are operably linked to the lipid via a linker.

In some aspects, the disclosure provides an amphiphilic ligand conjugate comprising: a dimer of an anti-CD19 CAR ligand; and a lipid operably linked to the dimer, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a cell expressing the anti-CD19 CAR. In some aspects, the cell expressing an anti-CD19 CAR is a CAR NK cell. In some aspects, the cell expressing an anti-CD19 CAR is a CAR macrophage. In some aspects, the cell expressing an anti-CD19 CAR is a CAR NKT cell.

In some aspects, the disclosure provides an amphiphilic ligand conjugate comprising: a dimer of an anti-CD19 CAR ligand; and a lipid operably linked to the dimer, wherein the anti-CD19 CAR ligand comprises a peptide comprising the sequence motif RICPWNCKEL (SEQ ID NO: 18), wherein the sequence motif binds to an anti-CD19 CAR antigen recognition domain comprising the antigen recognition domain of FMC63, wherein binding of the sequence motif to the anti-CD19 CAR antigen recognition domain activates a T cell expressing the anti-CD19 CAR.

In any of the foregoing or related aspects, the dimer comprises a first anti-CD19 CAR ligand and a second anti-CD19 CAR ligand. In some aspects, the first anti-CD19 CAR ligand and the second anti-CD19 CAR ligand are the same. In some aspects, the first anti-CD19 CAR ligand and the second anti-CD19 CAR ligand are different. In some aspects, the first anti-CD19 CAR ligand is operably linked to the lipid via a first linker; and the second anti-CD19 CAR ligand is operably linked to the lipid via a second linker. In some aspects, the first linker and the second linker are operably linked to the lipid via a heterotrifunctional compound. In some aspects, the heterotrifunctional compound is lysine. In some aspects, the peptide of the first anti-CD19 CAR ligand is operably linked to the lipid at its N-terminus or its C-terminus via the first linker. In some aspects, the peptide of the second anti-CD19 CAR ligand is operably linked to the lipid at its N-terminus or C-terminus via the second linker. In some aspects, the first linker and the second linker are each selected from: a hydrophilic polymer, a string of hydrophilic amino acids, a polysaccharide, or a combination thereof. In some aspects, the first linker and the second linker are the same. In some aspects, the first linker and the second linker are different. In some aspects, the first linker and the second linker each comprise "N" consecutive polyethylene glycol units, wherein N is at least 4, 5, 6, 7, 8, 9, or 10. In some aspects, "N" is up to about 15, 20, 25, 30, 35, 40, 45, or 50. In some aspects, the lipid is 1,2-distearoyl-sn-glycero-3-phosphoethanolamine (DSPE), and the first linker and the second linker are a polyethylene glycol polymer selected from PEG4 and PEG8. In some aspects, the first linker and the second linker are each PEG4. In some aspects, the first linker and the second linker are each PEG8.

In any of the foregoing or related aspects, the peptide comprises an amino acid sequence from N-terminus to C-terminus represented by the formula: $[A]_x$-[M]-$[B]_z$; wherein A, if present, is any amino acid residue, optionally an amino acid residue other than glycine; wherein M is the sequence motif RICPWNCKEL (SEQ ID NO: 18); wherein B, if present, is any amino acid residue, optionally an amino acid residue other than glycine; x and z are each integers from 1-20; and wherein either A is present or B is present, or both A and B are present. In some aspects, A is present and x is 1, 2, 3, 4, 5, 6, 7, 8, 9, 10, 11, 12, 13, 14, 15, 16, 17, 18, 19, or 20. In some aspects, A is the same or different amino acid residue, and x is 2-20. In some aspects, A comprises an amino acid sequence selected from: SAS; GGGSAS (SEQ ID NO: 109); GGSGGGGSAS (SEQ ID NO: 110); GSGGGGSGGGGSAS (SEQ ID NO: 111); GGGGSGGGGSGGGGSAS (SEQ ID NO: 112); PRKHSG (SEQ ID NO: 113); GGGSASPRKHSG (SEQ ID NO: 130); PLS; AKRRERDYVG (SEQ ID NO: 114); PPP; AGT; QFQ; and a combination thereof. In some aspects, the peptide comprises an amino acid sequence selected from SEQ ID NOs: 95-108, and 128-129. In some aspects, the peptide binds to the CAR antigen-recognition domain with an increased binding affinity ($K_D$) relative to a peptide without either A and/or B amino acid residues of about 1.1, 1.2, 1.3, 1.4, 1.5, 1.6, 1.7, 1.8, 1.9, or 2-fold. In some aspects, the peptide binds to the CAR antigen-recognition domain with a substantially reduced dissociation rate relative to a peptide without either A and/or B amino acid residues.

In any of the foregoing or related aspects, the peptide comprises an amino acid sequence from N-terminus to C-terminus represented by the formula: $[A]_x$-[M]-$[B]_z$; wherein A, if present, is any amino acid residue, optionally an amino acid residue other than glycine; wherein M is the sequence motif RICPWNCKEL (SEQ ID NO: 18); wherein B, if present, is any amino acid residue, optionally an amino acid residue other than glycine; x and z are each integers from 1-20; y is an integer from 1-5; and wherein either A is present or B is present, or both A and B are present. In some aspects, B is present and z is 1, 2, 3, 4, 5, 6, 7, 8, 9, 10, 11, 12, 13, 14, 15, 16, 17, 18, 19, or 20. In some aspects, B is the same or different amino acid residues, and z is 2-20. In some aspects, B is present, z is 10. In some aspects, B is present, z is 6. In some aspects, B comprises an amino acid sequence represented by the formula: [Tyr-Trp-Leu-Pro-Xaa3-Xaa4] (SEQ ID NO: 122), wherein Xaa3 is any amino acid residue, optionally D or Q; and wherein Xaa4 is any amino acid residue, optionally E, Q, or R. In some aspects, B comprises an amino acid sequence selected from: YWLPQR (SEQ ID NO: 117), YWLPDE (SEQ ID NO: 119), and YWLPDQ (SEQ ID NO: 123). In some aspects, B comprises an amino acid sequence selected from: DNPPFIFGNR (SEQ ID NO: 115), PTPYMMFDM (SEQ ID NO: 116), HPDTRHRIPV (SEQ ID NO: 118), PLDWPW (SEQ ID NO: 120), PSPPRIFGNR (SEQ ID NO: 121); and a combination thereof. In some aspects, the peptide comprises an amino acid sequence selected from SEQ ID NOs: 95-108, and 128-129. In some aspects, the peptide binds to the CAR antigen-recognition domain with an increased binding affinity ($K_D$) relative to a peptide without either A and/or B amino acid residues of about 1.1, 1.2, 1.3, 1.4, 1.5, 1.6, 1.7, 1.8, 1.9, or 2-fold. In some aspects, the peptide binds to the CAR antigen-recognition domain with a substantially reduced dissociation rate relative to a peptide without either A and/or B amino acid residues.

In any of the foregoing or related aspects, the peptide comprises an amino acid sequence from N-terminus to C-terminus represented by the formula: $[A]_x$-[M]-$[B]_z$; wherein A, if present, is any amino acid residue, optionally an amino acid residue other than glycine; wherein M is the sequence motif RICPWNCKEL (SEQ ID NO: 18); wherein B, if present, is any amino acid residue, optionally an amino acid residue other than glycine; x and z are each integers from 1-20; y is an integer from 1-5; and wherein either A is present or B is present, or both A and B are present. In some aspects, A is present and x is 1, 2, 3, 4, 5, 6, 7, 8, 9, 10, 11, 12, 13, 14, 15, 16, 17, 18, 19, or 20. In some aspects, A is the same or different amino acid residue, and x is 2-20. In some aspects, B is present and z is 1, 2, 3, 4, 5, 6, 7, 8, 9, 10, 11, 12, 13, 14, 15, 16, 17, 18, 19, or 20. In some aspects, B is the same or different amino acid residues, and z is 2-20. In some aspects, wherein A and B are present, x is 10, and z is 10. In some aspects, A and B are present, x is 6, and z is 10. In some aspects, A and B are present, x is 3, and z is 6. In some aspects, A comprises an amino acid sequence selected from: PLS, AGT, and QFQ; and B comprises an amino acid sequence represented by the formula: [Tyr-Trp-Leu-Pro-Xaa1-Xaa2] (SEQ ID NO: 124), wherein Xaa1 is any amino acid residue, optionally D or Q; and wherein Xaa2 is any amino acid residue, optionally E, Q, or R. In some aspects, A and B comprise an amino acid sequence of PRKHSG (SEQ ID NO: 113) and DNPPFIFGNR (SEQ ID NO: 115) respectively. In some aspects, A and B comprise an amino acid sequence of GGGSASPRKHSG (SEQ ID NO: 130) and DNPPFIFGNR (SEQ ID NO: 115) respectively. In some aspects, A and B comprise an amino acid sequence of PLS and YWLPQR (SEQ ID NO: 117) respectively. In some aspects, A and B comprise an amino acid sequence of PPP and PLDWPW (SEQ ID NO: 120) respectively. In some aspects, A and B comprise an amino acid sequence of GGGSAS (SEQ ID NO: 109) and PSPPRIFGNR (SEQ ID NO: 121) respectively. In some aspects, A and B comprise an amino acid sequence of AGT and YWLPDE (SEQ ID NO: 122) respectively. In some aspects, A and B comprise an amino acid sequence of QFQ and YWLPDQ (SEQ ID NO: 123) respectively. In some aspects, the peptide comprises an amino acid sequence selected from SEQ ID NOs: 95-108, and 128-129. In some aspects, the peptide comprises an amino acid sequence selected from SEQ ID NOs: 95-108, and 128-129. In some aspects, the peptide binds to the CAR antigen-recognition domain with an increased binding affinity ($K_D$) relative to a peptide without either A and/or and B amino acid residues of about 1.1, 1.2, 1.3, 1.4, 1.5, 1.6, 1.7, 1.8, 1.9, or 2-fold. In some aspects, the peptide binds to the CAR antigen-recognition domain with a substantially reduced dissociation rate relative to a peptide without either A and/or B amino acid residues.

In any of the foregoing or related aspects, the peptide is operably-linked to a lipid. In any of the foregoing or related aspects, the peptide is a fusion protein.

In any of the foregoing or related aspects, the anti-CD19 CAR ligand binds the anti-CD19 CAR antigen recognition domain with a binding affinity ($K_D$) of at least 5 μM, or about 1 nM, about 2 nM, about 3 nM, about 4 nM, about 5 nM, about 6 nM, about 7 nM, about 8 nM, about 9 nM, about 10 nM, about 20 nM, about 30 nM, about 40 nM, about 50 nM, about 60 nM, about 70 nM, about 80 nM, about 90 nM, about 100 nM, about 200 nM, about 300 nM, about 400 nM, about 500 nM, about 600 nM, about 700 nM, about 800 nM, about 900 nM, about 1 μM, about 2 μM, about 3 μM, about 4 μM, or about 5 μM.

In any of the foregoing or related aspects, the anti-CD19 CAR ligand binds to the anti-CD19 CAR antigen recognition domain with a binding affinity that is lower than the binding affinity of the anti-CD19 CAR antigen recognition domain for human CD19. In some aspects, the anti-CD19 CAR ligand binds the anti-CD19 CAR antigen recognition domain with a binding affinity sufficient to activate the T cell expressing the CAR comprising the anti-CD19 CAR antigen recognition without inducing exhaustion.

In any of the foregoing or related amphiphilic ligand conjugate aspects, the lipid inserts in a cell membrane under physiological conditions, binds albumin under physiological conditions, or both.

In any of the foregoing or related amphiphilic ligand conjugate aspects, the lipid is a diacyl lipid. In some aspects, the diacyl lipid comprises acyl chains comprising 12-30 hydrocarbon units, 14-25 hydrocarbon units, 16-20 hydrocarbon units, or 12, 13, 14, 15, 16, 17, 18, 19, 20, 21, 22, 23, 24, 25, 26, 27, 28, 29 or 30 hydrocarbon units.

In any of the foregoing or related amphiphilic ligand conjugate aspects, the CAR ligand is operably linked to the lipid via a linker. In some aspects, the linker is selected from the group consisting of hydrophilic polymers, a string of hydrophilic amino acids, polysaccharides, or a combination thereof. In some aspects, the linker comprises "N" consecutive polyethylene glycol units, wherein N is between 25-50. In some aspects, the lipid is 1,2-distearoyl-sn-glycero-3-phosphoethanolamine (DSPE) and wherein the polyethylene glycol moiety is PEG-2000.

In some aspects, the disclosure provides a vaccine comprising an immunomodulatory composition disclosed herein.

In other aspects, the disclosure provides a pharmaceutical composition comprising an amphiphilic ligand conjugate described herein, and a pharmaceutically acceptable carrier.

In yet other aspects, the disclosure provides an immunogenic composition comprising an amphiphilic ligand conjugate described herein or a pharmaceutical composition describe herein, and an adjuvant. In some aspects, the adjuvant is an amphiphilic oligonucleotide conjugate comprising an immunostimulatory oligonucleotide conjugated to a lipid, with or without a linker, and optionally a polar compound. In some aspects, the immunostimulatory oligonucleotide binds a pattern recognition receptor. In some aspects, the immunostimulatory oligonucleotide comprises CpG. In other aspects, the immunostimulatory oligonucleotide is a ligand for a toll-like receptor. In some aspects, the linker is an oligonucleotide linker. In some aspects, the oligonucleotide linker comprises "N" consecutive guanines, wherein N is between 0-2. In some aspects, the lipid is a diacyl lipid. In some aspects, the diacyl lipid comprises acyl chains comprising 12-30 hydrocarbon units. In other aspects, the adjuvant is a cyclic di-GMP (CDG).

In some aspects, the disclosure provides a method for identifying a peptide ligand that selectively binds a CAR, wherein the method comprises:

(i) providing a cellular library comprising a population of cells that display at least $10^6$ unique variable peptides, wherein the variable peptides are 5 or more amino acid residues in length; and (ii) selecting a peptide sequence motif that binds the CAR antigen-recognition domain with a binding affinity ($K_D$) of at least 5 μM.

In any of the foregoing or related aspects, providing the cellular library comprises (i) transforming a population of cells with a library of vectors, wherein each vector comprises a synthetic polynucleotide that encodes a variable peptide operably-linked to an adhesion protein, and (ii) maintaining the population of cells under conditions that induce expression of the synthetic polynucleotide in a plurality of transformed cells.

In any of the foregoing or related aspects, the cellular library is a phage display library, a viral display library, a yeast display library, a bacterial display library, a mammalian cell display library, or an insect cell display library.

In any of the foregoing or related aspects, the synthetic polynucleotide encodes a variable peptide that is at least 5, 6, 7, 8, 9, 10, 11, 12, 13, 14, 15, 16, 17, 18, 19, or 20 amino acid residues in length. In some aspects, each amino acid residue of the variable peptide is encoded by a degenerate codon. In some aspects, the degenerate codon is selected from: NNN, NNK, NDT, or DBK; wherein "N" is adenosine (A), thymidine (T), guanine (G), or cytosine (C); wherein "K" is G or T; and wherein "D" is A, T, or G. In some aspects, the synthetic polynucleotide sequence encoding the variable peptide is $(NNK)_w$ (SEQ ID NO: 134), wherein NNK is (A,T,G,C)(A,T,G,C)(G,T), and wherein w is 5-20.

In any of the foregoing or related aspects, the cellular library comprises synthetic polynucleotides encoding at least about $1\times10^6$, about $5\times10^6$, about $1\times10^7$, about $5\times10^7$, about $1\times10^8$, about $5\times10^8$, or about $1\times10^9$ unique variable peptide sequences. In any of the foregoing or related aspects, the variable peptide comprises at least two cysteine residues, and wherein the cysteine residues are capable of forming an intra-peptidyl disulfide bond.

In any of the foregoing or related aspects, the synthetic polynucleotide sequence encoding the variable peptide is $(NNK)_x(TGY)(NNK)_y(TGY)(NNK)_z$ (SEQ ID NO: 135), wherein NNK is (A,T,G,C)(A,T,G,C)(G,T); wherein TGY is (T)(G)(T,C); wherein x is 1-7; wherein y is 1-7; and wherein z is 1-7. In some aspects, y is 3.

In any of the foregoing or related aspects, the synthetic polynucleotide sequence encoding the variable peptide is $(CGN)(NNK)_q(TGY)(CCN)(TGG)(NNK)_r(TGY)(NNK)_s$ (SEQ ID NO: 136), wherein NNK is (A,T,G,C)(A,T,G,C)(G,T); wherein CGN is (C)(G)(A,T,G,C); wherein TGY is (T)(G)(T,C); wherein CCN is (C)(C)(A,T,G,C); wherein TGG is (T)(G)(G); wherein q is 1-3; wherein r is 1-3; and wherein s is 1-4. In some aspects, q is 1; wherein r is 1; and wherein s is 3.

In any of the foregoing or related aspects, the cellular library is a yeast display library, and wherein the adhesion protein is Aga2p. In some aspects, the variable peptide is operably-linked to the C-terminus of Aga2p via a linker, optionally wherein the linker is a peptide linker. In some aspects, the synthetic polynucleotide comprises the nucleotide sequence set forth in SEQ ID NO: 84. In some aspects, the synthetic polynucleotide encodes a polypeptide comprising the amino acid sequence set forth in SEQ ID NO: 83. In some aspects, the synthetic polynucleotide comprises the nucleotide sequence set forth in SEQ ID NO: 86. In some aspects, the synthetic polynucleotide encodes a polypeptide comprising the amino acid sequence set forth in SEQ ID NO: 85.

In any of the foregoing or related aspects, the yeast display library comprises (i) expression of about $10^2$, about $10^3$, about $10^4$, about $10^5$, or about $10^6$ copies of variable peptide per yeast cell; and (ii) expression of about $1\times10^6$, about $5\times10^6$, about $1\times10^7$, about $5\times10^7$, about $1\times10^8$, about $5\times10^8$, or about $1\times10^9$ total unique peptide sequences.

In any of the foregoing or related aspects, the selection comprises (i) a negative selection, wherein the negative selection comprises at least one, two, three, four, or five rounds of depletion of cells that bind to a solid support; and (ii) a positive selection, wherein the positive selection comprises at least one, two, three, four, or five rounds of enrichment of cells that bind to a solid support. In some aspects, (i) the solid support used for negative selection comprises binding sites, wherein a plurality of binding sites are unbound or wherein a plurality of binding sites display an isotype control antibody or fragment thereof; and (ii) the solid support used for positive selection comprises binding sites, wherein a plurality of binding sites display an antibody or fragment thereof comprising the CAR antigen-recognition domain. In some aspects, the isotype control antibody and the antibody comprising the CAR antigen-recognition domain are full-length antibodies. In some aspects, the constant regions of the isotype control antibody and the antibody comprising the CAR antigen-recognition domain are the same.

In any of the foregoing or related aspects, the negative selection is performed with at least about $10^5$, about $10^6$, about $10^7$, about $10^8$, or about $10^9$ cells, and wherein the number of cells exceeds the number of unique variable peptide sequences in the cellular library by at least 5-fold, 10-fold, 15-fold, 20-fold, 25-fold, or 30-fold.

In any of the foregoing or related aspects, the negative selection comprises:

(i) depletion of about 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the population of cells, wherein the depleted cells are removed by binding the solid support, wherein a plurality of binding sites are unbound; and (ii) depletion of about 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the population of cells, wherein the depleted cells are removed by binding the solid support, wherein a plurality of binding sites display an isotype control antibody or fragment thereof.

In any of the foregoing or related aspects, the positive selection comprises an increase in the proportion of the population of cells that bind the solid support used for positive selection, wherein the increase is at least 1.1-fold, 1.2-fold, 1.3-fold, 1.4-fold, 1.5-fold, 1.6-fold, 1.7-fold, 1.8-fold, 1.9-fold, or 2-fold compared to the population of cells prior to selection.

In any of the foregoing or related aspects, the negative selection is performed with a ratio of binding sites per cell, wherein the ratio is selected from:

(i) about $5\times10^6$ to 1, about $4\times10^6$ to 1, about $3\times10^6$ to 1, about $2\times10^6$ to 1, about $1\times10^6$ to 1, about $0.5\times10^6$ to 1, or about $0.1\times10^6$ to 1; and/or (ii) about $10^2$ to 1, about $10^3$ to 1, about $10^4$ to 1, about $10^5$ to 1, or about $10^6$ to 1.

In some aspects, the solid support is a magnetic bead. In some aspects, the negative selection is performed with a ratio of magnetic beads per cell, wherein the ratio is selected from (i) about 0.7 to 1, about 0.6 to 1, about 0.5 to 1, about 0.4 to 1, about 0.3 to 1, about 0.2 to 1, about 0.1 to 1, about 0.09 to 1, about 0.08 to 1, about 0.07 to 1, about 0.06 to 1, about 0.05 to 1, about 0.04 to 1, about 0.03 to 1, about 0.02 to 1, or about 0.01 to 1; and/or (ii) about 1 to 1, about $10^{-1}$ to 1, about $10^{-2}$ to 1, or about $10^{-3}$ to 1.

In any of the foregoing or related aspects, the selection comprises a positive selection, wherein the positive selection comprises at least one, two, three, or four rounds of selection using a method of single-cell sorting. In some aspects, each round of positive selection comprises labeling the population of cells with a fluorescently tagged antibody or fragment thereof comprising the CAR antigen-recognition domain. In some aspects, the positive selection is performed with at least about $10^5$, about $10^6$, about $10^7$, about $10^8$, or about $10^9$ cells, and wherein the number of cells exceeds the number of unique variable peptide sequences in the cellular library by at least 5-fold, 6-fold, 7-fold, 8-fold, 9-fold, or 10-fold.

In some aspects, the population of cells is labeled with the fluorescently tagged antibody or fragment thereof at a concentration of about 50 nM, about 100 nM, about 200 nM, about 300 nM, about 400 nM, about 500 nM, about 1000 nM, about 1500 nM, about 2000 nM, about 2500 nM, about 3000 nM, about 3500 nM, about 4000 nM, about 4500 nM, or about 5000 nM.

In some aspects, the positive selection comprises (i) at least one round of selection, wherein the population of cells is labeled with the fluorescent antibody or fragment thereof at a concentration of about 1 μM to about 5 μM;

(ii) at least one round of selection, wherein the population of cells is labeled with the fluorescent antibody or fragment thereof at a concentration of about 100 nM to about 1000 nM;

(iii) at least one round of selection, wherein the population of cells is labeled with the fluorescent antibody or fragment thereof at a concentration of about 10 nM to about 100 nM;

(iv) at least one round of selection, wherein the population of cells is labeled with the fluorescent antibody or fragment thereof at a concentration of about 1 nM to about 10 nM (v) at least one round of selection, wherein the population of cells is labeled with the fluorescent antibody or fragment thereof at a concentration of about 0.1 nM to about 1 nM; or (vi) any combination of (i)-(v).

In some aspects, the selection is performed using fluorescence activated cell sorting (FACS).

In any of the foregoing or related aspects, the positive selection comprises isolation of about 0.1%, about 0.2%, about 0.3%, about 0.4%, about 0.5%, about 0.6%, about 0.7%, about 0.8%, about 0.9%, or about 1.0% of cells labeled with the fluorescently tagged antibody or fragment thereof. In some aspects, cells labeled with the fluorescently-tagged antibody or fragment have a mean fluorescence intensity that is at least about $10^2$, about $10^3$, about $10^4$ or higher than background.

In some aspects, the positive selection comprises at least one round of selection comprising labeling with the fluorescent antibody or fragment thereof at a concentration of at least about 10 nM, 15 nM, 20 nM, 30 nM, 40 nM, 50 nM, 60 nM, 70 nM, 80 nM, 90 nM, 100 nM, 150 nM, 200 nM, 250 nM, 300 nM, 350 nM, 400 nM, 450 nM, or 500 nM or higher, wherein isolated cells express a variable peptide that binds the CAR antigen recognition domain with a binding affinity ($K_D$) of about 1 nM to about 5 μM. In other aspects, the positive selection comprises at least one round of selection comprising labeling with the fluorescent antibody or fragment thereof at a concentration of about 0.5 nM to about 1 nM, about 1 nM to about 5 nM, or about 0.5 nM, about 1 nM, about 2 nM, about 3 nM, about 4 nM, about 5 nM, wherein isolated cells express a variable peptide that binds the CAR antigen recognition domain with a binding affinity ($K_D$) of about 1 nM to about 1000 nM. In yet other aspects, the positive selection comprises at least one round of selection comprising labeling with the fluorescent antibody or fragment thereof at a concentration of about 0.05 nM to about 0.2 nM, about 0.1 nM to about 0.2 nM, or about 0.05 nM, about 0.06 nM, about 0.07 nM, about 0.08 nM, about 0.09 nM, about 0.1 nM, about 0.15 nM, or about 0.2 nM, wherein isolated cells express a variable peptide that binds the CAR antigen recognition domain with a binding affinity ($K_D$) of about 1 nM to about 500 nM.

In some aspects, the disclosure provides a method for identifying a peptide ligand with enhanced binding to a CAR antigen recognition domain, wherein the method comprises: (i) providing a cellular library comprising a population of cells that display at least 106 unique variable peptides, wherein the variable peptides comprise an amino acid sequence from N-terminus to C-terminus represented by the formula: [A]x-[M]-[B]z; wherein A, if present, is any amino acid residue; wherein M is a sequence motif identified by a method described herein; wherein B, if present, is any amino acid residue; x and z are each integers from 1-20; wherein either A is present or B is present, or both A and B are present; and (ii) selecting a peptide that binds the CAR antigen-recognition domain.

In some aspects, the disclosure provides a method for identifying a peptide ligand with enhanced binding to a CAR antigen recognition domain, wherein the method comprises: (i) providing a cellular library comprising a population of cells that display at least 106 unique variable peptides, wherein the variable peptides comprise an amino acid sequence from N-terminus to C-terminus represented by the formula: [A]x-[M]-[B]z; wherein A, if present, is any amino acid residue; wherein M is a sequence motif comprising an amino acid sequence represented by the formula: N'-[Xaa]n-Cys-[Xaa]m-Cys-[Xaa]n-C', wherein the sequence motif is capable of forming an intra-peptidyl disulfide bridge; wherein Xaa is any amino acid residue; n=1-10 amino acid residues; m=1-7 amino acid residues; wherein B, if present, is any amino acid residue; x and z are each integers from 1-20; wherein either A is present or B is present, or both A and B are present; and (ii) selecting a peptide that binds the CAR antigen-recognition domain. In some aspects, Xaa is encoded by a degenerate codon selected from: NNN, NNK, NDT, or DBK; wherein "N" is adenosine (A), thymidine (T), guanine (G), or cytosine (C); wherein "K" is G or T; and wherein "D" is A, T, or G. In some aspects, the degenerate codon is NNK. In some aspects, n is 3 and m is 3.

In any of the foregoing or related aspects, A is present and x is 1, 2, 3, 4, 5, 6, 7, 8, 9, 10, 11, 12, 13, 14, 15, 16, 17, 18, 19, or 20.

In any of the foregoing or related aspects, B is present and z is 1, 2, 3, 4, 5, 6, 7, 8, 9, 10, 11, 12, 13, 14, 15, 16, 17, 18, 19, or 20. In some aspects, z is 10. In some aspects, z is 6.

In any of the foregoing or related aspects, A is present and x is 1, 2, 3, 4, 5, 6, 7, 8, 9, 10, 11, 12, 13, 14, 15, 16, 17, 18, 19, or 20; and B is present and z is 1, 2, 3, 4, 5, 6, 7, 8, 9, 10, 11, 12, 13, 14, 15, 16, 17, 18, 19, or 20. In some aspects, x is 10 and z is 10. In some aspects, x is 6 and z is 10. In some aspects, x is 3 and z is 6.

In any of the foregoing or related aspects, A is encoded by a degenerate codon. In some aspects, the degenerate codon is selected from: NNN, NNK, NDT, or DBK; wherein "N" is adenosine (A), thymidine (T), guanine (G), or cytosine (C); wherein "K" is G or T; and wherein "D" is A, T, or G. In some aspects, the degenerate codon is NNK.

In some aspects, B is encoded by a degenerate codon. In some aspects, the degenerate codon is selected from: NNN, NNK, NDT, or DBK; wherein "N" is adenosine (A), thymidine (T), guanine (G), or cytosine (C); wherein "K" is G or T; and wherein "D" is A, T, or G. In some aspects, the degenerate codon is NNK.

In any of the foregoing aspects regarding the method for identifying a peptide ligand with enhanced binding to a CAR antigen recognition domain, the providing the cellular library comprises (i) transforming a population of cells with a library of vectors, wherein each vector comprises a synthetic polynucleotide that encodes the variable peptide operably-linked to an adhesion protein, and (ii) maintaining the population of cells under conditions that induce expression of the synthetic polynucleotide in a plurality of transformed cells. In some aspects, the cellular library is a phage display library, a viral display library, a yeast display library, a bacterial display library, a mammalian cell display library, or an insect cell display library.

In any of the foregoing or related aspects, the cellular library is a yeast display library, and wherein the adhesion protein is Aga2p. In some aspects, the synthetic polynucleotide comprises a nucleotide sequence from 5' to 3' represented by the formula: [P]-[T]-[L]-[V], wherein P is Aga2P, T is a tag, L is a linker, and V is the variable peptide. In some aspects, [P]-[T]-[L] has the nucleotide sequence of SEQ ID NO: 125. In some aspects, [P]-[T]-[L] encodes a polypeptide comprising the amino acid sequence of SEQ ID NO: 124. In some aspects, [P]-[T]-[L]-[V] has the nucleotide sequence of SEQ ID NO: 127. In some aspects, [P]-[T]-[L]-[V] encodes a polypeptide comprising the amino acid sequence of SEQ ID NO: 126. In some aspects, the yeast display library comprises (i) expression of about $10^2$, about $10^3$, about $10^4$, about $10^5$, or about $10^6$ copies of variable peptide per yeast cell; and (ii) expression of about $1\times10^6$, about $5\times10^6$, about $1\times10^7$, about $5\times10^7$, about $1\times10^8$, about $5\times10^8$, or about $1\times10^9$ total unique peptide sequences.

In any of the foregoing or related aspects, the selection comprises a negative selection, wherein the negative selection comprises at least one, two, three, four, or five rounds of depletion of cells that bind to a solid support. In some aspects, the solid support used for negative selection comprises binding sites, wherein a plurality of binding sites (e.g., streptavidin binding sites) are unbound. In some aspects, the solid support used for negative selection comprises binding sites, wherein a plurality of binding sites display an isotype control antibody or fragment thereof. In some aspects, the solid support used for negative selection is a magnetic bead. In some aspects, the negative selection is performed with at least about $10^5$, about $10^6$, about $10^7$, about $10^8$, or about $10^9$ cells, and wherein the number of cells exceeds the number of unique variable peptide sequences in the cellular library by at least 5-fold, 10-fold, 15-fold, 20-fold, 25-fold, or 30-fold.

In any of the foregoing or related aspects, the selection comprises a positive selection, wherein the positive selection comprises at least one, two, three, four, or five rounds of enrichment of cells that bind to a solid support. In some aspects, the solid support used for positive selection comprises binding sites, wherein a plurality of binding sites display an antibody or fragment thereof comprising the CAR antigen-recognition domain. In some aspects, the antibody or fragment thereof is a full-length antibody (e.g., IgG) comprising the CAR antigen-recognition domain. In some aspects, the antibody or fragment thereof is a single chain Fv (scFv) comprising the CAR antigen-recognition domain. In some aspects, the solid support used for positive selection is a magnetic bead.

In any of the foregoing or related aspects, the selection comprises a positive selection, wherein the positive selection comprises at least one, two, three, or four rounds of selection using a method of single-cell sorting. In some aspects, the selection is performed using fluorescence activated cell sorting (FACS). In some aspects, the positive selection is performed with at least about $10^5$, about $10^6$, about $10^7$, about $10^8$, or about $10^9$ cells. In some aspects, the number of cells exceeds the number of unique variable peptide sequences in the cellular library by at least about 5-fold, 10-fold, 15-fold, 20-fold, 25-fold, or 30-fold. In some aspects, each round of positive selection comprises the round of selection comprises: (i) labeling the population of cells with an antibody or fragment thereof comprising the CAR antigen-recognition domain at a concentration comprising a tag; (ii) washing the population of cells;

(iii) labeling the population of cells with an untagged antibody or fragment thereof comprising the CAR antigen-recognition domain. In some aspects, each round of positive selection comprises the round of selection comprises: (i) labeling the population of cells with a fluorescently-tagged antibody or fragment thereof comprising the CAR antigen-recognition domain at a concentration; (ii) washing the population of cells; (iii) labeling the population of cells with a untagged antibody or fragment thereof comprising the CAR antigen-recognition domain. In some aspects, the tagged or the fluorescently tagged antibody or fragment thereof is a full-length antibody (e.g., IgG) comprising the CAR antigen recognition domain. In some aspects, the tagged or the fluorescently tagged antibody or fragment thereof comprises an scFv comprising the CAR antigen recognition domain. In some aspects, the tagged or the fluorescently tagged antibody or fragment thereof is an scFv. In some aspects, the untagged antibody or fragment thereof comprises two antigen recognition domains. In some aspects, the untagged antibody or fragment thereof is an IgG or bivalent scFv.

In any of the foregoing or related aspects, labeling with the tagged or fluorescently-tagged antibody or fragment thereof is performed with a concentration of the tagged or fluorescently tagged antibody or fragment thereof that is at least 10-100% of the binding affinity (KD) of the sequence motif for the CAR antigen recognition domain. In some aspects, the population of cells is labeled with the tagged or fluorescently tagged antibody or fragment thereof at a concentration of at least 1-50 nM. In some aspects, the population of cells is labeled with the tagged or fluorescently tagged antibody or fragment thereof at a concentration of about 1-10, 1-20, 1-30, 1-40, or 1-50 nM In any of the foregoing or related aspects, labeling with the untagged antibody or fragment thereof is performed with a concentration of the untagged antibody or fragment thereof that is at least 10-100 fold higher than the concentration of the tagged or fluorescently tagged antibody or fragment thereof. In some aspects, the concentration of the untagged antibody or fragment thereof is about 10, 20, 30, 40, 50, 60, 70, 80, 90, or 100-fold higher than the concentration of the tagged or fluorescently tagged antibody or fragment thereof.

In any of the foregoing or related aspects, the positive selection comprises isolation of the about 1%, 2%, 3%, 4%, 5%, 6%, 7%, 8%, 9%, 10% of cells with the highest degree of labeling with the tagged or fluorescently tagged antibody or fragment thereof.

In any of the foregoing or related aspects, isolated cells express a peptide sequence motif that binds the CAR antigen recognition domain, and wherein the peptide sequence motif is identified by sequencing the isolated cells.

In any of the foregoing or related aspects, the CAR antigen-recognition domain binds to a disease-associated antigen or a tumor-associated antigen. In some aspects, the tumor-associated antigen is selected from CD19, CD20, CD30, CD70, CD138, EGFR, CD133, c-Met, carcinoembryonic antigen (CEA), epithelial cell adhesion molecule (Epcam), folate receptor alpha (FRα), ganglioside GD2, glypican-3 (GPC3), Kras G12D, mesothelin, mucin 1 (MUC1), mucin 16 (MUC16 ecto), natural killer group 2 member D (NKG2D), NY-ESO-1, prostate stem cell antigen (PSCA), Her2/neu, TRP1, ALK, and BCMA.

In other aspects, the disclosure provides a CAR ligand comprising a peptide comprising an amino acid sequence comprising a sequence motif that binds a CAR antigen recognition domain, wherein the sequence motif is identified by a method described herein. In some aspects, the sequence motif is 5, 6, 7, 8, 9, 10, 11, 12, 13, 14, 15, 16, 17, 18, 19 or 20 amino acid residues in length. In some aspects, the sequence motif comprises at least two cysteine residues. In some aspects, the at least two cysteine residues are capable of forming an intra-peptidyl disulfide bridge. In some aspects, the at least two cysteine residues are separated by two, three, four, five, six, or seven amino acid residues. In some aspects, the sequence motif forms a secondary structure comprising a loop.

In any of the foregoing or related aspects, the sequence motif comprises $$N'\text{-}[Xaa]_n\text{-}Cys\text{-}[Xaa]_m\text{-}Cys\text{-}[Xaa]_n\text{-}C',$$

wherein the sequence motif is capable of forming an intra-peptidyl disulfide bridge;

wherein Xaa is any amino acid residue;

n=1-10 amino acid residues; and m=1-7 amino acid residues. In some aspects, m is 3.

In any of the foregoing or related aspects, the sequence motif binds to the CAR antigen recognition domain with a binding affinity ($K_D$) of at least 5 μM, or about 1 nM, about 2 nM, about 3 nM, about 4 nM, about 5 nM, about 6 nM, about 7 nM, about 8 nM, about 9 nM, about 10 nM, about 20 nM, about 30 nM, about 40 nM, about 50 nM, about 60 nM, about 70 nM, about 80 nM, about 90 nM, about 100 nM, about 200 nM, about 300 nM, about 400 nM, about 500 nM, about 600 nM, about 700 nM, about 800 nM, about 900 nM, about 1 μM, about 2 μM, about 3 μM, about 4 μM, or about 5 μM.

In any of the foregoing or related aspects, the CAR antigen-recognition domain binds to a disease-associated antigen. In other aspects, the CAR antigen-recognition domain binds to a tumor-associated antigen. In some aspects, the tumor-associated antigen is selected from CD19, CD20, CD30, CD70, CD138, EGFR, CD133, c-Met, carcinoembryonic antigen (CEA), epithelial cell adhesion molecule (Epcam), folate receptor alpha (FRα), ganglioside GD2, glypican-3 (GPC3), Kras G12D, mesothelin, mucin 1 (MUC1), mucin 16 (MUC16 ecto), natural killer group 2 member D (NKG2D), NY-ESO-1, prostate stem cell antigen (PSCA), Her2/neu, TRP1, ALK, and BCMA. In some aspects, the sequence motif binds to the CAR antigen recognition domain with a binding affinity that is lower than the binding affinity of the CAR antigen recognition domain for the tumor-associated antigen.

In any of the foregoing or related aspects, the CAR ligand comprises one sequence motif that binds the CAR antigen recognition domain. In some aspects, the CAR ligand comprises more than one sequence motif that binds the CAR antigen recognition domain, or wherein the CAR ligand comprises at least two, three, four, or five sequence motifs that bind the CAR antigen recognition domain. In some aspects, the sequence motifs that binds the CAR antigen recognition domain are the same or different. In some aspects, the sequence motifs are directly fused or joined by a linker. In some aspects, the linker is a peptide linker.

In any of the foregoing or related aspects, the CAR ligand comprises a peptide that is about 5, about 6, about 7, about 8, about 9, about 10, about 15, about 20, about 25, about 30, about 35, about 40, about 45, about 50, about 55, about 60, about 65, about 70, about 75, about 80, about 85, about 90, or about 100 amino acid residues in length.

In some aspects, the disclosure provides an immunomodulatory composition comprising a CAR ligand described herein, wherein binding of the CAR ligand to the CAR antigen recognition domain activates a T cell expressing a CAR comprising the CAR antigen recognition domain. In some aspects, the CAR ligand binds to the CAR antigen recognition domain with a binding affinity sufficient to activate the T cell expressing the CAR antigen recognition domain without inducing exhaustion. In some aspects, the CAR ligand is operably-linked to a lipid. In some aspects, the immunomodulatory composition comprises a fusion protein comprising a CAR ligand described herein.

In some aspects, the disclosure provides an amphiphilic ligand conjugate comprising (i) a CAR ligand described herein; and (ii) a lipid operably linked to the CAR ligand, wherein binding of the CAR ligand to the CAR antigen recognition domain activates a cell expressing a CAR comprising the CAR antigen recognition domain. In some aspects, the disclosure provides an amphiphilic ligand conjugate comprising (i) a CAR ligand described herein; and (ii) a lipid operably linked to the CAR ligand, wherein binding of the CAR ligand to the CAR antigen recognition domain activates a T cell expressing a CAR comprising the CAR antigen recognition domain.

In some aspects, the lipid inserts in a cell membrane under physiological conditions, binds albumin under physiological conditions, or both. In some aspects, lipid is a diacyl lipid. In some aspects, the diacyl lipid comprises acyl chains comprising 12-30 hydrocarbon units, 14-25 hydrocarbon units, 16-20 hydrocarbon units, or 12, 13, 14, 15, 16, 17, 18, 19, 20, 21, 22, 23, 24, 25, 26, 27, 28, 29 or 30 hydrocarbon units. In some aspects, the CAR ligand is operably linked to the lipid via a linker. In some aspects, the linker is selected from the group consisting of hydrophilic polymers, a string of hydrophilic amino acids, polysaccharides, or a combination thereof. In some aspects, the linker comprises "N" consecutive polyethylene glycol units, wherein N is between 25-50. In some aspects, the lipid is 1,2-distearoyl-sn-glycero-3-phosphoethanolamine (DSPE) and wherein the polyethylene glycol moiety is PEG-2000.

In some aspects, the disclosure provides a pharmaceutical composition comprising an amphiphilic ligand conjugate described herein, and a pharmaceutically acceptable carrier.

In other aspects, the disclosure provides an immunogenic composition comprising an amphiphilic ligand conjugate or an pharmaceutical composition described herein, and an adjuvant. In some aspects, the adjuvant is an amphiphilic oligonucleotide conjugate comprising an immunostimulatory oligonucleotide conjugated to a lipid, with or without a linker, and optionally a polar compound. In some aspects, the immunostimulatory oligonucleotide binds a pattern recognition receptor. In some aspects, the immunostimulatory oligonucleotide comprises CpG. In some aspects, the immunostimulatory oligonucleotide is a ligand for a toll-like receptor. In some aspects, the linker is an oligonucleotide linker. In some aspects, the oligonucleotide linker comprises "N" consecutive guanines, wherein N is between 0-2. In some aspects, the lipid is a diacyl lipid. In some aspects, the diacyl lipid comprises acyl chains comprising 12-30 hydrocarbon units. In some aspects, the adjuvant is a cyclic di-GMP (CDG).

In some aspects, the disclosure provides a method of activating CAR expressing cells or increasing proliferation of CAR expressing cells in a subject, comprising administering a CAR ligand, an immunomodulatory composition, an amphiphilic ligand conjugate, a pharmaceutical composition, or an immunogenic composition, as described herein.

In some aspects, the disclosure provides a method of activating anti-CD19 CAR expressing cells or increasing proliferation of anti-CD19 CAR expressing cells in a subject, comprising administering an immunomodulatory composition, a vaccine, an amphiphilic ligand conjugate, a pharmaceutical composition, or an immunogenic composition, as described herein.

In other aspects, the disclosure provides a method of stimulating an immune response to a target cell population or a target tissue expressing an antigen in a subject, the method comprising administering to the subject CAR expressing cells specific for the antigen and a CAR ligand, an immunomodulatory composition, an amphiphilic ligand conjugate, a pharmaceutical composition, or an immunogenic composition, as described herein.

In other aspects, the disclosure provides a method of stimulating an immune response to a target cell population or a target tissue expressing CD19 in a subject, the method comprising administering to the subject anti-CD19 CAR expressing cells and comprising administering an immunomodulatory composition, a vaccine, an amphiphilic ligand conjugate, a pharmaceutical composition, or an immunogenic composition, as described herein.

In some aspects, the CAR expressing cells are CAR T cells. In some aspects, the CAR expressing cells are CAR NK cells. In some aspects, the CAR expressing cells are CAR macrophages. In some aspects, the CAR expressing cells are CAR NKT cells. In some aspects, the anti-CD19 CAR expressing cells are anti-CD19 CAR T cells. In some aspects, the anti-CD19 CAR expressing cells are anti-CD19 CAR NK cells. In some aspects, the anti-CD19 CAR expressing cells are anti-CD19 CAR macrophages. In some aspects, the anti-CD19 CAR expressing cells are anti-CD19 CAR NKT cells.

In other aspects, the disclosure provides a method of stimulating an immune response to a target cell population or a target tissue expressing CD19 in a subject, the method comprising administering to the subject anti-CD19 CAR T cells and comprising administering an immunomodulatory composition, a vaccine, an amphiphilic ligand conjugate, a pharmaceutical composition, or an immunogenic composition, as described herein.

In some aspects, the disclosure provides a method of activating anti-CD19 CAR T cells or increasing proliferation of anti-CD19 CAR T cells in a subject, comprising administering an immunomodulatory composition, a vaccine, an amphiphilic ligand conjugate, a pharmaceutical composition, or an immunogenic composition, as described herein.

In any of the foregoing or related aspects, the target cell population or target tissue is tumor cells or tumor tissue. In any of the foregoing or related aspects, the immune response is a T-cell mediated immune response or an anti-tumor immune response.

In any of the foregoing or related aspects, the CAR expressing cells are administered prior to administration of the CAR ligand, the immunomodulatory composition, the amphiphilic ligand conjugate, the pharmaceutical composition, or the immunogenic composition. In other aspects, the CAR expressing cells are administered concurrently to administration of the CAR ligand, the immunomodulatory composition, the amphiphilic ligand conjugate, the pharmaceutical composition, or the immunogenic composition. In yet other aspects, the CAR expressing cells are administered following administration of the CAR ligand, the immunomodulatory composition, the amphiphilic ligand conjugate, the pharmaceutical composition, or the immunogenic composition.

In any of the foregoing or related aspects, the anti-CD19 CAR expressing cells or anti-CD19 CAR T cells are administered prior to administration of the immunomodulatory composition, the vaccine, the amphiphilic ligand conjugate, the pharmaceutical composition, or the immunogenic composition. In other aspects, the anti-CD19 CAR expressing cells or anti-CD19 CAR T cells are administered concurrently to administration of the immunomodulatory composition, the vaccine, the amphiphilic ligand conjugate, the pharmaceutical composition, or the immunogenic composition. In yet other aspects, the anti-CD19 CAR expressing cells or the anti-CD19 CAR T cells are administered following administration of the immunomodulatory composition, the vaccine, the amphiphilic ligand conjugate, the pharmaceutical composition, or the immunogenic composition.

In any of the foregoing or related aspects, the subject has cancer.

In some aspects, the disclosure provides a method of inducing an anti-tumor response in a subject with cancer, comprising administering to the subject a CAR ligand, an immunomodulatory composition, an amphiphilic ligand conjugate, a pharmaceutical composition, or an immunogenic composition, as described herein, wherein the subject is receiving or has received CAR expressing cells. In some aspects, the CAR expressing cells are CAR T cells. In some aspects, the CAR expressing cells are CAR NK cells. In some aspects, the CAR expressing cells are CAR macrophages. In some aspects, the CAR expressing cells are CAR NKT cells.

In some aspects, the disclosure provides a method of inducing an anti-tumor response in a subject with cancer, comprising administering to the subject an immunomodulatory composition, a vaccine, an amphiphilic ligand conjugate, a pharmaceutical composition, or an immunogenic composition, as described herein, wherein the subject is receiving or has received anti-CD19 CAR expressing cells. In some aspects, the anti-CD19 CAR expressing cells are anti-CD19 CAR T cells. In some aspects, the anti-CD19 CAR expressing cells are anti-CD19 CAR NK cells. In some aspects, the anti-CD19 CAR expressing cells are anti-CD19 CAR macrophages. In some aspects, the anti-CD19 CAR expressing cells are anti-CD19 CAR NKT cells.

In other aspects, the disclosure provides a kit comprising a container comprising a CAR ligand described herein, an optional pharmaceutically acceptable carrier, and a package insert comprising instructions for administration of the composition for treating or delaying progression of cancer in an individual receiving CAR expressing cell therapy.

In other aspects, the disclosure provides a kit comprising a container comprising an anti-CD19 CAR ligand described herein, an optional pharmaceutically acceptable carrier, and a package insert comprising instructions for administration of the composition for treating or delaying progression of cancer in an individual receiving anti-CD19 CAR-T cell therapy.

In yet other aspects, the disclosure provides a kit comprising a container comprising an immunomodulatory composition described herein, an optional pharmaceutically acceptable carrier, and a package insert comprising instructions for administration of the composition for treating or delaying progression of cancer in an individual receiving CAR expressing cell therapy.

In some aspects, the disclosure provides a kit comprising a container comprising an immunomodulatory composition described herein, an optional pharmaceutically acceptable carrier, and a package insert comprising instructions for administration of the composition for treating or delaying progression of cancer in an individual receiving anti-CD19 CAR-T cell therapy.

In some aspects, the disclosure provides a kit comprising a container comprising an amphiphilic ligand conjugate described herein, an optional pharmaceutically acceptable carrier, and a package insert comprising instructions for administration of the composition for treating or delaying progression of cancer in an individual receiving CAR expressing cell therapy.

In any of the foregoing or related aspects, the kit further comprises an adjuvant and instructions for administration of the adjuvant for treating or delaying progression of cancer in an individual receiving CAR expressing cell therapy.

In other aspects, the disclosure provides a kit comprising a container comprising an amphiphilic ligand conjugate describe herein, an optional pharmaceutically acceptable carrier, and a package insert comprising instructions for administration of the composition for treating or delaying progression of cancer in an individual receiving anti-CD19 CAR cell therapy.

In any of the foregoing or related aspects, the kit further comprises an adjuvant and instructions for administration of the adjuvant for treating or delaying progression of cancer in an individual receiving anti-CD19 CAR cell therapy.

In some aspects, the disclosure provides a kit comprising a container comprising an immunogenic composition described herein, an optional pharmaceutically acceptable carrier, and a package insert comprising instructions for administration of the composition for treating or delaying progression of cancer in an individual receiving CAR expressing cell therapy.

In some aspects, the disclosure provides a kit comprising a container comprising an immunogenic composition described herein, an optional pharmaceutically acceptable carrier, and a package insert comprising instructions for administration of the composition for treating or delaying progression of cancer in an individual receiving anti-CD19 CAR expressing cell therapy.

In any of the foregoing or related aspects, the CAR expressing cells are CAR T cells. In any of the foregoing or related aspects, the CAR expressing cells are CAR NK cells. In any of the foregoing or related aspects, the CAR expressing cells are CAR macrophages. In any of the foregoing or related aspects, the CAR expressing cells are CAR NKT cells.

In some aspects, the disclosure provides, a kit comprising a container comprising an immunogenic composition described herein, an optional pharmaceutically acceptable carrier, and a package insert comprising instructions for administration of the composition for treating or delaying progression of cancer in an individual receiving anti-CD19 CAR cell therapy.

In some aspects, the anti-CD19 CAR expressing cells are anti-CD19 CAR T cells. In some aspects, the anti-CD19 CAR expressing cells are anti-CD19 CAR NK cells. In some aspects, the anti-CD19 CAR expressing cells are anti-CD19 CAR macrophages. In some aspects, the anti-CD19 CAR expressing cells are anti-CD19 CAR NKT cells.

In any of the foregoing or related aspects, the anti-CD19 CAR T cells express a CAR comprising an antigen recognition domain derived from FMC63. In some aspects, the anti-CD19 CAR T cells are derived from Kymriah or Yescarta.

BRIEF DESCRIPTION OF DRAWINGS

FIG. 12 provides flow cytometry plots of mouse CD19 (mCD19) mimotope clones generated from yeast display screen. Cells were stained with an isotype IgG control or anti-mCD19 (clone 1D3) IgG. A high and low affinity population were identified. 44 out of 48 high affinity clones sequenced expressed the mimotope SKLKGKSGPE (SEQ ID NO: 64) and 44 out of 48 low affinity clones sequenced expressed the mimotope QNTCHIHVST (SEQ ID NO: 65).

FIG. 13 provides a graph depicting binding of mouse mimotopes for single clone H11 and fusion mimotopes H11+C1 and H1+E2 (SEQ ID NOs: 64, 68, and 69 respectively) to 1D3 IgG as measured by ELISA, for determining absolute binding affinity (Kd) to 1D3 IgG.

FIG. 17A provides a schematic depicting a bivalent amphiphilic mimotope ("bivalent amph-mimotope" or "bi-amph-mimotope") displayed on an APC surface binding to a dimerized CAR present on a T cell surface.

FIG. 17B provides a schematic depicting the structure of an exemplary bivalent amph-mimotope. The structure contains a 1,2-diastearoyl-sn-glycero-3-phosphorylethanolamine (DSPE) lipid tail connected via its head group to the carboxyl group of lysine. The lysine is connected to two mimotope copies via an intervening PEG linker, with one copy attached to the α-amine and one copy attached to the ε-amine.

FIG. 17C provides exemplary structural components of bivalent amph-mimotopes of the disclosure containing the F12 mimotope (SEQ ID NO: 96)("Bi-F12-Peg8" and "Bi-F12-Peg4"). The amph-mimotope contain a first mimotope connected to a PEG linker connected to the α-amine of lysine and a second mimotope connected to a PEG linker connected to the ε-amine of the lysine. The lysine is connected to DSPE via its carboxyl group as depicted in FIG. 17B. The mimotope sequence is set forth in SEQ ID NO: 96 (corresponding to the F12 clone in underline with N-terminal flanking residues in bold). The mimotope has no modification at its N-terminus and is linked to the PEG linker at its C-terminus. The PEG linker contains 4 or 8 ethylene glycol units.

DETAILED DESCRIPTION

Overview

Figure 1:
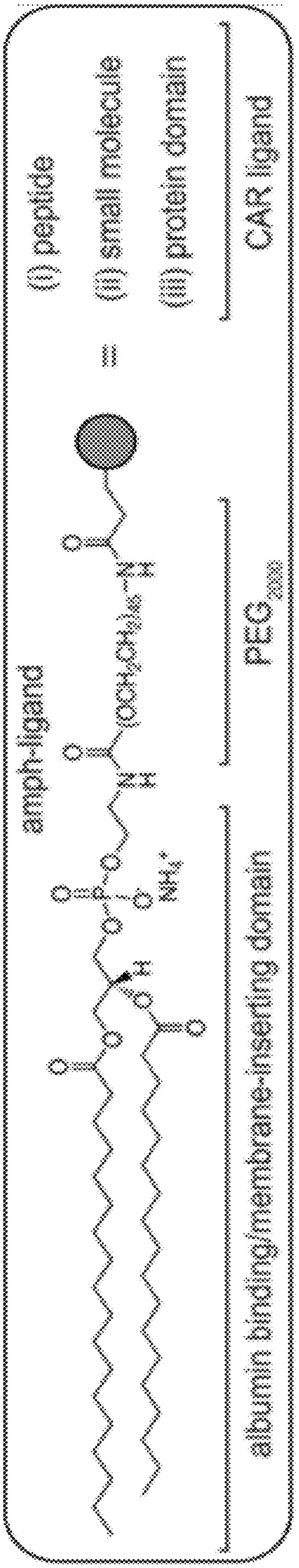
FIG. 1 is a schematic of an amphiphilic CAR ligand molecule ("amph-ligand") having an albumin binding/membrane-inserting domain operably linked to a poly(ethylene glycol) (PEG) molecule, which is operably linked to a CAR ligand.

The present disclosure is based, at least in part, on the identification of chimeric antigen receptor (CAR) ligands which provide powerful tools to promote and redirect responses by CAR expressing cells, for example, CAR T cells, CAR NK cells, CAR macrophage cells and CAR NKT cells. As described herein, CAR ligands were identified from a diverse library of peptides to have one or more characteristics that contribute to optimal engagement of CAR expressing cells, including a desired binding specificity and/or affinity. Without being bound by theory, it is thought that engagement of the CAR expressing cells in a manner that (i) activates the cells without inducing exhaustion; (ii) provides for desired functionality of the CAR expressing cells; and/or (iii) re-directs antigen targeting of the CAR expressing cells, depends on an optimal binding affinity between the CAR ligand and the CAR antigen recognition domain. Accordingly, in some embodiments, the disclosure provides CAR ligands that bind the CAR antigen recognition domain with a range of binding affinities (e.g., sub-nanomolar to micromolar).

In some aspects, the disclosure provides CAR ligands that bind an anti-CD19 CAR, wherein the anti-CD19 CAR antigen recognition domain is derived from the antibody FMC63, a mouse antibody that binds a conformational epitope on human CD19 and which provides the CAR antigen recognition domain for multiple FDA-approved anti-CD19 CAR-T therapies (e.g., Kymriah®, Yescarta®). As described herein, a sequence motif was discovered that binds the anti-CD19 CAR (FMC63) antigen recognition domain, wherein the sequence motif contains two cysteine residues that are capable of forming an intrapeptidyl disulfide bond. Without being bound by theory, it is thought that disulfide bond formation yields a loop structure that binds to the anti-CD19 CAR antigen recognition domain in a manner that mimics CD19 binding. Moreover, peptide ligands were discovered based upon variation of this sequence motif that have a range of binding affinities. For example, in some embodiments, the peptide ligands bind the anti-CD19 CAR antigen recognition domain (FMC63) with a dissociation constant ($K_D$) ranging from high affinity (e.g., sub-nanomolar to nanomolar $K_D$) to low affinity (e.g., sub-micromolar to micromolar $K_D$). It was further discovered that one or more binding parameters could be optimized by appending flanking residues to the N-terminus and/or C-terminus of the sequence motif, e.g., about 1-20 flanking residues. Without being bound by theory, the flanking residues are thought to contribute to interactions at the binding interface between the sequence motif and the CAR antigen recognition domain that stabilize the binding interaction and/or decrease the rate of dissociation.

In some embodiments, the disclosure provides immunomodulatory compositions comprising the CAR ligands that are used to activate CAR expressing cells. For example, in some embodiments, the disclosure provides immunomodulatory compositions comprising anti-CD19 CAR ligands for activation of anti-CD19 CAR expressing cells, including those of current FDA-approved anti-CD19 CAR-T therapies. In some embodiments, the immunomodulatory composition is a therapeutic vaccine comprising a CAR ligand (e.g., anti-CD19 CAR ligand) of the disclosure. For example, in some embodiments, the therapeutic vaccine is an amphiphilic ligand conjugate comprising a CAR peptide ligand (e.g., anti-CD19 CAR peptide ligand) operably-linked to a lipid. Without being bound by theory, one or more properties of the CAR ligands are beneficial for therapeutic vaccination to promote persistence and engraftment of CAR expressing cells, including (i) a binding affinity that enables cell activation without inducing exhaustion, and/or (ii) binding to the CAR antigen recognition domain in a manner that mimics binding of native antigen. Further, it is believed administration of a CAR ligand, e.g., intratumoral administration, allows for insertion of the lipid into any tumor cells such that CAR expressing cells are targeted to the tumor cells. In some embodiments, the immunomodulatory composition comprises a tumor-targeting domain fused to a CAR ligand, wherein the tumor-targeting domain re-directs CAR expressing cells to alternate tumor associated antigens, thereby enabling cross-reactivity with multiple tumor antigen targets.

In some aspects, the disclosure is based on the discovery than an amphiphilic ligand conjugate comprising a multimer of CAR ligands is effective in inducing long-term expansion of CAR T cells following in vivo administration, wherein the CAR T cells express a CAR comprising an antigen-recognition domain that binds the CAR ligand. Without being bound by theory, the presentation of CAR ligands in a multimeric format is thought to enable synchronous binding interactions between the CAR ligands and multiple CAR antigen recognition domains on the surface of the CAR-expressing T cell. Accordingly, the disclosure provides immunomodulatory compositions comprising at least two CAR ligands that are present in a multimeric format, i.e, wherein the at least two CAR ligands are present on the same molecule. Moreover, as it is generally understood that CAR molecules associate on the surface of CAR-expressing cells to form a complex e.g., dimerized CARs, the multimeric format is designed to present an optimal number of CAR ligands, optionally with appropriate spacing, to synchronously engage the multiple antigen recognition domains of a complex (e.g., dimerized) of CARs. In some embodiments, the immunogenic composition comprises a multimer of the CAR ligand as a fusion protein, wherein the fusion protein presents two or more copies of the CAR ligand. In some embodiments, the immunogenic composition comprises multimer of the CAR ligand as an amphiphilic ligand conjugate, wherein the amphiphilic ligand conjugate comprises two or more copies of the CAR ligand. In some embodiments, the amphiphilic ligand conjugate comprises two or more copies of the CAR ligand linked via a polar block linker to a lipophilic domain. In some aspects, the disclosure further provides methods for use of the immunomodulatory compositions in combination with CAR expressing cells (e.g., anti-CD19 CAR T cells) for treatment of cancer. In some embodiments, the method comprises use of immunomodulatory compositions (e.g., therapeutic vaccines) to promote persistence, functionality, and/or engraftment of CAR expressing cells. Without being bound by theory, it is believed that by promoting CAR cell persistence, a lower dose is required for successful treatment; while promoting CAR cell engraftment enables use of CAR therapy with a more mild lymphodepletion regimen. In some embodiments, the method comprises use of immunomodulatory compositions (e.g., fusion proteins) to redirect antigen recognition of CAR cells (e.g., anti-CD19 CAR T cells). For example, to enable a population of CAR T cells to target multiple tumor associated antigens. Without being bound by theory, it is believed that such an approach will prevent tumor evasion occurring by emergence of tumor clones lacking expression of the CAR-targeted antigen.

Immunomodulatory Compositions Comprising CAR Ligands

The CAR ligands of the disclosure are suitable for use in immunomodulatory compositions, e.g., as components of vaccines or as components of fusion proteins.

Current protocols for CAR-T therapy rely on infusions of large numbers of CAR-T cells, which can die out or rapidly lose functional activity against tumors. In preclinical animal models, it is known that expanding T cells in vivo through vaccination is one of the most effective strategies for bolstering the efficacy of T cell therapy, but a traditional vaccine cannot boost CAR T cells through their chimeric antigen receptor. Thus, based on the present disclosure, enhancement of CAR cell activation and proliferation is achieved using a therapeutic vaccine comprising a CAR ligand of the disclosure. In some embodiments, the therapeutic vaccine is an amphiphile ligand conjugate comprising a CAR ligand and a lipid. Amphiphile ligand conjugates comprising a CAR ligand have been shown to promote CAR T cell expansion and persistence as described by Ma, et al (2019) *SCIENCE* 12:365 and WO2019/060425, both of which are incorporated herein by reference. The present disclosure further provides amphiphile ligand conjugates comprising a CAR-targeting ligand, wherein the ligand affinity is varied in order to optimize CAR cell expansion, functionality and persistence in vivo. Additionally, CAR ligands of the disclosure enable adaptation of the amphiphile ligand conjugates approach to different CAR cell therapies, particularly those in clinical use or development. Therapeutic vaccines provided herein are further described below.

Fusion proteins comprising a CAR ligand and a tumor-targeting antibody or fragment thereof can be used to re-direct CAR cell responses to one or more alternate tumor-associated antigens, thereby minimizing or avoiding the risk of tumor evasion through emergence of tumor clones lacking expression of the CAR-targeted antigen. Accordingly, the disclosure provides fusion proteins comprising (i) a tumor-targeting antibody or fragment thereof that specifically binds a tumor associated antigen; and (ii) a CAR ligand of the disclosure. As disclosed herein, fusion proteins comprising the CAR ligand are used to redirect antigen recognition of CAR expressing cells (e.g., CAR T cells, CAR NK cells, CAR macrophage cells, CAR NKT cells). For example, in some embodiments, a CAR cell that binds a first tumor-associated antigen can be retargeted to an alternate tumor-associated antigen using a fusion protein of the disclosure. Fusion proteins provided herein are further described below.

I. CAR Ligands

In some embodiments, the disclosure provides ligands that bind the antigen recognition domain of a CAR. As used herein, the term "CAR ligand" refers to a peptide that binds to the antigen recognition domain of a CAR described herein. In some embodiments, the CAR ligand mimics the structure and/or function of the target antigen that binds the CAR antigen recognition domain. In some embodiments, the CAR ligand comprises a sequence motif. As used herein, the term "sequence motif" refers to the minimal amino acid sequence of the CAR ligand that enables binding to the CAR antigen recognition domain. In some embodiments, the sequence motif is the only segment of the CAR ligand that engages in a binding interaction with the CAR antigen recognition domain. In some embodiments, the sequence motif is the segment of the CAR ligand that substantially engages in a binding interaction with the CAR antigen recognition domain. In some embodiments, the CAR ligand comprises one or more additional sequence and/or structural motifs that contribute to the binding interaction with the CAR antigen recognition domain. In some embodiments, the CAR ligand binds to a site on the CAR antigen recognition domain that overlaps the binding site of the target antigen. In other embodiments, the CAR ligand binds to a site on the CAR antigen recognition domain that does not overlap the binding site of the target antigen. In some embodiments, the CAR ligand binds to more than one antigen recognition domain of one or more CARs.

The binding affinity of the CAR ligand or the target antigen for the antigen recognition domain of the CAR is typically measured by the equilibrium dissociation constant ($K_D$), which is used to evaluate and rank strengths of bimolecular interactions. As used herein the term "KD" or "$K_D$" refers to the equilibrium dissociation constant of a binding reaction between the CAR ligand or target antigen with the CAR antigen recognition domain. The value of $K_D$ is a numeric representation of the ratio of the CAR ligand or target antigen off-rate constant (kd) to the CAR ligand or target antigen on-rate constant (ka). The value of $K_D$ is inversely related to the binding affinity of the CAR ligand or target antigen to the antigen recognition domain of the CAR. The smaller the $K_D$ value the greater the affinity of the CAR ligand or target antigen to the antigen recognition domain of the CAR. As used herein, the term "kd" or "$k_d$" (alternatively "koff" or "$k_{off}$") is intended to refer to the off-rate constant for the dissociation of the CAR ligand or target antigen from a binding interaction with the antigen recognition domain of the CAR. The value of kd is a numeric representation of the fraction of complexes that decay or dissociate per second, and is expressed in units $sec^{-1}$. As used herein, the term "ka" or "$k_a$" (alternatively "kon" or "$k_{on}$") is intended to refer to the on-rate constant for the association of a CAR ligand or target antigen with the antigen recognition domain of the CAR. The value of ka is a numeric representation of the number of complexes of the CAR ligand/CAR antigen recognition domain or the target antigen/CAR antigen recognition domain formed per second in a 1 molar (1M) solution of CAR ligand or target antigen and CAR antigen recognition domain or an antibody comprising the CAR antigen recognition domain, or fragment thereof (e.g., scFv), and is expressed in units $M^{-1}sec^{-1}$.

In some embodiments, the target antigen binds to the CAR antigen recognition domain with a binding affinity ($K_D$) of at least $10^{-8}$, $10^{-9}$, $10^{-10}$, $10^{-11}$ M or lower. In some embodiments, the binding affinity ($K_D$) of the target antigen is about 100 nM, about 90 nM, about 80 nM, about 70 nM, about 60 nM, about 50 nM, about 40 nM, about 30 nM, about 20 nM, about 10 nM, about 9 nM, about 8 nM, about 7 nM, about 6 nM, about 5 nM, about 4 nM, about 3 nM, about 2 nM, or about 1 nM.

In some embodiments, the CAR ligand binds to the CAR antigen recognition domain with a binding affinity ($K_D$) that is higher (e.g., about 5-fold, about 10-fold, about 100-fold, or about 1000-fold higher) than the binding affinity ($K_D$) of the target antigen.

In some embodiments, the CAR ligand binds to the CAR antigen recognition domain with a binding affinity ($K_D$) that is substantially equivalent (e.g., ±10%, ±9%, ±8%, ±7%, ±6%, ±5%, ±4%, ±3%, ±2%, ±1%, or less) to the binding affinity ($K_D$) of the target antigen.

In some embodiments, the CAR ligand binds to the CAR antigen recognition domain with a binding affinity ($K_D$) that is lower (e.g., about 5-fold, about 10-fold, or about 100-fold lower) than the binding affinity ($K_D$) of the target antigen.

In some embodiments, the CAR ligand binds to the CAR antigen recognition domain with a binding affinity ($K_D$) of about 0.05 nM, about 0.1 nM, about 0.2 nM, about 0.3 nM, about 0.4 nM, about 0.5 nM, about 0.6 nM, about 0.7 nM, about 0.8 nM, about 0.9 nM, about 1 nM about 2 nM, about 3 nM, about 4 nM, about 5 nM, about 6 nM, about 7 nM, about 8 nM, about 9 nM, about 10, nM, about 15 nM, about 20 nM, about 30 nM, about 40 nM, about 50 nM, about 60 nM, about 70 nM, about 80 nM, about 90 nM, about 100 nM, about 200 nM, about 300 nM, about 400 nM, about 500 nM, about 600 nM, about 700 nM, about 800 nM, about 900 nM, about 1 μM, about 2 μM, about 3 μM, about 4 μM, or about 5 μM In some embodiments, the CAR ligand binds to the CAR antigen recognition domain with:

(i) a high binding affinity ($K_D$) of about 0.05 nM to about 0.5 nM, about 0.25 nM to about 1 nM, about 0.5 nM to about 1 nM, about 0.5 nM to about 5 nM, about 1 nM to about 10 nM, about 5 nM to about 50 nM, about 10 nM to about 100 nM:

(ii) a moderate binding affinity ($K_D$) of about 100 nM to 200 nM, about 100 nM to about 300 nM, about 200 nM to about 300 nM, about 200 nM to about 400 nM, about 300 nM to about 400 nM, about 300 nM to about 500 nM, about 400 nM to about 500 nM, about 400 nM to about 600 nM, about 500 nM to about 600 nM, about 500 nM to about 700 nM, about 600 nM to about 700 nM, about 600 nM to about 800 nM, about 700 nM to about 800 nM, about 700 to about 900 nM, about 800 to about 900 nM, about 800 nM to about 1000 nM, or about 900 nM to about 1000 nM; or (iii) a low binding affinity ($K_D$) of about 1 μM to about 2 μM, about 1 μM to about 3 μM, about 2 μM to about 3 μM, about 2 μM to about 4 μM, about 3 μM to about 5 μM, about 4 μM to about 5 μM, or higher.

In some embodiments, the CAR ligand does not significantly cross-react. As used herein, a CAR ligand that "does not significantly cross-react" refers to one that will not appreciably bind to an off-target CAR antigen recognition domain (e.g., a CAR with a different antigen recognition domain or a CAR that binds a different target antigen). For example, in some embodiments, the CAR ligand binds to the antigen recognition domain of a CAR (e.g., CAR comprising a FMC63 antigen recognition domain) with a binding affinity that is at least 1, 2, 3, 4 or more order(s) of magnitude higher than the binding affinity for a CAR with a different antigen recognition domain or a CAR that binds a different target antigen. In some embodiments, the CAR ligand binds to the antigen recognition domain of the CAR, but does not substantially or appreciably bind to any other portion of the CAR (e.g. hinge domain, transmembrane domain, intracellular signaling domain). In some embodiments, the CAR ligand binds to the antigen recognition domain of the CAR with at least one, two, three, four, or more order(s) of magnitude better binding affinity (i.e., binding exhibiting a one, two, three, four or more order(s) of magnitude lower $K_D$ value) than its binding affinity for any other portion of the CAR (e.g., hinge domain, transmembrane domain, intracellular signaling domain), to a CAR with a different antigen recognition domain, and/or to a CAR that binds to different target antigen. Methods of measuring cross-reactive binding are known in the art, and include for example, measurements according to Biacore analysis, bio-layer interferometry, and/or competitive (competition) binding assays.

In some embodiments, the CAR ligand is 5-100 amino acids, including for example, 5 amino acids, 10 amino acids, 15 amino acids, 20 amino acids, 25 amino acids, 30 amino acids, 35 amino acids, 40 amino acids, 45 amino acids, or 50 amino acids. In some embodiments, the CAR ligand is greater than 50 amino acids. In some embodiments, the CAR ligand is less than 100 amino acids.

In some embodiments, the CAR ligand comprises a sequence motif, wherein the sequence motif binds at least one CAR antigen recognition domain.

In some embodiments, the sequence motif is at least 5 to 20 amino acid residues. In some embodiments, the sequence motif is 5, 6, 7, 8, 9, 10, 11, 12, 13, 14, 15, 16, 17, 18, 19, or 20 amino acid residues.

In some embodiments, the sequence motif comprises one or more structural elements, wherein the structural elements limit the number of conformations adopted by the CAR ligand and/or limits the flexibility of the CAR ligand. In some embodiments, the one or more structural elements is necessary for binding to the CAR antigen recognition domain. In some embodiments, the structural element is a disulfide bond or another type of crosslinking bond. In some embodiments, the structural element favors formation of a particular secondary structure, such as a loop structure, a β-strand, a β-strand mimic, a β-turn, a β-turn mimic, an α-helix, or an α-helix mimic. In some embodiments, the secondary structure is necessary for binding to the CAR antigen recognition domain.

In some embodiments, the sequence motif comprises at least two cysteine residues. In some embodiments, the sequence motif comprises two cysteine residues that form an intra-peptidyl disulfide bond. In some embodiments, the two cysteine residues are separated by at least two, at least three, at least four, at least five, at least six, or at least seven amino acid residues. In some embodiments, the two cysteine residues are separated by three amino acid residues. In some embodiments, the two cysteine residues are separated by four amino acid residues. In some embodiments, the two cysteine residues are separated by five amino acid residues. In some embodiments, the two cysteine residues are separated by six amino acid residues. In some embodiments, the two cysteine residues are separated by seven amino acid residues. In some embodiments, the sequence motif comprises at least one, two, three, four, five, six, seven, eight, nine, or ten amino acid residues N-terminal to the first cysteine residue. In some embodiments, the sequence motif comprises at least one, two, three, four, five, six, seven, eight, nine, or ten amino acid residues C-terminal to the second cysteine residue.

In some embodiments, the sequence motif comprises N'-[Xaa]n-Cys1-[Xaa]m-Cys2-[Xaa]n-C', wherein Cys1 and Cys2 are cysteine residues that are capable of forming an intra-peptidyl disulfide bridge; wherein Xaa is any amino acid residue; wherein n is between 1 and 10 amino acid residues; and wherein m is between 1 and 7 amino acid residues. In some embodiments, m is 3.

In some embodiments, the sequence motif comprises N'-[Xaa]a-Cys1-[Xaa]b-Cys2-[Xaa]c-C', wherein Cys1 and Cys2 are cysteine residues that are capable of forming an intra-peptidyl disulfide bridge; wherein Xaa is any amino acid residue; wherein a is 1-10 amino acid residues; wherein b is 1-10 amino acid residues; and wherein c is 1-7 amino acid residues. In some embodiments, c is 3.

In some embodiments, the sequence motif comprises [Xaa1-Xaa2-Cys1-Xaa3-Xaa4-Xaa5-Cys2-Xaa6-Xaa7-Xaa8]. In some embodiments, Cys1 and Cys2 of the sequence motif are cysteine residues that are capable of forming an intra-peptidyl disulfide bridge. In some embodiments, Xaa1 is any amino acid or is Arg. In some embodiments, Xaa2 is any amino acid. In some embodiments, Xaa3 is any amino acid or is Pro. In some embodiments, Xaa4 is any amino acid or is Trp. In some embodiments, Xaa5 is any amino acid. In some embodiments, Xaa6 is any amino acid or is absent. In some embodiments, Xaa7 is any amino acid or is absent. In some embodiments, Xaa8 is any amino acid or is absent.

In some embodiments, the CAR ligand comprises flanking residues at the N-terminus of the sequence motif, at the C-terminus of the sequence motif, or both. As used herein, the term "flanking residues" refers to the amino residues directly linked to the N-terminus and/or the C-terminus of the sequence motif. In some embodiments, the CAR ligand comprises flanking residues at the N-terminus and/or the C-terminus of the sequence motif, wherein the flanking residues comprise at least 1, 2, 3, 4, 5, 6, 7, 8, 9, 10, 11, 12, 13, 14, 15, 16, 17, 18, 19, or 20 amino acid residues. In some embodiments, the CAR ligand comprises flanking residues at the N-terminus and/or C-terminus of the sequence motif, wherein the flanking residues consist of 1-5, 1-10, 1-15, 1-20, 5-10, 5-15, 5-20, 10-15, 10-20, 10-30, 10-40, or 10-50 amino acid residues. In some embodiments, the flanking residues proximal to the N-terminus and/or the C-terminus of the sequence motif are non-glycine residues. In some embodiments, the at least first, second, third, fourth, fifth, sixth, seventh, eighth, ninth, tenth, eleventh, twelfth, thirteenth, fourteenth, or fifteenth flanking residues proximal to the N-terminus and/or the C-terminus of the sequence motif are non-glycine residues. Without being bound by theory, flanking residues that are glycine are thought to minimally contribute to the binding interaction between the sequence motif of the CAR ligand and the antigen recognition domain of the CAR In some embodiments, the flanking residues at the N-terminus and/or the C-terminus of the sequence motif contribute to a binding interaction between the CAR ligand and the CAR antigen recognition domain. In some embodiments, the flanking residues at the N-terminus and/or the C-terminus of the sequence motif increase the binding affinity (i.e., decrease the $K_D$) of the binding interaction between the CAR ligand and the CAR antigen recognition domain. In some embodiments, the flanking residues at the N-terminus and/or the C-terminus of the sequence motif increase the binding affinity by about 1.1, 1.2, 1.3, 1.4, 1.5, 1.6, 1.7, 1.8, 1.9, 2, 2.5, 3, 3.5, 4, 4.5, 5, 6, 7, 8, 9, or 10-fold (i.e., decrease the $K_D$ by about 1.1, 1.2, 1.3, 1.4, 1.5, 1.6, 1.7, 1.8, 1.9, 2, 2.5, 3, 3.5, 4, 4.5, 5, 6, 7, 8, 9, or 10-fold) compared to a CAR ligand comprising the sequence motif without the flanking residues.

In some embodiments, the flanking residues at the N-terminus and/or the C-terminus of the sequence motif decrease the rate of dissociation (kd) of the CAR ligand bound to the CAR antigen recognition domain. In some embodiments, the flanking residues at the N-terminus and/or the C-terminus of the sequence motif decrease the rate of dissociation (kd) by about 1.1, 1.2, 1.3, 1.4, 1.5, 1.6, 1.7, 1.8, 1.9, 2, 2.5, 3, 3.5, 4, 4.5, 5, 6, 7, 8, 9, or 10-fold compared to a CAR ligand comprising the sequence motif without the flanking residues.

In some embodiments, the CAR ligand comprises multiple sequence motifs (e.g., one, two, three, four, or five sequence motifs). In some embodiments, a CAR ligand having multiple sequence motif has increased binding affinity (i.e., decreased $K_D$) for the CAR antigen recognition domain as a result of an avidity effect. Without being bound by theory, the presence of multiple sequence motifs provides a high local concentration of binders for the CAR antigen recognition domain such that the rate of dissociation/re-association is greater than the rate of diffusion, enabling the CAR ligand to remain complexed with the CAR antigen recognition domain for a greater period of time than a CAR ligand with a single sequence motif. In some embodiments, the CAR antigen recognition domain recognized by each sequence motif is the same. In some embodiments, a CAR ligand comprising multiple sequence motifs (e.g., one, two, three, four, or five sequence motifs) that are the same has increased binding affinity ($K_D$) for the CAR antigen recognition domain relative to a CAR ligand comprising a single sequence motif.

In some embodiments, the CAR antigen recognition domain recognized by each sequence motif is different. In some embodiments, the multiple sequence motifs are continuous without intervening amino acid residues. In some embodiments, the multiple sequence motifs are linked by peptide linkers (e.g., Gly-Ser linkers).

A. Exemplary CAR Ligands

In some embodiments, the CAR ligand binds to the antigen recognition domain of a CAR, wherein the CAR binds an epitope of a target antigen. In some embodiments, the target antigen is a disease-associated antigen. In some embodiments, the target antigen is a tumor-associated antigen. In some embodiments, the target antigen is human CD19.

In some embodiments, the antigen recognition domain comprises an scFv. In some embodiments, the antigen recognition domain is derived from an anti-human CD19 antibody. In some embodiments, the anti-human CD19 antibody is FMC63.

In some embodiments, the CAR binds an epitope of the target antigen (e.g., human CD19) that is a conformational epitope. In some embodiments, the CAR binds to the target antigen (e.g., human CD19) with a binding affinity ($K_D$) of about 1 nM, about 2 nM, about 3 nM, about 4 nM, about 5 nM, about 6 nM, about 7 nM, about 8 nM, about 9 nM, or about 10 nM.

In some embodiments, the CAR ligand binds the antigen recognition domain with a binding affinity ($K_D$) that is higher (e.g., about 5-fold, about 10-fold, about 100-fold, or about 1000-fold higher) than the binding affinity ($K_D$) of the target antigen (e.g., human CD19). For example, with a binding affinity ($K_D$) that is about 50 nM to about 5 μM.

In some embodiments, the CAR ligand binds to the CAR antigen recognition domain with a binding affinity ($K_D$) that is substantially equivalent (e.g., ±10%, ±9%, ±8%, ±7%, ±6%, ±5%, ±4%, ±3%, ±2%, ±1%, or less) than the binding affinity ($K_D$) of the target antigen (e.g., human CD19). For example, with a binding affinity ($K_D$) that is about 1 nM to about 10 nM.

In some embodiments, the CAR ligand binds to the CAR antigen recognition domain with a binding affinity ($K_D$) that is lower (e.g., about 5-fold, about 10-fold, or about 100-fold lower) than the binding affinity ($K_D$) of the target antigen (e.g., human CD19). For example, with a binding affinity ($K_D$) that is about 0.05 nM to about 0.5 nM.

In some embodiments, the disclosure provides a CAR ligand, wherein the CAR ligand is a peptide that is about 7 to about 100 amino acid residues in length, and wherein the CAR ligand:

(i) binds the antigen recognition domain of a CAR, wherein the CAR binds an epitope of a target antigen that is a disease-associated antigen, wherein the antigen is human CD19; and wherein the antigen recognition domain is derived from FMC63;

(ii) has a binding affinity ($K_D$) of at least 5 μM;

(iii) does not significantly cross-react with a CAR that does not bind human CD19 or a CAR comprising an antigen recognition domain that is not derived from FMC63; and (iv) comprises a sequence motif that binds the CAR antigen recognition domain, wherein the sequence motif is 7, 8, 9, 10, 11, 12, 13, 14, 15, 16, 17, 18, 19, or 20 amino acid residues in length; wherein the sequence motif comprises [Xaa1-Xaa2-Cys-Xaa3-Xaa4-Xaa5-Cys-Xaa6-Xaa7-Xaa8]; wherein the cysteine residues of the sequence motif are capable of forming an intra-peptidyl disulfide bridge, wherein Xaa1 is Arg; wherein Xaa2 is any amino acid; wherein Xaa3 is Pro; wherein Xaa4 is Trp; wherein Xaa5 is any amino acid; wherein Xaa6 is any amino acid or is absent; wherein Xaa7 is any amino acid or is absent; and wherein Xaa8 is any amino acid or is absent.

In some embodiments, the sequence motif comprises any amino acid sequence identified in Table 1. In some embodiments, the sequence motif has a binding affinity ($K_D$) that is at least about 5 μM, about 4 μM, about 3 μM, about 2 μM, about 1 μM, about 0.9 μM, about 0.8 μM, about 0.7 μM, about 0.6 μM, about 0.5 μM, about 0.4 μM, about 0.3 μM, about 0.2 μM, about 0.1 μM, about 90 nM, about 80 nM, about 70 nM, about 60 nM, about 50 nM, about 40 nM, about 30 nM, about 20 nM, about 10 nM, about 9 nM, about 8 nM, about 7 nM, about 6 nM, about 5 nM, about 4 nM, about 3 nM, about 2 nM, or about 1 nM. In some embodiments, the $K_D$ is less than 1 nM.

In some embodiments, the disclosure provides a CAR ligand of Subgroup I, wherein the CAR ligand is a peptide that is about 10 to about 100 amino acid residues in length, and wherein the CAR ligand:

(i) binds the antigen recognition domain of a CAR, wherein the CAR binds an epitope of a target antigen that is a disease-associated antigen, wherein the antigen is human CD19; and wherein the antigen recognition domain is derived from FMC63;

(ii) has a binding affinity ($K_D$) of at least 5 μM;

(iii) does not significantly cross-react with a CAR that does not bind human CD19 or a CAR comprising an antigen recognition domain that is not derived from FMC63; and (iv) comprises a sequence motif that binds the CAR antigen recognition domain, wherein the sequence motif is 7, 8, 9, 10, 11, 12, 13, 14, 15, 16, 17, 18, 19, or 20 amino acid residues in length, wherein the sequence motif comprises [Arg-Xaa1-Cys-Pro-Trp-Xaa2-Cys-Xaa3-Xaa4-Xaa5] (SEQ ID NO: 7), wherein the cysteine residues are capable of forming an intra-peptidyl disulfide bridge; wherein Xaa1 is selected from Ile, Leu, Met, Val, and Arg; wherein Xaa2 is selected from Ala, Glu, His, Ser, Asp, and Asn; wherein Xaa3 is selected from Leu, Arg, Ala, Met, Ser, Val, Ile, and Lys; wherein Xaa4 is selected from Ser, Val, Gln, Ile, Pro, Lys, Glu, and His; and wherein Xaa5 is selected from Leu, Ile, Arg, His, Gln, and Trp.

In some embodiments, a CAR ligand of Subgroup I comprises a sequence motif comprising an amino acid sequence set forth by any one of SEQ ID NOs: 9, 11, and 22-30 identified in Table 1.

In some embodiments, a CAR ligand of Subgroup I comprises a sequence motif with a binding affinity ($K_D$) that is at least about 5 μM, about 4 μM, about 3 μM, about 2 μM, about 1 μM, about 0.9 μM, about 0.8 μM, about 0.7 μM, about 0.6 μM, about 0.5 μM, about 0.4 μM, about 0.3 μM, about 0.2 μM, about 0.1 μM, about 90 nM, about 80 nM, about 70 nM, about 60 nM, about 50 nM, about 40 nM, about 30 nM, about 20 nM, about 10 nM, about 9 nM, about 8 nM, about 7 nM, about 6 nM, about 5 nM, about 4 nM, about 3 nM, about 2 nM, or about 1 nM. In some embodiments, the $K_D$ is less than 1 nM.

In some embodiments, the CAR ligand of Subgroup I comprises one or more sequence motifs according to (iv) of Subgroup I. In some embodiments, the CAR ligand comprises at least two, three, four, or five sequence motifs. In some embodiments, the sequence motifs are the same. In some embodiments, the sequence motifs are different. In some embodiments, the more than one sequence motifs are directly fused or joined by a linker. In some embodiments, the linker is a peptide linker. In some embodiments, the one or more sequence motif(s) of the CAR ligand has at least 1, 2, 3, 4, 5, 6, 7, 8, 9, 10, 11, 12, 13, 14, 15, 16, 17, 18, 19, or 20 flanking residues at its N-terminus, its C-terminus, or both. In some embodiments, the one or more sequence motif(s) has 1-5, 1-10, 1-15, 1-20, 5-10, 5-15, 5-20, 10-15, 10-20, 10-30, 10-40, or 10-50 flanking residues at its N-terminus, its C-terminus, or both. In some embodiments, the amino acid residues in closest proximity to the N-terminus and/or the C-terminus of the one or more sequence motif(s) are non-glycine residues. In some embodiments, the at least first, second, third, fourth, fifth, sixth, seventh, eighth, ninth, tenth, eleventh, twelfth, thirteenth, fourteenth, or fifteenth amino acid residue in closest proximity to the N-terminus and/or the C-terminus of the one or more sequence motif(s) are non-glycine residues. In some embodiments, the CAR ligand comprising one or more sequence motif(s) with flanking residues at its N-terminus and/or C-terminus has an increased binding affinity (i.e., decreased $K_D$) and/or decreased dissociation rate (kd) compared to the CAR ligand comprising the one or more sequence motif(s) without the flanking residues.

In some embodiments, the disclosure provides a CAR ligand of Subgroup II, wherein the CAR ligand is a peptide that is about 10 to about 100 amino acid residues in length, and wherein the CAR ligand:

(i) binds the antigen recognition domain of a CAR, wherein the CAR binds an epitope of a target antigen that is a disease-associated antigen, wherein the antigen is human CD19; and wherein the antigen recognition domain is derived from FMC63;

(ii) has a binding affinity ($K_D$) of at least 5 μM;

(iii) does not significantly cross-react with a CAR that does not bind human CD19 or a CAR comprising an antigen recognition domain that is not derived from FMC63; and (iv) comprises a sequence motif that binds the CAR antigen recognition domain, wherein the sequence motif is 7, 8, 9, 10, 11, 12, 13, 14, 15, 16, 17, 18, 19, or 20 amino acid residues in length, wherein the sequence motif comprises [Arg-Xaa1-Cys-Pro-Trp-Xaa2-Cys-Xaa3-Xaa4-Xaa5] (SEQ ID NO: 131); wherein the cysteine residues are capable of forming an intra-peptidyl disulfide bridge; wherein Xaa1 is selected from Leu, Ile, and Val; wherein Xaa2 is Ser or Lys; wherein Xaa3 is selected from Arg, Ile, Val, and Met; wherein Xaa4 is selected from Glu, Lys, and Pro; and wherein Xaa5 is selected from Leu, Gln, Phe, and Ile.

In some embodiments, a CAR ligand of Subgroup II comprises a sequence motif comprising an amino acid sequence set forth by any one of SEQ ID NOs: 14 and 31-36 identified in Table 1.

In some embodiments, a CAR ligand of Subgroup II comprises a sequence motif with a binding affinity ($K_D$) that is at least about 5 μM, about 4 μM, about 3 μM, about 2 μM, about 1 μM, about 0.9 μM, about 0.8 μM, about 0.7 μM, about 0.6 μM, about 0.5 μM, about 0.4 μM, about 0.3 μM, about 0.2 μM, about 0.1 μM, about 90 nM, about 80 nM, about 70 nM, about 60 nM, about 50 nM, about 40 nM, about 30 nM, about 20 nM, about 10 nM, about 9 nM, about 8 nM, about 7 nM, about 6 nM, about 5 nM, about 4 nM, about 3 nM, about 2 nM, or about 1 nM. In some embodiments, the $K_D$ is less than 1 nM.

In some embodiments, the CAR ligand of Subgroup II comprises one or more sequence motifs according to (iv) of Subgroup II. In some embodiments, the CAR ligand comprises at least two, three, four, or five sequence motifs. In some embodiments, the sequence motifs are the same. In some embodiments, the sequence motifs are different. In some embodiments, the more than one sequence motifs are directly fused or joined by a linker. In some embodiments, the linker is a peptide linker. In some embodiments, the one or more sequence motif(s) of the CAR ligand has at least 1, 2, 3, 4, 5, 6, 7, 8, 9, 10, 11, 12, 13, 14, 15, 16, 17, 18, 19, or 20 flanking residues at its N-terminus, its C-terminus, or both. In some embodiments, the one or more sequence motif(s) has 1-5, 1-10, 1-15, 1-20, 5-10, 5-15, 5-20, 10-15, 10-20, 10-30, 10-40, or 10-50 flanking residues at its N-terminus, its C-terminus, or both. In some embodiments, the amino acid residues in closest proximity to the N-terminus and/or the C-terminus of the one or more sequence motif(s) are non-glycine residues. In some embodiments, the at least first, second, third, fourth, fifth, sixth, seventh, eighth, ninth, tenth, eleventh, twelfth, thirteenth, fourteenth, or fifteenth amino acid residue in closest proximity to the N-terminus and/or the C-terminus of the one or more sequence motif(s) are non-glycine residues. In some embodiments, the CAR ligand comprising one or more sequence motif(s) with flanking residues at its N-terminus and/or C-terminus has an increased binding affinity (i.e., decreased $K_D$) and/or decreased dissociation rate (kd) compared to the CAR ligand comprising the one or more sequence motif(s) without the flanking residues.

In some embodiments, the disclosure provides a CAR ligand of Subgroup III, wherein the CAR ligand is a peptide that is about 10 to about 100 amino acid residues in length, and wherein the CAR ligand:

(i) binds the antigen recognition domain of a CAR, wherein the CAR binds an epitope of a target antigen that is a disease-associated antigen, wherein the antigen is human CD19; and wherein the antigen recognition domain is derived from FMC63;

(ii) has a binding affinity ($K_D$) of at least 5 μM;

(iii) does not significantly cross-react with a CAR that does not bind human CD19 or a CAR comprising an antigen recognition domain that is not derived from FMC63; and (iv) comprises a sequence motif that binds the CAR antigen recognition domain, wherein the sequence motif is 7, 8, 9, 10, 11, 12, 13, 14, 15, 16, 17, 18, 19, or 20 amino acid residues in length, wherein the sequence motif comprises [Arg-Xaa1-Cys-Pro-Trp-Xaa2-Cys-Xaa3-Xaa4-Xaa5] (SEQ ID NO: 132); wherein the cysteine residues are capable of forming an intra-peptidyl disulfide bridge; wherein Xaa1 is selected from Leu, Ile, and Met; wherein Xaa2 is selected from Ser, Asn, Asp, and Gly; wherein Xaa3 is selected from Leu, Met, Ser, Arg, and Lys; wherein Xaa4 is selected from Glu, Gln, and Pro; and wherein Xaa5 is Leu or Ile.

In some embodiments, a CAR ligand of Subgroup III comprises a sequence motif comprising an amino acid sequence set forth by any one of SEQ ID NOs: 16 and 37-43 identified in Table 1.

In some embodiments, a CAR ligand of Subgroup III comprises a sequence motif with a binding affinity ($K_D$) that is at least about 300 nM to about 200 nM, about 300 nM to about 100 nM, about 200 nM to about 100 nM, about 200 nM to about 50 nM, about 100 nM to about 50 nM, about 90 nM to about 50 nM, about 80 nM to about 50 nM, about 70 nM to about 50 nM, about 60 nM to about 50 nM, about 60 nM to about 40 nM, about 50 nM to about 40 nM, about 50 nM to about 30 nM, about 40 nM to about 30 nM, about 40 nM to about 20 nM, about 30 nM to about 20 nM, about 30 nM to about 10 nM, about 20 nM to about 10 nM, about 15 nM to about 10 nM, about 15 nM to about 5 nM, about 10 nM to about 5 nM, about 4 nM, about 3 nM, about 2 nM, about 1 nM. In some embodiments, the $K_D$ is less than 1 nM.

In some embodiments, the CAR ligand of Subgroup III comprises one or more sequence motif according to (iv) of Subgroup III. In some embodiments, the CAR ligand comprises at least two, three, four, or five sequence motifs. In some embodiments, the sequence motifs are the same. In some embodiments, the sequence motifs are different. In some embodiments, the more than one sequence motifs are directly fused or joined by a linker. In some embodiments, the linker is a peptide linker. In some embodiments, the one or more sequence motif(s) of the CAR ligand has at least 1, 2, 3, 4, 5, 6, 7, 8, 9, 10, 11, 12, 13, 14, 15, 16, 17, 18, 19, or 20 flanking residues at its N-terminus, its C-terminus, or both. In some embodiments, the one or more sequence motif(s) has 1-5, 1-10, 1-15, 1-20, 5-10, 5-15, 5-20, 10-15, 10-20, 10-30, 10-40, or 10-50 flanking residues at its N-terminus, its C-terminus, or both. In some embodiments, the amino acid residues in closest proximity to the N-terminus and/or the C-terminus of the one or more sequence motif(s) are non-glycine residues. In some embodiments, the at least first, second, third, fourth, fifth, sixth, seventh, eighth, ninth, tenth, eleventh, twelfth, thirteenth, fourteenth, or fifteenth amino acid residue in closest proximity to the N-terminus and/or the C-terminus of the one or more sequence motif(s) are non-glycine residues. In some embodiments, the CAR ligand comprising one or more sequence motif(s) with flanking residues at its N-terminus and/or C-terminus has an increased binding affinity (i.e., decreased $K_D$) and/or decreased dissociation rate (kd) compared to the CAR ligand comprising the one or more sequence motif(s) without the flanking residues.

In some embodiments, the disclosure provides a CAR ligand of Subgroup IV, wherein the CAR ligand is a peptide that is about 10 to about 100 amino acid residues in length, and wherein the CAR ligand:

(i) binds the antigen recognition domain of a CAR, wherein the CAR binds an epitope of a target antigen that is a disease-associated antigen, wherein the antigen is human CD19; and wherein the antigen recognition domain is derived from FMC63;

(ii) has a binding affinity ($K_D$) of at least 5 μM;

(iii) does not significantly cross-react with a CAR that does not bind human CD19 or a CAR comprising an antigen recognition domain that is not derived from FMC63; and (iv) comprises a sequence motif that binds the CAR antigen recognition domain, wherein the sequence motif is 7, 8, 9, 10, 11, 12, 13, 14, 15, 16, 17, 18, 19, or 20 amino acid residues in length, wherein the sequence motif comprises [Arg-Xaa1-Cys-Pro-Trp-Xaa2-Cys-Xaa3-Glu-Leu] (SEQ ID NO: 133); wherein the cysteine residues are capable of forming an intra-peptidyl disulfide bridge; wherein Xaa1 is Leu or Ile; wherein Xaa2 is selected from Ser, Asn, and Asp; and wherein Xaa3 is selected from Gln, Ile, Val, Lys, and Arg.

In some embodiments, a CAR ligand of Subgroup IV comprises a sequence motif comprising an amino acid sequence set forth by any one of SEQ ID NOs: 17-19, 21, and 44-47 identified in Table 1.

In some embodiments, a CAR ligand of Subgroup IV comprises a sequence motif with a binding affinity ($K_D$) that is at least about 200 nM to about 100 nM, about 200 nM to about 50 nM, about 100 nM to about 50 nM, about 90 nM to about 50 nM, about 80 nM to about 50 nM, about 70 nM to about 50 nM, about 60 nM to about 50 nM, about 60 nM to about 40 nM, about 50 nM to about 40 nM, about 50 nM to about 30 nM, about 40 nM to about 30 nM, about 40 nM to about 20 nM, about 30 nM to about 20 nM, about 30 nM to about 10 nM, about 20 nM to about 10 nM, about 15 nM to about 10 nM, about 15 nM to about 5 nM, about 10 nM to about 5 nM, about 4 nM, about 3 nM, about 2 nM, about 1 nM. In some embodiments, the $K_D$ is less than 1 nM.

In some embodiments, the CAR ligand of Subgroup IV comprises one or more sequence motifs according to (iv) of Subgroup IV. In some embodiments, the CAR ligand comprises at least two, three, four, or five sequence motifs. In some embodiments, the sequence motifs are the same. In some embodiments, the sequence motifs are different. In some embodiments, the more than one sequence motifs are directly fused or joined by a linker. In some embodiments, the linker is a peptide linker. In some embodiments, the one or more sequence motif(s) of the CAR ligand has at least 1, 2, 3, 4, 5, 6, 7, 8, 9, 10, 11, 12, 13, 14, 15, 16, 17, 18, 19, or 20 flanking residues at its N-terminus, its C-terminus, or both. In some embodiments, the one or more sequence motif(s) has 1-5, 1-10, 1-15, 1-20, 5-10, 5-15, 5-20, 10-15, 10-20, 10-30, 10-40, or 10-50 flanking residues at its N-terminus, its C-terminus, or both. In some embodiments, the amino acid residues in closest proximity to the N-terminus and/or the C-terminus of the one or more sequence motif(s) are non-glycine residues. In some embodiments, the at least first, second, third, fourth, fifth, sixth, seventh, eighth, ninth, tenth, eleventh, twelfth, thirteenth, fourteenth, or fifteenth amino acid residue in closest proximity to the N-terminus and/or the C-terminus of the one or more sequence motif(s) are non-glycine residues. In some embodiments, the CAR ligand comprising one or more sequence motif(s) with flanking residues at its N-terminus and/or C-terminus has an increased binding affinity (i.e., decreased $K_D$) and/or decreased dissociation rate (kd) compared to the CAR ligand comprising the one or more sequence motif(s) without the flanking residues.

In some embodiments, the CAR ligand comprising a sequence motif with an N-terminal and/or C-terminal flanking residues binds the CAR antigen-recognition domain with about 1.1, 1.2, 1.3, 1.4, 1.5, 1.6, 1.7, 1.8, 1.9, 2-fold increased binding affinity ($K_D$) relative to the CAR ligand comprising the sequence motif without the flanking residues. In some embodiments, the CAR ligand comprising the sequence motif with the N-terminal and/or the C-terminal flanking residues binds the CAR antigen-recognition domain with a substantially decreased (e.g., 1.1, 1.2, 1.3, 1.4, 1.5, 1.6, 1.7, 1.8, 1.9, 2, 2.5, 3, 3.5, 4, 4.5, 5, 6, 7, 8, 9, or 10-fold decreased) dissociation rate (kd) compared to the CAR ligand comprising the sequence motif without the flanking residues.

TABLE 1

| Exemplary CAR Ligands | |
|---|---|
| SEQ ID NO | Sequence |
| 5 | RHCPWNCSLL |
| 6 | RICPWSCRAP |
| 9 | RMCPWSCRPH |
| 10 | RICPWSCMVV |
| 11 | RRCPWSCKKQ |
| 12 | RMCPWSCYEL |
| 13 | RLCPWACQEQ |
| 14 | RVCPWSCMPI |
| 15 | RLCPWSCVPI |
| 16 | RLCPWSCREL |
| 17 | RLCPWNCREL |
| 18 | RICPWNCKEL |
| 19 | RLCPWDCREL |
| 20 | RICPWACVEL |
| 21 | RICPWSCREL |
| 22 | RICPWACLSL |
| 23 | RLCPWECRVL |
| 24 | RLCPWACRQL |
| 25 | RLCPWHCAII |
| 26 | RLCPWSCMPR |
| 27 | RLCPWDCLIL |
| 28 | RICPWNCSKL |
| 29 | RVCPWSCVEQ |
| 30 | RLCPWNCIHW |
| 31 | RLCPWKCREL |
| 32 | RLCPWSCIKL |
| 33 | RLCPWSCVEQ |
| 34 | RICPWSCRPL |
| 35 | RLCPWSCIPF |
| 36 | RICPWSCVKQ |
| 37 | RLCPWSCLEI |
| 38 | RICPWSCMEL |
| 39 | RLCPWNCSEL |
| 40 | RLCPWNCRQL |
| 41 | RICPWDCKPI |
| 42 | RMCPWNCREL |
| 43 | RICPWGCKEL |
| 44 | RLCPWNCQEL |

TABLE 1-continued

| Exemplary CAR Ligands | |
|---|---|
| SEQ ID NO | Sequence |
| 45 | RICPWSCIEL |
| 46 | RICPWSCVEL |
| 47 | RLCPWDCKEL |

In some embodiments, the disclosure provides a CAR ligand of Subgroup V, wherein the CAR ligand is a peptide that is about 10 to about 100 amino acid residues in length, and wherein the CAR ligand:

(i) binds the antigen recognition domain of a CAR, wherein the CAR binds an epitope of a target antigen that is a disease-associated antigen, wherein the antigen is human CD19; and wherein the antigen recognition domain is derived from FMC63;

(ii) has a binding affinity ($K_D$) of at least 5 μM;

(iii) does not significantly cross-react with a CAR that does not bind human CD19 or a CAR comprising an antigen recognition domain that is not derived from FMC63; and (iv) comprises a sequence motif having the amino acid sequence of SEQ ID NO: 18.

In some embodiments, the CAR ligand of Subgroup V comprises one or more sequence motifs according to (iv) of Subgroup V. In some embodiments, the CAR ligand comprises at least two, three, four, or five sequence motifs. In some embodiments, the more than one sequence motifs are directly fused or joined by a linker. In some embodiments, the linker is a peptide linker. In some embodiments, the one or more sequence motif(s) of the CAR ligand has at least 1, 2, 3, 4, 5, 6, 7, 8, 9, 10, 11, 12, 13, 14, 15, 16, 17, 18, 19, or 20 flanking residues at its N-terminus, its C-terminus, or both. In some embodiments, the one or more sequence motif(s) has 1-5, 1-10, 1-15, 1-20, 5-10, 5-15, 5-20, 10-15, 10-20, 10-30, 10-40, or 10-50 flanking residues at its N-terminus, its C-terminus, or both. In some embodiments, the amino acid residues in closest proximity to the N-terminus and/or the C-terminus of the one or more sequence motif(s) are non-glycine residues. In some embodiments, the at least first, second, third, fourth, fifth, sixth, seventh, eighth, ninth, tenth, eleventh, twelfth, thirteenth, fourteenth, or fifteenth amino acid residue in closest proximity to the N-terminus and/or the C-terminus of the one or more sequence motif(s) are non-glycine residues. In some embodiments, the CAR ligand comprising one or more sequence motif(s) with flanking residues at its N-terminus and/or C-terminus has an increased binding affinity (i.e., decreased $K_D$) and/or decreased dissociation rate (kd) compared to the CAR ligand comprising the one or more sequence motif(s) without the flanking residues.

In some embodiments, the CAR ligand of any one of Subgroups I-V comprises an amino acid sequence from N-terminus to C-terminus according to the formula: $[A]_x$-[M]; wherein A is any amino acid residue, wherein M is the sequence motif, and wherein x is an integer between 1-20.

In some embodiments, the CAR ligand of any one of Subgroups I-V comprises an amino acid sequence from N-terminus to C-terminus according to the formula: $[A]_x$-[M]; wherein A is any amino acid residue, wherein M is the sequence motif, wherein x is an integer between 2-20, and wherein A is the same or different amino acid residue.

In some embodiments, the CAR ligand of any one of Subgroups I-V comprises an amino acid sequence from N-terminus to C-terminus according to the formula: $[A]_x$-[M]; wherein A is any amino acid residue that is not glycine, wherein M is the sequence motif, and wherein x is an integer between 1-20.

In some embodiments, the CAR ligand of any one of Subgroups I-V comprises an amino acid sequence from N-terminus to C-terminus according to the formula: $[A]_x$-[M]; wherein A is any amino acid residue that is not glycine, wherein M is the sequence motif, wherein x is an integer between 2-20, and wherein A is the same or different amino acid residue.

In some embodiments, the CAR ligand of any one of Subgroups I-V comprises an amino acid sequence from N-terminus to C-terminus according to the formula: $[A]_x$-$[M]_y$; wherein A is any amino acid residue, wherein M is the one or more sequence motifs, wherein M is the same or different sequence motif, wherein x is an integer between 1-20, wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$; wherein A is any amino acid residue, wherein M is the one or more sequence motifs, wherein M is the same or different sequence motif, wherein x is an integer between 2-20, wherein A is the same or different amino acid residue, wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$; wherein A is any amino acid residue that is not glycine, wherein M is the one or more sequence motifs, wherein M is the same or different sequence motif, wherein x is an integer between 1-20, and wherein y is 2, 3, 4, or 5, wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$; wherein A is any amino acid residue that is not glycine, wherein M is the one or more sequence motifs, wherein M is the same or different sequence motif, wherein x is an integer between 2-20, wherein A is the same or different amino acid residue, wherein y is 2, 3, 4, or 5, and wherein the one or more sequence motifs are directly fused or joined by a linker, optionally wherein the linker is peptide linker.

In some embodiments, A comprise an amino acid sequence selected from: SAS, GGGSAS (SEQ ID NO: 109), GGSGGGGSAS (SEQ ID NO: 110), GSGGGGSGGGG-SAS (SEQ ID NO: 111), GGGGSGGGGSGGGGSAS (SEQ ID NO: 112), PRKHSG (SEQ ID NO: 113), GGGSASPRKHSG (SEQ ID NO: 130), PLS, AKR-RERDYVG (SEQ ID NO: 114), PPP, AGT, QFQ, and a combination thereof. In some embodiments, A comprise one or more amino acid sequences selected from: SAS, GGG-SAS (SEQ ID NO: 109), GGSGGGGSAS (SEQ ID NO: 110), GSGGGGSGGGGSAS (SEQ ID NO: 111), GGGGSGGGGSGGGGSAS (SEQ ID NO: 112), PRKHSG (SEQ ID NO: 113), GGGSASPRKHSG (SEQ ID NO: 130), PLS, AKRRERDYVG (SEQ ID NO: 114), PPP, AGT, QFQ, and a combination thereof.

In some embodiments, the CAR ligand binds to the CAR antigen-recognition domain with an increased binding affinity ($K_D$) of about 1.1, 1.2, 1.3, 1.4, 1.5, 1.6, 1.7, 1.8, 1.9, or 2-fold relative to a peptide without A. In some embodiments, the peptide binds to the CAR antigen-recognition domain with a substantially reduced (e.g., by about 1.1, 1.2, 1.3, 1.4, 1.5, 1.6, 1.7, 1.8, 1.9, or 2-fold) dissociation relative to a peptide without A.

In some embodiments, the CAR ligand of any one of Subgroups I-V comprises an amino acid sequence from N-terminus to C-terminus according to the formula: [M]-$[B]_z$; wherein B is any amino acid residue, wherein M is the sequence motif, and wherein z is an integer between 1-20.

In some embodiments, the CAR ligand of any one of Subgroups I-V comprises an amino acid sequence from N-terminus to C-terminus according to the formula: [M]-$[B]_z$; wherein B is any amino acid residue, wherein M is the sequence motif, wherein z is an integer between 2-20, and wherein B is the same or different amino acid residue.

In some embodiments, the CAR ligand of any one of Subgroups I-V comprises an amino acid sequence from N-terminus to C-terminus according to the formula: [M]-$[B]_z$; wherein B is any amino acid residue that is not glycine, wherein M is the sequence motif, and wherein z is an integer between 1-20.

In some embodiments, the CAR ligand of any one of Subgroups I-V comprises an amino acid sequence from N-terminus to C-terminus according to the formula: [M]-$[B]_z$; wherein B is any amino acid residue that is not glycine, wherein M is the sequence motif, wherein z is an integer between 2-20, wherein B is the same or different amino acid residue.

In some embodiments, the CAR ligand of any one of Subgroups I-V comprises an amino acid sequence from N-terminus to C-terminus according to the formula: $[M]_y$-$[B]_z$; wherein B is any amino acid residue, wherein M is the one or more sequence motifs, wherein M is the same or different sequence motif, wherein z is an integer between 1-20, wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[M]_y$-$[B]_z$; wherein B is any amino acid residue, wherein M is the one or more sequence motifs, wherein M is the same or different sequence motif, wherein z is an integer between 2-20, wherein B is the same or different amino acid residue, wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[M]_y$-$[B]_z$; wherein B is any amino acid residue that is not glycine, wherein M is the one or more sequence motifs, wherein M is the same or different sequence motif, wherein z is an integer between 1-20, wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[M]_y$-$[B]_z$; wherein B is any amino acid residue that is not glycine, wherein M is the one or more sequence motifs, wherein M is the same or different sequence motif, wherein z is an integer between 2-20, wherein B is the same or different amino acid residue, wherein y is 2, 3, 4, or 5, and wherein the one or more sequence motifs are directly fused or joined by a linker, optionally wherein the linker is peptide linker.

In some embodiments, B comprises an amino acid sequence represented by the formula: [Tyr-Trp-Leu-Pro-Xaa1-Xaa2] (SEQ ID NO: 124), wherein Xaa1 is any amino acid residue, optionally D or Q; and wherein Xaa2 is any amino acid residue, optionally E, Q, or R. In some embodiments, B comprises an amino acid sequence selected from: YWLPQR (SEQ ID NO: 117), YWLPDE (SEQ ID NO: 119), YWLPDE (SEQ ID NO: 122), YWLPDQ (SEQ ID NO: 123), DNPPFIFGNR (SEQ ID NO: 115), PTPYMMFDM (SEQ ID NO: 116), HPDTRHRIPV (SEQ ID NO: 118), PLDWPW (SEQ ID NO: 120), PSPPRIFGNR (SEQ ID NO: 121), and a combination thereof. In some embodiments, B comprises one or more amino acid sequence selected from: YWLPQR (SEQ ID NO: 117), YWLPDE (SEQ ID NO: 119), YWLPDE (SEQ ID NO: 122), YWLPDQ (SEQ ID NO: 123), DNPPFIFGNR (SEQ ID NO: 115), PTPYMMFDM (SEQ ID NO: 116), HPDTRHRIPV (SEQ ID NO: 118), PLDWPW (SEQ ID NO: 120), PSPPRIFGNR (SEQ ID NO: 121), and a combination thereof.

In some embodiments, the CAR ligand binds to the CAR antigen-recognition domain with an increased binding affinity ($K_D$) of about 1.1, 1.2, 1.3, 1.4, 1.5, 1.6, 1.7, 1.8, 1.9, or 2-fold relative to a peptide without B. In some embodiments, the peptide binds to the CAR antigen-recognition domain with a substantially reduced (e.g., by about 1.1, 1.2, 1.3, 1.4, 1.5, 1.6, 1.7, 1.8, 1.9, or 2-fold) dissociation relative to a peptide without B.

In some embodiments, the CAR ligand of any one of Subgroups I-V comprises an amino acid sequence from N-terminus to C-terminus according to the formula: $[A]_x$-[M]-$[B]_z$; wherein A is any amino acid residue; wherein M is the sequence motif; wherein B is any amino acid residue; wherein x and z are each integers from 1-20.

In some embodiments, the CAR ligand of any one of Subgroups I-V comprises an amino acid sequence from N-terminus to C-terminus according to the formula: $[A]_x$-[M]-$[B]_z$; wherein A is any amino acid residue that is not glycine; wherein M is the sequence motif; wherein B is any amino acid residue; wherein x and z are each integers from 1-20.

In some embodiments, the CAR ligand of any one of Subgroups I-V comprises an amino acid sequence from N-terminus to C-terminus according to the formula: $[A]_x$-[M]-$[B]_z$; wherein A is any amino acid residue; wherein M is the sequence motif; wherein B is any amino acid residue that is not glycine; wherein x and z are each integers from 1-20.

In some embodiments, the CAR ligand of any one of Subgroups I-V comprises an amino acid sequence from N-terminus to C-terminus according to the formula: $[A]_x$-[M]-$[B]_z$; wherein A is any amino acid residue that is not glycine; wherein M is the sequence motif; wherein B is any amino acid residue that is not glycine; wherein x and z are each integers from 1-20.

In some embodiments, the CAR ligand of any one of Subgroups I-V comprises an amino acid sequence from N-terminus to C-terminus according to the formula: $[A]_x$-[M]-$[B]_z$; wherein A is any amino acid residue, optionally any amino acid residue that is not glycine; wherein M is the sequence motif; wherein B is any amino acid residue, optionally any amino acid residue that is not glycine; wherein x is an integer from 2-20; wherein A is the same or different amino acid residue; and wherein z is an integer from 1-20.

In some embodiments, the CAR ligand of any one of Subgroups I-V comprises an amino acid sequence from N-terminus to C-terminus according to the formula: $[A]_x$-[M]-$[B]_z$; wherein A is any amino acid residue, optionally any amino acid residue that is not glycine; wherein M is the sequence motif; wherein B is any amino acid residue, optionally any amino acid residue that is not glycine; wherein x is an integer from 1-20; wherein z is an integer from 2-20; and wherein B is the same or different amino acid residue.

In some embodiments, the CAR ligand of any one of Subgroups I-V comprises an amino acid sequence from N-terminus to C-terminus according to the formula: $[A]_x$-[M]-$[B]_z$; wherein A is any amino acid residue, optionally any amino acid residue that is not glycine; wherein M is the sequence motif; wherein B is any amino acid residue, optionally any amino acid residue that is not glycine; wherein x is an integer from 2-20; wherein A is the same or different amino acid residue; wherein z is an integer from 2-20; and wherein B is the same or different amino acid residue.

In some embodiments, the CAR ligand of any one of Subgroups I-V comprises an amino acid sequence from N-terminus to C-terminus according to the formula: $[A]_x$-$[M]_y$-$[B]_z$; wherein A is any amino acid residue; wherein M is the one or more sequence motif; wherein B is any amino acid residue; wherein x and z are each integers from 1-20; wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$-$[B]_z$; wherein A is any amino acid residue that is not glycine; wherein M is the one or more sequence motif; wherein B is any amino acid residue; wherein x and z are each integers from 1-20.

In some embodiments, the CAR ligand of any one of Subgroups I-V comprises an amino acid sequence from N-terminus to C-terminus according to the formula: $[A]_x$-$[M]_y$-$[B]_z$; wherein A is any amino acid residue; wherein M is the one or more sequence motif; wherein B is any amino acid residue that is not glycine; wherein x and z are each integers from 1-20; wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$-$[B]_z$; wherein A is any amino acid residue that is not glycine; wherein M is the one or more sequence motif; wherein B is any amino acid residue that is not glycine; wherein x and z are each integers from 1-20; wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$-$[B]_z$; wherein A is any amino acid residue, optionally any amino acid residue that is not glycine; wherein M is the one or more sequence motif; wherein B is any amino acid residue, optionally any amino acid residue that is not glycine; wherein x is an integer from 2-20; wherein A is the same or different amino acid residue; wherein z is an integer from 1-20; wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$-$[B]_z$; wherein A is any amino acid residue, optionally any amino acid residue that is not glycine; wherein M is the one or more sequence motif; wherein B is any amino acid residue, optionally any amino acid residue that is not glycine; wherein x is an integer from 1-20; wherein z is an integer from 2-20; wherein B is the same or different amino acid residue; wherein y is 2, 3, 4, or 5, and wherein the one or more sequence motifs are directly fused or joined by a linker, optionally wherein the linker is peptide linker.

In some embodiments, the CAR ligand of any one of Subgroups I-V comprises an amino acid sequence from N-terminus to C-terminus according to the formula: $[A]_x$-$[M]_y$-$[B]_z$; wherein A is any amino acid residue, optionally any amino acid residue that is not glycine; wherein M is the one or more sequence motif; wherein B is any amino acid residue, optionally any amino acid residue that is not glycine; wherein x is an integer from 2-20; wherein A is the same or different amino acid residue; wherein z is an integer from 2-20; wherein B is the same or different amino acid residue; wherein y is 2, 3, 4, or 5, and wherein the one or more sequence motifs are directly fused or joined by a linker, optionally wherein the linker is peptide linker.

In some embodiments, A comprises an amino acid sequence selected from: SAS, GGGSAS (SEQ ID NO: 109), GGSGGGGSAS (SEQ ID NO: 110), GSGGGGSGGGG-SAS (SEQ ID NO: 111), GGGGSGGGGSGGGGSAS (SEQ ID NO: 112), GGGSASPRKHSG (SEQ ID NO: 130); PRKHSG (SEQ ID NO: 113), PLS, AKRRERDYVG (SEQ ID NO: 114), PPP, AGT, QFQ, and a combination thereof; and B comprises an amino acid sequence represented by the formula: [Tyr-Trp-Leu-Pro-Xaa1-Xaa2] (SEQ ID NO: 124), wherein Xaa1 is any amino acid residue, optionally D or Q; and wherein Xaa2 is any amino acid residue, optionally E, Q, or R. In some embodiments, A comprises one or more amino acid sequence selected from: SAS, GGGSAS (SEQ ID NO: 109), GGSGGGGSAS (SEQ ID NO: 110), GSGGGGSGGGGSAS (SEQ ID NO: 111), GGGGSGGGGSGGGGSAS (SEQ ID NO: 112), GGGSASPRKHSG (SEQ ID NO: 130); PRKHSG (SEQ ID NO: 113), PLS, AKRRERDYVG (SEQ ID NO: 114), PPP, AGT, QFQ, and a combination thereof; and B comprises an amino acid sequence represented by the formula: [Tyr-Trp-Leu-Pro-Xaa1-Xaa2] (SEQ ID NO: 124), wherein Xaa1 is any amino acid residue, optionally D or Q; and wherein Xaa2 is any amino acid residue, optionally E, Q, or R.

In some embodiments, A comprises an amino acid sequence selected from: PLS, AGT, QFQ; and B comprises amino acid sequence represented by the formula [Tyr-Trp-Leu-Pro-Xaa1-Xaa2] (SEQ ID NO: 124), wherein Xaa1 is any amino acid residue, optionally D or Q; and wherein Xaa2 is any amino acid residue, optionally E, Q, or R.

In some embodiments, A comprises an amino acid sequence selected from: SAS, GGGSAS (SEQ ID NO: 109), GGSGGGGSAS (SEQ ID NO: 110), GSGGGGSGGGG-SAS (SEQ ID NO: 111), GGGGSGGGGSGGGGSAS (SEQ ID NO: 112), GGGSASPRKHSG (SEQ ID NO: 130), PRKHSG (SEQ ID NO: 113), PLS, AKRRERDYVG (SEQ ID NO: 114), PPP, AGT, QFQ, and a combination thereof; and B comprises an amino acid sequence selected from: YWLPQR (SEQ ID NO: 117), YWLPDE (SEQ ID NO: 119), YWLPDE (SEQ ID NO: 122), YWLPDQ (SEQ ID NO: 123), DNPPFIFGNR (SEQ ID NO: 115), PTPYMMFDM (SEQ ID NO: 116), HPDTRHRIPV (SEQ ID NO: 118), PLDWPW (SEQ ID NO: 120), PSPPRIFGNR (SEQ ID NO: 121), and a combination thereof. In some embodiments, A comprises one or more amino acid sequence selected from: SAS, GGGSAS (SEQ ID NO: 109), GGSGGGGSAS (SEQ ID NO: 110), GSGGGGSGGGG-SAS (SEQ ID NO: 111), GGGGSGGGGSGGGGSAS (SEQ ID NO: 112), GGGSASPRKHSG (SEQ ID NO: 130), PRKHSG (SEQ ID NO: 113), PLS, AKRRERDYVG (SEQ ID NO: 114), PPP, AGT, QFQ, and a combination thereof; and B comprises one or more amino acid sequence selected from: YWLPQR (SEQ ID NO: 117), YWLPDE (SEQ ID NO: 119), YWLPDE (SEQ ID NO: 122), YWLPDQ (SEQ ID NO: 123), DNPPFIFGNR (SEQ ID NO: 115), PTPYMMFDM (SEQ ID NO: 116), HPDTRHRIPV (SEQ ID NO: 118), PLDWPW (SEQ ID NO: 120), PSPPRIFGNR (SEQ ID NO: 121), and a combination thereof.

In some embodiments, A comprises the amino acid sequence PRKHSG (SEQ ID NO: 113) and B comprises the amino acid sequence DNPPFIFGNR (SEQ ID NO: 115). In some embodiments, A comprises the amino acid sequence GGGSASPRKHSG (SEQ ID NO: 130) and B comprises the amino acid sequence DNPPFIFGNR (SEQ ID NO: 115). In some embodiments, A comprises the amino acid sequence GGGSAS (SEQ ID NO: 109) and B comprises the amino acid sequence PSPPRIFGNR (SEQ ID NO: 121). In some embodiments, A comprises the amino acid sequence PLS and B comprises the amino acid sequence YWLPQR (SEQ ID NO: 117). In some embodiments, the A comprises the amino acid sequence of PPP and B comprises the amino acid sequence PLDWPW (SEQ ID NO: 120). In some embodiments, A comprises the amino acid sequences AGT and B comprises the amino acid sequence YWLPDE (SEQ ID NO: 122). In some embodiments, A comprises the amino acid sequences QFQ and B comprises the amino acid sequence YWLPDQ (SEQ ID NO: 123).

In some embodiments, the CAR ligand binds to the CAR antigen-recognition domain with an increased binding affinity ($K_D$) of about 1.1, 1.2, 1.3, 1.4, 1.5, 1.6, 1.7, 1.8, 1.9, or 2-fold relative to a peptide without A and B. In some embodiments, the peptide binds to the CAR antigen-recognition domain with a substantially reduced (e.g., by about 1.1, 1.2, 1.3, 1.4, 1.5, 1.6, 1.7, 1.8, 1.9, or 2-fold) dissociation relative to a peptide without A and B.

In some embodiments, the CAR ligand comprises an amino acid sequence having at least 80%, 85%, 90%, 91%, 92%, 93%, 94%, 95%, 96%, 97%, 98%, 99% or higher identity to an amino acid sequence selected from SEQ ID NOs: 95-108 and 128-129. In some embodiments, the CAR ligand comprises the amino acid sequence selected from SEQ ID NOs: 95-108 and 128-129. In some embodiments, the CAR ligand is an amino acid sequence selected from SEQ ID NOs: 95-108 and 128-129.

B. Methods for Characterizing CAR Ligands (i) Methods of Measuring CAR Ligand Binding Affinity In some embodiments, a CAR ligand described herein binds to the antigen recognition domain of a CAR with a binding affinity ($K_D$) as determined by a ligand-binding assay. In some embodiments, the ligand-binding assay determines a binding affinity ($K_D$) of the CAR ligand for the antigen recognition domain of a CAR. In some embodiments, the ligand-binding assay is used to determine kinetic rate constants (e.g., kon, e.g., koff) for the binding interaction of the CAR ligand for the antigen recognition domain of a CAR.

Methods of measuring binding affinity and/or kinetic rate constants using ligand-binding assay are known in the art and include, but are not limited to, enzyme-linked immunosorbent assay (ELISA), gel-shift assays, pull-down assays, quantitative immunoblot, equilibrium dialysis, analytical ultracentrifugation, surface plasmon resonance, fluorescence anisotropy, solution equilibrium titration, kinetic exclusion assay, and isothermal titration calorimetry.

For example, in some embodiments a ligand binding assay is used to determine the presence, rate, extent of binding, or combinations thereof, of a CAR ligand to an antibody or fragment thereof comprising a CAR antigen recognition domain. In some embodiments, the ligand binding assay comprises detecting the formation of a CAR ligand:antibody complex. In some embodiments, the ligand binding assay comprises determining the dissociation of a CAR ligand:antibody complex.

In some embodiments, the formation and/or dissociation of the CAR ligand:antibody complex is determined by detection of a fluorescently-labeled ligand in complex with the antibody or fragment thereof comprising a CAR antigen recognition domain. In some embodiments, the formation and/or dissociation of a CAR ligand:antibody complex is determined by detection and/or quantification of an amount of fluorescently-labeled antibody or fragment thereof comprising a CAR antigen recognition domain in complex with a CAR ligand. Methods of detecting and quantifying fluorescence are known in the art and include, but are not limited to, fluorescence polarization (FP), fluorescence anisotropy (FA), flow cytometry and microscopy.

In some embodiments, the ligand-binding assay comprises measuring binding affinity of an antibody or fragment thereof comprising the CAR antigen recognition domain for a CAR ligand expressed on a cell surface. In some embodiments, the antibody or fragment thereof is labeled with a fluorescent molecule (e.g., a fluorescent dye). In some embodiments, binding is detected using a method of fluorescence detection (e.g., flow cytometry). In some embodiments, binding of the antibody or fragment thereof to a cell expressing the CAR ligand is compared relative to a reference cell lacking expression of the CAR ligand.

In some embodiments, an exact determination of $K_D$ is unnecessary, as it is sufficient to obtain a qualitative measurement of affinity. For example, by determining relative binding affinity of a CAR ligand relative to the native antigen of the CAR using a method such as ELISA or FACS analysis, e.g., determining whether affinity of the CAR ligand is higher (e.g., 10-fold, 100-fold, 1000-fold, etc), comparable (e.g., ±10%, ±9%, ±8%, etc), or lower (e.g., 10-fold, 100-fold, etc) than the native antigen.

In some embodiments, the ligand binding assay is surface plasmon resonance. "Surface plasmon resonance" includes an optical phenomenon that allows for the analysis of real-time biospecific interactions by detection of alterations in protein concentrations within a biosensor matrix, for example using the BIAcore system (Pharmacia Biosensor AB, Uppsala, Sweden and Piscataway, NJ). For further descriptions, see Jönsson, U., et al. (1993) Ann. Biol. Clin. 51:19-26; Jönsson, U., et al. (1991) Biotechniques 11:620-627; Johnsson, B., et al. (1995) J. Mol. Recognit. 8:125-131; and Johnnson, B., et al. (1991) Anal. Biochem. 198:268-277. In some embodiments, the ligand binding assay is biolayer interferometry (BLI). The phrase "biolayer interferometry" or "BLI" includes an optical phenomenon that allows for the measurement of sub-nanometer changes in the thickness of its optical layer detection surface. In some embodiments, biomolecules binds at a sensor surface and change the optical layer thickness. The magnitude of the optical layer thickness change is proportional to the mass or molecular weight of the binding molecule. In some embodiments, an antibody or fragment thereof comprising the CAR antigen recognition domain is immobilized to the sensor surface to measure binding of the antigen recognition domain, wherein binding creates a change in molecular weight to produce a corresponding change in the optical layer thickness. In some embodiments, samples of the CAR ligand are prepared by serial dilution and injected onto the sensor, and KD values are calculated from modeling of the curve of binding relative to CAR ligand concentration. In some embodiments, BLI is performed with an OCTET system (ForteBio).

In some embodiments, the ligand binding assay is a kinetic exclusion assay (KinExA). The KinExA is a solution-based method to determine equilibrium binding affinity (KD) and kinetics of binding for interactions between binding partners, particularly for binding interactions in the picomolar to subnanomolar range (see, e.g., Darling et al (2004) *Assay Drug Dev Technol* 2:647-657).

(ii) Methods of Characterizing CAR Ligand Binding

The disclosure provides CAR ligands that bind the antigen-recognition domain of a CAR. Methods to characterize, map, or otherwise elucidate the CAR ligand binding interaction can be grouped into structural, functional, or computational methods. A particularly suitable structural method to determine the precise molecular architecture of the interaction between the CAR ligand and the CAR antigen recognition domain to which it binds is x-ray crystallography (alternatively "x-ray co-crystallography"). In some embodiments, the method comprises x-ray crystallography of the CAR ligand bound to an antibody or fragment thereof comprising the CAR antigen recognition domain. A crystal structure of a bonded CAR ligand:antibody pair enables very accurate determination of key interactions between individual amino acids from both side chains and main chain atoms in both the sequence motif of the CAR ligand and the binding site of the CAR antigen recognition domain. Amino acids that are within 4 angstroms (Å) of each other are generally considered to be contacting residues. The methodology typically involves purification of CAR ligand and antibody or fragment thereof comprising the CAR antigen recognition domain, formation and purification of the complex, followed by successive rounds of crystallization screens and optimization to obtain diffraction-quality crystals. Structural solution is obtained following x-ray crystallography frequently at a synchrotron source. Accordingly, the binding portions of the CAR ligand and the CAR antigen recognition domain provided by the disclosure may be assessed through x-ray crystallographic analysis of a crystal structure comprising an antibody or fragment thereof comprising the CAR antigen recognition domain bound to the CAR ligand. In some embodiments, the CAR ligand binding site is identified by determining the residues on the CAR antigen recognition domain that reside or are located within 4 angstroms (Å) of the CAR ligand.

Other structural methods for mapping the CAR ligand binding site include, but are not limited to, hydrogen-deuterium exchange coupled to mass spectrometry, cross-linking-coupled mass spectrometry, and nuclear magnetic resonance (NMR) (see, e.g., Epitope Mapping Protocols in Methods in Molecular Biology, Vol. 66, G. E. Morris, Ed. (1996); Abbott et al., (2014) Immunology 142(4):526-535).

Functional methods for ligand mapping are well known in the art and can be used, for example, to identify residues of the peptide ligand that bind to the CAR antigen recognition domain and vice versa.

For example, in some embodiments, the CAR sequence motif is characterized using alanine scanning mutagenesis, (Cunningham and Wells (1989) Science 244:1081-085), or some other form of point mutagenesis of amino acid residues in the CAR ligand. As described herein, alanine scanning is a technique that involves the substitution of an alanine residue for a wild-type residue in a polypeptide, followed by an assessment of the stability or function(s) (e.g., binding affinity) of the alanine-substituted derivative or mutant polypeptide and comparison to the wild-type polypeptide. In some embodiments, residues of the CAR ligand are substituted with alanine residues and the effect on binding is determined relative to the wild-type CAR ligand. Without being bound by theory, an amino acid residue is essential for binding if amino acid mutation of that residue reduces or eliminates binding to the CAR antigen recognition domain.

II. Amphiphilic Ligand Conjugates

A. Overview

An amphiphile vaccine technology has been developed that involves linking adjuvants or antigens (e.g., peptides) to lipophilic polymeric tails, which promotes localization of vaccines to lymph node (see, e.g., Liu et al. (2014) *Nature* 507:519-522). Such amphiphile-antigens (e.g., amph-peptides) are also capable of inserting into cell membranes (see e.g., Liu et al. (2011) *Angewandte Chemie-Intl. Ed.* 50:7052-7055). Accordingly, the present disclosure provides amphiphilic ligand conjugates comprising a CAR ligand for use in stimulating, expanding, activating CAR effector cells (e.g., CAR-T cells).

In some embodiments, the amphiphilic conjugates of the disclosure are used with chimeric antigen receptor (CAR) expressing cell therapy (e.g., CAR-T cell therapy). In some embodiments, the amphiphilic conjugates of the disclosure stimulate a specific immune response against a specific target, such as a tumor-associated antigen. In some embodiments, the amphiphilic conjugates of the disclosure stimulate proliferation of CAR expressing cells (e.g., CAR-T cells) in vivo. In some embodiments, the amphiphilic conjugates comprise a CAR ligand of the disclosure, referred to herein as an amphiphilic ligand conjugate. In some embodiments, the amphiphilic conjugate comprises an immunostimulatory oligonucleotide and is referred to herein as an amphiphilic oligonucleotide conjugate.

As shown in FIG. 1, a diversity of amphiphilic ligand conjugate structures are disclosed wherein a lipophilic moiety, or "lipid tail", (e.g. DSPE) is linked (e.g., covalently linked) via a linker (e.g., PEG-2000), to a CAR ligand. The modularity of this design allows for various ligands including, but not limited to, small molecules (e.g. FITC), short peptides (e.g. a linear peptide providing an epitope specific for CARs), or modular protein domains (e.g. folded polypeptide or polypeptide fragment providing a conformational epitope specific for CARs) to be linked to the lipid (e.g., covalently), resulting in amphiphilic ligand conjugates with tailored specificity. As described herein, the amphiphilic ligand conjugates are designed to for attachment of CAR ligands of the disclosure to the lipid via covalent linkage.

Moreover, the present disclosure encompasses amphiphilic ligand conjugate structures comprising a lipid tail (e.g., DSPE) linked (e.g., covalently linked) to a multimer of CAR ligands (e.g., a dimer, trimer, tetramer, etc.). As used herein, a "multimer" refers to two or more CAR ligands that are assembled by linkage (e.g., covalent linkage) to a molecular scaffold. In some embodiments, the two or more CAR ligands remain assembled under physiological conditions. In some embodiments, a multimer of CAR ligands is multivalent, wherein at least two or more CAR ligands present on the molecular scaffold are presented for binding to one or more CAR antigen recognition domains (e.g., simultaneously or sequentially). In some embodiments, the multimer is a dimer of CAR ligands. As used herein, a "dimer" refers to two CAR ligands assembled by linkage (e.g., covalent linkage) to a molecular scaffold. In some embodiments, a dimer of CAR ligands is bivalent, wherein the two CAR ligands are presented for binding to one or more CAR antigen recognition domains (e.g., simultaneously or sequentially). In some embodiments, the multimer is a trimer of CAR ligands. As used herein, a "trimer" refers to three CAR ligands assembled by linkage (e.g., covalent linkage) to a molecular scaffold. In some embodiments, a trimer of CAR ligands is trivalent, wherein the three CAR ligands are presented for binding to one or more CAR antigen recognition domains (e.g., simultaneously or sequentially). In some embodiments, the multimer is a tetramer of CAR ligands. As used herein, a "tetramer" refers to four CAR ligands assembled by linkage (e.g., covalent linkage) to a molecular scaffold. In some embodiments, a tetramer of CAR ligands is tetravalent, wherein the four CAR ligands are presented for binding to one or more CAR antigen recognition domains (e.g., simultaneously or sequentially. In some embodiments, the multimer (e.g., dimer, trimer, tetramer) comprises CAR ligands of the disclosure. In some embodiments, the amphiphilic ligand conjugate comprises a dimer of CAR ligand, e.g., according to the structure depicted in FIG. 17B. In some embodiments, the CAR ligands of the multimer are each linked (e.g., covalently linked) to the lipid via a linker (e.g., PEG4, PEG8).

Figure 2:
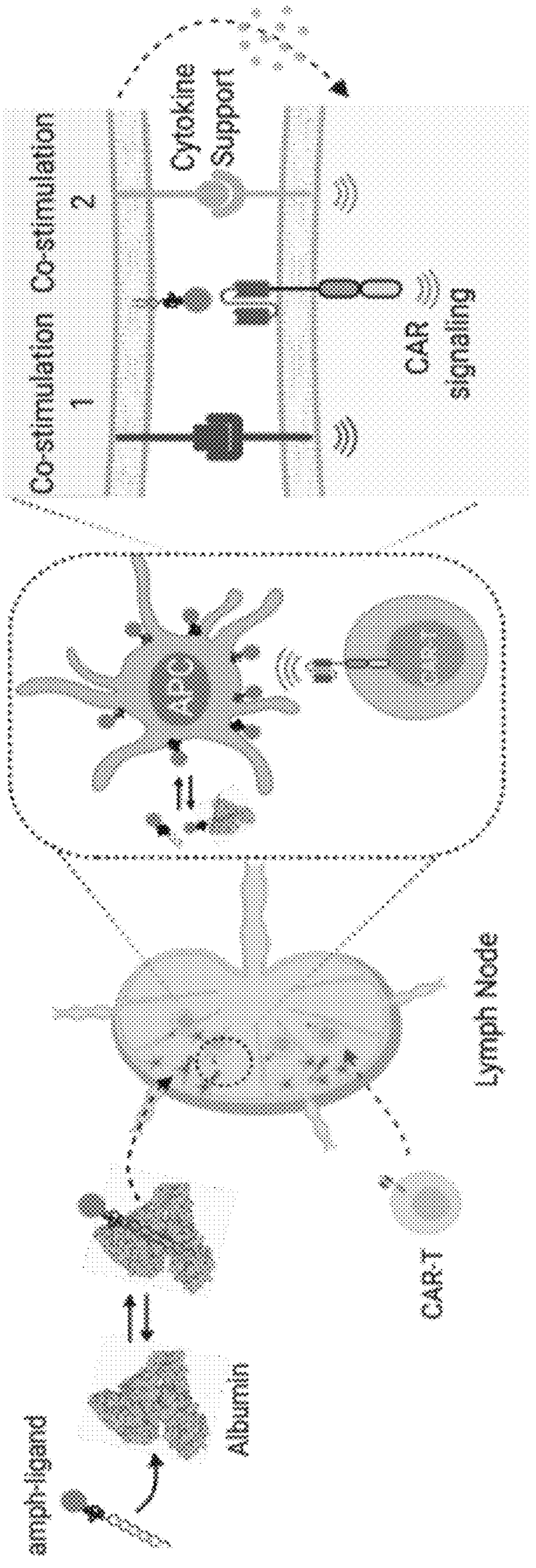
FIG. 2 is a schematic illustrating the application of an amph-ligand for CAR T cell stimulation. Amph-ligand molecules are trafficked to lymph nodes via albumin and partitioned on to the membrane of resident APCs. APCs decorated with amph-ligand molecules activate CAR T cells in the presence of a full complement of costimulatory receptors and cytokines in the native lymph node microenvironment.

Without being bound by theory, the amphiphilic ligand conjugate of the disclosure is believed to be delivered primarily to lymph nodes where the lipid tail portion is inserted into the membrane of antigen presenting cells (APCs), resulting in the decoration of the APC with a CAR ligand (FIG. 2). The embedded CAR ligands function as specific targets for CARs expressed on the surface of CAR expressing cells (e.g., CAR T cells) (which are administered prior to, subsequent or co-administered with the amphiphilic ligand conjugate of the disclosure) resulting in the recruitment of CAR expressing cells to the CAR ligand-decorated APCs. Interaction of the CAR with the embedded CAR-ligand provides a stimulatory signal through the CAR while the APC additionally presents other naturally occurring co-stimulatory signals, resulting in optimal CAR expressing cell activation, prolonged survival and efficient memory formation.

As shown in FIG. 17A, CAR molecules on the surface of CAR-expressing cells (e.g., CAR T cells) are present in a complex (e.g., dimer) due to interactions at their hinge and/or transmembrane domains. In some embodiments, the amphiphilic ligand conjugate comprises multiple CAR ligands with structural and/or spatial arrangement to allow for simultaneous or synchronous engagement of multiple antigen-recognition domains present on the complex (e.g., dimer) of CAR molecules, thereby providing for a multivalent CAR ligand/CAR interaction that has an increased functional affinity ($K_D$) compared to the binding affinity ($K_D$) of a monovalent CAR ligand/CAR interaction. In some embodiments, one or more features of the amphiphilic ligand conjugate are designed to optimize the multivalent interaction. In some embodiments, the linker is of an optimal length, e.g., to enable a spacing of the CAR ligands that allows for a simultaneous or synchronous binding to the multiple antigen recognition domains of the complex (e.g., dimer) of CAR molecules. In some embodiments, the amphiphilic ligand conjugate has a number of CAR ligands (e.g., two, three, four, etc.) that provides for an appreciably increased functional affinity ($K_D$) compared to the binding affinity ($K_D$) of a monovalent CAR ligand/CAR interaction.

B. Lipid Conjugates

In certain embodiments, a lipid conjugate (e.g., an amphiphilic ligand conjugate), as described in US 2013/0295129, herein incorporated by reference, is used in the methods disclosed herein. In some embodiments, a lipid conjugate comprises a hydrophobic tail that inserts into a cell membrane. In some embodiments, a lipid conjugate comprises an albumin-binding lipid to efficiently target the conjugate to lymph nodes in vivo. In some embodiments, a lipid conjugate comprises an albumin-binding lipid comprising a hydrophobic tail, wherein the hydrophobic tail inserts into the cell membrane, and wherein the conjugate is efficiently targeted to lymph nodes in vivo. In some embodiments, lipid conjugates bind to endogenous albumin, which targets them to lymphatics and draining lymph nodes where they accumulate due to the filtering of albumin by antigen presenting cells. In some embodiments, the lipid conjugate includes an antigenic peptide or molecular adjuvant, and thereby induces or enhances a robust immune response. In some embodiments, the lipid conjugate includes a CAR ligand, and thereby induces or enhances expansion, proliferation, and/or activation of CAR expressing cells (e.g., CAR effector cells, e.g., CAR-T cells). In some embodiments, the lipid conjugate comprises a multimer of CAR ligands, and thereby induces or enhances expansion, proliferation, and/or activation of CAR expressing cells (e.g., CAR effector cells, e.g., CAR-T cells). Lipid conjugates comprising a CAR ligand are referred to as "amphiphilic ligand conjugates" as defined supra. The term "amphiphilic ligand conjugates" further encompasses lipid conjugates comprising a multimer of CAR ligands, as further described herein.

In some embodiments, the lipid conjugates efficiently targeted to the lymph nodes are referred to as "lymph node-targeting conjugates." In some embodiments, lymph node-targeting conjugates comprises a highly lipophilic, albumin-binding domain (e.g., an albumin-binding lipid), and a cargo such as a CAR ligand or molecular adjuvant. In some embodiments, lymph node-targeting conjugates comprises a highly lipophilic, albumin-binding domain (e.g., an albumin-binding lipid), and a multimer of CAR ligands. In some embodiments, lymph node-targeting conjugates include three domains: a highly lipophilic, albumin-binding domain (e.g., an albumin-binding lipid), a cargo such as a CAR ligand or molecular adjuvant, and a polar block linker, which promotes solubility of the conjugate and reduces the ability of the lipid to insert into cellular plasma membranes at the site of injection. Accordingly, in certain embodiments, the general structure of the conjugate is L-P-C, where "L" is an albumin-binding lipid, "P" is a polar block, and "C" is a cargo such as a CAR ligand or a molecular adjuvant. In some embodiments, the cargo itself can also serve as the polar block domain, and a separate polar block domain is not required. Therefore, in certain embodiments the conjugate has only two domains: an albumin-binding lipid and a cargo. In some embodiments, the cargo of the conjugate is a CAR ligand, thereby resulting in an amphiphilic ligand conjugate. In some embodiments, the CAR ligand is any one described herein. In some embodiments, the amphiphilic ligand conjugate is administered or formulated with an adjuvant, wherein the adjuvant is an amphiphilic ligand comprising a molecular adjuvant such as an immunostimulatory oligonucleotide, as the cargo.

In some embodiments, the CAR ligand is operably linked to the polar block via its N-terminus. In some embodiments, the CAR ligand is operably linked to the polar block via its C-terminus.

In some embodiments, an amphiphilic ligand conjugate of the disclosure comprises two domains: a highly lipophilic, albumin-binding domain (e.g., an albumin-binding lipid) and a multimer of CAR ligands, wherein each CAR ligand of the multimer is linked to the lipophilic, albumin-binding domain via a polar block linker, which promotes solubility of the conjugate and/or provides for adequate spacing of the CAR ligands such that ligand binding occurs simultaneously or synchronously to the multiple antigen-recognition domains of a complex (e.g., dimer) of CAR molecules on the surface of a CAR-expressing cell (e.g., CAR-T cell). In some embodiments, each CAR ligand of the multimer is operably linked to the polar block linker via its N-terminus. In some embodiments, each CAR ligand of the multimer is operably linked to the polar block linker via its C-terminus.

In some embodiments, the multimer of CAR ligands is a dimer comprising a first CAR ligand and a second CAR ligand. In some embodiments, the first CAR ligand and the second CAR ligand are the same. In some embodiments, the first CAR ligand and the second CAR ligand are the different. In some embodiments, the CAR ligand multimer is a trimer comprising a first CAR ligand, a second CAR ligand, and a third CAR ligand. In some embodiments, the first, second, and third CAR ligands are the same. In some embodiments, the first, second, and third CAR ligands are different. In some embodiments, the CAR ligand multimer is a tetramer comprises a first CAR ligand, a second CAR ligand, a third CAR ligand, and a fourth CAR ligand. In some embodiments, the first, second, third, and fourth CAR ligands are the same. In some embodiments, the first, second, third, and fourth CAR ligands are different. In some embodiments, each CAR ligand of the multimer engages in a binding interaction with the antigen recognition domains of the complexed CAR molecules on the surface of the CAR-expressing cell.

In some embodiments, the general structure of the amphiphilic ligand conjugate comprising two domains is L-(P—C)$_n$, where "L" is an albumin-binding lipid and "(P—C)$_n$" is the multimer of CAR ligands. In some embodiments, the "P" is a polar block linker described herein, the "C" is a CAR ligand described herein, and "n" is the number of CAR ligands present in the multimer. In some embodiments, the multimer according to "(P—C)$_n$" has n=2, wherein the multimer of CAR ligands is a dimer. In some embodiments, the multimer according to "(P—C)$_n$" has n=3, wherein the multimer of CAR ligands is a trimer. In some embodiments, the multimer according to "(P—C)$_n$" has n=4, wherein the multimer of CAR ligands is a tetramer. In some embodiments, the multimer according to "(P—C)$_n$" has n=5, wherein the multimer of CAR ligands is a pentamer. In some embodiments, the CAR ligands of the multimer are the same. In some embodiments, the CAR ligands of the multimer are different.

In some embodiments, the covalent linkage of the CAR ligands of the multimer to the albumin-binding lipid occurs via a heterotrifunctional group. As used herein, a "heterotrifunctional group" refers to a chemical moiety that connects the lipid head group to at least two CAR ligands. In some embodiments, the hetertrifunctional group is a chemical moiety comprising a first reactive group for attachment to a carbon atom, nitrogen atom, oxygen atom, phosphate atom, or sulfur atom present on the lipid head group; a second reactive groups for attachment to a CAR ligand; and at least one additional reactive group for attachment to one or more additional CAR ligands (e.g., a second CAR ligand). In some embodiments, the second reactive group and at least one additional reactive group are each different from the first reactive group. In some embodiments, the second reactive group and the at least one additional reactive group are the same. In some embodiments, the second reactive group and the at least one additional reactive group are the same. In some embodiments, the first reactive group is a carboxyl group; the second reactive group is an amine; and the at least one additional reactive group is an amine. In some embodiments, the hetertrifunctional group is lysine.

(i) Lipids

In some embodiments, the lipid component of the amphiphilic conjugates (e.g., amphiphilic ligand conjugate, e.g., amphiphilic oligonucleotide conjugate) comprises a hydrophobic tail. In some embodiments, the hydrophobic tail inserts into a cell membrane. In some embodiments, the lipid is linear, branched, or cyclic. In some embodiments, the lipid is greater than 12 carbons in length. In some embodiments, the lipid is 13 carbons in length. In some embodiments, the lipid is 14 carbons in length. In some embodiments, the lipid is 15 carbons in length. In some embodiments, the lipid is 16 carbons in length. In some embodiments, the lipid is 17 carbons in length. In some embodiments, the lipid is 18 carbons in length. In some embodiments, the lipid is 19 carbons in length. In some embodiments, the lipid is 20 carbons in length. In some embodiments, the lipid is 21 carbons in length. In some embodiments, the lipid is 22 carbons in length. In some embodiments, the lipid is 23 carbons in length. In some embodiments, the lipid is 24 carbons in length. In some embodiments, the lipid is 25 carbons in length. In some embodiments, the lipid is 26 carbons in length. In some embodiments, the lipid is 27 carbons in length. In some embodiments, the lipid is 28 carbons in length. In some embodiments, the lipid is 29 carbons in length. In some embodiments, the lipid is 30 carbons in length. In some embodiments, the lipid at least 17 to 18 carbons in length, but may be shorter if it shows good albumin binding and adequate targeting to the lymph nodes.

Lymph node-targeting conjugates include amphiphilic ligand conjugates and amphiphilic oligonucleotide conjugates that can be trafficked from the site of delivery through the lymph to the lymph node. In certain embodiments, the activity relies, in-part, on the ability of the conjugate to associate with albumin in the blood of the subject. Therefore, lymph node-targeted conjugates typically include a lipid that can bind to albumin under physiological conditions. Lipids suitable for targeting the lymph node can be selected based on the ability of the lipid or a lipid conjugate including the lipid to bind to albumin. Suitable methods for testing the ability of the lipid or lipid conjugate to bind to albumin are known in the art.

For example, in certain embodiments, a plurality of lipid conjugates is allowed to spontaneously form micelles in aqueous solution. The micelles are incubated with albumin, or a solution including albumin such as Fetal Bovine Serum (FBS). Samples can be analyzed, for example, by ELISA, size exclusion chromatography or other methods to determine if binding has occurred. Lipid conjugates can be selected as lymph node-targeting conjugates if in the presence of albumin, or a solution including albumin such as Fetal Bovine Serum (FBS), the micelles dissociate and the lipid conjugates bind to albumin as discussed above.

Examples of preferred lipids for use in lymph node targeting lipid conjugates include, but are not limited to, fatty acids with aliphatic tails of 8-30 carbons including, but not limited to, linear unsaturated and saturated fatty acids, branched saturated and unsaturated fatty acids, and fatty acids derivatives, such as fatty acid esters, fatty acid amides, and fatty acid thioesters, diacyl lipids, cholesterol, cholesterol derivatives, and steroid acids such as bile acids, Lipid A or combinations thereof. In some embodiments, the lipid is saturated. In some embodiments, the lipid comprises at least one lipid tail comprising 8-30, 12-30, 15-25, or 16-20 carbons.

In certain embodiments, the lipid is a diacyl lipid or two-tailed lipid. In some embodiments, the tails in the diacyl lipid contain from about 8 to about 30 carbons and can be saturated, unsaturated, or combinations thereof. In some embodiments, the diacyl lipid is saturated. In some embodiments, the diacyl lipid is saturated and each tail comprises about 8 to about 30 carbons. In some embodiments, the diacyl lipid is saturated and each tail comprises 12 carbons. In some embodiments, the diacyl lipid is saturated and each tail comprises 13 carbons. In some embodiments, the diacyl lipid is saturated and each tail comprises 14 carbons. In some embodiments, the diacyl lipid is saturated and each tail comprises 15 carbons. In some embodiments, the diacyl lipid is saturated and each tail comprises 16 carbons. In some embodiments, the diacyl lipid is saturated and each tail comprises 17 carbons. In some embodiments, the diacyl lipid is saturated and each tail comprises 18 carbons. In some embodiments, the diacyl lipid is saturated and each tail comprises 19 carbons. In some embodiments, the diacyl lipid is saturated and each tail comprises 20 carbons. In some embodiments, the diacyl lipid is saturated and each tail comprises 21 carbons. In some embodiments, the diacyl lipid is saturated and each tail comprises 22 carbons. In some embodiments, the diacyl lipid is saturated and each tail comprises 23 carbons. In some embodiments, the diacyl lipid is saturated and each tail comprises 24 carbons. In some embodiments, the diacyl lipid is saturated and each tail comprises 25 carbons. In some embodiments, the diacyl lipid is saturated and each tail comprises 26 carbons. In some embodiments, the diacyl lipid is saturated and each tail comprises 27 carbons. In some embodiments, the diacyl lipid is saturated and each tail comprises 28 carbons. In some embodiments, the diacyl lipid is saturated and each tail comprises 29 carbons. In some embodiments, the diacyl lipid is saturated and each tail comprises 30 carbons. The tails can be coupled to the head group via ester bond linkages, amide bond linkages, thioester bond linkages, or combinations thereof. In a particular embodiment, the diacyl lipids are phosphate lipids, glycolipids, sphingolipids, or combinations thereof.

In some embodiments, the lipid is 1,2-distearoyl-sn-glycero-3-phosphoethanolamine (DSPE). In some embodiments, a diacyl lipid is synthesized as described in U.S. Pat. No. 9,107,904, herein incorporated by reference in its entirety. In some embodiments, a diacyl lipid is synthesized as provided below:

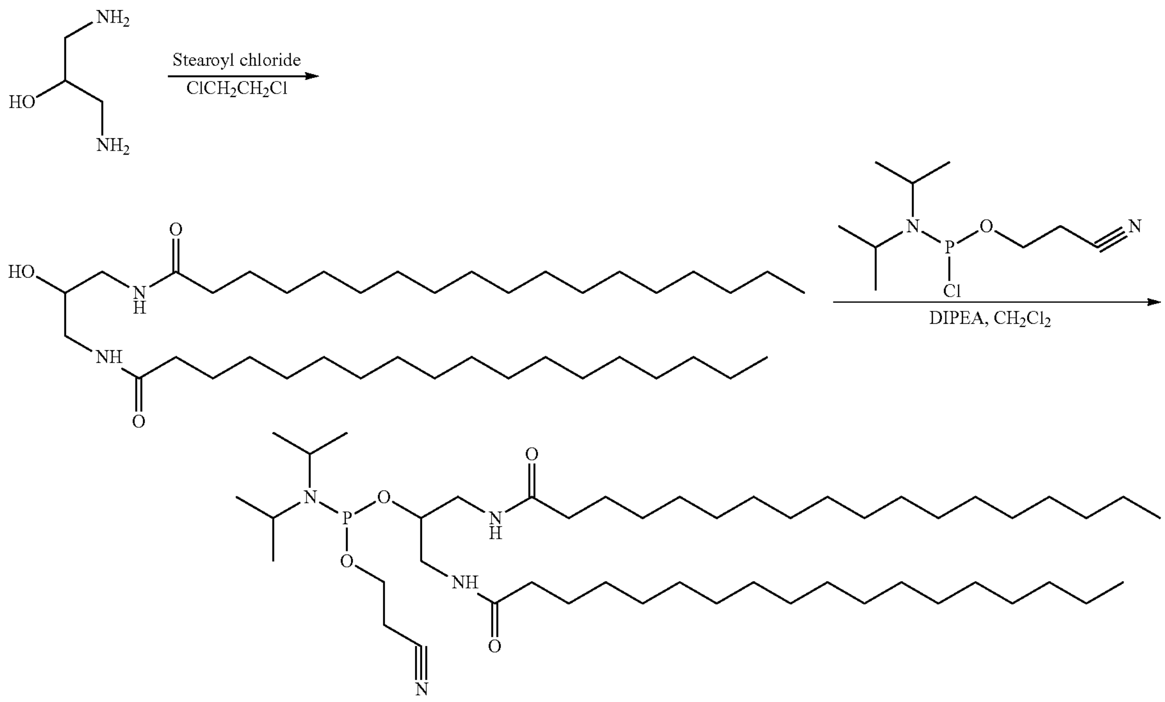

Preferably, lymph node-targeting conjugates include a lipid that is 8 or more carbon units in length. It is believed that increasing the number of lipid units can reduce insertion of the lipid into plasma membrane of cells, allowing the lipid conjugate to remain free to bind albumin and traffic to the lymph node.

For example, in some embodiments, the lipid can be a diacyl lipid composed of two C18 hydrocarbon tails. In certain embodiments, the lipid for use in preparing lymph node targeting lipid conjugates is not a single chain hydrocarbon (e.g., C18).

(ii) Molecular Adjuvants

In certain embodiments, amphiphilic oligonucleotide conjugates are used with the amphiphilic ligand conjugate. The oligonucleotide conjugates typically contain an immunostimulatory oligonucleotide.

In certain embodiments, the immunostimulatory oligonucleotide can serve as a ligand for pattern recognition receptors (PRRs). Examples of PRRs include the Toll-like family of signaling molecules that play a role in the initiation of innate immune responses and also influence the later and more antigen specific adaptive immune responses. Therefore, the oligonucleotide can serve as a ligand for a Toll-like family signaling molecule, such as Toll-Like Receptor 9 (TLR9).

For example, unmethylated CpG sites can be detected by TLR9 on plasmacytoid dendritic cells and B cells in humans (Zaida, et al., *Infection and Immunity,* 76(5):2123-2129, (2008)). Therefore, the sequence of oligonucleotide can include one or more unmethylated cytosine-guanine (CG or CpG, used interchangeably) dinucleotide motifs. The ‘p’ refers to the phosphodiester backbone of DNA, as discussed in more detail below, some oligonucleotides including CG can have a modified backbone, for example a phosphorothioate (PS) backbone.

In certain embodiments, an immunostimulatory oligonucleotide can contain more than one CG dinucleotide, arranged either contiguously or separated by intervening nucleotide(s). The CpG motif(s) can be in the interior of the oligonucleotide sequence. Numerous nucleotide sequences stimulate TLR9 with variations in the number and location of CG dinucleotide(s), as well as the precise base sequences flanking the CG dimers.

Typically, CG ODNs are classified based on their sequence, secondary structures, and effect on human peripheral blood mononuclear cells (PBMCs). The five classes are Class A (Type D), Class B (Type K), Class C, Class P, and Class S (Vollmer, J & Krieg, A M, *Advanced drug delivery reviews* 61(3): 195-204 (2009), incorporated herein by reference). CG ODNs can stimulate the production of Type I interferons (e.g., IFNα) and induce the maturation of dendritic cells (DCs). Some classes of ODNs are also strong activators of natural killer (NK) cells through indirect cytokine signaling. Some classes are strong stimulators of human B cell and monocyte maturation (Weiner, G L, PNAS USA 94(20): 10833-7 (1997); Dalpke, A H, Immunology 106(1): 102-12 (2002); Hartmann, G, J of Immun. 164(3): 1617-2 (2000), each of which is incorporated herein by reference).

According to some embodiments, a lipophilic-CpG oligonucleotide conjugate is used to enhance an immune response to an antigen. The lipophilic-CpG oligonucleotide is represented by the following, wherein “L” is a lipophilic compound, such as diacyl lipid, “$G_n$” is a guanine repeat linker and “n” represents 1, 2, 3, 4, or 5.

(SEQ ID NO: 137)
5'-L-$G_n$TCCATGACGTTCCTGACGTT-3'

Other PRR Toll-like receptors include TLR3, and TLR7 which may recognize double-stranded RNA, single-stranded and short double-stranded RNAs, respectively, and retinoic acid-inducible gene I (RIG-I)-like receptors, namely RIG-I and melanoma differentiation-associated gene 5 (MDA5), which are best known as RNA-sensing receptors in the cytosol. Therefore, in certain embodiments, the oligonucleotide contains a functional ligand for TLR3, TLR7, or RIG-I-like receptors, or combinations thereof.

Examples of immunostimulatory oligonucleotides, and methods of making them are known in the art, see for example, Bodera, P. *Recent Pat Inflamm Allergy Drug Discov.* 5(1):87-93 (2011), incorporated herein by reference.

In certain embodiments, the oligonucleotide cargo includes two or more immunostimulatory sequences.

The oligonucleotide can be between 2-100 nucleotide bases in length, including for example, 5 nucleotide bases in length, 10 nucleotide bases in length, 15 nucleotide bases in length, 20 nucleotide bases in length, 25 nucleotide bases in length, 30 nucleotide bases in length, 35 nucleotide bases in length, 40 nucleotide bases in length, 45 nucleotide bases in length, 50 nucleotide bases in length, 60 nucleotide bases in length, 70 nucleotide bases in length, 80 nucleotide bases in length, 90 nucleotide bases in length, 95 nucleotide bases in length, 98 nucleotide bases in length, 100 nucleotide bases in length or more.

The 3' end or the 5' end of the oligonucleotides can be conjugated to the polar block or the lipid. In certain embodiments the 5' end of the oligonucleotide is linked to the polar block or the lipid.

The oligonucleotides can be DNA or RNA nucleotides which typically include a heterocyclic base (nucleic acid base), a sugar moiety attached to the heterocyclic base, and a phosphate moiety which esterifies a hydroxyl function of the sugar moiety. The principal naturally-occurring nucleotides comprise uracil, thymine, cytosine, adenine and guanine as the heterocyclic bases, and ribose or deoxyribose sugar linked by phosphodiester bonds. In certain embodiments, the oligonucleotides are composed of nucleotide analogs that have been chemically modified to improve stability, half-life, or specificity or affinity for a target receptor, relative to a DNA or RNA counterpart. The chemical modifications include chemical modification of nucleobases, sugar moieties, nucleotide linkages, or combinations thereof. As used herein 'modified nucleotide" or "chemically modified nucleotide" defines a nucleotide that has a chemical modification of one or more of the heterocyclic base, sugar moiety or phosphate moiety constituents. In certain embodiments, the charge of the modified nucleotide is reduced compared to DNA or RNA oligonucleotides of the same nucleobase sequence. For example, the oligonucleotide can have low negative charge, no charge, or positive charge.

Typically, nucleoside analogs support bases capable of hydrogen bonding by Watson-Crick base pairing to standard polynucleotide bases, where the analog backbone presents the bases in a manner to permit such hydrogen bonding in a sequence-specific fashion between the oligonucleotide analog molecule and bases in a standard polynucleotide (e.g., single-stranded RNA or single-stranded DNA). In certain embodiments, the analogs have a substantially uncharged, phosphorus containing backbone.

(iii) Polar Block/Linker

For the conjugate to be trafficked efficiently to the lymph node, the conjugate should remain soluble. Therefore, in some embodiments a polar block linker is included between the cargo and the lipid to increase solubility of the conjugate. The polar block reduces or prevents the ability of the lipid to insert into the plasma membrane of cells, such as cells in the tissue adjacent to the injection site. The polar block can also reduce or prevent the ability of cargo, such as synthetic oligonucleotides containing a PS backbone, from non-specifically associating with extracellular matrix proteins at the site of administration. In some embodiments, the polar block increases the solubility of the conjugate without preventing its ability to bind to albumin. It is believed that this combination of characteristics allows the conjugate to bind to albumin present in the serum or interstitial fluid, and remain in circulation until the albumin is trafficked to, and retained in a lymph node. In some embodiments, the cargo functions as the polar block, and therefore a separate polar block is not required.

The length and composition of the polar block can be adjusted based on the lipid and cargo selected. For example, for oligonucleotide conjugates, the oligonucleotide itself may be polar enough to insure solubility of the conjugate, for example, oligonucleotides that are 10, 15, 20 or more nucleotides in length. Therefore, in certain embodiments, no additional polar block linker is required. However, depending on the amino acid sequence, some lipidated peptides can be essentially insoluble. In these cases, it can be desirable to include a polar block that mimics the effect of a polar oligonucleotide.

In some embodiments, a polar block is used as part of any of the lipid conjugates suitable for use in the methods disclosed herein, for example, amphiphilic oligonucleotide conjugates and amphiphilic ligand conjugates, which reduce cell membrane insertion/preferential portioning on albumin. In some embodiments, suitable polar blocks include, but are not limited to, oligonucleotides such as those discussed above, a hydrophilic polymer including but not limited to poly(ethylene glycol) (MW: 500 Da to 20,000 Da), polyacrylamide (MW: 500 Da to 20,000 Da), polyacrylic acid; a string of hydrophilic amino acids such as serine, threonine, cysteine, tyrosine, asparagine, glutamine, aspartic acid, glutamic acid, lysine, arginine, histidine, or combinations thereof polysaccharides, including but not limited to, dextran (MW: 1,000 Da to 2,000,000 Da), or combinations thereof.

In some embodiments, the polar block, whether a separate component or the cargo itself, provides solubility to the overall lipid conjugate based on the molecular weight of the polar block. For example, in some embodiments, a polar block having a molecular weight of 2,000 Da is sufficient to make the lipid conjugate soluble for albumin binding. In some embodiments, the polar block has a molecular weight of about 300 to about 20,000 Da. In some embodiments, the polar block has a molecular weight of about 1,000 to about 15,000 Da. In some embodiments, the polar block has a molecular weight of about 1,500 to about 10,000 Da. In some embodiments, the polar block has a molecular weight of about 2,000 to about 5,000 Da. In some embodiments, the polar block has a molecular weight of about 1,000 to about 2,500 Da. In some embodiments, the polar block has a molecular weight of about 1,000 to about 3,000 Da. In some embodiments, the polar block has a molecular weight of about 1,000 to about 3,500 Da. In some embodiments, the polar block has a molecular weight of about 1,000 to about 4,000 Da. In some embodiments, the polar block has a molecular weight of about 1,000 to about 5,000 Da. In some embodiments, the polar block has a molecular weight of about 5,000 to about 10,000 Da. In some embodiments, the polar block has a molecular weight of about 15,000 to about 20,000 Da.

In some embodiments, the hydrophobic lipid and the linker/cargo are covalently linked. In some embodiments, the covalent bond is a non-cleavable linkage or a cleavable linkage. In some embodiments, the non-cleavable linkage includes an amide bond or phosphate bond, and the cleavable linkage includes a disulfide bond, acid-cleavable linkage, ester bond, anhydride bond, biodegradable bond, or enzyme-cleavable linkage.

a. Ethylene Glycol Linkers

In certain embodiments, the polar block is one or more ethylene glycol (EG) units, more preferably two or more EG units (i.e., polyethylene glycol (PEG)). For example, in certain embodiments, a lipid conjugate includes a cargo (i.e., CAR ligand or molecular adjuvant) and a hydrophobic lipid linked by a polyethylene glycol (PEG) molecule or a derivative or analog thereof.

In certain embodiments, lipid conjugates suitable for use in the methods disclosed herein contain a CAR ligand linked to PEG which is in turn linked to a hydrophobic lipid, or lipid-Gn-ON conjugates, either covalently or via formation of protein-oligo conjugates that hybridize to oligo micelles. The precise number of EG units depends on the lipid and the cargo, however, typically, a polar block can have between about 1 and about 100, between about 20 and about 80, between about 30 and about 70, or between about 40 and about 60 EG units. In certain embodiments, the polar block has between about 45 and 55 EG, units. For example, in certain embodiments, the polar block has 48 EG units. In some embodiments, the polar block has at least 4, 5, 6, 7, 8, 9, or 10 EG units. In some embodiments, the polar block has 4 EG units. In some embodiments, the polar block has 8 EG units.

In some embodiments, the PEG molecule has a molecular weight of about 300-20,000 daltons. In some embodiments, the PEG molecule has a molecular weight of about 1,000 daltons. In some embodiments, the PEG molecule has a molecular weight of about 1,500 daltons. In some embodiments, the PEG molecule has a molecular weight of about 2,000 daltons. In some embodiments, the PEG molecule has a molecular weight of about 2,500 daltons. In some embodiments, the PEG molecule has a molecular weight of about 3,000 daltons. In some embodiments, the PEG molecule has a molecular weight of about 3,500 daltons. In some embodiments, the PEG molecule has a molecular weight of about 4,000 daltons. In some embodiments, the PEG molecule has a molecular weight of about 5,000 daltons. In some embodiments, the PEG molecule has a molecular weight of about 6,000 daltons. In some embodiments, the PEG molecule has a molecular weight of about 7,000 daltons. In some embodiments, the PEG molecule has a molecular weight of about 8,000 daltons. In some embodiments, the PEG molecule has a molecular weight of about 9,000 daltons. In some embodiments, the PEG molecule has a molecular weight of about 10,000 daltons. In some embodiments, the PEG molecule has a molecular weight of about 11,000 daltons. In some embodiments, the PEG molecule has a molecular weight of about 12,000 daltons. In some embodiments, the PEG molecule has a molecular weight of about 13,000 daltons. In some embodiments, the PEG molecule has a molecular weight of about 14,000 daltons. In some embodiments, the PEG molecule has a molecular weight of about 15,000 daltons. In some embodiments, the PEG molecule has a molecular weight of about 16,000 daltons. In some embodiments, the PEG molecule has a molecular weight of about 17,000 daltons. In some embodiments, the PEG molecule has a molecular weight of about 18,000 daltons. In some embodiments, the PEG molecule has a molecular weight of about 19,000 daltons. In some embodiments, the PEG molecule has a molecular weight of about 20,000 daltons.

b. Oligonucleotide Linkers

As discussed above, in certain embodiments, the polar block is an oligonucleotide. The polar block linker can have any sequence, for example, the sequence of the oligonucleotide can be a random sequence, or a sequence specifically chosen for its molecular or biochemical properties (e.g., highly polar). In certain embodiments, the polar block linker includes one or more series of consecutive adenine (A), cytosine (C), guanine (G), thymine (T), uracil (U), or analog thereof. In certain embodiments, the polar block linker consists of a series of consecutive adenine (A), cytosine (C), guanine (G), thymine (T), uracil (U), or analog thereof.

In certain embodiments, the linker is one or more guanines, for example between 1-10 guanines. It has been discovered that altering the number of guanines between a cargo such as a CpG oligonucleotide, and a lipid tail controls micelle stability in the presence of serum proteins. Therefore, the number of guanines in the linker can be selected based on the desired affinity of the conjugate for serum proteins such as albumin. When the cargo is a CpG immunostimulatory oligonucleotide and the lipid tail is a diacyl lipid, the number of guanines affects the ability of micelles formed in aqueous solution to dissociate in the presence of serum: 20% of the non-stabilized micelles (lipo-$G_0T_{10}$-CG) (SEQ ID NO: 138) were intact, while the remaining 80% were disrupted and bonded with FBS components. In the presence of guanines, the percentage of intact micelles increased from 36% (lipo-$G_2T_8$-CG) (SEQ ID NO: 139) to 73% (lipo-$G_4T_6$-CG) (SEQ ID NO: 140), and finally reached 90% (lipo-$G_6T_4$-CG) (SEQ ID NO: 141). Increasing the number of guanines to eight (lipo-$G_8T_2$-CG) (SEQ ID NO: 142) and ten (lipo-$G_{10}T_0$-CG) (SEQ ID NO: 143) did not further enhance micelle stability.

Therefore, in certain embodiments, the linker in a lymph node-targeting conjugate suitable for use in the methods disclosed herein can include 0, 1, or 2 guanines. As discussed in more detail below, linkers that include 3 or more consecutive guanines can be used to form micelle-stabilizing conjugates with properties that are suitable for use in the methods disclosed herein.

C. Exemplary Amphiphilic Lipid Conjugates

In some embodiments, the disclosure provides an amphiphilic ligand conjugate comprising an albumin-binding lipid operably linked to a CAR ligand. In some embodiments, the CAR ligand is an anti-CD19 CAR ligand described herein. In some embodiments, the anti-CD19 CAR ligand is operably linked to the lipid via polar block linker. In some embodiments, the anti-CD19 CAR ligand is operably linked to the lipid at its N-terminus. In some embodiments, the anti-CD19 CAR ligand is operably linked to the lipid at its C-terminus. In some embodiments, the lipid is a diacyl lipid. In some embodiments, the diacyl lipid comprises acyl chains comprising 12-30 hydrocarbon units, 14-25 hydrocarbon units, 16-20 hydrocarbon units, or 12, 13, 14, 15, 16, 17, 18, 19, 20, 21, 22, 23, 24, 25, 26, 27, 28, 29 or 30 hydrocarbon units. In some embodiments, the lipid is DSPE. In some embodiments, the polar block linker comprises "N" consecutive ethylene glycol units. In some embodiments, N is about 25, 30, 35, 40, 45, or 50. In some embodiments, the lipid is DSPE, and the polar block linker is PEG2000.

In some embodiments, the amphiphilic ligand conjugate comprises an albumin-binding lipid operably linked to a multimer of CAR ligands, wherein each CAR ligand is operably linked to the lipid via a polar block linker. As described herein, the CAR ligand multimer is constructed in such a manner that multiple CAR ligands are displayed on a single conjugate to have a spatial and/or structural arrangement that allows for binding to multiple CAR antigen-recognition domains simultaneously or synchronously, e.g., the multiple antigen-recognition domains present on a complex of CAR molecules on the surface of a CAR-expressing cell. In some embodiments, the multimer is a dimer, a trimer, a tetramer, etc. of a CAR ligand described herein.

In some embodiments, the amphiphilic ligand conjugate comprises an albumin-binding lipid operably linked to a dimer of CAR ligands. In some embodiments, the dimer comprises a first CAR ligand and a second CAR ligand. In some embodiments, the first CAR ligand is operably linked to the lipid via a first polar block linker, and the second CAR ligand is operably linked to the lipid via second polar block linker. In some embodiments, the first CAR ligand and the second CAR ligand are the same. In some embodiments, the first CAR ligand and the second CAR ligand are different.

In some embodiments, the first CAR ligand is attached to the first polar block linker via its N-terminus. In some embodiments, the first CAR ligand is attached to the first polar block linker via its C-terminus. In some embodiments, the second CAR ligand is attached to the second polar block linker via its N-terminus. In some embodiments, the second CAR ligand is attached to the second polar block linker via its C-terminus.

In some embodiments, the first polar block linker comprises "N" consecutive ethylene glycol units. In some embodiments, N of the first polar block linker is at least about 4, 6, 8, 10, 12, 14, 16, 18, 20, 25, 30, 35, 40, 45, or 50. In some embodiments, N of the first polar block linker is 4. In some embodiments, N of the first polar block linker is 8. In some embodiments, the second polar block linker comprise "N" consecutive ethylene glycol units. In some embodiments, N of the second polar block linker is at least about 4, 6, 8, 10, 12, 14, 16, 18, 20, 25, 30, 35, 40, 45, or 50. In some embodiments, N of the second polar block linker is 4. In some embodiments, N of the second polar block linker is 8. In some embodiments, the first polar block linker and the second polar block linker are the same. In some embodiments, the first polar block linker and the second polar block linker are different. In some embodiments, the first polar block linker and the second polar block linker are each PEG4, and the lipid is DSPE. In some embodiments, the first polar block linker and the second polar block linker are each PEG8, and the lipid is DSPE.

In some embodiments, the first polar block linker and the second polar block linker are each covalently linked to the lipid via a hetertrifunctional group. In some embodiments, the hetertrifunctional group comprises (i) a first reactive group, wherein the first reactive group is covalently linked to a carbon atom, nitrogen atom, phosphate atom, oxygen atom, or sulfur atom present on the head group of the lipid; (ii) a second reactive group, wherein the second reactive group is covalently linked to a carbon atom, nitrogen atom, phosphate atom, oxygen atom, or sulfur atom present on the first polar block linker; and (iii) a third reactive group, wherein the second reactive group is covalently linked to a carbon atom, nitrogen atom, phosphate atom, oxygen atom, or sulfur atom present on the second polar block linker. In some embodiments, the first reactive group is a carboxyl group. In some embodiments, the second reactive group and the third reactive group are each an amine group. In some embodiments, the hetertrifunctional group is lysine.

In some embodiments, the disclosure provides an amphiphilic ligand conjugate comprising (i) a dimer of a CAR ligand described herein, wherein the dimer comprises a first CAR ligand and a second CAR ligand; and (ii) a lipid that is operably linked to (a) the N-terminus or the C-terminus of the first CAR ligand via a first polar block linker, and (b) the N-terminus or the C-terminus of the second CAR ligand via a second polar block linker, wherein the lipid is linked to the first polar block linker and the second polar block linker via a heterotrifunctional group comprising a first reactive group, a second reactive group, and a third reactive group, wherein the first reactive group is operably linked to the lipid head group, wherein the second reactive group is operably linked to the first polar block linker, and wherein the third reactive group is operably linked to the second polar block linker.

In some embodiments, the disclosure provides an amphiphilic ligand conjugate comprising (i) a dimer of a CAR ligand described herein, wherein the dimer comprises a first CAR ligand and a second CAR ligand; and (ii) a lipid that is operably linked to (a) the N-terminus or the C-terminus of the first CAR ligand via a first PEG linker, and (b) the N-terminus or the C-terminus of the second CAR ligand via a second PEG linker, wherein the lipid is linked to the first PEG linker and the second PEG linker via a heterotrifunctional group comprising a first reactive group, a second reactive group, and a third reactive group, wherein the first reactive group is operably linked to the lipid head group, wherein the second reactive group is operably linked to the first PEG linker, and wherein the third reactive group is operably linked to the second PEG linker. In some embodiments, the first PEG linker comprises N consecutive ethylene glycol groups, wherein N is about 4, 6, 8, 10, 12, 14, 16, 18, 20, 22, 24, 26, 28, 30, 32, 34, 36, 38, 40, 42, 44, 46, 48, or 50. In some embodiments, the second PEG linker comprises N consecutive ethylene glycol groups, wherein N is about 4, 6, 8, 10, 12, 14, 16, 18, 20, 22, 24, 26, 28, 30, 32, 34, 36, 38, 40, 42, 44, 46, 48, or 50.

In some embodiments, the disclosure provides an amphiphilic ligand conjugate comprising (i) a dimer of a CAR ligand described herein, wherein the dimer comprises a first CAR ligand and a second CAR ligand; and (ii) a lipid that is operably linked to (a) the N-terminus or the C-terminus of the first CAR ligand via a first polar block linker, and (b) the N-terminus or the C-terminus of the second CAR ligand via a second polar block linker, wherein the lipid is linked to the first polar block linker and the second polar block linker via lysine, wherein the lipid head group is linked to lysine via its carboxyl group, wherein the first polar block linker is linked to the lysine via is α-amine, and wherein the second polar block linker is linked to the lysine via is ε-amine.

In some embodiments, the disclosure provides an amphiphilic ligand conjugate comprising (i) a dimer of a CAR ligand described herein, wherein the dimer comprises a first CAR ligand and a second CAR ligand; and (ii) a lipid that is operably linked to (a) the N-terminus or the C-terminus of the first CAR ligand via a first PEG linker, and (b) the N-terminus or the C-terminus of the second CAR ligand via a second PEG linker, wherein the lipid is linked to the first PEG linker and the second PEG linker via lysine, wherein the lipid head group is linked to lysine via its carboxyl group, wherein the first PEG linker is linked to the lysine via is α-amine, and wherein the second PEG linker is linked to the lysine via is ε-amine. In some embodiments, the first PEG linker comprises N consecutive ethylene glycol groups, wherein N is about 4, 6, 8, 10, 12, 14, 16, 18, 20, 22, 24, 26, 28, 30, 32, 34, 36, 38, 40, 42, 44, 46, 48, or 50. In some embodiments, the second PEG linker comprises N consecutive ethylene glycol groups, wherein N is about 4, 6, 8, 10, 12, 14, 16, 18, 20, 22, 24, 26, 28, 30, 32, 34, 36, 38, 40, 42, 44, 46, 48, or 50.

D. Immunogenic Compositions

The amphiphilic ligand conjugates suitable for use in the methods disclosed herein can be used in immunogenic compositions or as components in vaccines. Typically, the immunogenic compositions disclosed herein include an amphiphilic ligand conjugate, an adjuvant, or a combination thereof. The combination of an adjuvant and an amphiphilic ligand conjugate can be referred to as a vaccine. When administered to a subject in combination, the adjuvant and amphiphilic ligand conjugate can be administered in separate pharmaceutical compositions, or they can be administered together in the same pharmaceutical composition. In some embodiments, the adjuvant is a lipid conjugate or an amphiphilic conjugate.

In some embodiments, an immunogenic composition suitable for use in the methods disclosed herein includes an amphiphilic ligand conjugate administered alone, or in combination with an adjuvant. In some embodiments, the adjuvant is without limitation alum (e.g., aluminum hydroxide, aluminum phosphate); saponins purified from the bark of the *Q. saponaria* tree such as QS21 (a glycolipid that elutes in the 21st peak with HPLC fractionation; Antigenics, Inc., Worcester, Mass.); poly[di(carboxylatophenoxy)phosphazene (PCPP polymer; Virus Research Institute, USA), Flt3 ligand, *Leishmania* elongation factor (a purified *Leishmania* protein; Corixa Corporation, Seattle, Wash.), ISCOMS (immunostimulating complexes which contain mixed saponins, lipids and form virus-sized particles with pores that can hold antigen; CSL, Melbourne, Australia), Pam3Cys, SB-AS4 (SmithKline Beecham adjuvant system #4 which contains alum and MPL; SBB, Belgium), non-ionic block copolymers that form micelles such as CRL 1005 (these contain a linear chain of hydrophobic polyoxypropylene flanked by chains of polyoxyethylene, Vaxcel, Inc., Norcross, Ga.), and Montanide IMS (e.g., IMS 1312, water-based nanoparticles combined with a soluble immunostimulant, Seppic).

In some embodiments, an adjuvant is a TLR ligand, such as those discussed above. In some embodiments, adjuvants that act through TLR3 include, without limitation, double-stranded RNA. In some embodiments, adjuvants that act through TLR4 include, without limitation, derivatives of lipopolysaccharides such as monophosphoryl lipid A (MPLA; Ribi ImmunoChem Research, Inc., Hamilton, Mont.) and muramyl dipeptide (MDP; Ribi) and threonyl-muramyl dipeptide (t-MDP; Ribi); OM-174 (a glucosamine disaccharide related to lipid A; OM Pharma SA, Meyrin, Switzerland). In some embodiments, adjuvants that act through TLR5 include, without limitation, flagellin. In some embodiments, adjuvants that act through TLR7 and/or TLR8 include single-stranded RNA, oligoribonucleotides (ORN), synthetic low molecular weight compounds such as imidazoquinolinamines (e.g., imiquimod (R-837), resiquimod (R-848)). In some embodiments, adjuvants acting through TLR9 include DNA of viral or bacterial origin, or synthetic oligodeoxynucleotides (ODN), such as CpG ODN. In some embodiments, another adjuvant class is phosphorothioate containing molecules such as phosphorothioate nucleotide analogs and nucleic acids containing phosphorothioate backbone linkages.

In some embodiments, the adjuvant is selected from oil emulsions (e.g., Freund's adjuvant); saponin formulations; virosomes and viral-like particles; bacterial and microbial derivatives; immunostimulatory oligonucleotides; ADP-ribosylating toxins and detoxified derivatives; alum; BCG; mineral-containing compositions (e.g., mineral salts, such as aluminum salts and calcium salts, hydroxides, phosphates, sulfates, etc.); bioadhesives and/or mucoadhesives; microparticles; liposomes; polyoxyethylene ether and polyoxyethylene ester formulations; polyphosphazene; muramyl peptides; imidazoquinolone compounds; and surface active substances (e.g. lysolecithin, pluronic polyols, polyanions, peptides, oil emulsions, keyhole limpet hemocyanin, and dinitrophenol).

In some embodiments, an adjuvant is selected from immunomodulators such as cytokines, interleukins (e.g., IL-1, IL-2, IL-4, IL-5, IL-6, IL-7, IL-12, etc.), interferons (e.g., interferon-.gamma.), macrophage colony stimulating factor, and tumor necrosis factor.

In some embodiments, the adjuvant is an amphiphilic oligonucleotide conjugate comprising an immunostimulatory oligonucleotide, as described supra.

In some embodiments, the adjuvant is a STING (STimulator of Interferon Genes) agonist. The STING signaling pathway in immune cells is a central mediator of innate immune response and when stimulated, induces expression of various interferons, cytokines and T cell recruitment factors that amplify and strengthen immune activity. Recent work has shown that STING agonists are effective adjuvants and efficiently elicit an immune response, described, for example in Dubensky, T., et al., *Therapeutic Advances in Vaccines*, Vol. 1(4): 131-143 (2013); and Hanson, M., et al., *The Journal of Clinical Investigation*, Vol. 125 (6): 2532-2546 (2015), hereby incorporated by reference.

In some embodiments, a STING agonist is a cyclic dinucleotide. In certain embodiments, cyclic dinucleotides include, but are not limited to, cdAMP, cdGMP, cdIMP, c-AMP-GMP, c-AMP-IMP, and c-GMP-IMP, and analogs thereof including, but not limited to, phosphorothioate analogues. In some embodiments, suitable cyclic dinucleotides for use in the present disclosure are described in some detail in, e.g., U.S. Pat. Nos. 7,709,458 and 7,592,326; WO 2007/054279; US 2014/0205653; and Yan et al. Bioorg. Med. Chem Lett. 18: 5631 (2008), each of which is hereby incorporated by reference.

In certain embodiments, a STING agonist is chemically synthesized. In certain embodiments, a STING agonist is an analog of a naturally occurring cyclic dinucleotide. STING agonists, including analogs of cyclic dinucleotides, suitable for use in the disclosure are provided in U.S. Pat. Nos. 7,709,458 and 7,592,326; and US 2014/0205653.

III. Fusion Proteins

In some embodiments, the disclosure provides a fusion protein comprising a CAR ligand described herein and a tumor-targeting domain. In some embodiments, the tumor-targeting domain is a tumor-targeting antibody or fragment thereof.

In some embodiments, a fusion protein comprising a CAR ligand comprises more than one tumor-targeting domain. In some embodiments, a fusion protein comprising a CAR ligand comprises more than one CAR ligand and a tumor-targeting domain. In some embodiments, a fusion protein comprising a CAR ligand comprises more than one CAR ligand and more than one tumor-targeting domain.

In some embodiments, the fusion proteins described herein can be used to re-direct CAR cell responses to one or more alternate tumor-associated antigens. In some embodiments, fusion proteins comprising the CAR ligand are used to redirect antigen recognition of CAR expressing cells (e.g., CAR T cells, CAR NK cells, CAR macrophage cells, CAR NKT cells). For example, in some embodiments, a CAR cell that binds a first tumor-associated antigen can be retargeted to an alternate tumor-associated antigen using a fusion protein of the disclosure.

Tumor-targeting domains, e.g., tumor-targeting antibodies or fragments thereof, can bind any of the tumor antigens described infra. Methods for generating such tumor-targeting domains are also described herein and known to those of skill in the art.

Methods for generating fusion proteins are known to those of skill in the art and are described herein.

Method of Making Chimeric Antigen Receptor Ligands

In some aspects, the disclosure provides methods for making CAR ligands. In some embodiments, the method comprises selection of CAR ligands from a peptide library. In some embodiments, the method comprises (i) preparation of a peptide library; and (ii) selection of one or more peptide ligands that binds the antigen-recognition domain of a CAR described herein. In some embodiments, the method further comprises optimization of peptide ligand affinity, specificity, and/or stability towards proteolytic degradation.

Suitable methods for generating peptide libraries are known in the art. In some embodiments, the peptide library is a synthetic peptide library, such as a combinatorial library. In some embodiments, the synthetic peptide library is prepared using a solid support, wherein parallel manual or automated amino acid synthesis of individual peptide sequences is performed on a functionalized membrane or polymeric bead (see, e.g., Wang, et al *CURR. TOP. PEPT. PROTEIN RES.* (2014) 15:1). In some embodiments, the synthetic peptide library is prepared using SPOT synthesis, wherein solutions of activated amino acids are delivered as small drops to distinct points on a solid surface (e.g., a functionalized cellulose membrane, glass slide) forming a pattern of small spots. Synthetic peptides are constructed in a stepwise manner using standard manual or automated Fmoc-based peptide chemistry (see, e.g., Hilpert, et al *NAT. PROTOC.* (2007) 2:1333).

In some embodiments, the peptide library is an in vitro biological peptide library, wherein propagation of the library occurs in the absence of living cells. Non-limiting examples of methods for generating an in vitro biological peptide library include a ribosome display library, an mRNA display library, a CIS display library, or a CAD display library (see, e.g., He, et al *NUCLEIC ACIDS RES.* (1997) 25:5132; Hanes, et al *PNAS* (1997) 94:4937; Roberts, et al PNAS (1997) 94:12297; Mattheakis, et al *PNAS* (1994) 91:9022; Mattheakis, et al *METHODS ENZYMOL* (1996) 267:195).

In some embodiments, the peptide library is a cellular library. As used herein, a "cellular library" refers to a library comprising many unique variable peptides (e.g., at least $10^6$, $10^7$, $10^8$, $10^9$, $10^{10}$, $10^{11}$, or $10^{12}$ unique variable peptides), wherein each variable peptide is expressed as a recombinant polypeptide operably-linked to an adhesion protein that is displayed by a natural carrier. Preparation of the library requires transformation of a population of host cells with a library of vectors encoding the recombinant variable peptides. Each individual host cell is transformed with a single vector encoding a variable peptide. The population of host cells comprises the cellular library, wherein each host cell expresses a unique variable peptide. In some embodiments, a suitable natural carrier is a virus generated by the host cell or is the host cell. In some embodiments, the adhesion protein is a polypeptide that is displayed or anchored on the surface of the natural carrier. For example, in some embodiments, the adhesion protein is a viral coat protein and the natural carrier is a virus (e.g., bacteriophage). In some embodiments, the adhesion protein is a cell wall protein or a polypeptide that adheres to a cell wall protein and the natural carrier is a yeast cell. In some embodiments, the adhesion protein is an outer membrane protein and the natural carrier is a gram-negative bacteria. In some embodiments, the adhesion protein is a cell wall protein and the natural carrier is a gram-positive bacteria. In some embodiments, the adhesion protein comprises a signal sequence that directs efficient transport of the fusion protein to the cell surface, wherein the variable peptide is immobilized and accessible to the extracellular space.

In some embodiments, the cellular library is a phage display library, a viral display library, a yeast display library, a bacterial display library, a mammalian cell display library, or an insect cell display library.

In some embodiments, the cellular library is a phage display library. Phage display refers to a technique by which variant polypeptides are displayed as fusion proteins to a coat protein on the surface of phage particles (see, e.g., Scott, et al *SCIENCE* (1990) 249:386). Methods for identifying peptide ligands using phage display methods are well known in the art (see, e.g., Cwirla et al *PROC. NATL. ACAD. SCI* (1990) 87:6378). Such methods enable selection of high-affinity peptide ligands (e.g., sub-nanomolar to submicromolar binders) from a large library of randomized polypeptide variants (e.g., $10^{11}$, $10^{12}$ unique polypeptide variants). Furthermore, the phenotype of the phage particle, including the displayed variable peptide, corresponds to the genotype of the phage particle (e.g., as encoded by DNA enclosed by the phage coat proteins), enabling straightforward identification of peptide ligands selected from the phage library.

In some embodiments, the phage display library comprises display of variable peptides sequences on the surface of phage particles which carry the synthetic polynucleotide sequences encoding them. In some embodiments, the phage display library is prepared by constructing a library of replicable expression vectors, wherein the expression vectors comprise a transcription regulatory element operably linked to a gene fusion, wherein the gene fusion comprises a synthetic polynucleotide encoding a variable peptide operably-linked to a polynucleotide encoding a phage coat protein or fragment thereof. In some embodiments, the method further comprises (i) transforming suitable host cells with the library of replicable expression vectors, and (ii) culturing the transformed host cells under conditions suitable for forming recombinant phage or phagemid virus particles comprising a least a portion of the expression vector and capable of transforming the host, so that the particles display one or more copies of the fusion protein on the surface of the particle.

In some embodiments, the phage used are filamentous phage. In some embodiments, a suitable phage is a M13, f1, fd, Pf3 phage or a derivative thereof, In some embodiments, the variable peptide is expressed as a recombinantly fused polypeptide to any of the phage coat proteins. In some embodiments, the coat protein is pIII, pVIII, or pIX.

Suitable methods for generating a phage library includes any described in U.S. Pat. Nos. 5,223,409; 5,403,484; 5,571,689; 5,663,143; 5,723,286; 5,432,018; 5,580,717; 5,427,908; 5,498,530; 5,770,434; 5,734,018; 5,698,426; 5,763,192, and 5,723,323 which are each incorporated by reference herein. Exemplary methods for use of phage display methods to generate peptide libraries are disclosed in Smith, G. P. *SCIENCE* (1985) 228:1315; Kehoe, J. et al *CHEM REV* (2005) 105:4056; Rondot, et al *NAT. BIOTECHNOL.* (2001) 19:75; WO 00/77194; which are each incorporated by reference herein.

In some embodiments, a method for producing a CAR ligand described herein comprises preparation of a cellular library, wherein preparation of the cellular library comprises (i) preparation of a library of vectors, wherein each vector comprises a synthetic polynucleotide that encodes a variable peptide operably-linked to an adhesion protein; (ii) transforming a population of cells with the library of vectors; and (iii) maintaining the population of cells under conditions that induce expression of the synthetic polynucleotide in a plurality of transformed cells.

In some embodiments, the method further comprises a selection process, wherein the selection comprises isolation and/or enrichment of clones expressing a variable peptide that binds a CAR antigen-recognition domain. In some embodiments, the selection process comprises successive rounds of selection for clones expressing variable peptides having a desired affinity (e.g., $K_D$ $10^{-6}$, $10^{-7}$, $10^{-8}$, $10^{-9}$, $10^{-10}$ M) and/or desired binding characteristics (e.g., selective binding) for the antigen-recognition domain of a CAR described herein. In some embodiments, the selection comprises selection of clones expressing variable peptide having a desired rate of dissociation when bound to the antigen-recognition domain of a CAR described herein.

Synthetic Polynucleotides

The disclosure provides methods for preparation of a peptide library, wherein the library comprises synthetic polynucleotides that encode a diverse set of variable peptide sequences. In some embodiments, the diversity of the peptide library is sufficient such that the library comprises at least one variable peptide that binds the antigen recognition domain of a CAR disclosed herein with a binding affinity ($K_D$) of 5 μM or lower. As used herein, the "diversity" of the library refers to the size of the library, i.e., the number of unique variable peptide sequences encoded by synthetic polynucleotides present in the library.

In some embodiments, the peptide library comprises synthetic polynucleotides that encode at least $1\times10^6$ unique variable peptide sequences. In some embodiments, the peptide library comprises synthetic polynucleotides that encode at least $5\times10^6$ unique variable peptide sequences. In some embodiments, the peptide library comprises synthetic polynucleotides that encode at least $1\times10^7$ unique variable peptide sequences. In some embodiments, the peptide library comprises synthetic polynucleotides that encode at least $5\times10^7$ unique variable peptide sequences. In some embodiments, the peptide library comprises synthetic polynucleotides that encode at least $1\times10^8$ unique variable peptide sequences. In some embodiments, the peptide library comprises synthetic polynucleotides that encode at least $5\times10^8$ unique variable peptide sequences. In some embodiments, the peptide library comprises synthetic polynucleotides that encode at least $1\times10^9$ unique variable peptide sequences. In some embodiments, the peptide library comprises synthetic polynucleotides that encode at least $5\times10^9$ unique variable peptide sequences. In some embodiments, the peptide library comprises synthetic polynucleotides that encode at least $1\times10^{10}$ unique variable peptide sequences.

In some embodiments, the peptide library comprises synthetic polynucleotides that encode about $1\times10^6$ to about $5\times10^6$ unique variable peptide sequences. In some embodiments, the peptide library comprises synthetic polynucleotides that encode about $5\times10^6$ to about $1\times10^7$ unique variable peptide sequences. In some embodiments, the peptide library comprises synthetic polynucleotides that encode about $1\times10^7$ to about $5\times10^7$ unique variable peptide sequences. In some embodiments, the peptide library comprises synthetic polynucleotides that encode about $5\times10^7$ to about $1\times10^8$ unique variable peptide sequences. In some embodiments, the peptide library comprises synthetic polynucleotides that encode about $1\times10^8$ to about $5\times10^8$ unique variable peptide sequences. In some embodiments, the peptide library comprises synthetic polynucleotides that encode about $5\times10^8$ to about $1\times10^9$ unique variable peptide sequences. In some embodiments, the peptide library comprises synthetic polynucleotides that encode about $1\times10^8$ to about $1\times10^9$ unique variable peptide sequences. In some embodiments, the peptide library comprises synthetic polynucleotides that encode about $1\times10^9$ to about $5\times10^9$ unique variable peptide sequences. In some embodiments, the peptide library comprises synthetic polynucleotides that encode about $5\times10^9$ to about $1\times10^{10}$ unique variable peptide sequences.

In some embodiments, the library comprises synthetic polynucleotides encoding variable peptide sequences, wherein the length of the encoded variable peptide sequences are at least 5, at least 6, at least 7, at least 8, at least 9, at least 10, at least 11, at least 12, at least 13, at least 14, at least 15, at least 16, at least 17, at least 18, at least 19 or at least 20 amino acid residues. In some embodiments, the length of the encoded variable peptide sequences is no more than about 100, about 95, about 90, about 85, about 80, about 75, about 70, about 65, about 60, about 55, about 50, about 45, about 40, about 35, about 30, about 25, or about 20 amino acid residues.

In some embodiments, the length of the encoded variable peptide sequences is about 5 amino acid residues. In some embodiments, the length of the encoded variable peptide sequences is about 6 amino acid residues. In some embodiments, the length of the encoded variable peptide sequences is about 7 amino acid residues. In some embodiments, the length of the encoded variable peptide sequences is about 8 amino acid residues. In some embodiments, the length of the encoded variable peptide sequences is about 9 amino acid residues. In some embodiments, the length of the encoded variable peptide sequences is about 10 amino acid residues. In some embodiments, the length of the encoded variable peptide sequences is about 11 amino acid residues. In some embodiments, the length of the encoded variable peptide sequences is about 12 amino acid residues. In some embodiments, the length of the encoded variable peptide sequences is about 13 amino acid residues. In some embodiments, the length of the encoded variable peptide sequences is about 14 amino acid residues. In some embodiments, the length of the encoded variable peptide sequences is about 15 amino acid residues. In some embodiments, the length of the encoded variable peptide sequences is about 16 amino acid residues. In some embodiments, the length of the encoded variable peptide sequences is about 17 amino acid residues. In some embodiments, the length of the encoded variable peptide sequences is about 18 amino acid residues. In some embodiments, the length of the encoded variable peptide sequences is about 19 amino acid residues. In some embodiments, the length of the encoded variable peptide sequences is about 20 amino acid residues.

In some embodiments, a method of preparing a peptide library of the disclosure comprises (i) generating synthetic polynucleotides that encode the variable peptides, wherein the variable peptides are encoded by one or more degenerate codons; (ii) generating a gene fusion comprising the polynucleotide sequence encoding the variable peptide operably-linked to a polynucleotide encoding an adhesion protein; (iii) constructing expression vectors that comprise the gene fusion; (iv) transforming the vectors into host cells; and (v) maintaining the host cells under conditions that induce expression of the gene fusion.

In some embodiments, a method of preparing a peptide library of the disclosure comprises (i) generating synthetic polynucleotides that encode the variable peptides, wherein one or more amino acid residues of the variable peptide are fixed (i.e., the amino acid residue is present at the same position in each variable peptide of the peptide library), and wherein remaining amino acid residues of the variable peptide are each encoded by a degenerate codon; (ii) generating a gene fusion comprising the polynucleotide encoding the variable peptide operably-linked to a polynucleotide encoding an adhesion protein; (iii) constructing expression vectors that comprise the gene fusion; (iv) transforming the vectors into host cells; and (v) maintaining the host cells under conditions that induce expression of the gene fusion.

In some embodiments, synthetic polynucleotides that encode the variable peptides are synthesized using a method of oligonucleotide synthesis. Methods of oligonucleotide synthesis are well-known in the art. Typically, oligonucleotide synthesis comprises manual or automated solid-phase synthesis of oligonucleotides using phosphoramidite linking chemistry. The oligonucleotides are built from phosphoramidite building blocks using sequential rounds of protecting group removal, coupling, and oxidation. Phosphoramidite building blocks include those derived from protected 2'-deoxynucleosides: 2'-deoxyadenosine phosphoramidite (dA), 2'-deoxycytidine phosphoramidite (dC), 2'-deoxyguanosine phosphoramidite (dG), and 2'-deoxythymidine phosphoramidite (dT). Modified phosphoramidite are also used for oligonucleotide synthesis, such as 2'-OMe phosphoramidites and 2'-fluoro phosphoramidites.

As used herein, a "degenerate codon" refers to a three-base pair combination that encodes an amino acid residue, wherein the base pair in each position is incorporated during oligonucleotide synthesis from mixtures of nucleotides.

In some embodiments, wherein the base pair is designated as "R", the base-pair incorporated during oligonucleotide synthesis is derived from a mixture of dA and dG. In some embodiments, the mixture is about 50% dA and about 50% dG.

In some embodiments, wherein the base pair is designated as "Y", the base-pair incorporated during oligonucleotide synthesis is derived from a mixture of dC and dT. In some embodiments, the mixture is about 50% dC and about 50% dT.

In some embodiments, wherein the base pair is designated as "M", the base-pair incorporated during oligonucleotide synthesis is derived from a mixture of dA and dC. In some embodiments, the mixture is about 50% dA and about 50% dC.

In some embodiments, wherein the base pair is designated as "K", the base-pair incorporated during oligonucleotide synthesis is derived from a mixture of dG and dT. In some embodiments, the mixture is about 50% dG and about 50% dT.

In some embodiments, wherein the base pair is designated as "S", the base-pair incorporated during oligonucleotide synthesis is derived from a mixture of dG and dC. In some embodiments, the mixture is about 50% dG and about 50% dC.

In some embodiments, wherein the base pair is designated as "W", the base-pair incorporated during oligonucleotide synthesis is derived from a mixture of dA and dT. In some embodiments, the mixture is about 50% dA and about 50% dT.

In some embodiments, wherein the base pair is designated as "H", the base-pair incorporated during oligonucleotide synthesis is derived from a mixture of dA and dC. In some embodiments, the mixture is about 33% dA, about 33% dC, and about 33% dT.

In some embodiments, wherein the base pair is designated as "B", the base-pair incorporated during oligonucleotide synthesis is derived from a mixture of dG, dC, and dT. In some embodiments, the mixture is about 33% dG, about 33% dC, and about 33% dT.

In some embodiments, wherein the base pair is designated as "V", the base-pair incorporated during oligonucleotide synthesis is derived from a mixture of dA, dC, and dG. In some embodiments, the mixture is about 33% dA, about 33% dC, and about 33% dG.

In some embodiments, wherein the base pair is designated as "D", the base-pair incorporated during oligonucleotide synthesis is derived from a mixture of dA, dG, and dT. In some embodiments, the mixture is about 33% dA, about 33% dG, and about 33% dT.

In some embodiments, wherein the base pair is designated as "N", the base-pair incorporated during oligonucleotide synthesis is derived from a mixture of dA, dC, dG, and dT. In some embodiments, the mixture is about 25% dA, about 25% dC, about 25% dG, and about 25% dT.

In some embodiments, wherein the degenerate codon is designated as "NNN", the oligonucleotide sequence is prepared by sequential addition of base pairs, wherein the first base pair is derived from a mixture of dA, dC, dG, and dT; the second base pair is derived from a mixture of dA, dC, dG, and dT; and the third base pair is derived from a mixture of dA, dC, dG, and dT. In some embodiments, the degenerate codon "NNN" is synthesized as (N1:25252525)(N2:25252525)(N3:25252525), wherein the first, second, and third position of the three-base pair oligonucleotide are each derived from equal mixtures of about 25% dA, about 25% dC, about 25% dG, and about 25% dT. In some embodiments, the one or more positions of the three-base pair oligonucleotide are derived from unequal mixtures of dA, dC, dG, and dT. As a non-limiting example, the degenerate codon "NNN" is synthesized as (N1:20202040)(N2:20202040)(N3: 20202040), wherein the first, second, and third position of the three-base pair oligonucleotide are each derived from mixtures of about 20% dA, about 20%, dC, about 20% dG, and about 40% dT.

In some embodiments, wherein the degenerate codon is designated as "NNK", the oligonucleotide sequence is prepared by sequential addition of base pairs, wherein the first base pair is derived from a mixture of dA, dC, dG, and dT; wherein the second base pair is derived from a mixture of dA, dC, dG, and dT; and wherein the third base pair is derived from a mixture of dG and dT. In some embodiments, the degenerate codon "NNK" is synthesized as (N1:25252525)(N2:25252525)(K1:00005050), wherein the first and second position of the three-base pair oligonucleotide are each derived from equal mixtures of about 25% dA, about 25% dC, about 25% dG, and about 25% dT; and wherein the third position of the three-base pair oligonucleotide is derived from an equal mixture of about 50% dG and about 50% dT. In some embodiments, an unequal ratio of bases is used. As a non-limiting example, the degenerate codon "NNK" is synthesized as (N1:20202040)(N2:20202040)(K1: 00004060), wherein the first and second position of the three-base pair oligonucleotide are each derived from mixtures of about 20% dA, about 20%, dC, about 20% dG, and about 40% dT; and wherein the third position of the three-base pair oligonucleotide is derived from a mixture of about 40% dG and about 60% dT.

In some embodiments, the library comprises synthetic polynucleotide encoding variable peptides, wherein each amino acid residue is encoded by a degenerate codon. In some embodiments, the amino acid residues of the variable peptides are each encoded by the same degenerate codon. In some embodiments, the amino acid residues of the variable peptides are encoded by a combination of degenerate codons. Non-limiting examples of suitable degenerate codons for use in preparing synthetic oligonucleotides encoding variable peptides include NNN, NNK, NDT, and DBK.

In some embodiments, the synthetic polynucleotides encoding the variable peptides comprise the degenerate codon "NNK". In some embodiments, each amino acid residue of the variable peptides are encoded by the degenerate codon "NNK". In some embodiments, the synthetic polynucleotides have the sequence $(NNK)_w$ (SEQ ID NO: 134), wherein NNK is (A,C,G,T)(A,C,G,T)(G,T), and wherein w is the length of the variable peptide. In some embodiments, w is 5. In some embodiments, w is 6. In some embodiments, w is 7. In some embodiments, w is 8. In some embodiments, w is 9. In some embodiments, w is 10. In some embodiments, w is 11. In some embodiments, w is 12. In some embodiments, w is 13. In some embodiments, w is 14. In some embodiments, w is 15. In some embodiments, w is 16. In some embodiments, w is 17. In some embodiments, w is 18. In some embodiments, w is 19. In some embodiments, w is 20.

In some embodiments, the synthetic polynucleotides encode variable peptides, wherein the variable peptides comprise one or more cysteine amino acid residues. In some embodiments, the variable peptides comprise two cysteine amino acid residues. In some embodiments, the two cysteine amino acid residues are separated by one or more amino acid residues. In some embodiments, the two cysteine amino acid residues are separated by at least one, two, three, four, five, six, or seven amino acid residues. In some embodiments, the two cysteine amino acid residues are separated by three amino acid residues. In some embodiments, the two cysteine amino acid residues are separated by four amino acid residues. In some embodiments, the two cysteine amino acid residues are separated by five amino acid residues. In some embodiments, the two cysteine amino acid residues are separated by six amino acid residues. In some embodiments, the two cysteine amino acid residues are separated by seven amino acid residues.

In some embodiments, the cysteine amino acid residues are encoded by ACA or ACG; and the remaining amino acid residues are encoded by a degenerate codon or combination of degenerate codons. In some embodiments, the degenerate codon is "NNK". In some embodiments, the synthetic polynucleotides encoding the variable peptides have the sequence $(NNK)_x(TGY)(NNK)_y(TGY)(NNK)_z$ (SEQ ID NO: 135), wherein NNK is (A,C,G,T)(A,C,G,T)(G,T); wherein TGY is (T)(G)(T,C); wherein x is the number of encoded variable amino acid residues preceding (i.e., at the N-terminus) the first encoded cysteine residue; wherein y is the number of encoded variable amino acid residues between the first and second encoded cysteine residues; and wherein z is the number of encoded variable amino acid residues following (i.e., at the C-terminus) the second encoded cysteine residue. In some embodiments, x is 1, 2, 3, 4, 5, 6, or 7. In some embodiments, x is 2. In some embodiments, x is 3. In some embodiments, x is 4. In some embodiments, y is 1, 2, 3, 4, 5, 6, or 7. In some embodiments, y is 2. In some embodiments, y is 3. In some embodiments, y is 4. In some embodiments, z is 1, 2, 3, 4, 5, 6, or 7. In some embodiments, z is 2. In some embodiments, z is 3. In some embodiments, z is 4. In some embodiments, x is 1, 2, 3, 4, 5, 6, or 7; y is 1, 2, 3, 4, 5, 6, or 7; and z is 1, 2, 3, 4, 5, 6, or 7. In some embodiments, x is 1, 2, 3, 4, 5, 6, or 7; y is 3; and z is 1, 2, 3, 4, 5, 6, or 7. In some embodiments, x is 1, 2, 3, 4, 5, 6, or 7; y is 4; and z is 1, 2, 3, 4, 5, 6, or 7. In some embodiments, x is 1, 2, 3, 4, 5, 6, or 7; y is 5; and z is 1, 2, 3, 4, 5, 6, or 7. In some embodiments, x is 1, 2, 3, 4, 5, 6, or 7; y is 6; and z is 1, 2, 3, 4, 5, 6, or 7. In some embodiments, x is 1, 2, 3, 4, 5, 6, or 7; y is 7; and z is 1, 2, 3, 4, 5, 6, or 7. In some embodiments, x is 2; y is 3; and z is 3. In some embodiments, x is 3; y is 3; and z is 3.

In some embodiments, the synthetic polynucleotides encoding the variable peptides have the sequence $(CGN)(NNK)_q(TGY)(CCN)(TGG)(NNK)_r(TGY)(NNK)_s$ (SEQ ID NO: 136); wherein NNK is (A,T,G,C)(A,T,G,C)(G,T); wherein CGN is (C)(G)(A,T,G,C) and encodes the amino acid arginine (Arg); wherein TGY is (T)(G)(T,C) and encodes the amino acid cysteine (Cys); wherein CCN is (C)(C)(A,T,G,C) and encodes the amino acid proline (Pro); wherein TGG is (T)(G)(G) and encodes the amino acid tryptophan (Trp); wherein q is the number of encoded variable amino acid residues between Arg and the first Cys; wherein r is the number of variable encoded amino acid residues between Trp and the second Cys; and s is the number of encoded variable amino acid residues following (i.e., at the C-terminus) the second Cys. In some embodiments, q is 1, 2, or 3. In some embodiments, r is 1, 2, or 3. In some embodiments, s is 1, 2, 3, or 4. In some embodiments, q is 1, r is 1, and s is 3.

In some embodiments, the synthetic polynucleotides encoding the variable peptide has a nucleotide sequence represented by the formula: (NNK)t(M)u(NNK)v (SEQ ID NO: 150); wherein NNK is (A,T,G,C)(A,T,G,C)(G,T); wherein M encodes a sequence motif that binds a CAR antigen recognition domain described herein; wherein u is the number of residues present in the sequence motif; wherein u is an integer between 5 and 20; wherein t is an integer between 0 and 20; v is an integer between 0 and 20; and v+t is an integer between 1 and 40. In some In some embodiments, u is 5, 6, 7, 8, 9, 10, 11, 12, 13, 14, 15, 16, 17, 18, 19, or 20. In some embodiments, t is 1, 2, 3, 4, 5, 6, 7, 8, 9, 10, 11, 12, 13, 14, 15, 16, 17, 18, 19, or 20; and v is 0. In some embodiments, v is 1, 2, 3, 4, 5, 6, 7, 8, 9, 10, 11, 12, 13, 14, 15, 16, 17, 18, 19, or 20; and t is 0. In some embodiments, t is 1, 2, 3, 4, 5, 6, 7, 8, 9, 10, 11, 12, 13, 14, 15, 16, 17, 18, 19, or 20; and v is 1, 2, 3, 4, 5, 6, 7, 8, 9, 10, 11, 12, 13, 14, 15, 16, 17, 18, 19, or 20. In some embodiments, u is 7, 8, 9, or 10; t is 10 and v is 10. In some embodiments, u is 7, 8, 9, or 10; t is 6; and v is 10. In some embodiments, u is 7, 8, 9, or 10; t is 0; and v is 6 or 10. In some embodiments, u is 7, 8, 9, or 10; t is 3; and v is 6.

In some embodiments, the sequence motif binds to the CAR antigen recognition domain with a binding affinity (KD¬) of at least 5 μM. In some embodiments, the sequence motif binds to the CAR antigen recognition domain with a binding affinity (KD¬) of at least about 0.5 μM, about 0.6 μM, about 0.7 μM, about 0.8 μM, about 0.9 μM, about 1 μM, about 2 μM, about 3 μM, about 4 μM, or about 5 μM. In some embodiments, the sequence motif binds to the CAR antigen recognition domain with a binding affinity (KD¬) of about 1 nM to about 5000 nM, or about 1 nM, about 10 nM, about 20 nM, about 30 nM, about 40 nM, about 50 nM, about 60 nM, about 70 nM, about 80 nM, about 90 nM, about 100 nM, about 150 nM, about 200 nM, about 250 nM, about 300 nM, about 350 nM, about 400 nM, about 450 nM, about 500 nM, about 550 nM, about 600 nM, about 650 nM, about 700 nM, about 750 nM, about 800 nM, about 850 nM, about 900 nM, about 950 nM, about 1000 nM, about 1500 nM, about 2000 nM, about 2500 nM, about 3000 nM, about 3500 nM, about 4000 nM, about 4500 nM, or about 5000 nM.

Yeast Display Library

In some embodiments, the cellular library is a yeast display library. As used herein, "yeast display" refers to a technique by which a library of recombinant polypeptides are displayed as fusion proteins to a cell wall protein or an adhesion protein that binds a cell wall protein and displayed on the surface of yeast cells. In some embodiments, yeast display is used to generate a peptide library for selection of CAR ligands due to one or more properties of the yeast display library. For example, in some embodiments, yeast display provides a eukaryotic expression system capable of incorporating post-translational modifications (e.g., disulfide bond formation). In some embodiments, yeast display is used to allow disulfide bond formation for variable peptides comprising at least two cysteine residues. In some embodiments, yeast display enables preparation of peptide libraries (e.g., about $10^8$ to about $10^9$ unique variable peptides) sufficient to allow selection of at least one peptide ligand that binds to the antigen recognition domain of a CAR described herein. In some embodiments, yeast display is compatible with rapid and high-throughput selection methods (e.g., by magnetic bead selection technology, e.g., by FACS-based selection) required for selection of a CAR-binding ligand.

A. Library Preparation

In some embodiments, a yeast display library of the disclosure comprises a population of yeast cells, wherein a plurality of the population of yeast cells express a fusion protein comprising a variable peptide operably-linked to an adhesion protein, and wherein the fusion protein is displayed on the extracellular surface of the yeast cell wall. In some embodiments, a method of preparing the yeast display library comprises (i) generating synthetic polynucleotides that encode the variable peptides, wherein the variable peptides are encoded by one or more degenerate codons; (ii) generating a gene fusion comprising the polynucleotide sequence encoding the variable peptide operably-linked to a polynucleotide encoding a yeast cell adhesion protein; (iii) constructing expression vectors that comprise the gene fusion; (iv) transforming the expression vectors into a population of yeast cells; and (v) maintaining the population of yeast cells under conditions that induce expression of the gene fusion and cell-surface presentation of the variable peptide fusion protein.

Methods for preparing yeast display libraries comprising variable polypeptides are known in the art. For example, yeast display has been used to generate antibodies and fragments thereof as described by Boder, et al *ARCHIVES OF BIOCHEMISTRY AND BIOPHYSICS* (2012) 526:99; Boder, et al *NAT. BIOTECHNOL.* (1997) 15:553; Chao, et al *NAT. PROTOC.* (2006) 1:755; and Colby, et al *METHODS IN ENZYMOLOGY* (2004) 388:348. Yeast display has also been used to generate fibronectin-based binders as described in Chen, et al *METHODS IN ENZYMOLOGY* (2013) 523: 303. Methods for preparation of yeast display libraries known in the art are suitable for use in the present disclosure.

(i) Yeast Display Fusion Proteins

In some embodiments, the fusion protein comprises an adhesion protein that anchors to the yeast cell wall. Non-limiting examples of such proteins includes Aga1p, Aga2p, Cwp1p, Cwp2p, Tip1p, Flo1p, Sed1p, YCR89w, and Tir1 (see, e.g., Kondo et al *APPL MICROBIOL BIOTECHNOL* (2004) 64:28).

In some embodiments, the fusion protein comprises a variable peptide operably-linked to either the N-terminus or the C-terminus of the adhesion protein. In some embodiments, the variable peptide is linked to the terminus of the adhesion protein that is farthest from the functional portion of the adhesion protein (e.g., the portion required for anchoring to the yeast cell wall).

In some embodiments, the adhesion protein is Aga2p. In some embodiments, the variable peptide is operably-linked to the N-terminus or C-terminus of Aga2p. In some embodiments, the variable peptide is operably-linked to the C-terminus of Aga2p. In some embodiments, the fusion protein is anchored to the yeast cell wall through Aga2p. In some embodiments, the population of yeast cells comprises a genome encoding the Aga1 gene. In some embodiments, Aga2p is anchored by disulfide bond formation to Aga1p that is present on the yeast cell surface. (see, e.g., Boder, et al *METHODS ENZYMOL* (2000) 328:430).

In some embodiments, the gene fusion encodes a polypeptide comprising a variable peptide operably-linked to an adhesion protein (e.g., Aga2p), wherein the polypeptide further comprises one or more tags. In some embodiments, the polypeptide comprises two tags. As used herein, a "tag" refers to a detectable polypeptide label such as, for example, an enzymatic label, a fluorescent label (e.g., GFP, BFP, RFP, EGFP, EBFP, YFP, tdTomato, and mCherry), a luminescent label (e.g., luciferin), an affinity label (e.g., streptavidin), or an antigenic label (e.g., hemagglutinin (HA; YPYDVPDYA) (SEQ ID NO: 151), FLAG (DYKDDDDK) (SEQ ID NO: 152), c-Myc, polyhisitidine (HHHHHH) (SEQ ID NO: 153), and V5). In some embodiments, the one or more tags are incorporated into the fusion protein to allow normalization of the quantity of fusion protein expressed at the cell-surface, thereby enabling identification of peptide ligands that have high expression levels and bind with high affinity to the target protein (e.g., antibody or fragment thereof comprising a CAR antigen-recognition domain).

In some embodiments, the gene fusion encodes a polypeptide comprising at least one tag that is an antigen label. In some embodiments, the polypeptide comprises two tags that are antigen labels. In some embodiments, the gene fusion encodes a polypeptide comprising the formula AD-T1-L-$(Xaa)_n$-T2, wherein Xaa is an amino acid residue encoded by (A,T,G,C)(A,T,G,C)(G,T); wherein n is 5-20; wherein AD is the adhesion protein (e.g., Aga2p); wherein L is a peptide linker; wherein T1 is a first tag; wherein T2 is a second tag; and wherein the first and second epitope tag are different. In some embodiments, T1 is HA and T2 is c-Myc. In some embodiments, the gene fusion comprises a nucleotide sequence as set forth by SEQ ID NO: 84. In some embodiments, the gene fusion encodes a polypeptide with an amino acid sequence as set forth by SEQ ID NO: 83.

In some embodiments, the gene fusion encodes a polypeptide comprising at least one tag that is an antigen label. In some embodiments, the polypeptide comprises two tags that are antigen labels. In some embodiments, the gene fusion encodes a polypeptide comprising the formula AD-T1-L-(Xaa)x(Cys)(Xaa)y(Cys)(Xaa)z, -T2, wherein Xaa is an amino acid residue encoded by (A,T,G,C)(A,T,G,C)(G,T); wherein x is 1, 2, 3, 4, 5, 6, or 7; y is 1, 2, 3, 4, 5, 6, or 7; and z is 1, 2, 3, 4, 5, 6, or 7; wherein AD is the adhesion protein (e.g., Aga2p); wherein L is a peptide linker; wherein T1 is a first tag; wherein T2 is a second tag; and wherein the first and second epitope tag are different. In some embodiments, x is 1, 2, 3, 4, 5, 6, or 7; y is 3; and z is 1, 2, 3, 4, 5, 6, or 7. In some embodiments, x is 1, 2, 3, 4, 5, 6, or 7; y is 4; and z is 1, 2, 3, 4, 5, 6, or 7. In some embodiments, x is 1, 2, 3, 4, 5, 6, or 7; y is 5; and z is 1, 2, 3, 4, 5, 6, or 7. In some embodiments, x is 1, 2, 3, 4, 5, 6, or 7; y is 6; and z is 1, 2, 3, 4, 5, 6, or 7. In some embodiments, x is 1, 2, 3, 4, 5, 6, or 7; y is 7; and z is 1, 2, 3, 4, 5, 6, or 7. In some embodiments, x is 2; y is 3; and z is 3. In some embodiments, x is 3; y is 3; and z is 3. In some embodiments, T1 is HA and T2 is c-Myc. In some embodiments, the gene fusion comprises a nucleotide sequence as set forth by SEQ ID NO: 127. In some embodiments, the gene fusion encodes a polypeptide with an amino acid sequence as set forth by SEQ ID NO: 126.

In some embodiments, the gene fusion encodes a polypeptide comprising the formula AD-T1-L-(Arg)-$(Xaa)_k$-(Cys)-(Pro)-(Trp)-$(Xaa)_l$-(Cys)-$(Xaa)_m$-T2 (SEQ ID NO: 154), wherein Xaa is an amino acid residue encoded by (A,T,G,C)(A,T,G,C)(G,T); wherein k is 5-10; wherein 1 is 5-10; wherein m is 5-10; wherein AD is the adhesion protein (e.g., Aga2p); wherein L is a peptide linker; wherein T1 is a first tag; wherein T2 is a second tag; and wherein the first and second epitope tag are different. In some embodiments, T1 is HA and T2 is c-Myc. In some embodiments, k is 1, 1 is 1, nd m is 3. In some embodiments, the gene fusion comprises a nucleotide sequence as set forth by SEQ ID NO: 86. In some embodiments, the gene fusion encodes a polypeptide with an amino acid sequence as set forth by SEQ ID NO: 85.

In some embodiments, the gene fusion encodes a polypeptide comprising the formula AD-T1-L-(Xaa)o-(M)-(Xaa)p-T2, wherein Xaa is any amino acid residue encoded by (A,T,G,C)(A,T,G,C)(G,T); wherein M is a sequence motif that binds a CAR antigen recognition domain described herein (e.g., with a binding affinity of at least 5 μM), wherein o is an integer between 1 and 20, wherein p is an integer between 1 and 20, wherein o+p is an integer between 1 and 40, wherein AD is the adhesion protein (e.g., Aga2p); wherein L is a peptide linker; wherein T1 is a first tag; wherein T2 is a second tag; and wherein the first and second epitope tag are different. In some embodiments, the sequence motif binds to the CAR antigen recognition domain with a binding affinity (KD¬) of at least about 0.5 μM, about 0.6 μM, about 0.7 μM, about 0.8 μM, about 0.9 μM, about 1 μM, about 2 μM, about 3 μM, about 4 μM, or about 5 μM. In some embodiments, the sequence motif binds to the CAR antigen recognition domain with a binding affinity (KD¬) of about 1 nM to about 5000 nM, or about 1 nM, about 10 nM, about 20 nM, about 30 nM, about 40 nM, about 50 nM, about 60 nM, about 70 nM, about 80 nM, about 90 nM, about 100 nM, about 150 nM, about 200 nM, about 250 nM, about 300 nM, about 350 nM, about 400 nM, about 450 nM, about 500 nM, about 550 nM, about 600 nM, about 650 nM, about 700 nM, about 750 nM, about 800 nM, about 850 nM, about 900 nM, about 950 nM, about 1000 nM, about 1500 nM, about 2000 nM, about 2500 nM, about 3000 nM, about 3500 nM, about 4000 nM, about 4500 nM, or about 5000 nM.

(ii) Yeast Display Expression Vectors

In some embodiments, the expression vector comprises the gene fusion encoding a variable peptide operably-linked to an adhesion protein, as well as any other transcriptional and/or translational regulatory sequences necessary for expression in yeast cells. Non-limiting regulatory sequences include promoter sequences, ribosomal binding sites, transcriptional start and stop sequences, translational start and stop sequences, transcription terminator signals, polyadenylation signals, and enhancer or activator sequences. In some embodiments, the regulatory sequences include promoter and transcriptional start and stop sequences. In some embodiments, the expression vector includes more than one replication system such that it can be maintained in two different organisms, for example in yeast cells for expression and in a prokaryotic host (e.g., bacteria) for cloning and amplification.

In some embodiments, the expression vector used to generate the library comprise a selection marker. As used herein, a "selection marker" refers to a gene capable of expression in a host cell (e.g., yeast cell) that allows for selection of host cells comprising the exogenously introduced polynucleotide sequence or expression vector. Examples of selectable markers include, but are not limited, antimicrobial substances (e.g., hygromycin, bleomycin, or chloramphenicol) and/or genes that confer a metabolic advantage, such as a nutritional advantage, on the host cell (e.g., yeast cell).

In some embodiments, the expression vectors are introduced into yeast cells in a manner that enables subsequent expression of the gene fusion encoded by the vector. Suitable methods are selected from, but not limited to, $CaPO_4$ precipitation, liposome fusion, cationic liposomes, electroporation, viral infection, dextran-mediated transfection, polybrene-mediated transfection, protoplast fusion, and direct microinjection.

In some embodiments, the yeast cells are engineered to be deficient for synthesis of an enzyme necessary for metabolite production. In some embodiments, the yeast cells are unable to grow and/or survive under conditions lacking the metabolite. In some embodiments, the expression vector used to generate the library comprises a selection marker encoding an enzyme necessary for production of the metabolite. In some embodiments, the population of yeast cells is maintained under conditions lacking the metabolite, wherein the lack of the metabolite allows selection of yeast cells transformed with the expression vector. In some embodiments, the metabolite is the amino acid tryptophan and the selection marker is the gene TRP1.

Yeast cells suitable for use in preparing a yeast display library are known in the art. Non-limiting examples include *Pichia panaris* or *Saccharomyces cerevisiae*. In some embodiments, the yeast cell strain is (i) deficient in the metabolic machinery necessary for synthesis of the amino acid tryptophan; and (ii) comprises a genome encoding the Aga1 gene. In some embodiments, the yeast cell strain is EBY100.

In some embodiments, expression of the gene fusion is under control of a galactose-inducible promoter. In some embodiments, expression of the gene fusion requires conditions comprising galactose. In some embodiments, transfer of the population of yeast comprising the expression vector from glucose-rich media to galactose-rich media will induce expression and display of the fusion protein. In some embodiments, galactose-rich media comprises a galactose concentration of about 0.5 g/L, about 0.6 g/L, about 0.7 g/L, about 0.8 g/L, about 0.9 g/L, about 1.0 g/L, about 1.1 g/L, about 1.2 g/L, about 1.3 g/L, about 1.4 g/L, about 1.5 g/L, or higher.

In some embodiments, a plurality of yeast cells transformed with the expression vector and maintained under conditions that induce expression express cell-surface fusion protein comprising a variable peptide.

In some embodiments, the yeast cells express about $10^2$, about $10^3$, about $10^4$, about $10^5$, or about $10^6$ copies of cell-surface fusion protein.

In some embodiments, the total number of unique variable peptide sequences displayed by the yeast library is about $1\times10^8$ to about $1\times10^9$, about $2\times10^8$ to about $9\times10^9$, about $3\times10^8$ to about $8\times10^8$, about $4\times10^8$, about $5\times10^8$, about $6\times10^8$, or about $7\times10^8$; and the total number of copies of variable peptide displayed on the yeast cell surface is about $1\times10^5$, about $2\times10^5$, about $3\times10^5$, about $4\times10^5$, about $5\times10^5$, about $6\times10^5$, about $7\times10^5$, about $8\times10^5$, about $9\times10^5$, or about $1\times10^6$.

B. Library Selection

In some embodiments, a method of selection is used to identify a CAR ligand from a yeast display library described herein, wherein the CAR ligand is a variable peptide that binds the antigen recognition domain of a CAR described herein. In some embodiments, the method comprises a combination of enrichment and sorting to identify binders of the CAR antigen recognition domain. Suitable methods for enriching and sorting binders from a yeast display library includes those described in Chen, et al *METHODS IN ENZYMOLOGY* (2013) 523:303, which is herein incorporated by reference.

(i) Enrichment for CAR Ligands

In some embodiments, binders of the CAR antigen recognition domain are enriched from a population of cells, wherein the number of cells exceeds the diversity of the library by at least 5-fold, 10-fold, 15-fold, 20-fold, 25-fold, or 30-fold. For example, in some embodiments, the total number of unique variable peptide sequences present in the cellular library is about $1\times10^6$, about $5\times10^6$, about $1\times10^7$, about $5\times10^7$, about $1\times10^8$, about $5\times10^8$, or about $1\times10^9$; and the selection is performed with a number of cells that exceeds the number of unique variable peptide sequences in the library by at least 5-fold, 10-fold, 15-fold, 20-fold, 25-fold, or 30-fold. In some embodiments, the total number of unique variable peptide sequences is about $3\times10^8$, $4\times10^8$, $5\times10^8$, $6\times10^8$, or $7\times10^8$; and the selection is performed with a number of cells that is about $1\times10^9$ to about $5\times10^9$, about $1\times10^9$ to about $1\times10^{10}$, about $5\times10^9$ to about $1\times10^{10}$, about $5\times10^9$ to about $5\times10^{10}$, or about $1\times10^{10}$ to about $5\times10^{10}$.

In some embodiments, the population is enriched for binders through multiple rounds of negative selection (e.g., one, two, three, four, or five rounds) and multiple rounds of positive selection (e.g., one, two, three, four, or five rounds), wherein the negative selection and positive selection are performed using a solid support. As used herein, a "solid support" refers to an insoluble matrix, such as a synthetic matrix (e.g., acrylamide derivative, cellulose, nylon, silica, or magnetized beads), to which soluble molecules may be linked. By linking soluble molecules, the solid support is modified to provide binding sites. For example, by linking soluble molecules such as streptavidin or an epitope tag, the solid support is modified with binding sites respectively for biotin or an epitope-specific antibody. In some embodiments, the solid support provides many binding sites (e.g., $10^4$, $10^5$, $10^6$, $10^7$ binding sites per 10, 15, 20, 25, 30, 35, 40, 45, or 50 $\mu m^2$ of surface area of the solid support).

In some embodiment, the solid support used for selection is compatible with a method of cell sorting. In some embodiments, the solid support is compatible with a method of bulk cell sorting. Methods of bulk cell sorting are known in the art (see, e.g., Shields et al (2015) *LAB CHIP* 7:1230; Orfao et al (1996) *CLINICAL BIOCHEMISTRY* 29:5), such as centrifugation, filtration, and magnetic sorting. For example, in some embodiments, the solid support comprises magnetic beads and the method of cell sorting comprises use of a magnetic field to separate cells bound to the magnetic beads from cells that are unbound and removed by elution. In some embodiments, the selection solid support comprises non-magnetic polymeric beads and the method of cell sorting comprises use of centrifugation and/or filtration to separate cells bound to the polymeric beads from cells that are unbound.

In some embodiments, the solid support comprises binding sites, wherein the binding sites bind to a label, such as a fluorescent label (e.g., FITC) or an affinity tag (e.g., biotin). In some embodiments, the solid support is any solid support that is compatible with a method of cell sorting. In some embodiments, the solid support comprises magnetic beads. In some embodiments, the magnetic beads comprise binding sites that bind an affinity tag. In some embodiments, the affinity tag is biotin.

In some embodiments, enriching the population for binders of the CAR antigen recognition domain comprises a negative selection, wherein the negative selection comprises multiple rounds (e.g., at least one, two, three, four, or five rounds) of depletion of cells that are non-selective binders of the solid support. As used herein, "non-selective binders" refers to cells of the library that bind to the solid support, but do not appreciably bind the CAR antigen recognition domain (e.g., cells comprising a variable peptide with no binding affinity or low binding affinity (e.g., $K_D$ of $10^{-4}$, $10^{-3}$, $10^{-2}$ M or higher) for the CAR antigen-recognition domain). In some embodiments, non-selective binders comprise cells that bind e.g., the solid support matrix, linkages used for display of molecules on the solid support, a control antibody or fragment thereof displayed by the solid support.

In some embodiments, enriching the population for binders of the CAR antigen recognition domain comprises a positive selection, wherein the positive selection comprises multiple rounds (e.g., at least one, two, three, four, or five rounds) of selection for cells that bind the solid support, wherein the solid support displays an antibody or fragment thereof comprising a CAR antigen recognition domain.

In some embodiments, the multiple rounds of negative selection are used to remove or deplete cells from the population that are non-specific binders. In some embodiments, the multiple rounds of positive selection are used to enrich for cells that bind the CAR antigen-recognition domain. In some embodiments, the selection comprises at least one, two, three, four, or five rounds of negative selection for depletion of cells that are non-specific binders; followed by at least one, two, three, four, or five rounds of positive selection to enrich for cells that bind the CAR antigen-recognition domain.

In some embodiments, the selection comprises:

(i) a negative selection comprising multiple rounds (e.g., at least one, two, three, four, or five rounds) of depletion of cells that bind to the solid support (e.g., magnetic beads), wherein the plurality of binding sites are unbound;

(ii) optionally a negative selection comprising multiple rounds (e.g., at least one, two, three, four, or five rounds) of depletion of cells that bind to the solid support (e.g., magnetic beads), wherein the plurality of binding sites display a label (e.g., biotin);

(iii) a negative selection comprising multiple rounds (e.g., at least one, two, three, four, or five rounds) of depletion of cells that bind to the solid support (e.g., magnetic beads), wherein the plurality of binding sites display a control antibody or fragment thereof (e.g., isotype control); and (iv) a positive selection comprising multiple rounds (e.g., at least one, two, three, four, or five rounds) of enrichment of cells that bind to the solid support (e.g., magnetic beads), wherein the plurality of binding sites display an antibody or fragment thereof comprising the CAR antigen recognition domain. In some embodiments, the control antibody or fragment thereof used for negative selection has the same constant regions as the antibody or fragment thereof comprising the CAR antigen recognition domain. In some embodiments, the constant regions are full-length constant regions.

In some embodiments, the antibody or fragment thereof comprising the CAR antigen recognition domain is a single chain antibody. As used herein, the term "single-chain" refers to a molecule comprising amino acid monomers linearly linked by peptide bonds, e.g., a single chain Fv can be a VH and a VL operably linked by a linker region, e.g., a single chain Fv can be a VH and a VL connected with a short linker peptide of ten to about 25 amino acids. In some embodiments, the single chain antibody comprises one variable region (e.g., VH) or multiple variable regions (e.g., VH and VL). In some embodiments, the single chain antibody is a single chain Fv (scFv) comprising the CAR antigen recognition domain. In some embodiments, the antibody or fragment thereof comprising the CAR antigen recognition domain is a full-length antibody (e.g., IgG).

In some embodiments, the solid support comprises a number of binding sites per cell that is about $10^2$ to 1, about $10^3$ to 1, about $10^4$ to 1, about $10^5$ to 1, or about $10^6$ to 1. In some embodiments the solid support comprises magnetic beads, wherein the number of beads to the number of cells is about 1 to 1, about $10^{-1}$ to 1, about $10^{-2}$ to 1, about $10^{-3}$ to 1, about $10^{-4}$ to 1, or about $10^{-5}$ to 1.

In some embodiments, the number of binding sites per cell is increased for the negative selection or at least one round of the negative selection. In some embodiments, increasing the number of binding sites per cell is a method to enhance the stringency of the selection. For example, by increasing the number of binding sites per cell, more binding sites are available to capture cells that are non-selective binders, e.g., cells that bind the solid support matrix, cells that bind the linkage used to display molecules from the binding sites, or cells that bind the control antibody or fragment thereof displayed by the binding sites. By capturing more cells that are non-selective binders, an increased number of non-selective binders are depleted or removed from the cellular library.

In some embodiments, the stringency of the negative selection is enhanced by increasing the number of binding sites per cell to about $5\times10^6$ to 1, about $4\times10^6$ to 1, about $3\times10^6$ to 1, about $2\times10^6$ to 1, about $1\times10^6$ to 1, about $0.5\times10^6$ to 1, or about $0.1\times10^6$ to 1. In some embodiments, the solid support comprises magnetic beads, wherein the stringency of the negative selection is enhanced by increasing the number of beads to the number of cells to about 0.7 to 1, about 0.6 to 1, about 0.5 to 1, about 0.4 to 1, about 0.3 to 1, about 0.2 to 1, about 0.1 to 1, about 0.09 to 1, about 0.08 to 1, about 0.07 to 1, about 0.06 to 1, about 0.05 to 1, about 0.04 to 1, about 0.03 to 1, about 0.02 to 1, or about 0.01 to 1.

In some embodiments, enrichment of the library comprises:

(i) depletion of about 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the population, wherein the depleted cells are removed by binding a solid support (e.g., magnetic beads) comprising binding sites, wherein a plurality of binding sites are unbound;

(ii) optionally depletion of about 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the population, wherein the depleted cells are removed by binding a solid support (e.g., magnetic beads) comprising binding sites, wherein a plurality of binding sites display a label (e.g., biotin);

(iii) depletion of about 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the population, wherein the depleted cells are removed by binding a solid support (e.g., magnetic beads) comprising binding sites, wherein a plurality of binding sites display a control antibody or fragment thereof (e.g., isotype control); and (iv) selection of cells that bind the solid support (e.g., magnetic beads) comprising binding sites, wherein the plurality of binding sites display an antibody or fragment thereof comprising the CAR antigen recognition domain.

In some embodiments, the enrichment comprises an increase in the proportion of cells that bind the CAR antigen recognition domain. In some embodiments, the proportion is least 1.1-fold, 1.2-fold, 1.3-fold, 1.4-fold, 1.5-fold, 1.6-fold, 1.7-fold, 1.8-fold, 1.9-fold, 2-fold or higher compared to the population of cells prior to the enrichment.

(ii) Sorting for CAR Ligands

In some embodiments, a cellular library described herein is sorted for binders of the CAR antigen recognition domain. In some embodiments, the sorting comprises isolation of binders that have a desired binding affinity and/or binding selectivity for the CAR antigen recognition domain. In some embodiments, the sorting comprising isolation of binders that have a reduced dissociation rate for the CAR antigen recognition domain.

In some embodiments, the sorting comprises selection of binders for the CAR antigen recognition domain using a method of single-cell sorting. In some embodiments, the sorting comprises multiple rounds of selection (e.g., at least one round, two rounds, three rounds, four rounds, or five rounds) for binders using a method of single-cell sorting. In some embodiments, the method of single-cell sorting enables (i) characterization of individual cells in the population (e.g., level of fusion protein expression, e.g., relative binding affinity of variable peptide); and (ii) isolation of individual cells and/or a subset of cells from the population. Methods of single-cell sorting are known in the art. Non-limiting examples include fluorescence activated cell sorting (FACS), single cell Raman spectroscopy sorting, mass cytometry, and flow cytometry.

In some embodiments, the sorting comprises selection of binders for the CAR antigen recognition domain using FACS. In some embodiments, the sorting comprises multiple rounds of selection (e.g., at least one round, two rounds, three rounds, four rounds, or five rounds) for binders using FACS.

In some embodiments, the cellular library is sorted without prior enrichment of the library for binders of the CAR antigen recognition domain. In some embodiments, the cellular library is sorted following enrichment for binders of the CAR antigen recognition domain using any of the foregoing methods of enrichment.

In some embodiments, the cellular library used for sorting has a number of cells that (i) exceeds the diversity of the library by at least 5-fold, 10-fold, 15-fold, 20-fold, 25-fold, or 30-fold; and/or (ii) is about $1\times10^6$, about $2\times10^6$, about $3\times10^6$, about $4\times10^6$, about $5\times10^6$, about $6\times10^6$, about $7\times10^6$, about $8\times10^6$, about $9\times10^6$, about $10\times10^6$, about $20\times10^6$, about $30\times10^6$, about $40\times10^6$, about $50\times10^6$, about $60\times10^6$, about $70\times10^6$, about $80\times10^6$, about $90\times10^6$, about $100\times10^6$ cells.

In some embodiments, the sorting comprises labeling the population of cells in the cellular library with an antibody or fragment thereof comprising the CAR antigen recognition domain. In some embodiments, the cells are labeled with an antibody that is a full-length antibody comprising the CAR antigen recognition domain. In some embodiments, the cells are labeled with a fragment that is a single chain Fv (scFv), an Fv fragment, a Fab fragment, a Fab' fragment, a $F(ab')_2$ fragment, or a single chain antibody molecule comprising the CAR antigen recognition domain.

In some embodiments, the population of cells is labeled with the antibody or fragment thereof, wherein:

(i) the concentration of the antibody or fragment thereof is about 50 nM, about 100 nM, about 200 nM, about 300 nM, about 400 nM, about 500 nM, about 1000 nM, about 1500 nM, about 2000 nM, about 2500 nM, about 3000 nM, about 3500 nM, about 4000 nM, about 4500 nM, or about 5000 nM; and/or (ii) the stoichiometric ratio of the antibody or fragment thereof to the average number of cell-surface fusion proteins comprising the variable peptide is about 0.1:1, about 0.5:1, about 1:1, about 2:1, about 3:1, about 4:1, about 5:1, about 6:1, about 7:1, about 8:1, about 9:1, about 10:1 or higher.

In some embodiments, the sorting comprises multiple rounds of selection (e.g., at least one, two, three, four, or five rounds of selection), wherein each round of selection comprises labeling the population of cells with the antibody or fragment thereof; wherein:

(i) the concentration used in the first round of selection is the same or is about 2-fold, about 3-fold, about 4-fold, about 5-fold, about 6-fold, about 7-fold, about 8-fold, about 9-fold, or about 10-fold higher than the concentration used in the second round of selection;

(ii) the concentration used in the second round of selection is the same or is about 2-fold, about 3-fold, about 4-fold, about 5-fold, about 6-fold, about 7-fold, about 8-fold, about 9-fold, or about 10-fold higher than the concentration used in the third round of selection;

(iii) the concentration used in the third round of selection is the same or is about 2-fold, about 3-fold, about 4-fold, about 5-fold, about 6-fold, about 7-fold, about 8-fold, about 9-fold, or about 10-fold higher than the concentration used in the fourth round of selection;

(iv) the concentration used in the fourth round of selection is the same or is about 2-fold, about 3-fold, about 4-fold, about 5-fold, about 6-fold, about 7-fold, about 8-fold, about 9-fold, or about 10-fold higher than the concentration used in the fifth round of selection; or (v) any combination of (i)-(iv).

In some embodiments, the sorting comprises:

(i) at least one round of selection, optionally the first, second, or third round of selection, wherein the population of cells is labeled with the antibody or fragment at a concentration of about 1 μM to about 5 μM;

(ii) at least one round of selection, optionally the first, second, or third round of selection, wherein the population of cells is labeled with the antibody or fragment at a concentration of about 100 nM to about 1000 nM;

(iii) at least one round of selection, optionally wherein the first, second or third round of selection, wherein the population of cells is labeled with the antibody or fragment at a concentration of about 10 nM to about 100 nM;

(iv) at least one round of selection, optionally wherein the first, second or third round of selection, wherein the population of cells is labeled with the antibody or fragment at a concentration of about 1 nM to about 10 nM;

(v) at least one round of selection, optionally the first, second, or third round of selection, wherein the population of cells is labeled with the antibody or fragment at a concentration of about 0.1 nM to about 1 nM; or (vi) any combination of (i)-(v).

In some embodiments, the antibody or fragment thereof comprises a label for detection by a method of cell sorting (e.g., FACS). In some embodiments, the label is detectable by FACS. Labels suitable for detection by FACS are known in the art. Non-limiting examples include a fluorescent tag (e.g., FITC) or an affinity tag (e.g., biotin) amenable to labeling by a detectable secondary reagent (e.g., fluorescently-labeled streptavidin). In some embodiments, the antibody or fragment thereof is detected by the FACS by labeling with a fluorescently-labeled secondary antibody (e.g., fluorescently-labeled anti-Fc antibody).

In some embodiments, the sorting comprises a kinetic competition or kinetic-based selection, e.g., as described in Cherf, et al (2015) METHODS MOL. BIOL. 1319:155-175. In some embodiments, the kinetic competition is performed by (i) incubating the population of cells with a CAR antibody (e.g., IgG or scFv comprising the CAR antigen recognition domain) comprising a label (e.g., fluorophore, biotin), (ii) washing the population of cells to remove unbound CAR antibody of (i), and (iii) incubating the population of cells with a CAR antibody (e.g., IgG or scFv comprising the CAR antigen recognition domain) that is unlabeled. In some embodiments, (i) is performed with a concentration of the labeled CAR antibody that is saturating or near saturating. In some embodiments, (ii) is performed by incubating the population of cells with a concentration of the unlabeled CAR antibody that is at least 10-100-fold higher than the concentration of the labeled CAR antibody of (i). In some embodiments, the kinetic competition is performed by (i) incubating the population of cells with a CAR antibody that is labeled, and (ii) incubating the population of cells in a large volume of buffer. Application of an excess of unlabeled CAR antibody or a large incubation volume prevents rebinding of labeled CAR antibody that becomes dissociated subsequent to initial binding. Accordingly, the largest proportion of the population of cells comprising labeled CAR antibody are those expressing a variable peptide that binds the CAR antigen recognition domain with high binding affinity (KD) and/or a slow rate of dissociation (koff), whereas the subset of the population expressing variable peptides with low binding affinity (KD) and/or a fast rate of dissociation (koff) retain minimal labeled CAR antibody.

In some embodiments, the sorting comprises at least one round of selection, wherein the selection comprises the following steps: (i) labeling the population of cells with an antibody or fragment thereof comprising the CAR antigen recognition domain, wherein the antibody or fragment thereof comprises a label for detection (e.g., fluorophore, biotin); (ii) washing the population of cells, e.g., to remove unbound antibody or fragment thereof of (i); and (iii) labeling the population of cells with an unlabeled antibody or fragment thereof comprising the CAR antigen recognition domain. In some embodiments, (i) is performed with a concentration of the antibody or fragment thereof that is selected based on the binding affinity (KD) of the weakest affinity binder in the population of cells for the CAR antigen recognition domain. In some embodiments, (i) is performed with a concentration of the antibody or fragment thereof that is at least 10-100% of the binding affinity (KD) of the highest affinity binder in the population of cells. In some embodiments, (i) is performed with a concentration of the antibody or fragment thereof that is at least 1-50 nM, 1-100 nM, 1-200 nM, 1-300 nM, 1-400 nM, or 1-500 nM. (i) is performed with a concentration of the antibody or fragment thereof that is about 1, 5, 10, 20, 30, 40, 50, 60, 70, 80, 90 or 100 μM. In some embodiments, (i) is performed with a full-length antibody (e.g., IgG) comprising the CAR antigen recognition domain. In some embodiments, (i) is performed with an scFv comprising the CAR antigen recognition domain. In some embodiments, (iii) is performed with a concentration of that is selected based on the concentration used in (i). In some embodiments, (iii) is performed with a concentration that is at least 10-200-fold higher than the concentration used in (i). In some embodiments, (iii) is performed with a concentration that is about 5, 10, 15, 20, 30, 40, 50, 60, 70, 80, 90, 100, 110, 120, 130, 140, 150, 160, 170, 180, 190, or 200-fold higher than the concentration used in (i). In some embodiments, (iii) is performed with a full-length antibody (e.g., IgG) comprising the CAR antigen recognition domain. In some embodiments, (iii) is performed with an scFv comprising the CAR antigen recognition domain.

In some embodiments, the sorting comprises selection of cells that bind the antibody or fragment thereof comprising the CAR antigen recognition domain. In some embodiments, wherein the antibody or fragment thereof comprises a fluorescent label that is detected by FACS, the mean fluorescence intensity of cells that bind the antibody or fragment thereof is at least about $10^1$, about $10^2$, about $10^3$-fold higher than the mean fluorescence intensity of unlabeled cells. In some embodiments, the sorting comprises selection of at least about 0.1%, about 0.2%, about 0.3%, about 0.4%, about 0.5%, about 0.6%, about 0.7%, about 0.8%, about 0.9%, or about 1.0% of cells that bind the antibody or fragment thereof.

In some embodiments, the sorting comprises labeling the population of cells to detect cells that express a full-length fusion protein comprising the variable peptide, e.g., by labeling for one or more tag components linked to the fusion protein. For example, detection of a tag located at the N-terminus of the fusion protein ensures the cell comprises the vector encoding the fusion protein; while detection of a tag located at the C-terminus of the fusion protein ensures the protein is expressed as a full-length protein, e.g., without a frameshift mutation or truncation mutation. Methods for labeling and detection of yeast display fusion proteins by FACS are known in the art, and include those described in Chen, et al *METHODS IN ENZYMOLOGY* (2013) 523:303.

In some embodiments, cells that bind the antibody or fragment thereof comprising the CAR antigen recognition domain are isolated by FACS. In some embodiments, binders are characterized by methods of sequencing known in the art (e.g., Sanger sequencing, next generation sequencing) to determine the sequence of the encoded variable peptide. In some embodiments, the peptide sequence is synthesized by known methods of polypeptide synthesis and then characterized to determine binding affinity and selectivity to the CAR antigen recognition domain using immunological or biochemical based methods known in the art and further described herein.

C. Exemplary Methods

In some aspects, the disclosure provides methods to identify a peptide sequence motif that binds to the CAR antigen recognition domain, wherein the method comprises (i) preparing a peptide library comprising a population of cells (e.g., yeast cells) transformed with vectors, each vector comprising a synthetic polynucleotide that encodes a variable peptide, wherein the peptide is encoded by degenerate codons (e.g., NNK); and (ii) selecting one or more peptide sequence motifs that bind the CAR antigen recognition domain. In some aspects, the one or more peptide sequence motifs identified have a binding affinity (KD) for the CAR antigen recognition domain of at least 5 μM (e.g., about 1-5 μM). As described herein, the selection enables identification of at least two or more peptide sequence motifs that bind the CAR antigen recognition domain. In some aspects, the two or more peptide sequence motifs share a consensus motif, wherein the consensus motif comprises fixed residues that occur frequently at the same position in the two or more peptide sequence motifs, and variable residues that occur infrequently at the same position in the two or more peptide sequence motifs. In some aspects, the disclosure provides methods to improve one or more binding properties of the two or more peptide sequence motifs to the CAR antigen recognition domain. In some aspects, the method comprises (i) preparing a peptide library comprising a population of cells (e.g., yeast cells) transformed with vectors, each vector comprising a synthetic polynucleotide encoding a variable peptide, wherein the variable peptide comprises the consensus motif, and wherein each variable residue of the consensus motif is encoded by a degenerate codon; and (ii) selecting one or more peptide sequence motifs that bind the CAR antigen recognition domain, e.g., with improved binding affinity and/or decreased dissociation rate relative to the one or more peptide sequence motifs identified in the degenerate codon library. In some aspects, the concentration of the CAR antibody that is used for the selection is titrated to identify one or more peptide sequence motifs that bind the CAR antigen recognition domain with a desired binding affinity. In some aspects, the CAR antibody that is used for the selection is displaced with a competing CAR antibody (e.g., kinetic-based sorting), thereby enabling identification of one or more peptide sequence motifs that bind the CAR antigen recognition domain with high binding affinity (e.g., nanomolar or subnanomolar) and/or a slow rate of dissociation.

In some aspects, the disclosure is based on the discovery that one or more binding parameters (e.g., binding affinity, dissociation rate) of a sequence motif that binds a CAR antigen recognition domain is optimized by appending flanking residues to the N-terminus and/or C-terminus of the sequence motif. Accordingly, in some aspects, the disclosure provides a method to improve binding of a sequence motif for a CAR antigen recognition domain (e.g., a sequence motif identified in a peptide library described herein), the method comprising (i) preparing a peptide library comprising a population of cells (e.g., yeast cells) transformed with vectors, each vector comprising a synthetic polynucleotide encoding the sequence motif having N-terminal and/or C-terminal flanking residues (e.g., 1-20), wherein the flanking residues are each encoded by a degenerate codon; and (ii) selecting one or more peptides that bind to the CAR antigen recognition domain with increased binding affinity (KD) and/or decreased dissociation rate relative to the sequence motif without the N-terminal and/or C-terminal flanking residues. In some aspects, the selection is performed using kinetic-based sorting as described herein to limit the selection to peptides that bind the CAR antigen recognition domain with high binding affinity (e.g., nanomolar or subnanomolar) and/or a slow rate of dissociation.

(i) Degenerate Codon Library

In some embodiments, the disclosure provides a method of identifying a peptide ligand that selectively binds a CAR antigen recognition domain described herein, wherein the method comprises selection of a peptide sequence motif that binds the CAR antigen recognition domain, wherein the peptide library is prepared from a library of vectors, wherein each vector comprises a synthetic polynucleotide that encodes a variable peptide operably-linked to an adhesion protein, wherein each amino acid residue of the variable peptide is encoded by a degenerate codon.

In some embodiments, the synthetic polynucleotide encodes a variable peptide that is at least 5, 6, 7, 8, 9, 10, 11, 12, 13, 14, 15, 16, 17, 18, 19, or 20 amino acid residues in length. In some embodiments, the variable peptide is about 5-20, 5-25, 5-30, 5-35, or 5-40 amino acid residues in length. In some embodiments, the variable peptide is 5, 6, 7, 8, 9, 10, 11, or 12 amino acid residues in length In some embodiment, each amino acid residue of the variable peptide is encoded by a degenerate codon, wherein the degenerate codon is selected from NNK, NNN, NDT, or DBK. In some embodiments, the degenerate codon is NNK. In some embodiments, the synthetic polynucleotide that encodes the variable peptide is $(NNK)_w$ (SEQ ID NO: 134), wherein NNK is (A,T,G,C)(A,T,G,C)(G,T), and wherein w is an integer between 5 and 20. In some embodiments, w is an integer between 5 and 25, 5 and 30, 5 and 35, or 5 and 40. In some embodiments, w is 5, 6, 7, 8, 9, 10, 11, or 12. In some embodiments, the cellular library is a yeast display library. In some embodiments, the adhesion protein is Aga2p. In some embodiments, the synthetic polynucleotide encodes the variable peptide operably-linked to the C-terminus of Aga2p via a linker. In some embodiments, the linker is a peptide linker. In some embodiments, the synthetic polynucleotide comprises the nucleotide sequence set forth in SEQ ID NO: 84. In some embodiments, the synthetic polynucleotide encodes a polypeptide comprising the amino acid sequence set forth in SEQ ID NO: 83.

In some embodiments, the synthetic polynucleotide encodes a variable peptide comprising at least two fixed residues that are cysteine residues, wherein the remaining amino acid residues are encoded by a degenerate codon. In some embodiments, the at least two cysteine residues are capable of disulfide bond formation. In some embodiments, the synthetic polynucleotide encodes the variable peptide $(NNK)_x(TGY)(NNK)_y(TGY)(NNK)_z$ (SEQ ID NO: 135), wherein NNK is (A,T,G,C)(A,T,G,C)(G,T); wherein TGY is (T)(G)(T,C); wherein x is an integer between 1 and 7; wherein y is an integer between 1 and 7; and wherein z is an integer between 1 and 7. In some embodiments, y is 3. In some embodiments, the cellular library is a yeast display library. In some embodiments, the adhesion protein is Aga2p. In some embodiments, the synthetic polynucleotide encodes the variable peptide operably-linked to the C-terminus of Aga2p via a linker. In some embodiments, the linker is a peptide linker. In some embodiments, the synthetic polynucleotide comprises the nucleotide sequence set forth in SEQ ID NO: 127. In some embodiments, the synthetic polynucleotide encodes a polypeptide comprising the amino acid sequence set forth in SEQ ID NO: 126.

In some embodiments, the method comprises transforming the library of vectors into a population of cells (e.g., yeast cells), wherein the population of cell is maintained under conditions that induce expression of the synthetic polynucleotide in a plurality of transformed cells, thereby generating a cellular library. In some embodiments, the cellular library encodes at least about $1\times10^6$, about $5\times10^6$, about $1\times10^7$, about $5\times10^7$, about $1\times10^8$, about $5\times10^8$, or about $1\times10^9$ unique variable peptide sequences. In some embodiments, the cellular library encodes $1\times10^8$, $2\times10^8$, $3\times10^8$, $4\times10^8$, $5\times10^8$, $6\times10^8$, $7\times10^8$, $8\times10^8$, $9\times10^8$, or $1\times10^9$ unique variable peptide sequences. In some embodiments, the cellular library comprises transformed cells (e.g., yeast cells) that express about $10^2$, about $10^3$, about $10^4$, about $10^5$, or about $10^6$ copies of variable peptide per cell.

In some embodiments, the peptide library is used for selection of one or more peptide ligands that bind to the antigen-recognition domain of a CAR described herein. In some embodiments, the CAR antigen recognition domain binds to a disease-associated antigen. In some embodiments, the CAR antigen recognition domain binds to a tumor associated antigen. In some embodiments, the tumor-associated antigen is selected from CD19, CD20, CD30, CD70, CD138, EGFR, CD133, c-Met, carcinoembryonic antigen (CEA), epithelial cell adhesion molecule (Epcam), folate receptor alpha (FRα), ganglioside GD2, glypican-3 (GPC3), Kras G12D, mesothelin, mucin 1 (MUC1), mucin 16 (MUC16 ecto), natural killer group 2 member D (NKG2D), NY-ESO-1, prostate stem cell antigen (PSCA), Her2/neu, TRP1, ALK, and BCMA. In some embodiments, the CAR antigen recognition domain comprises an anti-CD19 antigen recognition domain, an anti-BCMA antigen recognition domain, an anti-EGFR antigen recognition domain, or an anti-Her2 antigen recognition domain. In some embodiments, the CAR antigen recognition domain comprises an anti-CD19 antigen recognition domain. In some embodiments, the CAR antigen recognition domain is an FMC63 antigen recognition domain.

In some embodiments, the selection comprises one or more rounds of negative selection using a solid support, e.g., a magnetic bead. In some embodiments, the negative selection comprises at least one, two, three, four, or five rounds of depletion of cells that bind to the solid support. In some embodiments, the negative selection comprises: (i) at least one, two, three, four, or five rounds of depletion of cells that bind a solid support having a plurality of binding sites that are unbound (e.g., streptavidin binding sites), wherein the depleted cells are removed by binding to the solid support; and/or (ii) at least one, two, three, four, or five rounds of depletion of cells that bind a solid support having a plurality of binding sites displaying an antibody or fragment thereof of an isotype control antibody, wherein the depleted cells are removed by binding to the solid support. In some embodiments, each round of (i) and/or (ii) is performed with at least about $10^5$, about $10^6$, about $10^7$, about $10^8$, about $10^9$, or about $10^{10}$ cells. In some embodiments, each round of (i) and/or (ii) is performed wherein the number of cells that exceeds the number of unique variable peptide sequences in the cellular library by at least 5-fold, 10-fold, 15-fold, 20-fold, 25-fold, or 30-fold. In some embodiments, each round of (i) and/or (ii) results in depletion of 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the population of cells.

In some embodiments, the selection comprises one or more rounds of positive selection using a solid support, e.g., a magnetic bead. In some embodiments, the positive selection comprises at least one, two, three, four, or five rounds of enrichment of cells that bind to the solid support. In some embodiments, at least one, two, three, four, or five rounds of positive selection comprise enrichment of cells that bind a solid support having a plurality of binding sites that display an antibody or fragment thereof comprising the CAR antigen-recognition domain. In some embodiments, the plurality of binding sites display an antibody that is a full-length antibody (e.g., IgG) comprising the CAR antigen-recognition domain. In some embodiments, the plurality of binding sites display an scFv comprising the CAR-antigen recognition domain. In some embodiments, the positive selection results in an enrichment of the population of cells, wherein the enrichment is an increase in the proportion of the population that binds the CAR antigen recognition domain relative to the population of cells prior to the positive selection, e.g., wherein the increase is at least 1.1-fold, 1.2-fold, 1.3-fold, 1.4-fold, 1.5-fold, 1.6-fold, 1.7-fold, 1.8-fold, 1.9-fold, or 2-fold.

In some embodiments, the positive selection comprises at least one, two, three, or four rounds of selection using a method of single-cell sorting (e.g., FACS). In some embodiments, the positive selection comprises labeling the population of cells with an antibody or fragment thereof comprising the CAR antigen-recognition domain, wherein the antibody or fragment thereof comprises a label for detection (e.g., fluorophore, biotin). In some embodiments, the labeling is performed with a full-length antibody (e.g., IgG) comprising the CAR antigen recognition domain. In some embodiments, the labeling is performed with a scFv comprising the CAR antigen recognition domain. In some embodiments, each round of the positive selection is performed with at least about $10^5$, about $10^6$, about $10^7$, about $10^8$, or about $10^9$ cells. In some embodiments, each round of the positive selection is performed using a number of cells that exceeds the number of unique variable peptide sequences in the cellular library by at least 5-fold, 6-fold, 7-fold, 8-fold, 9-fold, 10-fold, 15-fold, 20-fold, 25-fold, or 30-fold. In some embodiments, the population of cells is labeled with the antibody or fragment thereof at a concentration of about 50 nM, about 100 nM, about 200 nM, about 300 nM, about 400 nM, about 500 nM, about 1000 nM, about 1500 nM, about 2000 nM, about 2500 nM, about 3000 nM, about 3500 nM, about 4000 nM, about 4500 nM, or about 5000 nM. In some embodiments, the population of cells is labeled with the antibody or fragment thereof at a concentration of 1-5 μM, 1-10 μM, or 5-10 μM. In some embodiments, the positive selection comprises isolation of about 0.1%, about 0.2%, about 0.3%, about 0.4%, about 0.5%, about 0.6%, about 0.7%, about 0.8%, about 0.9%, or about 1.0% of cells labeled with the fluorescently tagged antibody or fragment thereof.

In some embodiments, isolated cells express a peptide sequence motif that binds the CAR antigen recognition domain. In some embodiments, the peptide sequence motif is identified by sequencing the isolated cells. In some embodiments, the peptide sequence motif binds to the CAR antigen recognition domain with a binding affinity ($K_D$) of about 1 μM to about 5 μM. In some embodiments, the peptide sequence motif binds to the CAR antigen recognition domain with a binding affinity ($K_D$) of about 0. μM to about 5 μM. In some embodiments, the peptide sequence motif binds to the CAR antigen recognition domain with a binding affinity ($K_D$) less than 0.5 μM. In some embodiments, at least one peptide sequence motif is identified. In some embodiments, more than one peptide sequence motif is identified. In some embodiments, the more than one peptide sequence motif is used to identify a consensus motif comprising at least 1, 2, 3, 4, or 5 fixed amino acid residues. In some embodiments, the fixed residues are found at the same position of each or a majority of the isolated peptide sequence motifs, and the remaining residues are variable residues that occur infrequently at equivalent positions in each of the isolated peptide sequence motif.

(ii) Fixed Pattern Library

In some embodiments, the disclosure provides a method of improving one or more binding properties of a peptide sequence motif identified from a peptide library described herein. In some embodiments, the method comprises preparing a library of vectors, wherein each vector comprises a synthetic polynucleotide that encodes a variable peptide operably-linked to an adhesion protein, wherein the variable peptide comprises a consensus motif identified from a peptide library described herein, and wherein variable residues of the consensus motif are encoded by a degenerate codon. In some embodiments, the degenerate codon is selected from NNK, NNN, NDT, or DBK. In some embodiments, the degenerate codon is NNK.

In some embodiments, the synthetic polynucleotide encodes a variable peptide that is at least 5, 6, 7, 8, 9, 10, 11, 12, 13, 14, 15, 16, 17, 18, 19, or 20 amino acid residues in length. In some embodiments, the variable peptide is about 5-20, 5-25, 5-30, 5-35, or 5-40 amino acid residues in length. In some embodiments, the variable peptide is 5, 6, 7, 8, 9, 10, 11, or 12 amino acid residues in length.

In some embodiments, the synthetic polynucleotide encodes a nucleotide sequence represented by the formula: $(CGN)(NNK)_q(TGY)(CCN)(TGG)(NNK)_r(TGY)(NNK)_s$ (SEQ ID NO: 136); wherein NNK is (A,T,G,C)(A,T,G,C)(G,T); wherein CGN is (C)(G)(A,T,G,C) and encodes the amino acid arginine (Arg); wherein TGY is (T)(G)(T,C) and encodes the amino acid cysteine (Cys); wherein CCN is (C)(C)(A,T,G,C) and encodes the amino acid proline (Pro); wherein TGG is (T)(G)(G) and encodes the amino acid tryptophan (Trp); wherein q is the number of encoded variable amino acid residues between Arg and the first Cys; wherein r is the number of variable encoded amino acid residues between Trp and the second Cys; and s is the number of encoded variable amino acid residues at the C-terminus of the second Cys. In some embodiments, q is 1, 2, or 3. In some embodiments, r is 1, 2, or 3. In some embodiments, s is 1, 2, 3, or 4. In some embodiments, q is 1, r is 1, and s is 3.

In some embodiments, the cellular library is a yeast display library. In some embodiments, the adhesion protein is Aga2p. In some embodiments, the synthetic polynucleotide encodes the variable peptide operably-linked to the C-terminus of Aga2p via a linker. In some embodiments, the linker is a peptide linker. In some embodiments, the variable peptide comprises a sequence represented by the formula: $(Arg)-(Xaa)_k-(Cys)-(Pro)-(Trp)-(Xaa)_l-(Cys)-(Xaa)_m$ (SEQ ID NO: 155), wherein Xaa is any amino acid, wherein k is 5-10; wherein 1 is 5-10; wherein m is 5-10; wherein AD is the adhesion protein (e.g., Aga2p); wherein L is a peptide linker; wherein T1 is a first tag; wherein T2 is a second tag; and wherein the first and second epitope tag are different. In some embodiments, T1 is HA and T2 is c-Myc. In some embodiments, k is 1, 1 is 1, and m is 3. In some embodiments, the gene fusion comprises a nucleotide sequence as set forth by SEQ ID NO: 86. some embodiments, the gene fusion encodes a polypeptide with an amino acid sequence as set forth by SEQ ID NO: 85.

In some embodiments, the method comprises transforming the library of vectors into a population of cells (e.g., yeast cells), wherein the population of cell is maintained under conditions that induce expression of the synthetic polynucleotide in a plurality of transformed cells, thereby generating a cellular library. In some embodiments, the cellular library encodes at least about $1\times10^6$, about $5\times10^6$, about $1\times10^7$, about $5\times10^7$, about $1\times10^8$, about $5\times10^8$, or about $1\times10^9$ unique variable peptide sequences. In some embodiments, the cellular library encodes $1\times10^8$, $2\times10^8$, $3\times10^8$, $4\times10^8$, $5\times10^8$, $6\times10^8$, $7\times10^8$, $8\times10^8$, $9\times10^8$, or $1\times10^9$ unique variable peptide sequences. In some embodiments, the cellular library comprises transformed cells (e.g., yeast cells) that express about $10^2$, about $10^3$, about $10^4$, about $10^5$, or about $10^6$ copies of variable peptide per cell.

In some embodiments, the selection comprises one or more rounds of negative selection using a solid support, e.g., a magnetic bead. In some embodiments, the negative selection comprises at least one, two, three, four, or five rounds of depletion of cells that bind to the solid support. In some embodiments, the negative selection comprises: (i) at least one, two, three, four, or five rounds of depletion of cells that bind a solid support having a plurality of binding sites that are unbound (e.g., streptavidin binding sites), wherein the depleted cells are removed by binding to the solid support; and/or (ii) at least one, two, three, four, or five rounds of depletion of cells that bind a solid support having a plurality of binding sites displaying an antibody or fragment thereof of an isotype control antibody, wherein the depleted cells are removed by binding to the solid support. In some embodiments, (i) and/or (ii) is performed wherein the solid support comprises magnetic beads, and wherein the number of beads to the number of cells is about 0.7 to 1, about 0.6 to 1, about 0.5 to 1, about 0.4 to 1, about 0.3 to 1, about 0.2 to 1, about 0.1 to 1, about 0.09 to 1, about 0.08 to 1, about 0.07 to 1, about 0.06 to 1, about 0.05 to 1, about 0.04 to 1, about 0.03 to 1, about 0.02 to 1, or about 0.01 to 1. In some embodiments, each round of (i) and/or (ii) is performed with at least about $10^5$, about $10^6$, about $10^7$, about $10^8$, or about $10^9$ cells. In some embodiments, each round of (i) and/or (ii) is performed wherein the number of cells exceeds the number of unique variable peptide sequences in the cellular library by at least 5-fold, 10-fold, 15-fold, 20-fold, 25-fold, or 30-fold. In some embodiments, each round of (i) and/or (ii) results in depletion of 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the population of cells.

In some embodiments, the selection comprises one or more rounds of positive selection using a solid support, e.g., a magnetic bead. In some embodiments, the positive selection comprises at least one, two, three, four, or five rounds of enrichment of cells that bind to the solid support. In some embodiments, at least one, two, three, four, or five rounds of positive selection comprise enrichment of cells that bind a solid support having a plurality of binding sites that display an antibody or fragment thereof comprising the CAR antigen-recognition domain. In some embodiments, the plurality of binding sites display an antibody that is a full-length antibody (e.g., IgG) comprising the CAR antigen-recognition domain. In some embodiments, the plurality of binding sites display an scFv comprising the CAR-antigen recognition domain. In some embodiments, the positive selection results in an enrichment of the population of cells, wherein the enrichment is an increase in the proportion of the population that binds the CAR antigen recognition domain relative to the population of cells prior to the positive selection, e.g., wherein the increase is at least 1.1-fold, 1.2-fold, 1.3-fold, 1.4-fold, 1.5-fold, 1.6-fold, 1.7-fold, 1.8-fold, 1.9-fold, or 2-fold.

In some embodiments, the positive selection comprises at least one, two, three, or four rounds of selection using a method of single-cell sorting (e.g., FACS). In some embodiments, the positive selection comprises labeling the population of cells with an antibody or fragment thereof comprising the CAR antigen-recognition domain, wherein the antibody or fragment thereof comprises a label for detection (e.g., fluorophore, biotin). In some embodiments, the labeling is performed with a full-length antibody (e.g., IgG) comprising the CAR antigen recognition domain. In some embodiments, the labeling is performed with a scFv comprising the CAR antigen recognition domain. In some embodiments, each round of the positive selection is performed with at least about $10^5$, about $10^6$, about $10^7$, about $10^8$, or about $10^9$ cells. In some embodiments, each round of the positive selection is performed using a number of cells that exceeds the number of unique variable peptide sequences in the cellular library by at least 5-fold, 6-fold, 7-fold, 8-fold, 9-fold, 10-fold, 15-fold, 20-fold, 25-fold, or 30-fold.

In some embodiments, the positive selection comprises (i) at least one round of selection, wherein the population of cells is labeled with the antibody or fragment thereof at a concentration of about 1 μM to about 5 μM; (ii) at least one round of selection, wherein the population of cells is labeled with the antibody or fragment thereof at a concentration of about 100 nM to about 1000 nM; (iii) at least one round of selection, wherein the population of cells is labeled with the antibody or fragment thereof at a concentration of about 10 nM to about 100 nM; (iv) at least one round of selection, wherein the population of cells is labeled with the antibody or fragment thereof at a concentration of about 1 nM to about 10 nM; and/or (v) at least one round of selection, wherein the population of cells is labeled with the antibody or fragment thereof at a concentration of about 0.1 nM to about 1 nM.

In some embodiments, the positive selection comprises (i) one round of selection, wherein the population of cells is labeled with the antibody or fragment thereof at a concentration of about 100 nM to about 1000 nM; and (ii) a round of selection, wherein the population of cells is labeled with the antibody or fragment thereof at a concentration of about 10 nM to about 100 nM.

In some embodiments, the positive selection comprises (i) one round of selection, wherein the population of cells is labeled with the antibody or fragment thereof at a concentration of about 100 nM to about 1000 nM; and (ii) a round of selection, wherein the population of cells is labeled with the antibody or fragment thereof at a concentration of about 1 nM to about 10 nM.

In some embodiments, the positive selection comprises (i) one round of selection, wherein the population of cells is labeled with the antibody or fragment thereof at a concentration of about 100 nM to about 1000 nM; and (ii) a round of selection, wherein the population of cells is labeled with the antibody or fragment thereof at a concentration of about 0.1 nM to about 1 nM.

In some embodiments, the positive selection comprises isolation of about 0.1%, about 0.2%, about 0.3%, about 0.4%, about 0.5%, about 0.6%, about 0.7%, about 0.8%, about 0.9%, or about 1.0% of cells labeled with the antibody or fragment thereof.

In some embodiments, the positive selection comprises at least one round of selection wherein the population of cells is labeled with the antibody or fragment thereof at a concentration of at least about 10 nM, 15 nM, 20 nM, 30 nM, 40 nM, 50 nM, 60 nM, 70 nM, 80 nM, 90 nM, 100 nM, 150 nM, 200 nM, 250 nM, 300 nM, 350 nM, 400 nM, 450 nM, or 500 nM or higher, wherein isolated cells express a variable peptide that binds the CAR antigen recognition domain with a binding affinity ($K_D$) of about 1 nM to about 5 μM. In some embodiments, the positive selection comprises at least one round of selection wherein the population of cells is labeled with the antibody or fragment thereof at a concentration of at least about 0.5 nM to about 1 nM, about 1 nM to about 5 nM, or about 0.5 nM, about 1 nM, about 2 nM, about 3 nM, about 4 nM, about 5 nM, wherein isolated cells express a variable peptide that binds the CAR antigen recognition domain with a binding affinity ($K_D$) of about 1 nM to about 1000 nM. In some embodiments, the positive selection comprises at least one round of selection wherein the population of cells is labeled with the antibody or fragment thereof at a concentration of at least about 0.05 nM to about 0.2 nM, about 0.1 nM to about 0.2 nM, or about 0.05 nM, about 0.06 nM, about 0.07 nM, about 0.08 nM, about 0.09 nM, about 0.1 nM, about 0.15 nM, or about 0.2 nM, wherein isolated cells express a variable peptide that binds the CAR antigen recognition domain with a binding affinity ($K_D$) of about 1 nM to about 500 nM.

In some embodiments, positive selection comprises at least one round of selection comprising: (i) labeling the population of cells with an antibody or fragment thereof comprising the CAR antigen recognition domain, wherein the antibody or fragment thereof comprises a label for detection (e.g., fluorophore, biotin); (ii) washing the population of cells, e.g., to remove unbound antibody or fragment thereof of (i); and (iii) labeling the population of cells with an unlabeled antibody or fragment thereof comprising the CAR antigen recognition domain. In some embodiments, (i) is performed with a concentration of the antibody or fragment thereof that is selected based on the binding affinity ($K_D$) of the weakest affinity binder in the population of cells for the CAR antigen recognition domain. In some embodiments, (i) is performed with a concentration of the antibody or fragment thereof that is at least 10-100% of the binding affinity ($K_D$) of the weakest affinity binder in the population of cells. In some embodiments, (i) is performed with a concentration of the antibody or fragment thereof that is at least 1-50 nM, 1-100 nM, 1-200 nM, 1-300 nM, 1-400 nM, or 1-500 nM. In some embodiments, (i) is performed with a concentration of the antibody or fragment thereof that is about 1, 5, 10, 20, 30, 40, 50, 60, 70, 80, 90 or 100 μM. In some embodiments, (i) is performed with a full-length antibody (e.g., IgG) comprising the CAR antigen recognition domain. In some embodiments, (i) is performed with an scFv comprising the CAR antigen recognition domain. In some embodiments, (iii) is performed with a concentration that is selected based on the concentration used in (i). In some embodiments, (iii) is performed with a concentration that is at least 10 to 200-fold higher than the concentration used in (i). In some embodiments, (iii) is performed with a concentration that is about 5, 10, 15, 20, 30, 40, 50, 60, 70, 80, 90, 100, 110, 120, 130, 140, 150, 160, 170, 180, 190, or 200-fold higher than the concentration used in (i). In some embodiments, (iii) is performed with a full-length antibody (e.g., IgG) comprising the CAR antigen recognition domain. In some embodiments, (iii) is performed with an scFv comprising the CAR antigen recognition domain.

In some embodiments, the isolated cells express a peptide sequence motif that binds the CAR antigen recognition domain. In some embodiments, the peptide sequence motif is identified by sequencing the isolated cells. In some embodiments, the selection provides a peptide sequence motif that binds the CAR antigen recognition domain with a binding affinity ($K_D$) that is micromolar (e.g., 1-5 μM), submicromolar (e.g., 0.1-1 μM), or nanomolar (e.g., 1-100 nM).

(iii) Flanking Residue Library

In some embodiments, the disclosure provides a method of improving or enhancing one or more binding properties of a peptide sequence motif identified from a peptide library described herein. In some embodiments, the method comprises preparing a library of vectors, wherein each vector comprises a synthetic polynucleotide encoding a variable peptide comprising a sequence motif that binds a CAR antigen recognition domain described herein (e.g., a sequence motif identified from a peptide library described herein, a sequence motif that binds the CAR antigen recognition domain with a binding affinity ($K_D$) of at least 5 μM) wherein the sequence motif has N-terminal and/or C-terminal flanking residues, (e.g., about 1-20 flanking residues) wherein the flanking residues are each any amino acid residue.

In some embodiments, the sequence motif binds to the CAR antigen recognition domain with a binding affinity ($K_D$) of at least 5 μM. In some embodiments, the sequence motif binds to the CAR antigen recognition domain with a binding affinity ($K_D$) of at least about 0.5 μM, about 0.6 μM, about 0.7 μM, about 0.8 μM, about 0.9 μM, about 1 μM, about 2 μM, about 3 μM, about 4 μM, or about 5 μM. In some embodiments, the sequence motif binds to the CAR antigen recognition domain with a binding affinity ($K_D$) of about 1 nM to about 5000 nM, or about 1 nM, about 10 nM, about 20 nM, about 30 nM, about 40 nM, about 50 nM, about 60 nM, about 70 nM, about 80 nM, about 90 nM, about 100 nM, about 150 nM, about 200 nM, about 250 nM, about 300 nM, about 350 nM, about 400 nM, about 450 nM, about 500 nM, about 550 nM, about 600 nM, about 650 nM, about 700 nM, about 750 nM, about 800 nM, about 850 nM, about 900 nM, about 950 nM, about 1000 nM, about 1500 nM, about 2000 nM, about 2500 nM, about 3000 nM, about 3500 nM, about 4000 nM, about 4500 nM, or about 5000 nM.

In some embodiments, the synthetic polynucleotide encodes a variable peptide that is at least 7-40 amino acid residues in length. In some embodiments, the variable peptide is about 7-20, 7-25, 7-30, 7-35, or 7-40 amino acid residues in length. In some embodiments, the variable peptide is 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 amino acid residues in length.

In some embodiments, the synthetic polynucleotides encoding the variable peptide has a nucleotide sequence represented by the formula: (NNK)t(M)u(NNK)v (SEQ ID NO: 150); wherein NNK (A,T,G,C)(A,T,G,C)(G,T); wherein M encodes the sequence motif that binds the CAR antigen recognition domain with a binding affinity ($K_D$) of at least 5 μM; wherein u is the number of residues present in the sequence motif; wherein u is an integer between 5 and 20; wherein t is an integer between 0 and 20; v is an integer between 0 and 20; and v+t is an integer between 1 and 40. In some embodiments, the sequence motif binds to the CAR antigen recognition domain with a binding affinity ($K_D$) of about 1-50 nM, 1-100 nM, 1-200 nM, 1-300 nM, 1-400 nM, 1-500 nM, 50-500 nM, 100-500 nM, 0.1-1 μM, 0.5-1 μM, 0.5-2 μM, 0.5-3 μM, 0.5-4 μM, or 0.5-5 μM. In some embodiments, u is 5, 6, 7, 8, 9, 10, 11, 12, 13, 14, 15, 16, 17, 18, 19, or 20. In some embodiments, t is 1, 2, 3, 4, 5, 6, 7, 8, 9, 10, 11, 12, 13, 14, 15, 16, 17, 18, 19, or 20; and v is 0. In some embodiments, v is 1, 2, 3, 4, 5, 6, 7, 8, 9, 10, 11, 12, 13, 14, 15, 16, 17, 18, 19, or 20; and t is 0. In some embodiments, t is 1, 2, 3, 4, 5, 6, 7, 8, 9, 10, 11, 12, 13, 14, 15, 16, 17, 18, 19, or 20; and v is 1, 2, 3, 4, 5, 6, 7, 8, 9, 10, 11, 12, 13, 14, 15, 16, 17, 18, 19, or 20. In some embodiments, u is 7, 8, 9, or 10; t is 10 and v is 10. In some embodiments, u is 7, 8, 9, or 10; t is 6; and v is 10. In some embodiments, u is 7, 8, 9, or 10; t is 0; and v is 6 or 10. In some embodiments, u is 7, 8, 9, or 10; t is 3; and v is 6.

In some embodiments, the synthetic polynucleotides encoding the variable peptide has a nucleotide sequence represented by the formula: (NNK)t(M)u(NNK)v (SEQ ID NO: 150); wherein M encodes a sequence motif that binds the CAR antigen recognition domain with a binding affinity ($K_D$) of at least 5 μM, wherein M comprises a nucleotide sequence represented by the formula: $(NNK)_x(TGY)(NNK)_y(TGY)(NNK)_z$ (SEQ ID NO: 135); wherein NNK is (A,T,G,C)(A,T,G,C)(G,T); wherein TGY is (T)(G)(T,C); wherein x is an integer between 1 and 7; wherein y is an integer between 1 and 7; wherein z is an integer between 1 and 7; wherein t is an integer between 0 and 20; v is an integer between 0 and 20; and v+t is an integer between 1 and 40. In some embodiments, y is 3. In some embodiments, the sequence motif binds to the CAR antigen recognition domain with a binding affinity ($K_D$) of about 1-50 nM, 1-100 nM, 1-200 nM, 1-300 nM, 1-400 nM, 1-500 nM, 50-500 nM, 100-500 nM, 0.1-1 μM, 0.5-1 μM, 0.5-2 μM, 0.5-3 μM, 0.5-4 μM, or 0.5-5 μM. In some embodiments, u is 5, 6, 7, 8, 9, 10, 11, 12, 13, 14, 15, 16, 17, 18, 19, or 20. In some embodiments, t is 1, 2, 3, 4, 5, 6, 7, 8, 9, 10, 11, 12, 13, 14, 15, 16, 17, 18, 19, or 20; and v is 0. In some embodiments, v is 1, 2, 3, 4, 5, 6, 7, 8, 9, 10, 11, 12, 13, 14, 15, 16, 17, 18, 19, or 20; and t is 0. In some embodiments, t is 1, 2, 3, 4, 5, 6, 7, 8, 9, 10, 11, 12, 13, 14, 15, 16, 17, 18, 19, or 20; and v is 1, 2, 3, 4, 5, 6, 7, 8, 9, 10, 11, 12, 13, 14, 15, 16, 17, 18, 19, or 20. In some embodiments, u is 7, 8, 9, or 10; t is 10 and v is 10. In some embodiments, u is 7, 8, 9, or 10; t is 6; and v is 10. In some embodiments, u is 7, 8, 9, or 10; t is 0; and v is 6 or 10. In some embodiments, u is 7, 8, 9, or 10; t is 3; and v is 6.

In some embodiments, the cellular library is a yeast display library. In some embodiments, the adhesion protein is Aga2p. In some embodiments, the synthetic polynucleotide encodes the variable peptide operably-linked to the C-terminus of Aga2p via a linker. In some embodiments, the linker is a peptide linker.

In some embodiments, the method comprises transforming the library of vectors into a population of cells (e.g., yeast cells), wherein the population of cell is maintained under conditions that induce expression of the synthetic polynucleotide in a plurality of transformed cells, thereby generating a cellular library. In some embodiments, the cellular library encodes at least about $1\times10^6$, about $5\times10^6$, about $1\times10^7$, about $5\times10^7$, about $1\times10^8$, about $5\times10^8$, or about $1\times10^9$ unique variable peptide sequences. In some embodiments, the cellular library encodes $1\times10^8$, $2\times10^8$, $3\times10^8$, $4\times10^8$, $5\times10^8$, $6\times10^8$, $7\times10^8$, $8\times10^8$, $9\times10^8$, or $1\times10^9$ unique variable peptide sequences. In some embodiments, the cellular library comprises transformed cells (e.g., yeast cells) that express about $10^2$, about $10^3$, about $10^4$, about $10^5$, or about $10^6$ copies of variable peptide per cell.

In some embodiments, the selection comprises one or more rounds of negative selection using a solid support, e.g., a magnetic bead. In some embodiments, the negative selection comprises at least one, two, three, four, or five rounds of depletion of cells that bind to the solid support. In some embodiments, the negative selection comprises: (i) at least one, two, three, four, or five rounds of depletion of cells that bind a solid support having a plurality of binding sites that are unbound (e.g., streptavidin binding sites), wherein the depleted cells are removed by binding to the solid support; and/or (ii) at least one, two, three, four, or five rounds of depletion of cells that bind a solid support having a plurality of binding sites displaying an antibody or fragment thereof of an isotype control antibody, wherein the depleted cells are removed by binding to the solid support. In some embodiments, each round of (i) and/or (ii) is performed with a number of binding sites per cell that is about $5\times10^6$ to 1, about $4\times10^6$ to 1, about $3\times10^6$ to 1, about $2\times10^6$ to 1, about $1\times10^6$ to 1, about $0.5\times10^6$ to 1, or about $0.1\times10^6$ to 1. In some embodiments, (i) and/or (ii) is performed wherein the solid support comprises magnetic beads, and wherein the number of beads to the number of cells is about 0.7 to 1, about 0.6 to 1, about 0.5 to 1, about 0.4 to 1, about 0.3 to 1, about 0.2 to 1, about 0.1 to 1, about 0.09 to 1, about 0.08 to 1, about 0.07 to 1, about 0.06 to 1, about 0.05 to 1, about 0.04 to 1, about 0.03 to 1, about 0.02 to 1, or about 0.01 to 1. In some embodiments, each round of (i) and/or (ii) is performed with at least about $10^5$, about $10^6$, about $10^7$, about $10^8$, or about $10^9$ cells. In some embodiments, each round of (i) and/or (ii) is performed wherein the number of cells exceeds the number of unique variable peptide sequences in the cellular library by at least 5-fold, 10-fold, 15-fold, 20-fold, 25-fold, or 30-fold.

In some embodiments, the selection comprises one or more rounds of positive selection using a solid support, e.g., a magnetic bead. In some embodiments, the positive selection comprises at least one, two, three, four, or five rounds of enrichment of cells that bind to the solid support. In some embodiments, at least one, two, three, four, or five rounds of positive selection comprise enrichment of cells that bind a solid support having a plurality of binding sites that display an antibody or fragment thereof comprising the CAR antigen-recognition domain. In some embodiments, the plurality of binding sites display an antibody that is a full-length antibody (e.g., IgG) comprising the CAR antigen-recognition domain. In some embodiments, the plurality of binding sites display an scFv comprising the CAR-antigen recognition domain.

In some embodiments, the positive selection comprises at least one, two, three, or four rounds of selection using a method of single-cell sorting (e.g., FACS). In some embodiments, the positive selection comprises labeling the population of cells with a fluorescently tagged antibody or fragment thereof comprising the CAR antigen-recognition domain. In some embodiments, the labeling is performed with a full-length antibody (e.g., IgG) comprising the CAR antigen recognition domain. In some embodiments, the labeling is performed with a scFv comprising the CAR antigen recognition domain. In some embodiments, each round of the positive selection is performed with at least about $10^5$, about $10^6$, about $10^7$, about $10^8$, or about $10^9$ cells. In some embodiments, each round of the positive selection is performed using a number of cells that exceeds the number of unique variable peptide sequences in the cellular library by at least 5-fold, 6-fold, 7-fold, 8-fold, 9-fold, 10-fold, 15-fold, 20-fold, 25-fold, or 30-fold.

In some embodiments, positive selection comprises at least one round of selection comprising: (i) labeling the population of cells with an antibody or fragment thereof comprising the CAR antigen recognition domain, wherein the antibody or fragment thereof comprises a label for detection (e.g., fluorophore, biotin); (ii) washing the population of cells, e.g., to remove unbound antibody or fragment thereof of (i); and (iii) labeling the population of cells with an unlabeled antibody or fragment thereof comprising the CAR antigen recognition domain. In some embodiments, (i) is performed with a concentration of the antibody or fragment thereof that is selected based on the binding affinity ($K_D$) of the weakest affinity binder in the population of cells for the CAR antigen recognition domain. In some embodiments, (i) is performed with a concentration of the antibody or fragment thereof that is at least 10-100% of the binding affinity ($K_D$) of the weakest affinity binder in the population of cells. In some embodiments, (i) is performed with a concentration of the antibody or fragment thereof that is at least 1-50 nM, 1-100 nM, 1-200 nM, 1-300 nM, 1-400 nM, or 1-500 nM. (i) is performed with a concentration of the antibody or fragment thereof that is about 1, 5, 10, 20, 30, 40, 50, 60, 70, 80, 90 or 100 μM. In some embodiments, (i) is performed with a full-length antibody (e.g., IgG) comprising the CAR antigen recognition domain. In some embodiments, (i) is performed with an scFv comprising the CAR antigen recognition domain. In some embodiments, (iii) is performed with a concentration of that is selected based on the concentration used in (i). In some embodiments, (iii) is performed with a concentration that is at least 10-200-fold higher than the concentration used in (i). In some embodiments, (iii) is performed with a concentration that is about 5, 10, 15, 20, 30, 40, 50, 60, 70, 80, 90, 100, 110, 120, 130, 140, 150, 160, 170, 180, 190, or 200-fold higher than the concentration used in (i). In some embodiments, (iii) is performed with a full-length antibody (e.g., IgG) comprising the CAR antigen recognition domain. In some embodiments, (iii) is performed with an scFv comprising the CAR antigen recognition domain.

In some embodiments, the isolated cells express a peptide sequence motif that binds the CAR antigen recognition domain. In some embodiments, the peptide sequence motif is identified by sequencing the isolated cells. In some embodiments, the selection provides for isolation of transformed cells expressing peptides comprising a sequence motif with N-terminal and/or C-terminal flanking residues that have increased binding affinity and/or decreased dissociation rate for the CAR antigen recognition domain relative to a peptide comprising only the sequence motif.

Chimeric Antigen Receptors

In some aspects, the disclosure provides compositions and methods to be used or performed in conjunction with chimeric antigen receptor (CAR) effector cells.

Chimeric antigen receptors (CARs) are genetically-engineered, artificial transmembrane receptors, which confer an arbitrary specificity for a ligand onto an immune effector cell (e.g. a T cell, natural killer cell or other immune cell) and which results in activation of the effector cell upon recognition and binding to the ligand. Typically these receptors are used to impart the antigen specificity of a monoclonal antibody onto a T cell.

In some embodiments, CARs contain three domains: 1) an ectodomain typically comprising a signal peptide, a ligand or antigen recognition region (e.g. scFv), and a flexible spacer; 2) a transmembrane (TM) domain; 3) an endodomain (alternatively known as an "activation domain") typically comprising one or more intracellular signaling domains. The ectodomain of the CAR resides outside of the cell and is exposed to the extracellular space, whereby it is accessible for interaction with its cognate ligand. The TM domain allows the CAR to be anchored into the cell membrane of the effector cell. The third endodomain (also known as the "activation domain") aids in effector cell activation upon binding of the CAR to its specific ligand. In some embodiments, effector cell activation comprises induction of cytokine and chemokine production, as well as activation of the cytolytic activity of the cells. In some embodiments, the CARs redirect cytotoxicity toward tumor cells.

In some embodiments, CARs comprise a ligand- or antigen-specific recognition domain that binds to a specific target ligand or antigen (also referred to as a binding domain or an antigen recognition domain). In some embodiments, the binding domain is a single-chain antibody variable fragment (scFv), a tethered ligand or the extracellular domain of a co-receptor, fused to a transmembrane domain, which is linked, in turn, to a signaling domain. In some embodiments, the signaling domain is derived from CD3ζ or FcRγ. In some embodiments, the CAR comprises one or more co-stimulatory domains derived from a protein such as CD28, CD137 (also known as 4-1BB), CD134 (also known as OX40) and CD278 (also known as ICOS).

Engagement of the antigen binding domain of the CAR with its target antigen on the surface of a target cell results in clustering of the CAR and delivers an activation stimulus to the CAR-containing cell. In some embodiments, the main characteristic of CARs are their ability to redirect immune effector cell specificity, thereby triggering proliferation, cytokine production, phagocytosis or production of molecules that can mediate cell death of the target antigen expressing cell in a major histocompatibility (MHC) independent manner, exploiting the cell specific targeting abilities of monoclonal antibodies, soluble ligands or cell specific co-receptors. Although scFv-based CARs engineered to contain a signaling domain from CD3ζ or FcRγ have been shown to deliver a potent signal for T cell activation and effector function, they are not sufficient to elicit signals that promote T cell survival and expansion in the absence of a concomitant co-stimulatory signal. A new generation of CARs containing a binding domain, a hinge, a transmembrane and the signaling domain derived from CD3ζ or FcRγ together with one or more co-stimulatory signaling domains (e.g., intracellular co-stimulatory domains derived from CD28, CD137, CD134 and CD278) has been shown to more effectively direct antitumor activity as well as increased cytokine secretion, lytic activity, survival and proliferation in CAR expressing T cells in vitro, in animal models and cancer patients (Milone et al., Molecular Therapy, 2009; 17: 1453-1464; Zhong et al., Molecular Therapy, 2010; 18: 413-420; Carpenito et al., PNAS, 2009; 106:3360-3365).

In some embodiments, chimeric antigen receptor-expressing effector cells (e.g. CAR-T cells) are cells that are derived from a patient with a disease or condition and genetically modified in vitro to express at least one CAR with an arbitrary specificity to a ligand. The cells perform at least one effector function (e.g. induction of cytokines) that is stimulated or induced by the specific binding of the ligand to the CAR and that is useful for treatment of the same patient's disease or condition. In some embodiments, the effector cells are T cells (e.g. cytotoxic T cells or helper T cells). One skilled in the art would understand that other cell types (e.g. a natural killer cell or a stem cell) may express CARs and that a chimeric antigen receptor effector cell may comprise an effector cell other than a T cell. For example, in some embodiments the effector cell is an NK cell. In some embodiments, the effector cell is a macrophage. In some embodiments, the effector cell is an NKT cell. In some embodiments, the effector cell is a T cell (e.g. a cytotoxic T cell) that exerts its effector function (e.g. a cytotoxic T cell response) on a target cell when brought in contact or in proximity to the target or target cell (e.g. a cancer cell) (see e.g., Chang and Chen (2017) Trends Mol Med 23(5):430-450).

Prolonged exposure of T cells to their cognate antigen can result in exhaustion of effector functions, enabling the persistence of infected or transformed cells. Recently developed strategies to stimulate or rejuvenate host effector function using agents that induce an immune checkpoint blockade have resulted in success towards the treatment of several cancers. Emerging evidence suggests that T cell exhaustion may also represent a significant impediment in sustaining long-lived antitumor activity by chimeric antigen receptor-expressing T cells (CAR-T cells). In some embodiments, the differentiation status of the patient-harvested T cells prior to CAR transduction and the conditioning regimen a patient undergoes before reintroducing the CAR-T cells (e.g., addition or exclusion of alkylating agents, fludarabine, total-body irradiation) can profoundly affect the persistence and cytotoxic potential of CAR-T cells. In vitro culture conditions that stimulate (via anti-CD3/CD28 or stimulator cells) and expand (via cytokines, such as IL-2) T cell populations can also alter the differentiation status and effector function of CAR-T cells (Ghoneim et al., (2016) Trends in Molecular Medicine 22(12):1000-1011).

The present disclosure addresses several shortcomings with current approaches toward the generation of therapeutic CAR-T cells. Existing methods of therapeutic CAR-T cell preparation often requires extensive cell culture in vitro to obtain a sufficient number of modified cells for adoptive cell transfer, during which natural identity or differentiation state of the T cells may have changed and T cell function may have been compromised. Furthermore, when patients are in urgent need of therapy to prevent disease progression, the time required to generate sufficient quantities of CAR-T cells may not be aligned with the opportunity to treat the patient, resulting in therapeutic failure and demise of the patient. The compositions and methods provided by the disclosure bypass this hurdle and offer an expedient and more physiologically relevant therapeutic approach by stimulating CAR-T cell activation and proliferation in vivo. In addition, current CAR-T cell therapy regime requires lymphodepletion beforehand, which weakens patients' health and destroys the nourishing environment that can improve CAR-T efficacy. In some aspects, the disclosure provides methods to stimulate adoptively transferred CAR-T cells such that they can still engraft, actively proliferate and expand in vivo in the absence of lymphodepletion or with use of a more mild lymphodepletion regimen.

Current CAR-T cell therapy only relies on the engineered co-stimulatory signal to maintain CAR-T effector function. The lack of other co-stimulatory signals and a natural stimulatory environment may lead to incomplete T cell maturation and increased T cell exhaustion. In one aspect, the disclosure provides methods and compositions to recruit T cells into lymph nodes, the physiologically relevant activation environment for immune cells and co-administration of adjuvant to activate APCs which provide a complete suite of essential co-stimulatory signals for optimal CAR-T cell activation.

In some embodiments, in particular for the treatment of ALL and/or NHL, suitable CARs target CD19 or CD20. Non-limiting examples include CARs comprising a structure: (i) an anti-CD19 scFv, a CD8 H/TM domain, an 4-1BB CS domain and a CD3ζ TCR signaling domain; (ii) an anti-CD19 scFv, a CD28 hinge and transmembrane domain, a CD28 co-stimulatory domain and a CD3ζ TCR signaling domain; and (iii) an anti-CD20 scFv, an IgG hinge and transmembrane domain, a CD28/4-1BB co-stimulatory domain and a CD3ζ TCR signaling domain.

In some embodiments, the anti-CD19 CAR comprises an anti-CD19 scFv derived from FMC63 As used herein, "FMC63" refers to a murine monoclonal antibody that specifically binds to human CD19 (see, e.g., Nicholson, et al. (1997) *MOL IMMUNOL* 34:1157; Imai, et al (2004) *LEUKEMIA* 18:676; Kowolik, et al (2006) *CANCER RES.* 66:10995; U.S. Pat. No. 9,701,758). Amino acid sequences of the VH and VL domains of FMC63 are set forth by SEQ ID NOs: 71 and 72 respectively.

In some embodiments, a CAR effector cell suitable for combination with the combinations and methods disclosed herein targets CD19, including but not limited to Kymriah™ (tisagenlecleucel; Novartis; formerly CTL019) and Yescarta™ (axicabtagene ciloleucel; Kite Pharma).

Tandem CAR (TanCAR) Effector Cells

It has been observed that using a CAR approach for cancer treatment, tumor heterogeneity and immunoediting can cause escape from CAR treatment (Grupp et al., New Eng. J. Med (2013) 368:1509-1518). As an alternative approach, bispecific CARs, known as tandem CARs or TanCARs, have been developed in an attempt to target multiple cancer specific markers simultaneously. In a TanCAR, the extracellular domain comprises two antigen binding specificities in tandem, joined by a linker. The two binding specificities (scFvs) are thus both linked to a single transmembrane portion: one scFv being juxtaposed to the membrane and the other being in a distal position. As an exemplary TanCAR, Grada et al. (Mol Ther Nucleic Acids (2013) 2, e105) describes a TanCAR which includes a CD19-specific scFv, followed by a Gly-Ser linker and a HER2-specific scFv. The HER2-scFv was in the juxta-membrane position, and the CD19-scFv in the distal position. The TanCAR was shown to induce distinct T cell reactivity against each of the two tumor restricted antigens.

Accordingly, some aspects of the disclosure relate to a tandem chimeric antigen receptor that mediates bispecific activation and targeting of T cells. Although the present disclosure refers to bispecificity for the CAR, in some aspects the CARs are able to target three, four, or more tumor antigens. Targeting multiple antigens using CAR T cells may enhance T cell activation and/or offset tumor escape by antigen loss. TanCARs may also target multiple expressed antigens, target various tumors using the same cellular product with a broad specificity, and/or provide a better toxicity profile with a less intensely signaling CAR achieving the same results due to multiple specificity.

In some embodiments, the disclosure provides a TanCAR that includes two targeting domains. In some embodiments, the disclosure provides a multispecific TanCAR that includes three or more targeting domains. In another embodiment, the disclosure provides a first CAR and second CAR at the cell surface, each CAR comprising an antigen-binding domain, wherein the antigen-binding domain of the first CAR binds to a first tumor antigen (e.g., CD19, CD20, CD22, HER2) and the antigen-binding domain of the second CAR binds to another (different) tumor antigen. TanCARs are described in US20160303230A1 and US20170340705A1, incorporated herein by reference.

In some embodiments, the TanCAR of the disclosure targets two or more tumor antigens. Exemplary tumor antigens include one or more of CD19, CD20, CD22, k light chain, CD30, CD33, CD123, CD38, ROR1, ErbB2, ErbB3/4, EGFr vIII, carcinoembryonic antigen, EGP2, EGP40, mesothelin, TAG72, PSMA, NKG2D ligands, B7-H6, IL-13 receptor α2, MUC1, MUC16, CA9, GD2, GD3, HMW-MAA, CD171, Lewis Y, G250/CALX, HLA-AI MAGE A1, HLA-A2 NY-ESO-1, PSC1, folate receptor-α, CD44v7/8, 8H9, NCAM, VEGF receptors, 5T4, Fetal AchR, NKG2D ligands, CD44v6, TEM1, and/or TEM8.

In some embodiments, the disclosure provides a bispecific TanCAR that targets CD19 and another tumor antigen. In some embodiments, the disclosure provides a bispecific TanCAR that targets CD22 and another tumor antigen. In some embodiments, the disclosure provides a bispecific TanCAR that targets HER2 and another tumor antigen. In some embodiments, the disclosure provides a bispecific TanCAR that targets IL13R-alpha2 and another tumor antigen. In some embodiments, the disclosure provides a bispecific TanCAR that targets VEGF-A and another tumor antigen. In some embodiments, the disclosure provides a bispecific TanCAR that targets Tem8 and another tumor antigen. In some embodiments, the disclosure provides a bispecific TanCAR that targets FAP and another tumor antigen. In some embodiments, the disclosure provides a bispecific TanCAR that targets EphA2 and another tumor antigen. In some embodiments, the disclosure provides a bispecific TanCAR that targets one or more, two or more, three or more, or four or more of the following tumor antigens: CD19, CD22, HER2, IL13R-alpha2, VEGF-A, Tem8, FAP, or EphA2, and any combination thereof. In some embodiments, the disclosure provides a bispecific TanCAR that targets HER2 and IL13R-alpha2. In some embodiments, the disclosure provides a bispecific TanCAR that targets CD19 and CD22.

Methods for Generating Chimeric Antigen Receptors and CAR Effector Cells

In some embodiments, a subject's effectors cells (e.g., T cells, NK cells, macrophages, NKT cells) are genetically modified with a chimeric antigen receptor (Sadelain et al., *Cancer Discov.* 3:388-398, 2013). For example, an effector cell (e.g., T cell) is provided and a recombinant nucleic acid encoding a chimeric antigen receptor is introduced into the patient-derived effector cell (e.g., T cell) to generate a CAR cell. In some embodiments, effector cells (e.g., T cells) not derived from the subject are genetically modified with a chimeric antigen receptor. For example, in some embodiments, effector cells (e.g., T cells) are allogeneic cells that have been engineered to be used as an "off the shelf" adoptive cell therapy, such as Universal Chimeric Antigen Receptor T cells (UCARTs), as developed by Cellectis. UCARTs are allogeneic CAR T cells that have been engineered to be used for treating the largest number of patients with a particular cancer type. Non-limiting examples of UCARTs under development by Cellectis include those that target the following tumor antigens: CD19, CD123, CD22, CS1 and CD38.

A variety of different methods known in the art can be used to introduce any of the nucleic acids or expression vectors disclosed herein into an effector cell (e.g., T cell). Non-limiting examples of methods for introducing nucleic acid into a an effector cell (e.g., T cell) include: lipofection, transfection (e.g., calcium phosphate transfection, transfection using highly branched organic compounds, transfection using cationic polymers, dendrimer-based transfection, optical transfection, particle-based transfection (e.g., nanoparticle transfection), or transfection using liposomes (e.g., cationic liposomes)), microinjection, electroporation, cell squeezing, sonoporation, protoplast fusion, impalefection, hydrodynamic delivery, gene gun, magnetofection, viral transfection, and nucleofection. Furthermore, the CRISPR/Cas9 genome editing technology known in the art can be used to introduce CAR nucleic acids into effector cells (e.g., T cells) and/or to introduce other genetic modifications (e.g., as described below) into effector cells (e.g., T cells) to enhance CAR cell activity (for use of CRISPR/Cas9 technology in connection with CAR T cells, see e.g., U.S. Pat. Nos. 9,890,393; 9,855,297; US 2017/0175128; US 2016/0184362; US 2016/0272999; WO 2015/161276; WO 2014/191128; CN 106755088; CN 106591363; CN 106480097; CN 106399375; CN 104894068).

Provided herein are methods that can be used to generate any of the cells or compositions described herein where each cell can express a CAR (e.g., any of the CARs described herein).

Chimeric antigen receptors (CARs) include an antigen-binding domain, a transmembrane domain, and an cytoplasmic signaling domain that includes a cytoplasmic sequence of CD3ζ sequence sufficient to stimulate a T cell when the antigen-binding domain binds to the antigen, and optionally, a cytoplasmic sequence of one or more (e.g., two, three, or four) co-stimulatory proteins (e.g., a cytoplasmic sequence of one or more of B7-H3, BTLA, CD2, CD7, CD27, CD28, CD30, CD40, CD40L, CD80, CD160, CD244, ICOS, LAG3, LFA-1, LIGHT, NKG2C, 4-1BB, OX40, PD-1, PD-L1, TIM3, and a ligand that specifically binds to CD83) that provides for co-stimulation of the T cell when the antigen-binding domain binds to the antigen. In some embodiments, a CAR can further include a linker. Non-limiting aspects and features of CARs are described below. Additional aspects of CARs and CAR cells, including exemplary antigen-binding domains, linkers, transmembrane domains, and cytoplasmic signaling domains, are described in, e.g., Kakarla et al., *Cancer J.* 20:151-155, 2014; Srivastava et al., *Trends Immunol.* 36:494-502, 2015; Nishio et al., *Oncoimmunology* 4(2): e988098, 2015; Ghorashian et al., *Br. J. Haematol.* 169:463-478, 2015*; Levine, Cancer Gene Ther.* 22:79-84, 2015; Jensen et al., *Curr. Opin. Immunol.* 33:9-15, 2015; Singh et al., *Cancer Gene Ther.* 22:95-100, 2015; Li et al., *Zhongguo Shi Yan Xue Ye Xue Za Zhi* 22:1753-1756, 2014; Gill et al., *Immunol. Rev.* 263:68-89, 2015; Magee et al., *Discov. Med.* 18:265-271, 2014; Gargett et al., *Front. Pharmacol.* 5:235, 2014; Yuan et al., *Zhongguo Shi Yan Xue Ye Xue Za Zhi* 22:1137-1141, 2014; Pedgram et al., *Cancer J.* 20:127-133, 2014; Eshhar et al., *Cancer J.* 20:123-126, 2014; Ramos et al., *Cancer J.* 20:112-118, 2014; Maus et al., *Blood* 123:2625-2635, 2014; Jena et al., *Curr. Hematol. Malig. Rep.* 9:50-56, 2014; Maher et al., *Curr. Gene Ther.* 14:35-43, 2014; Riches et al., *Discov. Med.* 16:295-302, 2013; Cheadle et al., *Immunol. Rev.* 257:83-90, 2014; Davila et al., *Int. J. Hematol.* 99:361-371, 2014; Xu et al., *Cancer Lett.* 343:172-178, 2014; Kochenderfer et al., *Nat. Rev. Clin. Oncol.* 10:267-276, 2013; Hosing et al., *Curr. Hematol. Malig. Rep.* 8:60-70, 2013; Hombach et al., *Curr. Mol. Med.* 13:1079-1088, 2013; Xu et al., *Leuk. Lymphoma* 54:255-260, 2013; Gilham et al., *Trends Mol. Med.* 18:377-384, 2012; Lipowska-Bhalla et al., *Cancer Immunol. Immunother.* 61:953-962, 2012; Chmielewski et al., *Cancer Immunol. Immunother.* 61:1269-1277, 2013; Jena et al., *Blood* 116:1035-1044, 2010; Dotti et al, *Immunology Reviews* 257(1): 107-126, 2013; Dai et al., *Journal of the National Cancer Institute* 108(7): djv439, 2016; Wang and Riviere, *Molecular Therapy-Oncolytics* 3: 16015, 2016; U.S. Patent Application Publication Nos. 2018/0057609; 2018/0037625; 2017/0362295; 2017/0137783; 2016/0152723, 2016/0206656, 2016/0199412, 2016/0208018, 2015/0232880, 2015/0225480; 2015/0224143; 2015/0224142; 2015/0190428; 2015/0196599; 2015/0152181; 2015/0140023; 2015/0118202; 2015/0110760; 2015/0099299; 2015/0093822; 2015/0093401; 2015/0051266; 2015/0050729; 2015/0024482; 2015/0023937; 2015/0017141; 2015/0017136; 2015/0017120;

2014/0370045; 2014/0370017; 2014/0369977; 2014/0349402; 2014/0328812; 2014/0322275; 2014/0322216; 2014/0322212; 2014/0322183; 2014/0314795; 2014/0308259; 2014/0301993; 2014/0296492; 2014/0294784; 2014/0286973; 2014/0274909; 2014/0274801; 2014/0271635; 2014/0271582; 2014/0271581; 2014/0271579; 2014/0255363; 2014/0242701; 2014/0242049; 2014/0227272; 2014/0219975; 2014/0170114; 2014/0134720; 2014/0134142; 2014/0120622; 2014/0120136; 2014/0106449; 2014/0106449; 2014/0099340; 2014/0086828; 2014/0065629; 2014/0050708; 2014/0024809; 2013/0344039; 2013/0323214; 2013/0315884; 2013/0309258; 2013/0288368; 2013/0287752; 2013/0287748; 2013/0280221; 2013/0280220; 2013/0266551; 2013/0216528; 2013/0202622; 2013/0071414; 2012/0321667; 2012/0302466; 2012/0301448; 2012/0301447; 2012/0060230; 2011/0213288; 2011/0158957; 2011/0104128; 2011/0038836; 2007/0036773; and 2004/0043401. Additional aspects of CARs and CAR cells, including exemplary antigen-binding domains, linkers, transmembrane domains, and cytoplasmic signaling domains, are described in WO 2016/168595; WO 12/079000; 2015/0141347; 2015/0031624; 2015/0030597; 2014/0378389; 2014/0219978; 2014/0206620; 2014/0037628; 2013/0274203; 2013/0225668; 2013/0116167; 2012/0230962; 2012/0213783; 2012/0093842; 2012/0071420; 2012/0015888; 2011/0268754; 2010/0297093; 2010/0158881; 2010/0034834; 2010/0015113; 2009/0304657; 2004/0043401; 2014/0322253; 2015/0118208; 2015/0038684; 2014/0024601; 2012/0148552; 2011/0223129; 2009/0257994; 2008/0160607; 2008/0003683; 2013/0121960; 2011/0052554; and 2010/0178276.

A. Antigen Recognition Domains

Antigen recognition domains included in the chimeric antigen receptor (CAR) can specifically bind to an antigen (e.g., a disease associated antigen, e.g., a tumor associated antigen (TAA) or an antigen that is not expressed on an non-cancerous cell) or a universal receptor (e.g., a tag). Non-limiting examples of an antigen recognition domains include: a monoclonal antibody (e.g., IgG1, IgG2, IgG3, IgG4, IgM, IgE, and IgD) (e.g., a fully human or a chimeric (e.g., a humanized) antibody), an antigen binding fragment of an antibody (e.g., Fab, Fab', or $F(ab')_2$ fragments) (e.g., a fragment of a fully human or a chimeric (e.g., humanized) antibody), a diabody, a triabody, a tetrabody, a minibody, a scFv, scFv-Fc, $(scFv)_2$, scFab, bis-scFv, hc-IgG, a BiTE, a single domain antibody (e.g., a V-NAR domain or a VhH domain), IgNAR, and a multispecific (e.g., bispecific antibody) antibody. Methods of making these antigen-recognition domains are known in the art.

In some embodiments, an antigen recognition domain includes at least one (e.g., one, two, three, four, five, or six) CDR (e.g., any of the three CDRs from an immunoglobulin light chain variable domain or any of the three CDRs from an immunoglobulin heavy chain variable domain) of an antibody that is capable of specifically binding to the target antigen, such as immunoglobulin molecules (e.g., light or heavy chain immunoglobulin molecules) and immunologically-active (antigen-binding) fragments of immunoglobulin molecules.

In some embodiments, an antigen recognition domain is a single-chain antibody (e.g., a V-NAR domain or a $V_HH$ domain, or any of the single-chain antibodies as described herein). In some embodiments, an antigen recognition domain is a whole antibody molecule (e.g., a murine, a human, humanized, or chimeric antibody) or a multimeric antibody (e.g., a bi-specific antibody).

In some embodiments, antigen recognition domains include antibody fragments and multispecific (e.g., bi-specific) antibodies or antibody fragments. Examples of antibodies and antigen recognition fragments thereof include, but are not limited to: single-chain Fvs (scFvs), Fab fragments, Fab' fragments, $F(ab')_2$, disulfide-linked Fvs (sdFvs), Fvs, and fragments containing either a VL or a VH domain.

Additional antigen recognition domains provided herein are polyclonal, monoclonal, multispecific (multimeric, e.g., bi-specific), human antibodies, chimeric antibodies (e.g., human-mouse chimera), single-chain antibodies, intracellularly-made antibodies (i.e., intrabodies), and antigen-binding fragments thereof. The antibodies or antigen-binding fragments thereof can be of any type (e.g., IgG, IgE, IgM, IgD, IgA, and IgY), class (e.g., $IgG_1$, $IgG_2$, $IgG_3$, $IgG_4$, $IgA_1$, and $IgA_2$), or subclass. In some embodiments, the antigen recognition domain is an $IgG_1$ antibody or antigen-binding fragment thereof. In some examples, the antigen recognition domain is an $IgG_4$ antibody or antigen-binding fragment thereof. In some embodiments, the antigen recognition domain is an immunoglobulin comprising a heavy and light chain.

Additional examples of antigen recognition domains are antigen-binding fragments of an IgG (e.g., an antigen-binding fragment of IgG1, IgG2, IgG3, or IgG4) (e.g., an antigen-binding fragment of a human or humanized IgG, e.g., human or humanized IgG1, IgG2, IgG3, or IgG4), an antigen-binding fragment of an IgA (e.g., an antigen-binding fragment of IgA1 or IgA2) (e.g., an antigen-binding fragment of a human or humanized IgA, e.g., a human or humanized IgA1 or IgA2), an antigen-binding fragment of an IgD (e.g., an antigen-binding fragment of a human or humanized IgD), an antigen-binding fragment of an IgE (e.g., an antigen-binding fragment of a human or humanized IgE), or an antigen-binding fragment of an IgM (e.g., an antigen-binding fragment of a human or humanized IgM).

In some embodiments, an antigen recognition domain can bind to a particular antigen (e.g., a tumor-associated antigen, e.g., a disease-associated antigen) with an affinity ($K_D$) about or less than $1\times10^{-7}$ M (e.g., about or less than $1\times10^{-8}$ M, about or less than $5\times10^{-9}$ M, about or less than $2\times10^{-9}$ M, or about or less than $1\times10^{-9}$ M), e.g., in saline or in phosphate buffered saline.

As can be appreciated by those in the art, the choice of the antigen recognition domain to include in the CAR depends upon the type and number of ligands that define the surface of a cell (e.g., cancer cell or tumor) to be targeted in a subject in need thereof, and/or depends on the ligand present on the amphiphilic ligand conjugate. For example, in some embodiments the antigen recognition domain is chosen to recognize a ligand that acts as a cell surface marker on cancer cells, or is a tumor-associated antigen (e.g., CD19, CD30, Her2/neu, EGFR, BCMA, TRP1, ALK, and CD20) or a tumor-specific antigen (TSA). In some embodiments, the antigen recognition domain binds to a CAR ligand disclosed herein, e.g., a CAR ligand on an amphiphilic ligand conjugate disclosed herein.

In some embodiments, CAR effector cells (e.g., CAR T cells) comprise a CAR molecule that binds to a tumor antigen (e.g., comprises a tumor antigen binding domain). In some embodiments, the CAR molecule comprises an antigen recognition domain that binds a tumor antigen of a solid tumor (e.g., breast cancer, colon cancer, etc.). In some embodiments, the CAR molecule is a tandem CAR molecule as described supra, which comprises at least two antigen recognition domains. In some embodiments, the CAR molecule comprises an antigen recognition domain that recognizes a tumor antigen of a hematologic malignancy (e.g., leukemia, acute lymphocytic leukemia, acute myelocytic leukemia, acute promyelocytic leukemia, chronic leukemia, chronic myelocytic (granulocytic) leukemia, chronic lymphocytic leukemia, mantle cell lymphoma, primary central nervous system lymphoma, Burkitt's lymphoma and marginal zone B cell lymphoma, Polycythemia vera, Hodgkin's disease, non-Hodgkin's disease, multiple myeloma, etc.).

In some embodiments, the tumor antigen is a tumor-specific antigen (TSA). A TSA is unique to tumor cells and does not occur on other cells in the body. In some embodiments, the tumor antigen is a tumor-associated antigen (TAA). A TAA is not unique to a tumor cell and instead is also expressed on a normal cell under conditions that fail to induce a state of immunologic tolerance to the antigen. The expression of the antigen on the tumor may occur under conditions that enable the immune system to respond to the antigen. In some embodiments, a TAA is expressed on normal cells during fetal development when the immune system is immature and unable to respond or is normally present at extremely low levels on normal cells but which are expressed at much higher levels on tumor cells.

In certain embodiments, the tumor-associated antigen is determined by sequencing a patient's tumor cells and identifying mutated proteins only found in the tumor. These antigens are referred to as "neoantigens." Once a neoantigen has been identified, therapeutic antibodies can be produced against it and used in the methods described herein.

In some embodiments, the tumor antigen is an epithelial cancer antigen, (e.g., breast, gastrointestinal, lung), a prostate specific cancer antigen (PSA) or prostate specific membrane antigen (PSMA), a bladder cancer antigen, a lung (e.g., small cell lung) cancer antigen, a colon cancer antigen, an ovarian cancer antigen, a brain cancer antigen, a gastric cancer antigen, a renal cell carcinoma antigen, a pancreatic cancer antigen, a liver cancer antigen, an esophageal cancer antigen, a head and neck cancer antigen, or a colorectal cancer antigen. In certain embodiments, the tumor antigen is a lymphoma antigen (e.g., non-Hodgkin's lymphoma or Hodgkin's lymphoma), a B-cell lymphoma cancer antigen, a leukemia antigen, a myeloma (e.g., multiple myeloma or plasma cell myeloma) antigen, an acute lymphoblastic leukemia antigen, a chronic myeloid leukemia antigen, or an acute myelogenous leukemia antigen.

Tumor antigens, (e.g. tumor-associated antigens (TAAs) and tumor-specific antigens (TSAs)) that may be targeted by CAR effector cells (e.g., CAR T cells), include, but are not limited to, 1GH-IGK, 43-9F, 5T4, 791Tgp72, acyclophilin C-associated protein, alpha-fetoprotein (AFP), α-actinin-4, A3, antigen specific for A33 antibody, ART-4, B7, Ba 733, BAGE, BCR-ABL, beta-catenin, beta-HCG, BrE3-antigen, BCA225, BTAA, CA125, CA 15-3\CA 27.29\BCAA, CA195, CA242, CA-50, CAM43, CAMEL, CAP-1, carbonic anhydrase IX, c-Met, CA19-9, CA72-4, CAM 17.1, CASP-8/m, CCCL19, CCCL21, CD1, CD1a, CD2, CD3, CD4, CD5, CD8, CD11A, CD14, CD15, CD16, CD18, CD19, CD20, CD21, CD22, CD23, CD25, CD29, CD30, CD32b, CD33, CD37, CD38, CD40, CD40L, CD44, CD45, CD46, CD52, CD54, CD55, CD59, CD64, CD66a-e, CD67, CD68, CD70, CD70L, CD74, CD79a, CD79b, CD80, CD83, CD95, CD126, CD132, CD133, CD138, CD147, CD154, CDC27, CDK4, CDK4m, CDKN2A, CO-029, CTLA4, CXCR4, CXCR7, CXCL12, HIF-1a, colon-specific antigen-p (CSAp), CEA (CEACAM5), CEACAM6, c-Met, DAM, E2A-PRL, EGFR, EGFRvIII, EGP-1 (TROP-2), EGP-2, ELF2-M, Ep-CAM, fibroblast growth factor (FGF), FGF-5, Flt-1, Flt-3, folate receptor, G250 antigen, Ga733VEpCAM, GAGE, gp100, GRO-β, H4-RET, HLA-DR, HM1.24, human chorionic gonadotropin (HCG) and its subunits, HER2/neu, HMGB-1, hypoxia inducible factor (HIF-1), HSP70-2M, HST-2, HTgp-175, Ia, IGF-1R, IFN-γ, IFN-α, IFN-β, IFN-λ, IL-4R, IL-6R, IL-13R, IL-15R, IL-17R, IL-18R, IL-2, IL-6, IL-8, IL-12, IL-15, IL-17, IL-18, IL-23, IL-25, insulin-like growth factor-1 (IGF-1), KC4-antigen, KSA, KS-1-antigen, KS1-4, LAGE-1a, Le-Y, LDR/FUT, M344, MA-50, macrophage migration inhibitory factor (MIF), MAGE, MAGE-1, MAGE-3, MAGE-4, MAGE-5, MAGE-6, MART-1, MART-2, TRAG-3, mCRP, MCP-1, MIP-1A, MIP-1B, MIF, MG7-Ag, MOV18, MUC1, MUC2, MUC3, MUC4, MUC5ac, MUC13, MUC16, MUM-1/2, MUM-3, MYL-RAR, NB/70K, Nm23H1, NuMA, NCA66, NCA95, NCA90, NY-ESO-1, p15, p16, p185erbB2, p180erbB3, PAM4 antigen, pancreatic cancer mucin, PD1 receptor (PD-1), PD-1 receptor ligand 1 (PD-L1), PD-1 receptor ligand 2 (PD-L2), PI5, placental growth factor, p53, PLAGL2, Pmel17 prostatic acid phosphatase, PSA, PRAME, PSMA, PIGF, ILGF, ILGF-1R, IL-6, IL-25, RCAS1, RS5, RAGE, RANTES, Ras, T101, SAGE, S100, survivin, survivin-2B, SDDCAG16, TA-90\Mac2 binding protein, TAAL6, TAC, TAG-72, TLP, tenascin, TRAIL receptors, TRP-1, TRP-2, TSP-180, TNF-α, Tn antigen, Thomson-Friedenreich antigens, tumor necrosis antigens, tyrosinase, VEGFR, ED-B fibronectin, WT-1, 17-1A-antigen, complement factors C3, C3a, C3b, C5a, C5, an angiogenesis marker, bcl-2, bcl-6, and K-ras, anaplastic lymphoma kinase (ALK), an oncogene marker and an oncogene product (see, e.g., Sensi et al., Clin Cancer Res 2006, 12:5023-32; Parmiani et al., J Immunol 2007, 178:1975-79; Novellino et al. Cancer Immunol Immunother 2005, 54:187-207).

In some embodiments, the tumor antigen is a viral antigen derived from a virus associated with a human chronic disease or cancer (such as cervical cancer). For example, in some embodiments, the viral antigen is derived from Epstein-Barr virus (EBV), HPV antigens E6 and/or E7, hepatitis C virus (HCV), hepatitis B virus (HBV), or cytomegalovirus (CMV).

Exemplary cancers or tumors and specific tumor antigens associated with such tumors (but not exclusively), include acute lymphoblastic leukemia (etv6, aml1, cyclophilin b), B cell lymphoma (Ig-idiotype), glioma (E-cadherin, α-catenin, β-catenin, γ-catenin, p120ctn), bladder cancer (p21ras), biliary cancer (p21ras), breast cancer (MUC family, HER2/neu, c-erbB-2), cervical carcinoma (p53, p21ras), colon carcinoma (p21ras, HER2/neu, c-erbB-2, MUC family), colorectal cancer (Colorectal associated antigen (CRC)-CO17-1A/GA733, APC), choriocarcinoma (CEA), epithelial cell cancer (cyclophilin b), gastric cancer (HER2/neu, c-erbB-2, ga733 glycoprotein), hepatocellular cancer (α-fetoprotein), Hodgkins lymphoma (Imp-1, EBNA-1), lung cancer (CEA, MAGE-3, NY-ESO-1), lymphoid cell-derived leukemia (cyclophilin b), melanoma (p5 protein, gp75, oncofetal antigen, GM2 and GD2 gangliosides, Melan-A/MART-1, cdc27, MAGE-3, p21ras, gp100, TRP), mycloma (MUC family, p21ras), non-small cell lung carcinoma (HER2/neu, c-erbB-2, ALK), nasopharyngeal cancer (Imp-1, EBNA-1), ovarian cancer (MUC family, HER2/neu, c-erbB-2), prostate cancer (Prostate Specific Antigen (PSA) and its antigenic epitopes PSA-1, PSA-2, and PSA-3, PSMA, HER2/neu, c-erbB-2, ga733 glycoprotein), renal cancer (HER2/neu, c-erbB-2), squamous cell cancers of the cervix and esophagus, testicular cancer (NY-ESO-1), and T cell leukemia (HTLV-1 epitopes), and viral products or proteins.

In some embodiments, the immune effector cell comprising a CAR molecule (e.g., CAR T cell) useful in the methods disclosed herein expresses a CAR comprising a mesothelin binding domain (i.e., the CAR T cell specifically recognizes mesothelin). Mesothelin is a tumor antigen that is overexpressed in a variety of cancers including ovarian, lung and pancreatic cancers.

In some embodiments, the immune effector cell comprising a CAR molecule (e.g., CAR T cell) useful in the methods disclosed herein expresses a CAR comprising a CD19 binding domain. In some embodiments, the immune effector cell comprising a CAR molecule (e.g., CAR T cell) useful in the methods disclosed herein expresses a CAR comprising a HER2 binding domain. In some embodiments, the immune effector cell comprising a CAR molecule (e.g., CAR T cell) useful in the methods disclosed herein expresses a CAR comprising a EGFR binding domain.

In some embodiments, the CAR effector cell expressing a CAR comprising a CD19 targeting or binding domain is Kymriah™ (tisagenlecleucel; Novartis; see WO 2016109410, herein incorporated by reference in its entirety) or Yescarta™ (axicabtagene ciloleucel; Kite; see US 20160346326, herein incorporated by reference in its entirety).

B. Linker

Provided herein are CARs that can optionally include a linker (1) between the antigen recognition domain and the transmembrane domain, and/or (2) between the transmembrane domain and the cytoplasmic signaling domain. In some embodiments, the linker can be a polypeptide linker. For example, the linker can have a length of between about 1 amino acid and about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, about 16 amino acids, about 14 amino acids, about 12 amino acids, about 10 amino acids, about 8 amino acids, about 6 amino acids, about 4 amino acids, or about 2 amino acids; about 2 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, about 16 amino acids, about 14 amino acids, about 12 amino acids, about 10 amino acids, about 8 amino acids, about 6 amino acids, or about 4 amino acids; about 4 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, about 16 amino acids, about 14 amino acids, about 12 amino acids, about 10 amino acids, about 8 amino acids, or about 6 amino acids; about 6 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, about 16 amino acids, about 14 amino acids, about 12 amino acids, about 10 amino acids, or about 8 amino acids; about 8 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, about 16 amino acids, about 14 amino acids, about 12 amino acids, or about 10 amino acids; about 10 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, about 16 amino acids, about 14 amino acids, or about 12 amino acids; about 12 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, about 16 amino acids, or about 14 amino acids; about 14 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, about 18 amino acids, or about 16 amino acids; about 16 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, about 20 amino acids, or about 18 amino acids; about 18 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, about 25 amino acids, or about 20 amino acids; about 20 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, about 30 amino acids, or about 25 amino acids; about 25 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, about 35 amino acids, or about 30 amino acids; about 30 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, about 40 amino acids, or about 35 amino acids; about 35 amino acids to about 500 amino acids, about 400 amino acids, about 300 amino acids, about 200 amino acids, about 100 amino acids, about 90 amino acids, about 80 amino acids, about 70 amino acids, about 60 amino acids, about 50 amino acids, or about 40 amino acids; about 40 amino acids to about 500 amino acids, about 400 amino acids, about 300 amino acids, about 200 amino acids, about 100 amino acids, about 90 amino acids, about 80 amino acids, about 70 amino acids, about 60 amino acids, or about 50 amino acids; about 50 amino acids to about 500 amino acids, about 400 amino acids, about 300 amino acids, about 200 amino acids, about 100 amino acids, about 90 amino acids, about 80 amino acids, about 70 amino acids, or about 60 amino acids; about 60 amino acids to about 500 amino acids, about 400 amino acids, about 300 amino acids, about 200 amino acids, about 150 amino acids, about 100 amino acids, about 90 amino acids, about 80 amino acids, or about 70 amino acids; about 70 amino acids to about 500 amino acids, about 400 amino acids, about 300 amino acids, about 200 amino acids, about 100 amino acids, about 90 amino acids, or about 80 amino acids; about 80 amino acids to about 500 amino acids, about 400 amino acids, about 300 amino acids, about 200 amino acids, about 100 amino acids, or about 90 amino acids; about 90 amino acids to about 500 amino acids, about 400 amino acids, about 300 amino acids, about 200 amino acids, or about 100 amino acids; about 100 amino acids to about 500 amino acids, about 400 amino acids, about 300 amino acids, or about 200 amino acids; about 200 amino acids to about 500 amino acids, about 400 amino acids, or about 300 amino acids; about 300 amino acids to about 500 amino acids or about 400 amino acids; or about 400 amino acids to about 500 amino acids.

Additional examples and aspects of linkers are described in the references cited herein, and are thus incorporated in their entirety herein.

C. Transmembrane Domain

In some embodiments, the CARs described herein also include a transmembrane domain. In some embodiments, the transmembrane domain is naturally associated with a sequence in the cytoplasmic domain. In some embodiments, the transmembrane domain can be modified by one or more (e.g., two, three, four, five, six, seven, eight, nine, or ten) amino acid substitutions to avoid the binding of the domain to other transmembrane domains (e.g., the transmembrane domains of the same or different surface membrane proteins) to minimize interactions with other members of the receptor complex.

In some embodiments, the transmembrane domain may be derived from a natural source. In some embodiments, the transmembrane domain may be derived from any membrane-bound or transmembrane protein. Non-limiting examples of transmembrane domains that may be used herein may be derived from (e.g., comprise at least the transmembrane sequence or a part of the transmembrane sequence of) the alpha, beta, or zeta chain of the T-cell receptor, CD28, CD3 epsilon, CD33, CD37, CD64, CD80, CD45, CD4, CD5, CD8, CD9, CD16, CD22, CD86, CD134, CD137 or CD154.

In some embodiments, the transmembrane domain may be synthetic. For example, in some embodiments where the transmembrane domain is from a synthetic source, the transmembrane domain may include (e.g., predominantly include) hydrophobic residues (e.g., leucine and valine). In some embodiments, the synthetic transmembrane domain will include at least one (e.g., at least two, at least three, at least four, at least five, or at least six) triplet of phenylalanine, tryptophan, and valine at the end of a synthetic transmembrane domain. In some embodiments, the transmembrane domain of a CAR can include a CD8 hinge domain.

Additional specific examples of transmembrane domains are described in the references cited herein.

D. Cytoplasmic Domains

Also provided herein are CAR molecules that comprise, e.g., a cytoplasmic signaling domain that includes a cytoplasmic sequence of CD3ζ sufficient to stimulate a cell when the antigen binding domain binds to the antigen, and optionally, a cytoplasmic sequence of one or more of co-stimulatory proteins (e.g., a cytoplasmic sequence of one or more of CD27, CD28, 4-1BB, OX40, CD30, CD40L, CD40, PD-1, PD-L1, ICOS, LFA-1, CD2, CD7, CD160, LIGHT, BTLA, TIM3, CD244, CD80, LAG3, NKG2C, B7-H3, a ligand that specifically binds to CD83, and any of the ITAM sequences described herein or known in the art) that provides for co-stimulation of the T cell. The stimulation of a CAR immune effector cell can result in the activation of one or more anti-cancer activities of the CAR immune effector cell. For example, in some embodiments, stimulation of a CAR immune effector cell can result in an increase in the cytolytic activity or helper activity of the CAR immune effector cell, including the secretion of cytokines. In some embodiments, the entire intracellular signaling domain of a co-stimulatory protein is included in the cytoplasmic signaling domain. In some embodiments, the cytoplasmic signaling domain includes a truncated portion of an intracellular signaling domain of a co-stimulatory protein (e.g., a truncated portion of the intracellular signaling domain that transduces an effector function signal in the CAR immune effector cell). Non-limiting examples of intracellular signaling domains that can be included in a cytoplasmic signaling domain include the cytoplasmic sequences of the T cell receptor (TCR) and co-receptors that act in concert to initiate signal transduction following antigen receptor engagement, as well as any variant of these sequences including at least one (e.g., one, two, three, four, five, six, seven, eight, nine, or ten) substitution and have the same or about the same functional capability.

In some embodiments, a cytoplasmic signaling domain can include two distinct classes of cytoplasmic signaling sequences: signaling sequences that initiate antigen-dependent activation through the TCR (primary cytoplasmic signaling sequences) (e.g., a CD3ζ cytoplasmic signaling sequence) and a cytoplasmic sequence of one or more of co-stimulatory proteins that act in an antigen-independent manner to provide a secondary or co-stimulatory signal (secondary cytoplasmic signaling sequences).

In some embodiments, the cytoplasmic domain of a CAR can be designed to include the CD3ζ signaling domain by itself or combined with any other desired cytoplasmic signaling sequence(s) useful in the context of a CAR. In some examples, the cytoplasmic domain of a CAR can include a CD3ζ chain portion and a costimulatory cytoplasmic signaling sequence. The costimulatory cytoplasmic signaling sequence refers to a portion of a CAR including a cytoplasmic signaling sequence of a costimulatory protein (e.g., CD27, CD28, 4-IBB (CD 137), OX40, CD30, CD40, PD-1, ICOS, lymphocyte function-associated antigen-1 (LFA-1), CD2, CD7, LIGHT, NKG2C, B7-H3, and a ligand that specifically binds with CD83).

In some embodiments, the cytoplasmic signaling sequences within the cytoplasmic signaling domain of a CAR are positioned in a random order. In some embodiments, the cytoplasmic signaling sequences within the cytoplasmic signaling domain of a CAR are linked to each other in a specific order. In some embodiments, a linker (e.g., any of the linkers described herein) can be used to form a linkage between different cytoplasmic signaling sequences.

In some embodiments, the cytoplasmic signaling domain is designed to include the cytoplasmic signaling sequence of CD3ζ and the cytoplasmic signaling sequence of the costimulatory protein CD28. In some embodiments, the cytoplasmic signaling domain is designed to include the cytoplasmic signaling sequence of CD3ζ and the cytoplasmic signaling sequence of costimulatory protein 4-IBB. In some embodiments, the cytoplasmic signaling domain is designed to include the cytoplasmic signaling sequence of CD3ζ and the cytoplasmic signaling sequences of costimulatory proteins CD28 and 4-1BB. In some embodiments, the cytoplasmic signaling domain does not include the cytoplasmic signaling sequences of 4-1BB.

E. Additional Modifications of CAR Expressing Cells

In another embodiment, the therapeutic efficacy of CAR effector cells (e.g., CAR T cells) is enhanced by disruption of a methylcytosine dioxygenase gene (e.g., Tet1, Tet2, Tet3), which leads to decreased total levels of 5-hydroxymethylcytosine in association with enhanced proliferation, regulation of effector cytokine production and degranulation, and thereby increases CAR effector cell (e.g., CAR T cell) proliferation and/or function, as described in PCT Publication WO 2017/049166. Thus, an effector cell (e.g., T cell) can be engineered to express a CAR and wherein expression and/or function of Tet1, Tet2 and/or Tet3 in said effector cell (e.g., T cell) has been reduced or eliminated.

In another embodiment, the therapeutic efficacy of CAR effector cells (e.g., CAR T cells) is enhanced by using an effector cell (e.g., T cell) that constitutively expresses a CAR (referred to as a nonconditional CAR) and conditionally expresses another agent useful for treating cancer, as described in PCT Publication WO 2016/126608 and US Publication No. 2018/0044424. In such embodiments, the conditionally expressed agent is expressed upon activation of the effector cell (e.g., T cell), e.g., the binding of the nonconditional CAR to its target. In one embodiment, the conditionally expressed agent is a CAR (referred to herein as a conditional CAR). In another embodiment, the conditionally expressed agent inhibits a checkpoint inhibitor of the immune response. In another embodiment, the conditionally expressed agent improves or enhances the efficacy of a CAR, and can include a cytokine.

In another embodiment, the therapeutic efficacy of CAR T cells is enhanced by modifying the CAR T cell with a nucleic acid that is capable of altering (e.g., downmodulating) expression of an endogenous gene selected from the group consisting of TCR α chain, TCR β chain, beta-2 microglobulin, a HLA molecule, CTLA-4, PD1, and FAS, as described in PCT Publication WO 2016/069282 and US Publication No. 2017/0335331.

In another embodiment, the therapeutic efficacy of CAR T cells is enhanced by co-expressing in the T cells the CAR and one or more enhancers of T cell priming ("ETPs"), as described in PCT Publication WO 2015/112626 and US Publication No. 2016/0340406. The addition of an ETP component to the CAR T cell confers enhanced "professional" antigen-presenting cell (APC) function. In an embodiment, the CAR and one or more ETPs are transiently co-expressed in the T cell. Thus, the engineered T cells are safe (given the transient nature of the CAR/ETP expression), and induce prolonged immunity via APC function.

In another embodiment, the therapeutic efficacy of CAR T cells is enhanced by co-expressing in the T cells a CAR and an inhibitory membrane protein (IMP) comprising a binding (or dimerization) domain, as described in PCT Publication WO 2016/055551 and US Publication No. 2017/0292118. The CAR and the IMP are made both reactive to a soluble compound, especially through a second binding domain comprised within the CAR, thereby allowing the co-localization, by dimerization or ligand recognition, of the inhibitory signaling domain borne by the IMP and of the signal transducing domain borne by the CAR, having the effect of turning down the CAR activation. The inhibitory signaling domain is preferably the programmed death-1 (PD-1), which attenuates T-cell receptor (TCR)-mediated activation of IL-2 production and T-cell proliferation.

In another embodiment, the therapeutic efficacy of CAR T cells is enhanced using a system where controlled variations in the conformation of the extracellular portion of a CAR containing the antigen-binding domain is obtained upon addition of small molecules, as described in PCT Publication WO 2017/032777. This integrated system switches the interaction between the antigen and the antigen binding domain between on/off states. By being able to control the conformation of the extracellular portion of a CAR, downstream functions of the CAR T cell, such as cytotoxicity, can be directly modulated, Thus, a CAR can be characterized in that it comprises: a) at least one ectodomain which comprises: i) an extracellular antigen binding domain; and ii) a switch domain comprising at least a first multimerizing ligand-binding domain and a second multimerizing ligand-binding domain which are capable of binding to a predetermined multivalent ligand to form a multimer comprising said two binding domains and the multivalent ligand to which they are capable of binding; b) at least one transmembrane domain; and c) at least one endodomain comprising a signal transducing domain and optionally a co-stimulatory domain; wherein the switch domain is located between the extracellular antigen binding domain and the transmembrane domain.

Methods of Making Polypeptides

In some embodiments, the polypeptides described herein for use in the immunomodulatory compositions comprising CAR ligands of the disclosure (e.g., amphiphilic ligand conjugates, fusion proteins) are made in transformed host cells using recombinant DNA techniques. To do so, a recombinant DNA molecule coding for the peptide is prepared. Methods of preparing such DNA molecules are well known in the art. For instance, sequences coding for the peptides could be excised from DNA using suitable restriction enzymes. Alternatively, the DNA molecule could be synthesized using chemical synthesis techniques, such as the phosphoramidate method. Also, a combination of these techniques could be used.

The methods of making polypeptides also include a vector capable of expressing the peptides in an appropriate host. The vector comprises the DNA molecule that codes for the peptides operatively linked to appropriate expression control sequences. Methods of affecting this operative linking, either before or after the DNA molecule is inserted into the vector, are well known. Expression control sequences include promoters, activators, enhancers, operators, ribosomal nuclease domains, start signals, stop signals, cap signals, polyadenylation signals, and other signals involved with the control of transcription or translation.

The resulting vector having the DNA molecule thereon is used to transform an appropriate host. This transformation may be performed using methods well known in the art.

Any of a large number of available and well-known host cells may be suitable for use in the methods disclosed herein. The selection of a particular host is dependent upon a number of factors recognized by the art. These include, for example, compatibility with the chosen expression vector, toxicity of the peptides encoded by the DNA molecule, rate of transformation, ease of recovery of the peptides, expression characteristics, bio-safety and costs. A balance of these factors must be struck with the understanding that not all hosts may be equally effective for the expression of a particular DNA sequence. Within these general guidelines, useful microbial hosts include bacteria (such as *E. coli* sp.), yeast (such as *Saccharomyces* sp.) and other fungi, insects, plants, mammalian (including human) cells in culture, or other hosts known in the art.

Next, the transformed host is cultured and purified. Host cells may be cultured under conventional fermentation conditions so that the desired compounds are expressed. Such fermentation conditions are well known in the art. Finally, the peptides are purified from culture by methods well known in the art.

The compounds (e.g., CAR ligands) may also be made by synthetic methods. For example, solid phase synthesis techniques may be used. Suitable techniques are well known in the art, and include those described in Merrifield (1973), Chem. Polypeptides, pp. 335-61 (Katsoyannis and Panayotis eds.); Merrifield (1963), J. Am. Chem. Soc. 85: 2149; Davis et al. (1985), Biochem. Intl. 10: 394-414; Stewart and Young (1969), Solid Phase Peptide Synthesis; U.S. Pat. No. 3,941,763; Finn et al. (1976), The Proteins (3rd ed.) 2: 105-253; and Erickson et al. (1976), The Proteins (3rd ed.) 2: 257-527. Solid phase synthesis is the preferred technique of making individual peptides since it is the most cost-effective method of making small peptides. Compounds that contain derivatized peptides or which contain non-peptide groups may be synthesized by well-known organic chemistry techniques.

Other methods are of molecule expression/synthesis are generally known in the art to one of ordinary skill.

The nucleic acid molecules described above (e.g., synthetic polynucleotides) can be contained within a vector that is capable of directing their expression in, for example, a cell that has been transduced with the vector. Accordingly, in addition to polypeptide mutants, expression vectors containing a nucleic acid molecule encoding a mutant and cells transfected with these vectors are among the certain embodiments.

Vectors suitable for use include T7-based vectors for use in bacteria (see, for example, Rosenberg et al., Gene 56: 125, 1987), the pMSXND expression vector for use in mammalian cells (Lee and Nathans, J. Biol. Chem. 263:3521, 1988), and baculovirus-derived vectors (for example the expression vector pBacPAKS from Clontech, Palo Alto, Calif.) for use in insect cells. The nucleic acid inserts, which encode the polypeptide of interest in such vectors, can be operably linked to a promoter, which is selected based on, for example, the cell type in which expression is sought. For example, a T7 promoter can be used in bacteria, a polyhedrin promoter can be used in insect cells, and a cytomegalovirus or metallothionein promoter can be used in mammalian cells. Also, in the case of higher eukaryotes, tissue-specific and cell type-specific promoters are widely available. These promoters are so named for their ability to direct expression of a nucleic acid molecule in a given tissue or cell type within the body. Skilled artisans are well aware of numerous promoters and other regulatory elements which can be used to direct expression of nucleic acids.

In addition to sequences that facilitate transcription of the inserted nucleic acid molecule, vectors can contain origins of replication, and other genes that encode a selectable marker. For example, the neomycin-resistance ($neo^r$) gene imparts G418 resistance to cells in which it is expressed, and thus permits phenotypic selection of the transfected cells. Those of skill in the art can readily determine whether a given regulatory element or selectable marker is suitable for use in a particular experimental context.

Viral vectors that are suitable for use include, for example, retroviral, adenoviral, and adeno-associated vectors, herpes virus, simian virus 40 (SV40), and bovine papilloma virus vectors (see, for example, Gluzman (Ed.), Eukaryotic Viral Vectors, CSH Laboratory Press, Cold Spring Harbor, N.Y.).

Prokaryotic or eukaryotic cells that contain and express a nucleic acid molecule that encodes a polypeptide mutant are also suitable for use. A cell is a transfected cell, i.e., a cell into which a nucleic acid molecule, for example a nucleic acid molecule encoding a mutant polypeptide, has been introduced by means of recombinant DNA techniques. The progeny of such a cell are also considered suitable for use in the methods disclosed herein.

The precise components of the expression system are not critical. For example, a polypeptide mutant can be produced in a prokaryotic host, such as the bacterium *E. coli*, or in a eukaryotic host, such as an insect cell (e.g., an Sf21 cell), or mammalian cells (e.g., COS cells, NIH 3T3 cells, or HeLa cells). These cells are available from many sources, including the American Type Culture Collection (Manassas, Va.). In selecting an expression system, it matters only that the components are compatible with one another. Artisans or ordinary skill are able to make such a determination. Furthermore, if guidance is required in selecting an expression system, skilled artisans may consult Ausubel et al. (Current Protocols in Molecular Biology, John Wiley and Sons, New York, N.Y., 1993) and Pouwels et al. (Cloning Vectors: A Laboratory Manual, 1985 Suppl. 1987).

The expressed polypeptides can be purified from the expression system using routine biochemical procedures, and can be used, e.g., conjugated to a lipid, as described herein.

Pharmaceutical Composition and Modes of Administration

In some embodiments, an immunomodulatory composition comprising a CAR ligand of the disclosure (e.g., amphiphilic ligand conjugate; e.g., fusion protein) and CAR expressing cells (e.g., CAR T cells) are administered together (simultaneously or sequentially). In some embodiments, the immunomodulatory composition is a vaccine comprising a CAR ligand of the disclosure. In some embodiments, the immunomodulatory composition is an amphiphilic ligand conjugate comprising a CAR ligand of the disclosure. In some embodiments, the immunomodulatory composition is a fusion protein comprising a CAR ligand of the disclosure.

In some embodiments, an amphiphilic ligand conjugate and CAR expressing cells (e.g., CAR T cells) are administered together (simultaneously or sequentially). In some embodiments, an amphiphilic ligand conjugate and an adjuvant (e.g., amphiphilic oligonucleotide conjugate) are administered together (simultaneously or sequentially). In some embodiments, an amphiphilic ligand conjugate, an adjuvant (e.g., amphiphilic oligonucleotide conjugate), and CAR expressing cells (e.g., CAR T cells) are administered together (simultaneously or sequentially). In some embodiments, an amphiphilic ligand conjugate and CAR expressing cells (e.g., CAR T cells) are administered separately. In some embodiments, an amphiphilic ligand conjugate and an adjuvant (e.g., amphiphilic oligonucleotide conjugate) are administered separately. In some embodiments, an amphiphilic ligand conjugate, an adjuvant (e.g., amphiphilic oligonucleotide conjugate) and CAR expressing cells (e.g., CAR T cells) are administered separately.

In some embodiments, a fusion protein of the disclosure and CAR expressing cells (e.g., CAR T cells) are administered together (simultaneously or sequentially). In some embodiments, a fusion protein of the disclosure and CAR expressing cells (e.g., CAR T cells) are administered separately.

In some embodiments, an immunomodulatory composition comprising a CAR ligand of the disclosure (e.g., amphiphilic ligand conjugate; e.g., fusion protein) is administered intratumorally and CAR expressing cells are administered intravenously.

In some embodiments, the disclosure provides for a pharmaceutical composition comprising an immunomodulatory composition comprising a CAR ligand disclosed herein with a pharmaceutically acceptable diluent, carrier, solubilizer, emulsifier, preservative and/or adjuvant.

In some embodiments, the disclosure provides for a pharmaceutical composition comprising an amphiphilic ligand conjugate comprising a CAR ligand disclosed herein with a pharmaceutically acceptable diluent, carrier, solubilizer, emulsifier, preservative and/or adjuvant.

In some embodiments, the adjuvant is an amphiphilic oligonucleotide conjugate. In some embodiments, the adjuvant is a STING agonist (e.g., CDG) In some embodiments, the adjuvant is formulated in a separate pharmaceutical composition.

In some embodiments, the disclosure provides for a pharmaceutical composition comprising a fusion protein comprising a CAR ligand disclosed herein with a pharmaceutically acceptable diluent, carrier, solubilizer, emulsifier, preservative and/or adjuvant.

In some embodiments, acceptable formulation materials preferably are nontoxic to recipients at the dosages and concentrations employed. In certain embodiments, the formulation material(s) are for s.c. and/or I.V. administration. In some embodiments, the pharmaceutical composition contains formulation materials for modifying, maintaining or preserving, for example, the pH, osmolality, viscosity, clarity, color, isotonicity, odor, sterility, stability, rate of dissolution or release, adsorption or penetration of the composition. In some embodiments, suitable formulation materials include, but are not limited to, amino acids (such as glycine, glutamine, asparagine, arginine or lysine); antimicrobials; antioxidants (such as ascorbic acid, sodium sulfite or sodium hydrogen-sulfite); buffers (such as borate, bicarbonate, Tris-HCl, citrates, phosphates or other organic acids); bulking agents (such as mannitol or glycine); chelating agents (such as ethylenediamine tetraacetic acid (EDTA)); complexing agents (such as caffeine, polyvinylpyrrolidone, beta-cyclodextrin or hydroxypropyl-beta-cyclodextrin); fillers; monosaccharides; disaccharides; and other carbohydrates (such as glucose, mannose or dextrins); proteins (such as serum albumin, gelatin or immunoglobulins); coloring, flavoring and diluting agents; emulsifying agents; hydrophilic polymers (such as polyvinylpyrrolidone); low molecular weight polypeptides; salt-forming counterions (such as sodium); preservatives (such as benzalkonium chloride, benzoic acid, salicylic acid, thimerosal, phenethyl alcohol, methylparaben, propylparaben, chlorhexidine, sorbic acid or hydrogen peroxide); solvents (such as glycerin, propylene glycol or polyethylene glycol); sugar alcohols (such as mannitol or sorbitol); suspending agents; surfactants or wetting agents (such as pluronics, PEG, sorbitan esters, polysorbates such as polysorbate 20, polysorbate 80, triton, tromethamine, lecithin, cholesterol, tyloxapal); stability enhancing agents (such as sucrose or sorbitol); tonicity enhancing agents (such as alkali metal halides, preferably sodium or potassium chloride, mannitol sorbitol); delivery vehicles; diluents; excipients and/or pharmaceutical adjuvants. (Remington's Pharmaceutical Sciences, 18th Edition, A. R. Gennaro, ed., Mack Publishing Company (1995). In certain embodiments, the formulation comprises PBS; 20 mM NaOAC, pH 5.2, 50 mM NaCl; and/or 10 mM NAOAC, pH 5.2, 9% Sucrose. In some embodiments, the optimal pharmaceutical composition is determined by one skilled in the art depending upon, for example, the intended route of administration, delivery format and desired dosage. See, for example, Remington's Pharmaceutical Sciences, supra. In some embodiments, such compositions may influence the physical state, stability, rate of in vivo release and rate of in vivo clearance of the amphiphilic conjugate.

In some embodiments, the primary vehicle or carrier in a pharmaceutical composition can be either aqueous or non-aqueous in nature. For example, in some embodiments, a suitable vehicle or carrier is water for injection, physiological saline solution or artificial cerebrospinal fluid, possibly supplemented with other materials common in compositions for parenteral administration. In some embodiments, the saline comprises isotonic phosphate-buffered saline. In certain embodiments, neutral buffered saline or saline mixed with serum albumin are further exemplary vehicles. In some embodiments, pharmaceutical compositions comprise Tris buffer of about pH 7.0-8.5, or acetate buffer of about pH 4.0-5.5, which can further include sorbitol or a suitable substitute therefore. In some embodiments, a composition comprising an amphiphilic conjugate can be prepared for storage by mixing the selected composition having the desired degree of purity with optional formulation agents (Remington's Pharmaceutical Sciences, supra) in the form of a lyophilized cake or an aqueous solution. Further, in some embodiments, a composition comprising an amphiphilic conjugate, can be formulated as a lyophilizate using appropriate excipients such as sucrose.

In some embodiments, the pharmaceutical composition can be selected for parenteral delivery. In some embodiments, the compositions can be selected for inhalation or for delivery through the digestive tract, such as orally. The preparation of such pharmaceutically acceptable compositions is within the ability of one skilled in the art.

In some embodiments, the formulation components are present in concentrations that are acceptable to the site of administration. In some embodiments, buffers are used to maintain the composition at physiological pH or at a slightly lower pH, typically within a pH range of from about 5 to about 8.

In some embodiments, when parenteral administration is contemplated, a therapeutic composition can be in the form of a pyrogen-free, parenterally acceptable aqueous solution comprising an immunomodulatory composition (e.g., amphiphilic conjugate, e.g., fusion protein), in a pharmaceutically acceptable vehicle. In some embodiments, a vehicle for parenteral injection is sterile distilled water in which an immunomodulatory composition (e.g., amphiphilic conjugate, e.g., fusion protein) is formulated as a sterile, isotonic solution, properly preserved. In some embodiments, the preparation can involve the formulation of the desired molecule with an agent, such as injectable microspheres, bio-erodible particles, polymeric compounds (such as polylactic acid or polyglycolic acid), beads or liposomes, that can provide for the controlled or sustained release of the product which can then be delivered via a depot injection. In some embodiments, hyaluronic acid can also be used, and can have the effect of promoting sustained duration in the circulation. In some embodiments, implantable drug delivery devices can be used to introduce the desired molecule.

In some embodiments, a pharmaceutical composition can be formulated for inhalation. In some embodiments, an immunomodulatory composition (e.g., amphiphilic conjugate, e.g., fusion protein) can be formulated as a dry powder for inhalation. In some embodiments, an inhalation solution comprising an immunomodulatory composition (e.g., amphiphilic conjugate, e.g., fusion protein) can be formulated with a propellant for aerosol delivery. In some embodiments, solutions can be nebulized. Pulmonary administration is further described in PCT application No. PCT/US94/001875, which describes pulmonary delivery of chemically modified proteins.

In some embodiments, it is contemplated that formulations can be administered orally. In some embodiments, an immunomodulatory composition (e.g., amphiphilic conjugate, e.g., fusion protein) that is administered in this fashion can be formulated with or without those carriers customarily used in the compounding of solid dosage forms such as tablets and capsules. In some embodiments, a capsule can be designed to release the active portion of the formulation at the point in the gastrointestinal tract when bioavailability is maximized and pre-systemic degradation is minimized. In some embodiments, at least one additional agent can be included to facilitate absorption of the immunomodulatory composition (e.g., amphiphilic conjugate, e.g., fusion protein). In certain embodiments, diluents, flavorings, low melting point waxes, vegetable oils, lubricants, suspending agents, tablet disintegrating agents, and binders can also be employed.

In some embodiments, a pharmaceutical composition can involve an effective quantity of an immunomodulatory composition (e.g., amphiphilic conjugate, e.g., fusion protein) in a mixture with nontoxic excipients which are suitable for the manufacture of tablets. In some embodiments, by dissolving the tablets in sterile water, or another appropriate vehicle, solutions can be prepared in unit-dose form. In some embodiments, suitable excipients include, but are not limited to, inert diluents, such as calcium carbonate, sodium carbonate or bicarbonate, lactose, or calcium phosphate; or binding agents, such as starch, gelatin, or acacia; or lubricating agents such as magnesium stearate, stearic acid, or talc.

Additional pharmaceutical compositions will be evident to those skilled in the art, including formulations involving an immunomodulatory composition (e.g., amphiphilic conjugate, e.g., fusion protein) in sustained- or controlled-delivery formulations. In some embodiments, techniques for formulating a variety of other sustained- or controlled-delivery means, such as liposome carriers, bio-erodible microparticles or porous beads and depot injections, are also known to those skilled in the art. See for example, PCT Application No. PCT/US93/00829 which describes the controlled release of porous polymeric microparticles for the delivery of pharmaceutical compositions. In some embodiments, sustained-release preparations can include semipermeable polymer matrices in the form of shaped articles, e.g. films, or microcapsules. Sustained release matrices can include polyesters, hydrogels, polylactides (U.S. Pat. No. 3,773,919 and EP 058,481), copolymers of L-glutamic acid and gamma ethyl-L-glutamate (Sidman et al., Biopolymers, 22:547-556 (1983)), poly (2-hydroxyethyl-methacrylate) (Langer et al., J. Biomed. Mater. Res., 15: 167-277 (1981) and Langer, Chem. Tech., 12:98-105 (1982)), ethylene vinyl acetate (Langer et al., supra) or poly-D(−)-3-hydroxybutyric acid (EP 133,988). In some embodiments, sustained release compositions can also include liposomes, which can be prepared by any of several methods known in the art. See, e.g., Eppstein et al, Proc. Natl. Acad. Sci. USA, 82:3688-3692 (1985); EP 036,676; EP 088,046 and EP 143,949.

In some embodiments, the pharmaceutical composition to be used for in vivo administration is sterile. In some embodiments, sterility is accomplished by filtration through sterile filtration membranes. In certain embodiments, where the composition is lyophilized, sterilization using this method is conducted either prior to or following lyophilization and reconstitution. In some embodiments, the composition for parenteral administration is stored in lyophilized form or in a solution. In some embodiments, parenteral compositions are placed into a container having a sterile access port, for example, an intravenous solution bag or vial having a stopper pierceable by a hypodermic injection needle.

In some embodiments, once the pharmaceutical composition has been formulated, it is stored in sterile vials as a solution, suspension, gel, emulsion, solid, or as a dehydrated or lyophilized powder. In some embodiments, such formulations are stored either in a ready-to-use form or in a form (e.g., lyophilized) that is reconstituted prior to administration.

In some embodiments, kits are provided for producing a single-dose administration unit. In some embodiments, the kit can contain both a first container having a dried protein and a second container having an aqueous formulation. In some embodiments, kits containing single and multi-chambered pre-filled syringes (e.g., liquid syringes and lyosyringes) are included.

In some embodiments, the effective amount of a pharmaceutical composition comprising an immunomodulatory composition (e.g., amphiphilic conjugate, e.g., fusion protein) to be employed therapeutically will depend, for example, upon the therapeutic context and objectives. One skilled in the art will appreciate that the appropriate dosage levels for treatment, according to certain embodiments, will thus vary depending, in part, upon the molecule delivered, the indication for which an immunomodulatory composition (e.g., amphiphilic conjugate, e.g., fusion protein) is being used, the route of administration, and the size (body weight, body surface or organ size) and/or condition (the age and general health) of the patient. In some embodiments, the clinician can titer the dosage and modify the route of administration to obtain the optimal therapeutic effect.

In some embodiments, the frequency of dosing will take into account the pharmacokinetic parameters of the immunomodulatory composition (e.g., amphiphilic conjugate, e.g., fusion protein), in the formulation used. In some embodiments, a clinician will administer the composition until a dosage is reached that achieves the desired effect. In some embodiments, the composition can therefore be administered as a single dose, or as two or more doses (which may or may not contain the same amount of the desired molecule) over time, or as a continuous infusion via an implantation device or catheter. Further refinement of the appropriate dosage is routinely made by those of ordinary skill in the art and is within the ambit of tasks routinely performed by them. In some embodiments, appropriate dosages can be ascertained through use of appropriate dose-response data.

In some embodiments, the route of administration of the pharmaceutical composition is in accord with known methods, e.g. orally, through injection by intravenous, intraperitoneal, intracerebral (intra-parenchymal), intracerebroventricular, intramuscular, subcutaneously, intra-ocular, intraarterial, intraportal, or intralesional routes; by sustained release systems or by implantation devices. In certain embodiments, the compositions can be administered by bolus injection or continuously by infusion, or by implantation device. In certain embodiments, individual elements of the combination therapy may be administered by different routes.

In some embodiments, the composition can be administered locally via implantation of a membrane, sponge or another appropriate material onto which the desired molecule has been absorbed or encapsulated. In some embodiments, where an implantation device is used, the device can be implanted into any suitable tissue or organ, and delivery of the desired molecule can be via diffusion, timed-release bolus, or continuous administration. In some embodiments, it can be desirable to use a pharmaceutical composition comprising an immunomodulatory composition (e.g., amphiphilic conjugate, e.g., fusion protein) in an ex vivo manner. In such instances, cells, tissues and/or organs that have been removed from the patient are exposed to a pharmaceutical composition comprising an immunomodulatory composition (e.g., amphiphilic conjugate, e.g., fusion protein), after which the cells, tissues and/or organs are subsequently implanted back into the patient.

In some embodiments, an immunomodulatory composition (e.g., amphiphilic conjugate, e.g., fusion protein) can be delivered by implanting certain cells that have been genetically engineered, using methods such as those described herein, to express and secrete the conjugate or fusion protein. In some embodiments, such cells can be animal or human cells, and can be autologous, heterologous, or xenogeneic. In some embodiments, the cells can be immortalized. In some embodiments, in order to decrease the chance of an immunological response, the cells can be encapsulated to avoid infiltration of surrounding tissues. In some embodiments, the encapsulation materials are typically biocompatible, semipermeable polymeric enclosures or membranes that allow the release of the protein product(s) but prevent the destruction of the cells by the patient's immune system or by other detrimental factors from the surrounding tissues.

Methods of Use

In some embodiments, the disclosure provides methods of expanding or activating CAR effector cells (e.g., CAR-T cells, CAR NK cells, CAR macrophages, CAR NKT cells) in vivo in a subject, comprising administering an immunomodulatory composition comprising a CAR ligand disclosed herein. In some embodiments, the immunomodulatory composition comprises an amphiphilic ligand conjugate comprising a CAR ligand disclosed herein. In some embodiments, the amphiphilic ligand conjugate is administered as an immunogenic composition or as a component of a vaccine. In some embodiments, the immunomodulatory composition comprises a fusion protein of a CAR ligand disclosed herein. In some embodiments, the disclosure provides methods of stimulating proliferation of CAR effector cells (e.g., CAR-T cells) in vivo in a subject, comprising administering an immunomodulatory composition (e.g., amphiphilic ligand conjugate, e.g., fusion protein) comprising a CAR ligand described herein.

Methods for determining expansion, activation and proliferation of cells are known to those of skill in the art. For example, the number of cells at a specified location (e.g., lymph nodes, blood, tumor) can be determined by isolating the cells and analyzing them via flow cytometry. In some embodiments, the cells are stained with appropriate markers, such as activation markers (e.g., CD80, CD86, 41BBL, ICOSL or OX40L) and/or proliferation markers (e.g., Ki67). In some embodiments, the number of cells is measured by introducing a dye (e.g., crystal violet) into cells, and measuring the dilution of the dye over time, wherein dilution indicates cell proliferation.

In some embodiments, the disclosure provides methods for treating a subject having a disease, disorder or condition associated with expression or elevated expression of an antigen, comprising administering to the subject CAR effector cells (e.g., CAR-T cells) targeted to the antigen, and an immunomodulatory composition (e.g., amphiphilic lipid conjugate, e.g., fusion protein). In some embodiments, the antigen is a disease-associated antigen. In some embodiments, the antigen is a tumor-associated antigen or a tumor-specific antigen. In some embodiments, the antigen is CD19 and the subject has a hematologic malignancy. In some embodiments, the CAR effector cells are anti-CD19 CAR T cells.

In some embodiments, the subject is administered the CAR effector cells (e.g., CAR-T cells) prior to receiving the immunomodulatory composition (e.g., amphiphilic lipid conjugate, e.g., fusion protein). In some embodiments, the subject is administered the CAR effector cells (e.g., CAR-T cells) after receiving the immunomodulatory composition (e.g., amphiphilic lipid conjugate, e.g., fusion protein). In some embodiments, the subject is administered the CAR effector cells (e.g., CAR-T cells) and the immunomodulatory composition (e.g., amphiphilic lipid conjugate, e.g., fusion protein) sequentially or simultaneously.

In some embodiments, the CAR ligand in the immunomodulatory composition (e.g., amphiphilic lipid conjugate, e.g., fusion protein) binds to more than one CAR. Accordingly, in some embodiments the disclosure provides methods for stimulating proliferation cells expressing more than one CAR or a population of cells comprising cells expressing a first CAR and cells expressing a second CAR.

In some embodiments, the disclosure provides methods for stimulating cells (e.g., increasing proliferation) expressing more than one CAR by administering more than one immunomodulatory composition (e.g., amphiphilic lipid conjugate, e.g., fusion protein) comprising a CAR ligand.

Cancer and Cancer Immunotherapy

In some embodiments, the immunomodulatory composition (e.g., amphiphilic conjugate; e.g., fusion protein) comprising a CAR ligand described herein is useful for treating a disorder associated with abnormal apoptosis or a differentiative process (e.g., cellular proliferative disorders (e.g., hyperproliferative disorders) or cellular differentiative disorders, such as cancer). Non-limiting examples of cancers that are amenable to treatment with the methods of the present invention are described below.

Examples of cellular proliferative and/or differentiative disorders include cancer (e.g., carcinoma, sarcoma, metastatic disorders or hematopoietic neoplastic disorders, e.g., leukemias). A metastatic tumor can arise from a multitude of primary tumor types, including but not limited to those of prostate, colon, lung, breast and liver. Accordingly, the compositions used herein, comprising, an amphiphilic ligand conjugate can be administered to a patient who has cancer.

As used herein, we may use the terms "cancer" (or "cancerous"), "hyperproliferative," and "neoplastic" to refer to cells having the capacity for autonomous growth (i.e., an abnormal state or condition characterized by rapidly proliferating cell growth). Hyperproliferative and neoplastic disease states may be categorized as pathologic (i.e., characterizing or constituting a disease state), or they may be categorized as non-pathologic (i.e., as a deviation from normal but not associated with a disease state). The terms are meant to include all types of cancerous growths or oncogenic processes, metastatic tissues or malignantly transformed cells, tissues, or organs, irrespective of histopathologic type or stage of invasiveness. "Pathologic hyperproliferative" cells occur in disease states characterized by malignant tumor growth. Examples of non-pathologic hyperproliferative cells include proliferation of cells associated with wound repair.

The terms "cancer" or "neoplasm" are used to refer to malignancies of the various organ systems, including those affecting the lung, breast, thyroid, lymph glands and lymphoid tissue, gastrointestinal organs, and the genitourinary tract, as well as to adenocarcinomas which are generally considered to include malignancies such as most colon cancers, renal-cell carcinoma, prostate cancer and/or testicular tumors, non-small cell carcinoma of the lung, cancer of the small intestine and cancer of the esophagus.

The term "carcinoma" is art recognized and refers to malignancies of epithelial or endocrine tissues including respiratory system carcinomas, gastrointestinal system carcinomas, genitourinary system carcinomas, testicular carcinomas, breast carcinomas, prostatic carcinomas, endocrine system carcinomas, and melanomas. The amphiphilic ligand conjugate can be used to treat patients who have, who are suspected of having, or who may be at high risk for developing any type of cancer, including renal carcinoma or melanoma, or any viral disease. Exemplary carcinomas include those forming from tissue of the cervix, lung, prostate, breast, head and neck, colon and ovary. The term also includes carcinosarcomas, which include malignant tumors composed of carcinomatous and sarcomatous tissues. An "adenocarcinoma" refers to a carcinoma derived from glandular tissue or in which the tumor cells form recognizable glandular structures.

Additional examples of proliferative disorders include hematopoietic neoplastic disorders. As used herein, the term "hematopoietic neoplastic disorders" includes diseases involving hyperplastic/neoplastic cells of hematopoietic origin, e.g., arising from myeloid, lymphoid or erythroid lineages, or precursor cells thereof. Preferably, the diseases arise from poorly differentiated acute leukemias (e.g., erythroblastic leukemia and acute megakaryoblastic leukemia). Additional exemplary myeloid disorders include, but are not limited to, acute promyeloid leukemia (APML), acute myelogenous leukemia (AML) and chronic myelogenous leukemia (CML) (reviewed in Vaickus, L. (1991) Crit. Rev. in Oncol./Hemotol. 11:267-97); lymphoid malignancies include, but are not limited to acute lymphoblastic leukemia (ALL) which includes B-lineage ALL and T-lineage ALL, chronic lymphocytic leukemia (CLL), prolymphocytic leukemia (PLL), hairy cell leukemia (HLL) and Waldenstrom's macro globulinemia (WM). Additional forms of malignant lymphomas include, but are not limited to non-Hodgkin lymphoma and variants thereof, peripheral T cell lymphomas, adult T cell leukemia/lymphoma (ATL), cutaneous T cell lymphoma (CTCL), large granular lymphocytic leukemia (LGF), Hodgkin's disease and Reed-Sternberg disease.

It will be appreciated by those skilled in the art that amounts for an immunomodulatory composition (e.g., fusion protein, e.g., amphiphilic conjugate) that is sufficient to reduce tumor growth and size, or a therapeutically effective amount, will vary not only on the particular compound or composition selected, but also with the route of administration, the nature of the condition being treated, and the age and condition of the patient, and will ultimately be at the discretion of the patient's physician or pharmacist. The length of time during which the compound used in the instant method will be given varies on an individual basis.

In some embodiments, the disclosure provides methods of reducing or decreasing the size of a tumor, or inhibiting a tumor growth in a subject in need thereof, comprising administering to the subject an immunomodulatory composition (e.g., fusion protein, e.g., amphiphilic conjugate), wherein the subject is receiving or has received CAR effector cell therapy (e.g., CAR-T cell therapy). In some embodiments, the disclosure provides methods for inducing an anti-tumor response in a subject with cancer, comprising administering to the subject an immunomodulatory composition (e.g., fusion protein, e.g., amphiphilic conjugate) described herein, wherein the subject is receiving or has received CAR effector cell therapy (e.g., CAR-T cell therapy).

In some embodiments, the disclosure provides methods for stimulating an immune response to a target cell population or target tissue expressing an antigen in a subject, comprising administering effector CAR cells (e.g., CAR-T cells) targeted to the antigen, and an immunomodulatory composition (e.g., fusion protein, e.g., amphiphilic conjugate) described herein. In some embodiments, the immune response is a T-cell mediated immune response. In some embodiments, the immune response is an anti-tumor immune response. In some embodiments, the target cell population or target tissue is tumor cells or tumor tissue.

It will be appreciated by those skilled in the art that reference herein to treatment extends to prophylaxis as well as the treatment of the noted cancers and symptoms.

Infectious Diseases

In some embodiments, an immunomodulatory composition (e.g., fusion protein, e.g., amphiphilic conjugate) disclosed herein is useful for treating acute or chronic infectious diseases. Because viral infections are cleared primarily by T-cells, an increase in T-cell activity is therapeutically useful in situations where more rapid or thorough clearance of an infective viral agent would be beneficial to an animal or human subject. Recently, CAR-T cell therapy has been investigated for its usefulness in treating viral infections, such as human immunodeficiency virus (HIV), as described in PCT Publication No. WO 2015/077789; Hale et al., (2017) Engineering HIV-Resistant, Anti-HIV Chimeric Antigen Receptor T Cells. Molecular Therapy, Vol. 25(3): 570-579; Liu et al., (2016), ABSTRACT. Journal of Virology, 90(21), 9712-9724; Liu et al., (2015). ABSTRACT. Journal of Virology, 89(13), 6685-6694; Sahu et al., (2013). Virology, 446(1-2), 268-275.

Thus, in some embodiments the immunomodulatory composition (e.g., fusion protein, e.g., amphiphilic conjugate) is administered for the treatment of local or systemic viral infections, including, but not limited to, immunodeficiency (e.g., HIV), papilloma (e.g., HPV), herpes (e.g., HSV), encephalitis, influenza (e.g., human influenza virus A), and common cold (e.g., human rhinovirus) viral infections. In some embodiments, pharmaceutical formulations including the immunomodulatory composition (e.g., fusion protein, e.g., amphiphilic conjugate) are administered topically to treat viral skin diseases such as herpes lesions or shingles, or genital warts. In some embodiments, the immunomodulatory composition (e.g., fusion protein, e.g., amphiphilic conjugate) are administered to treat systemic viral diseases, including, but not limited to, AIDS, influenza, the common cold, or encephalitis.

In some embodiments, the disclosure provides methods for increasing proliferation of CAR effector cells (e.g., CAR-T cells) in vivo, in a subject with a viral infection, comprising administering an immunomodulatory composition comprising a fusion protein comprising a CAR ligand described herein or an amphiphilic ligand conjugate comprising a CAR ligand described herein, or an immunogenic composition thereof, wherein the CAR comprises a viral peptide binding domain (e.g., a HIV Env binding domain), and wherein the immunomodulatory composition comprises a CAR ligand that binds the viral peptide binding domain (e.g., a HIV Env binding domain), wherein the CAR ligand is selected according to a method disclosed herein.

In some embodiments, the disclosure provides methods for expanding CAR effector cells (e.g., CAR-T cells) in vivo, in a subject with a viral infection, comprising administering an immunomodulatory composition comprising a fusion protein comprising a CAR ligand described herein or an amphiphilic ligand conjugate comprising a CAR ligand described herein, or an immunogenic composition thereof, wherein the CAR comprises a viral peptide binding domain (e.g., a HIV Env binding domain), and wherein the amphiphilic ligand conjugate comprises a CAR ligand that binds the viral peptide binding domain (e.g., a HIV Env binding domain), wherein the CAR ligand is selected according to a method disclosed herein.

In some embodiments, the disclosure provides methods of reducing a viral infection in a subject in need thereof, comprising administering to the subject an immunomodulatory composition comprising a fusion protein comprising a CAR ligand described herein or an amphiphilic ligand conjugate comprising a CAR ligand described herein, or an immunogenic composition thereof, wherein the subject is receiving or has received CAR effector cell therapy (e.g., CAR-T cell therapy). In some embodiments, the disclosure provides methods for inducing an anti-viral response in a subject with cancer, comprising administering to the subject an immunomodulatory composition described herein, wherein the subject is receiving or has received CAR effector cell therapy (e.g., CAR-T cell therapy).

It will be appreciated by those skilled in the art that reference herein to treatment extends to prophylaxis as well as the treatment of the noted infections and symptoms.

Kits

Provided herein are kits comprising at least an immunomodulatory composition described herein and instructions for use. In some embodiments, the kits comprise, in a suitable container, the immunomodulatory composition, one or more controls, and various buffers, reagents, enzymes and other standard ingredients well known in the art. In some embodiments, the kits further comprise an adjuvant (e.g., an amphiphilic oligonucleotide conjugate or a STING agonist (e.g., CDG)). Accordingly, in some embodiments, the immunomodulatory composition and adjuvant are in the same vial. In some embodiments, the immunomodulatory composition and adjuvant are in separate vials.

In some embodiments, the kits comprise an amphiphilic ligand conjugate described herein and instructions for use. In some embodiments, the kits comprise, in a suitable container, the amphiphilic ligand conjugate, one or more controls, and various buffers, reagents, enzymes and other standard ingredients well known in the art. In some embodiments, the kits further comprise an adjuvant (e.g., an amphiphilic oligonucleotide conjugate or a STING agonist (e.g., CDG)). Accordingly, in some embodiments, the amphiphilic ligand conjugate and adjuvant are in the same vial. In some embodiments, the amphiphilic ligand conjugate and adjuvant are in separate vials.

In some embodiments, the kits comprise a fusion protein described herein and instructions for use. In some embodiments, the kits comprise, in a suitable container, the fusion protein, one or more controls, and various buffers, reagents, enzymes and other standard ingredients well known in the art.

In some embodiments, the container is at least one vial, well, test tube, flask, bottle, syringe, or other container means, into which an immunomodulatory composition may be placed, and in some instances, suitably aliquoted. When an additional component is provided, the kit can contain additional containers into which this compound may be placed. The kits can also include a means for containing an immunomodulatory composition, and any other reagent containers in close confinement for commercial sale. Such containers may include injection or blow-molded plastic containers into which the desired vials are retained. Containers and/or kits can include labeling with instructions for use and/or warnings.

In some embodiments, the disclosure provides a kit comprising a container comprising an immunomodulatory composition comprising a CAR ligand described herein, an optional pharmaceutically acceptable carrier, and a package insert comprising instructions for administration of the immunomodulatory composition for treating or delaying progression of cancer in an individual receiving CAR cell therapy (e.g., CAR T cell therapy). In some embodiments, the kit further comprises an adjuvant and instructions for administration of the adjuvant for treating or delaying progression of cancer in an individual receiving CAR cell therapy (e.g., CAR T cell therapy). In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a container comprising an amphiphilic ligand conjugate described herein, an optional pharmaceutically acceptable carrier, and a package insert comprising instructions for administration of the amphiphilic ligand conjugate for treating or delaying progression of cancer in an individual receiving CAR cell therapy (e.g., CAR T cell therapy). In some embodiments, the kit further comprises an adjuvant and instructions for administration of the adjuvant for treating or delaying progression of cancer in an individual receiving CAR-T cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a container comprising a fusion protein described herein, an optional pharmaceutically acceptable carrier, and a package insert comprising instructions for administration of the fusion protein for treating or delaying progression of cancer in an individual receiving CAR cell therapy (e.g., CAR T cell therapy).

In some embodiments, the disclosure provides a kit comprising a medicament comprising an immunomodulatory composition comprising a CAR ligand described herein, an optional pharmaceutically acceptable carrier, and a package insert comprising instructions for administration of the medicament alone or in combination with a composition comprising an adjuvant and an optional pharmaceutically acceptable carrier, for treating or delaying progression of cancer in an individual receiving CAR cell therapy (e.g., CAR T cell therapy).

In some embodiments, the disclosure provides a kit comprising a medicament comprising an amphiphilic ligand conjugate comprising a CAR ligand described herein, an optional pharmaceutically acceptable carrier, and a package insert comprising instructions for administration of the medicament alone or in combination with a composition comprising an adjuvant and an optional pharmaceutically acceptable carrier, for treating or delaying progression of cancer in an individual receiving CAR cell therapy (e.g., CAR T cell therapy).

In some embodiments, the disclosure provides a kit comprising a medicament comprising a fusion protein comprising a CAR ligand described herein, an optional pharmaceutically acceptable carrier, and a package insert comprising instructions for administration of the medicament and an optional pharmaceutically acceptable carrier, for treating or delaying progression of cancer in an individual receiving CAR cell therapy (e.g., CAR T cell therapy).

In some embodiments, the disclosure provides a kit comprising a container comprising an immunomodulatory composition comprising a CAR ligand described herein, an optional pharmaceutically acceptable carrier, and a package insert comprising instructions for administration of the immunomodulatory composition for expanding CAR expressing cells in an individual receiving CAR-cell therapy. In some embodiments, the kit further comprises an adjuvant and instructions for administration of the adjuvant for expanding CAR expressing cells in an individual receiving CAR-T cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a container comprising an amphiphilic ligand conjugate comprising a CAR ligand described herein, an optional pharmaceutically acceptable carrier, and a package insert comprising instructions for administration of the amphiphilic ligand conjugate for expanding CAR expressing cells in an individual receiving CAR cell therapy. In some embodiments, the kit further comprises an adjuvant and instructions for administration of the adjuvant for expanding CAR expressing cells in an individual receiving CAR cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a container comprising a fusion protein comprising a CAR ligand described herein, an optional pharmaceutically acceptable carrier, and a package insert comprising instructions for administration of the fusion protein for expanding CAR expressing cells in an individual receiving CAR cell therapy.

In some embodiments, the disclosure provides a kit comprising a medicament comprising an immunomodulatory composition comprising a CAR ligand described herein, an optional pharmaceutically acceptable carrier, and a package insert comprising instructions for administration of the medicament alone or in combination with an immunogenic composition comprising an adjuvant and an optional pharmaceutically acceptable carrier, for expanding CAR expressing cells in an individual receiving CAR cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a medicament comprising an amphiphilic ligand conjugate comprising a CAR ligand described herein, an optional pharmaceutically acceptable carrier, and a package insert comprising instructions for administration of the medicament alone or in combination with a immunogenic composition comprising an adjuvant and an optional pharmaceutically acceptable carrier, for expanding CAR expressing cells in an individual receiving CAR cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a medicament comprising a fusion protein comprising a CAR ligand described herein, an optional pharmaceutically acceptable carrier, and a package insert comprising instructions for administration of the medicament and an optional pharmaceutically acceptable carrier, for expanding CAR expressing cells in an individual receiving CAR cell therapy.

In some embodiments, the disclosure provides a kit comprising a container comprising an immunomodulatory composition comprising a CAR ligand described herein, an optional pharmaceutically acceptable carrier, and a package insert comprising instructions for administration of the immunomodulatory composition for increasing proliferation of CAR expressing cells in an individual receiving CAR cell therapy. In some aspects, the kit further comprises an adjuvant and instructions for administration of the adjuvant for increasing proliferation of CAR expressing cells in an individual receiving CAR cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a container comprising an amphiphilic ligand conjugate comprising a CAR ligand described herein, an optional pharmaceutically acceptable carrier, and a package insert comprising instructions for administration of the amphiphilic ligand conjugate for increasing proliferation of CAR expressing cells in an individual receiving CAR cell therapy. In some aspects, the kit further comprises an adjuvant and instructions for administration of the adjuvant for increasing proliferation of CAR expressing cells in an individual receiving CAR cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a container comprising a fusion protein comprising a CAR ligand described herein, an optional pharmaceutically acceptable carrier, and a package insert comprising instructions for administration of the fusion protein for increasing proliferation of CAR expressing cells in an individual receiving CAR cell therapy.

In some embodiments, the disclosure provides a kit comprising a medicament comprising an immunomodulatory composition comprising an CAR ligand described herein, an optional pharmaceutically acceptable carrier, and a package insert comprising instructions for administration of the medicament alone or in combination with an immunogenic composition comprising an adjuvant and an optional pharmaceutically acceptable carrier, for increasing proliferation of CAR expressing cells in an individual receiving CAR cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a medicament comprising an amphiphilic ligand conjugate comprising a CAR ligand described herein, an optional pharmaceutically acceptable carrier, and a package insert comprising instructions for administration of the medicament alone or in combination with an immunogenic composition comprising an adjuvant and an optional pharmaceutically acceptable carrier, for increasing proliferation of CAR expressing cells in an individual receiving CAR cell therapy. In some embodiments, the adjuvant is an amphiphilic oligonucleotide conjugate described herein. In some embodiments, the adjuvant is a STING agonist. In some embodiments, the adjuvant is CDG.

In some embodiments, the disclosure provides a kit comprising a medicament comprising a fusion protein comprising a CAR ligand described herein, an optional pharmaceutically acceptable carrier, and a package insert comprising instructions for administration of the medicament and an optional pharmaceutically acceptable carrier, for increasing proliferation of CAR expressing cells in an individual receiving CAR cell therapy.

In some embodiments, any of the kits described herein further comprise CAR-T cells comprising a CAR that binds to the CAR ligand present in the immunomodulatory composition (e.g., fusion protein, e.g., amphiphilic ligand conjugate).

Definitions

Terms used in the claims and specification are defined as set forth below unless otherwise specified.

It must be noted that, as used in the specification and the appended claims, the singular forms "a," "an" and "the" include plural referents unless the context clearly dictates otherwise.

As used herein, "about" will be understood by persons of ordinary skill and will vary to some extent depending on the context in which it is used. If there are uses of the term which are not clear to persons of ordinary skill given the context in which it is used, "about" will mean up to plus or minus 10% of the particular value.

As used herein, the term "adjuvant" refers to a compound that, with a specific immunogen or antigen, will augment or otherwise alter or modify the resultant immune response. Modification of the immune response includes intensification or broadening the specificity of either or both antibody and cellular immune responses. Modification of the immune response can also mean decreasing or suppressing certain antigen-specific immune responses. In certain embodiments, the adjuvant is a cyclic dinucleotide. In some embodiments, the adjuvant is an immunostimulatory oligonucleotide as described herein. In some embodiments, the adjuvant is an amphiphilic oligonucleotide conjugate. In some embodiments, the adjuvant is administered prior to, concurrently, or after administration of an immunomodulatory composition comprising a CAR ligand described herein (e.g., an amphiphilic ligand conjugate). In some embodiments, the adjuvant is present in the immunomodulatory composition. In some embodiments, the immunomodulatory composition comprises an amphiphilic ligand conjugate described herein. In some embodiments, the adjuvant is co-formulated with the amphiphilic ligand conjugate.

As used herein, "amino acid" refers to naturally occurring and synthetic amino acids, as well as amino acid analogs and amino acid mimetics that function in a manner similar to the naturally occurring amino acids. Naturally occurring amino acids are those encoded by the genetic code, as well as those amino acids that are later modified, e.g., hydroxyproline, γ-carboxyglutamate, and O-phosphoserine. Amino acid analogs refers to compounds that have the same basic chemical structure as a naturally occurring amino acid, i.e., an α carbon that is bound to a hydrogen, a carboxyl group, an amino group, and an R group, e.g., homoserine, norleucine, methionine sulfoxide, methionine methyl sulfonium. Such analogs have modified R groups (e.g., norleucine) or modified peptide backbones, but retain the same basic chemical structure as a naturally occurring amino acid. Amino acid mimetics refers to chemical compounds that have a structure that is different from the general chemical structure of an amino acid, but that function in a manner similar to a naturally occurring amino acid.

Amino acids can be referred to herein by either their commonly known three letter symbols or by the one-letter symbols recommended by the IUPAC-IUB Biochemical Nomenclature Commission. Nucleotides, likewise, can be referred to by their commonly accepted single-letter codes.

As used herein, an "amino acid substitution" refers to the replacement of at least one existing amino acid residue in a predetermined amino acid sequence (an amino acid sequence of a starting polypeptide) with a second, different "replacement" amino acid residue. An "amino acid insertion" refers to the incorporation of at least one additional amino acid into a predetermined amino acid sequence. While the insertion will usually consist of the insertion of one or two amino acid residues, the present larger "peptide insertions," can be made, e.g. insertion of about three to about five or even up to about ten, fifteen, or twenty amino acid residues. The inserted residue(s) may be naturally occurring or non-naturally occurring as disclosed above. An "amino acid deletion" refers to the removal of at least one amino acid residue from a predetermined amino acid sequence.

As used herein, "amphiphile" or "amphiphilic" refers to a conjugate comprising a hydrophilic head group and a hydrophobic tail, thereby forming an amphiphilic conjugate. In some embodiments, an amphiphile conjugate comprises a chimeric antigen receptor (CAR) ligand described herein and one or more hydrophobic lipid tails, referred to herein as an "amphiphilic ligand conjugate." In some embodiments, the amphiphile conjugate further comprises a polymer (e.g., polyethylene glycol), wherein the polymer is conjugated to the one or more lipids or the CAR ligand. In some embodiments, the amphiphilic conjugate comprises an immunostimulatory oligonucleotide and one or more hydrophobic lipid tails, referred to herein as an "amphiphilic oligonucleotide conjugate".

As used herein, the term "ameliorating" refers to any therapeutically beneficial result in the treatment of a disease state, e.g., cancer, including prophylaxis, lessening in the severity or progression, remission, or cure thereof.

As used herein, the term "antigenic formulation" or "antigenic composition" or "immunogenic composition" refers to a preparation which, when administered to a vertebrate, especially a mammal, will induce an immune response.

As used herein, the term "antigen presenting cell" or "APC" is a cell that displays foreign antigen complexed with MHC on its surface. T cells recognize this complex using T cell receptor (TCR). Examples of APCs include, but are not limited to, dendritic cells (DCs), peripheral blood mononuclear cells (PBMC), monocytes (such as THP-1), B lymphoblastoid cells (such as C1R.A2, 1518 B-LCL) and monocyte-derived dendritic cells (DCs). Some APCs internalize antigens either by phagocytosis or by receptor-mediated endocytosis.

As used herein, the term "bispecific" or "bifunctional antibody" refers to an artificial hybrid antibody or fragment thereof having two different heavy/light chain pairs and two different binding sites. Bispecific antibodies can be produced by a variety of methods including fusion of hybridomas or linking of Fab' fragments. See, e.g., Songsivilai & Lachmann, (1990) *Clin. Exp. Immunol.* 79:315-321; Kostelny et al., (1992) *J. Immunol.* 148:1547-1553.

As used herein, the term "β-turn" refers to a protein secondary structure consisting of a tetrapeptide sequence which causes the peptide chain to reverse direction, and which often contains a 4' to 1' hydrogen bond, forming a pseudo-10-membered ring. The most widely accepted classification of the different conformations of the R-turn are described in Chou, et al *J MOL BIOL* (1977) 115:135. Various β-turn types have been defined, for example, type I. I', II, and II'. A reverse-turn encompasses well known protein secondary structures including β-turns, γ-turns, β-hairpins, and β-bulges.

As used herein the term "coat protein" means a protein, at least a portion of which is present on the surface of a virus particle. Typically, a coat protein is a protein that associates with a virus particle during the viral assembly process in a host cell, and remains associated with the assembled virus until it As used herein, the term "chimeric antigen receptor (CAR)" refers to an artificial transmembrane protein receptor comprising (i) an extracellular domain capable of binding to at least one predetermined CAR ligand or antigen, (ii) an intracellular segment comprising one or more cytoplasmic domains derived from signal transducing proteins different from the polypeptide from which the extracellular domain is derived, and (iii) a transmembrane domain. The "chimeric antigen receptor (CAR)" is sometimes called a "chimeric receptor", a "T-body", or a "chimeric immune receptor (CIR)."

As used herein, the phrase "CAR ligand" refers to a peptide comprising a sequence motif that specifically binds to the antigen recognition domain of a CAR described herein, wherein the peptide is selected from a peptide library according to methods of the disclosure (e.g., a peptide selected from a yeast display library).

As used herein, the "intracellular signaling domain" means any oligopeptide or polypeptide domain known to function to transmit a signal causing activation or inhibition of a biological process in a cell, for example, activation of an immune cell such as a T cell or a NK cell. Examples include ILR chain, CD28 and/or CD3ζ.

As used herein, "cancer antigen" refers to (i) tumor-specific antigens, (ii) tumor-associated antigens, (iii) cells that express tumor-specific antigens, (iv) cells that express tumor-associated antigens, (v) embryonic antigens on tumors, (vi) autologous tumor cells, (vii) tumor-specific membrane antigens, (viii) tumor-associated membrane antigens, (ix) growth factor receptors, (x) growth factor ligands, and (xi) any other type of antigen or antigen-presenting cell or material that is associated with a cancer.

As used herein, "CG oligodeoxynucleotides (CG ODNs)", also referred to as "CpG ODNs", are short single-stranded synthetic DNA molecules that contain a cytosine nucleotide (C) followed by a guanine nucleotide (G). In certain embodiments, the immunostimulatory oligonucleotide is a CG ODN.

As used herein the term "co-stimulatory ligand" includes a molecule on an antigen presenting cell (e.g., an APC, dendritic cell, B cell, and the like) that specifically binds a cognate co-stimulatory molecule on a T cell, thereby providing a signal which, in addition to the primary signal provided by, for instance, binding of a TCR/CD3 complex with an MHC molecule loaded with peptide, mediates a T cell response, including, but not limited to, proliferation, activation, differentiation, and the like. A co-stimulatory ligand can include, but is not limited to, CD7, B7-1 (CD80), B7-2 (CD86), PD-L 1, PD-L2, 4-1BBL, OX40L, inducible costimulatory ligand (ICOS-L), intercellular adhesion molecule (rCAM), CD30L, CD40, CD70, CD83, HLA-G, MICA, MICB, HVEM, lymphotoxin beta receptor, TR6, ILT3, ILT4, HVEM, an agonist or antibody that binds Toll ligand receptor and a ligand that specifically binds with B7-H3. A co-stimulatory ligand also encompasses, inter alia, an antibody that specifically binds with a co-stimulatory molecule present on a T cell, such as, but not limited to, CD27, CD28, 4-IBB, OX40, CD30, CD40, PD-1, 1COS, lymphocyte function-associated antigen-1 (LFA-1), CD2, CD7, LIGHT, NKG2C, B7-H3, and a ligand that specifically binds with CD83.

As used herein, a "co-stimulatory molecule" refers to the cognate binding partner on a T cell that specifically binds with a co-stimulatory ligand, thereby mediating a co-stimulatory response by the T cell, such as, but not limited to, proliferation. Co-stimulatory molecules include, but are not limited to, an MHC class I molecule, BTLA and a Toll ligand receptor.

As used herein, a "co-stimulatory signal", as used herein, refers to a signal, which in combination with a primary signal, such as TCR/CD3 ligation, leads to T cell proliferation and/or upregulation or downregulation of key molecules As used herein, a polypeptide or amino acid sequence "derived from" a designated polypeptide or protein refers to the origin of the polypeptide. Preferably, the polypeptide or amino acid sequence which is derived from a particular sequence has an amino acid sequence that is essentially identical to that sequence or a portion thereof, wherein the portion consists of at least 10-20 amino acids, preferably at least 20-30 amino acids, more preferably at least 30-50 amino acids, or which is otherwise identifiable to one of ordinary skill in the art as having its origin in the sequence.

Polypeptides derived from another peptide may have one or more mutations relative to the starting polypeptide, e.g., one or more amino acid residues which have been substituted with another amino acid residue or which has one or more amino acid residue insertions or deletions.

A polypeptide can comprise an amino acid sequence which is not naturally occurring. Such variants necessarily have less than 100% sequence identity or similarity with the starting molecule. In a preferred embodiment, the variant will have an amino acid sequence from about 75% to less than 100% amino acid sequence identity or similarity with the amino acid sequence of the starting polypeptide, more preferably from about 80% to less than 100%, more preferably from about 85% to less than 100%, more preferably from about 90% to less than 100% (e.g., 91%, 92%, 93%, 94%, 95%, 96%, 97%, 98%, 99%) and most preferably from about 95% to less than 100%, e.g., over the length of the variant molecule.

In one embodiment, there is one amino acid difference between a starting polypeptide sequence and the sequence derived therefrom. Identity or similarity with respect to this sequence is defined herein as the percentage of amino acid residues in the candidate sequence that are identical (i.e., same residue) with the starting amino acid residues, after aligning the sequences and introducing gaps, if necessary, to achieve the maximum percent sequence identity.

As used herein, the term antigen "cross-presentation" refers to presentation of exogenous protein antigens to T cells via MHC class I and class II molecules on APCs.

As used herein, the term "cytotoxic T lymphocyte (CTL) response" refers to an immune response induced by cytotoxic T cells. CTL responses are mediated primarily by $CD8^+$ T cells.

As used herein, the term "effective dose" or "effective dosage" is defined as an amount sufficient to achieve or at least partially achieve the desired effect. The term "therapeutically effective dose" is defined as an amount sufficient to cure or at least partially arrest the disease and its complications in a patient already suffering from the disease. Amounts effective for this use will depend upon the severity of the disorder being treated and the general state of the patient's own immune system.

As used herein, the term "effector cell" or "effector immune cell" refers to a cell involved in an immune response, e.g., in the promotion of an immune effector response. In some embodiments, immune effector cells specifically recognize an antigen. Examples of immune effector cells include, but are not limited to, Natural Killer (NK) cells, B cells, monocytes, macrophages, T cells (e.g., cytotoxic T lymphocytes (CTLs). In some embodiments, the effector cell is a T cell.

As used herein, the term "immune effector function" or "immune effector response" refers to a function or response of an immune effector cell that promotes an immune response to a target.

As used herein, the term "hematological cancer" includes a lymphoma, leukemia, myeloma or a lymphoid malignancy, as well as a cancer of the spleen and lymph nodes. Exemplary lymphomas include both B cell lymphomas (a B-cell hematological cancer) and T cell lymphomas. B-cell lymphomas include both Hodgkin's lymphomas and most non-Hodgkin's lymphomas. Non-limiting examples of B cell lymphomas include diffuse large B-cell lymphoma, follicular lymphoma, mucosa-associated lymphatic tissue lymphoma, small cell lymphocytic lymphoma (overlaps with chronic lymphocytic leukemia), mantle cell lymphoma (MCL), Burkitt's lymphoma, mediastinal large B cell lymphoma, Waldenstrom macroglobulinemia, nodal marginal zone B cell lymphoma, splenic marginal zone lymphoma, intravascular large B-cell lymphoma, primary effusion lymphoma, lymphomatoid granulomatosis. Non-limiting examples of T cell lymphomas include extranodal T cell lymphoma, cutaneous T cell lymphomas, anaplastic large cell lymphoma, and angioimmunoblastic T cell lymphoma. Hematological malignancies also include leukemia, such as, but not limited to, secondary leukemia, chronic lymphocytic leukemia, acute myelogenous leukemia, chronic myelogenous leukemia, and acute lymphoblastic leukemia. Hematological malignancies further include myelomas, such as, but not limited to, multiple myeloma and smoldering multiple myeloma. Other hematological and/or B cell- or T-cell-associated cancers are encompassed by the term hematological malignancy.

As used herein, the term "heterologous DNA" refers to any DNA that is introduced to a host cell. In some embodiments, the DNA is derived from genomic DNA, cDNA, synthetic DNA, or any combination or fusion thereof. In some embodiments, the DNA is DNA from the same cell type as the host cell. In some embodiments, the DNA is from a different cell type than the host cell. In some embodiments, the DNA comprises selection genes, for example, antibiotic resistance genes, metabolic regulator genes, temperature resistance genes, etc.

As used herein, "immune cell" is a cell of hematopoietic origin and that plays a role in the immune response. Immune cells include lymphocytes (e.g., B cells and T cells), natural killer cells, and myeloid cells (e.g., monocytes, macrophages, eosinophils, mast cells, basophils, and granulocytes).

As used herein, an "immunostimulatory oligonucleotide" is an oligonucleotide that can stimulate (e.g., induce or enhance) an immune response.

As used herein the terms "inducing an immune response" and "enhancing an immune response" are used interchangeably and refer to the stimulation of an immune response (i.e., either passive or adaptive) to a particular antigen. The term "induce" as used with respect to inducing CDC or ADCC refer to the stimulation of particular direct cell killing mechanisms.

As used herein, a subject "in need of prevention," "in need of treatment," or "in need thereof," refers to one, who by the judgment of an appropriate medical practitioner (e.g., a doctor, a nurse, or a nurse practitioner in the case of humans; a veterinarian in the case of non-human mammals), would reasonably benefit from a given treatment (such as treatment with a composition comprising an amphiphilic ligand conjugate).

As used herein, the term "in vivo" refers to processes that occur in a living organism.

As used herein, the terms "linked," "operably linked," "fused", or "fusion", are used interchangeably. These terms refer to the joining together of two more elements or components or domains, by an appropriate means including chemical conjugation or recombinant DNA technology. Methods of chemical conjugation (e.g., using heterobifunctional crosslinking agents) are known in the art as are methods of recombinant DNA technology.

As used herein, the term "lipid" refers to a biomolecule that is soluble in nonpolar solvents and insoluble in water. Lipids are often described as hydrophobic or amphiphilic molecules which allows them to form structures such as vesicles or membranes in aqueous environments. Lipids include fatty acids, glycerolipids, glycerophospholipids, sphingolipids, sterol lipids (including cholesterol), prenol lipids, saccharolipids, and polyketides. In some embodiments, the lipid suitable for the amphiphilic ligand conjugates of the disclosure binds to human serum albumin under physiological conditions. In some embodiments, the lipid suitable for the amphiphilic ligand conjugates of the disclosure inserts into a cell membrane under physiological conditions. In some embodiments, the lipid binds albumin and inserts into a cell membrane under physiological conditions. In some embodiments, the lipid is a diacyl lipid. In some embodiments, the diacyl lipid comprises more than 12 carbons. In some embodiments, the diacyl lipid comprises at least 13, at least 14, at least 15, at least 16, at least 17 or at least 18 carbons.

As used herein, the term "mammal" or "subject" or "patient" as used herein includes both humans and non-humans and includes, but is not limited to, humans, non-human primates, canines, felines, murines, bovines, equines, and porcines.

As used herein, "Nucleic acid" refers to deoxyribonucleotides or ribonucleotides and polymers thereof in either single- or double-stranded form. Unless specifically limited, the term encompasses nucleic acids containing known analogues of natural nucleotides that have similar binding properties as the reference nucleic acid and are metabolized in a manner similar to naturally occurring nucleotides. Unless otherwise indicated, a particular nucleic acid sequence also implicitly encompasses conservatively modified variants thereof (e.g., degenerate codon substitutions) and complementary sequences and as well as the sequence explicitly indicated. Specifically, degenerate codon substitutions can be achieved by generating sequences in which the third position of one or more selected (or all) codons is substituted with mixed-base and/or deoxyinosine residues (Batzer et al., *Nucleic Acid Res.* 19:5081, 1991; Ohtsuka et al., *J. Biol. Chem.* 260:2605-2608, 1985); and Cassol et al., 1992; Rossolini et al., *Mol. Cell. Probes* 8:91-98, 1994). For arginine and leucine, modifications at the second base can also be conservative. The term nucleic acid is used interchangeably with gene, cDNA, and mRNA encoded by a gene.

Polynucleotides of the present invention can be composed of any polyribonucleotide or polydeoxribonucleotide, which can be unmodified RNA or DNA or modified RNA or DNA. For example, polynucleotides can be composed of single- and double-stranded DNA, DNA that is a mixture of single- and double-stranded regions, single- and double-stranded RNA, and RNA that is mixture of single- and double-stranded regions, hybrid molecules comprising DNA and RNA that can be single-stranded or, more typically, double-stranded or a mixture of single- and double-stranded regions. In addition, the polynucleotide can be composed of triple-stranded regions comprising RNA or DNA or both RNA and DNA. A polynucleotide can also contain one or more modified bases or DNA or RNA backbones modified for stability or for other reasons. "Modified" bases include, for example, tritylated bases and unusual bases such as inosine. A variety of modifications can be made to DNA and RNA; thus, "polynucleotide" embraces chemically, enzymatically, or metabolically modified forms.

In some embodiments, the peptides of the invention are encoded by a nucleotide sequence. Nucleotide sequences of the invention can be useful for a number of applications, including: cloning, gene therapy, protein expression and purification, mutation introduction, DNA vaccination of a host in need thereof, antibody generation for, e.g., passive immunization, PCR, primer and probe generation, and the like.

As used herein, "parenteral administration," "administered parenterally," and other grammatically equivalent phrases, refer to modes of administration other than enteral and topical administration, usually by injection, and include, without limitation, intravenous, intratumoral, intranasal, intraocular, intramuscular, intraarterial, intrathecal, intracapsular, intraorbital, intracardiac, intradermal, intraperitoneal, transtracheal, subcutaneous, subcuticular, intraarticular, subcapsular, subarachnoid, intraspinal, epidural, intracerebral, intracranial, intracarotid and intrasternal injection and infusion.

As generally used herein, "pharmaceutically acceptable" refers to those compounds, materials, compositions, and/or dosage forms which are, within the scope of sound medical judgment, suitable for use in contact with the tissues, organs, and/or bodily fluids of human beings and animals without excessive toxicity, irritation, allergic response, or other problems or complications commensurate with a reasonable benefit/risk ratio.

As used herein, the term "physiological conditions" refers to the in vivo condition of a subject. In some embodiments, physiological condition refers to a neutral pH (e.g., pH between 6-8).

As used herein, "Polypeptide," "peptide", and "protein" are used interchangeably herein to refer to a polymer of amino acid residues. In some embodiments, the term applies to soluble amino acid polymers or amino acid polymers appended to a solid support or cell surface. In some embodiments, the amino acid polymers comprise naturally occurring amino acid residues. In some embodiments, the amino acid polymers comprise non-naturally occurring amino acid residues.

As used herein, a "small molecule" is a molecule with a molecular weight below about 500 Daltons.

As used herein, the term "subject" includes any human or non-human animal. For example, the methods and compositions of the present invention can be used to treat a subject with a cancer or infection. The term "non-human animal" includes all vertebrates, e.g., mammals and non-mammals, such as non-human primates, sheep, dog, cow, chickens, amphibians, reptiles, etc.

As used herein, the term "sufficient amount" or "amount sufficient to" means an amount sufficient to produce a desired effect, e.g., an amount sufficient to reduce the diameter of a tumor.

As used herein, the term "T cell" refers to a type of white blood cell that can be distinguished from other white blood cells by the presence of a T cell receptor on the cell surface. There are several subsets of T cells, including, but not limited to, T helper cells (a.k.a. TH cells or $CD4^+$ T cells) and subtypes, including $T_H1$, $T_H2$, $T_H3$, $T_H17$, $T_H9$, and $T_{FH}$ cells, cytotoxic T cells (i.e., $T_C$ cells, $CD8^+$ T cells, cytotoxic T lymphocytes, T-killer cells, killer T cells), memory T cells and subtypes, including central memory T cells ($T_{CM}$ cells), effector memory T cells ($T_{EM}$ and $T_{EMRA}$ cells), and resident memory T cells ($T_{RM}$ cells), regulatory T cells (a.k.a. $T_{reg}$ cells or suppressor T cells) and subtypes, including $CD4^+$ $FOXP3^+$ $T_{reg}$ cells, $CD4^+$ $FOXP3^-$ $T_{reg}$ cells, Tr1 cells, Th3 cells, and $T_{reg}17$ cells, natural killer T cells (a.k.a. NKT cells), mucosal associated invariant T cells (MAITs), and gamma delta T cells (γδ T cells), including Vγ9/Vδ2 T cells. Any one or more of the aforementioned or unmentioned T cells may be the target cell type for a method of use of the invention.

As used herein, the term "T cell activation" or "activation of T cells" refers to a cellular process in which mature T cells, which express antigen-specific T cell receptors on their surfaces, recognize their cognate antigens and respond by entering the cell cycle, secreting cytokines or lytic enzymes, and initiating or becoming competent to perform cell-based effector functions. T cell activation requires at least two signals to become fully activated. The first occurs after engagement of the T cell antigen-specific receptor (TCR) by the antigen-major histocompatibility complex (MHC), and the second by subsequent engagement of co-stimulatory molecules (e.g., CD28). These signals are transmitted to the nucleus and result in clonal expansion of T cells, upregulation of activation markers on the cell surface, differentiation into effector cells, induction of cytotoxicity or cytokine secretion, induction of apoptosis, or a combination thereof.

As used herein, the term "T cell-mediated response" refers to any response mediated by T cells, including, but not limited to, effector T cells (e.g., $CD8^+$ cells) and helper T cells (e.g., $CD4^+$ cells). T cell mediated responses include, for example, T cell cytotoxicity and proliferation.

As used herein, the term "T cell cytotoxicity" includes any immune response that is mediated by CD8+ T cell activation. Exemplary immune responses include cytokine production, CD8+ T cell proliferation, granzyme or perforin production, and clearance of an infectious agent.

As used herein, "therapeutic protein" refers to any polypeptide, protein, protein variant, fusion protein and/or fragment thereof which may be administered to a subject as a medicament.

As used herein, the term "therapeutically effective amount" is an amount that is effective to ameliorate a symptom of a disease. A therapeutically effective amount can be a "prophylactically effective amount" as prophylaxis can be considered therapy.

As used herein, the terms "treat," "treating," and "treatment," as used herein, refer to therapeutic or preventative measures described herein. The methods of "treatment" employ administration to a subject, in need of such treatment, an immunomodulatory composition (e.g., amphiphilic ligand conjugate, e.g., fusion protein) of the present disclosure, for example, to a subject receiving or has received CAR T cell therapy. In some embodiments, an immunomodulatory composition (e.g., amphiphilic ligand conjugate, e.g., fusion protein) is administered to a subject in need of an enhanced immune response (e.g., a CAR T cell immune response) against a particular antigen or a subject who ultimately may acquire such a disorder, in order to prevent, cure, delay, reduce the severity of, or ameliorate one or more symptoms of the disorder or recurring disorder, or in order to prolong the survival of a subject beyond that expected in the absence of such treatment.

As used herein, "vaccine" refers to a formulation which contains an immunomodulatory composition comprising a CAR ligand described herein (e.g., an amphiphilic ligand conjugate), combined with an adjuvant, which is in a form that is capable of being administered to a vertebrate and which is sufficient to induce immunity, e.g., to prevent and/or ameliorate an infection or disease, e.g., to reduce at least one symptom of an infection or disease, e.g., to enhance the efficacy of a CAR T cell therapy. In some embodiments, the vaccine is administered to a subject who is receiving or has received CAR T cells. In some embodiments, the vaccine comprises a CAR ligand that selectively binds the antigen recognition domain of the CAR expressed by the CAR T cells. Typically, the vaccine comprises a conventional saline or buffered aqueous solution medium in which a composition as described herein is suspended or dissolved. In this form, a composition as described herein is used to prevent, ameliorate, or otherwise treat an infection or disease. Upon introduction into a host, the vaccine provokes an immune response including, but not limited to, the production of antibodies and/or cytokines and/or the activation of cytotoxic T cells, antigen presenting cells, helper T cells, dendritic cells and/or other cellular responses. In some embodiments, the vaccine promotes survival, proliferation, activation, engraftment, and/or persistence of CAR T cells previously administered or being administered (e.g., simultaneously or sequentially) to the host.

EXAMPLES

Below are examples of specific embodiments for carrying out the methods described herein. The examples are offered for illustrative purposes only, and are not intended to limit the scope of the present invention in any way. Efforts have been made to ensure accuracy with respect to numbers used (e.g., amounts, temperatures, etc.), but some experimental error and deviation should, of course, be allowed for.

Example 1: Generation of an Anti-CD19 CAR Peptide Ligand by Yeast Display

CAR-T cells targeting the CD19 antigen (i.e., anti-CD19 CAR-T cells) have produced dramatic clinical responses in patients with leukemia and lymphoma, including a high proportion of durable complete remissions (see, e.g., Fesnak, A. et al (2016) *Nat Rev Cancer* 16:566-581; Khalil, D. et al (2016) *Nat Rev Clin Oncol* 13:394). However, poor functional persistence of CAR-T cells in some patients results in disease progression (see, e.g., Guedan, et al (2018) *JCI Insight* 3). A potential strategy to induce more potent CAR-T cell expansion and persistence is to provide stimulation through the CAR itself.

Towards this end amphiphile conjugates comprising a CAR ligand operably linked to an albumin-binding phospholipid-polymer have been developed. As described by Liu, H., et al. (2014) *Nature,* 507:519-522, amphiphilic conjugates comprising a peptide ligand operably linked to a phospholipid-polymer promote trafficking of the peptide ligand to lymph nodes. While small peptides are rapidly dispersed into the blood following parenteral injection, peptides linked to an amphiphile conjugate bind to endogenous albumin, which constitutively traffics from blood to lymph, and are retargeted to lymph nodes. Moreover, the lipid tail of the amphiphilic peptide conjugate enables insertion of the peptide ligand into cell membranes. As further demonstrated by Ma, et al. (2019) *Science* 365:162-168, by appending a CAR ligand to the amphiphile conjugate (FIG. 1), the CAR ligand is efficiently delivered to the lymph nodes and inserts into the membranes of resident antigen presenting cells (APCs). The presentation of the amphiphile ligand (amph-ligand) on the APC surface, together with native cytokine/receptor costimulation, provides stimulation to CAR T cells and promotes their expansion and enhanced anti-tumor activity (FIG. 2). Further description of this strategy is provided by PCT Publication WO 2019/060425 and US Application No. 2020/0230221, each of which are incorporated by reference in its entirety.

Figure 3:
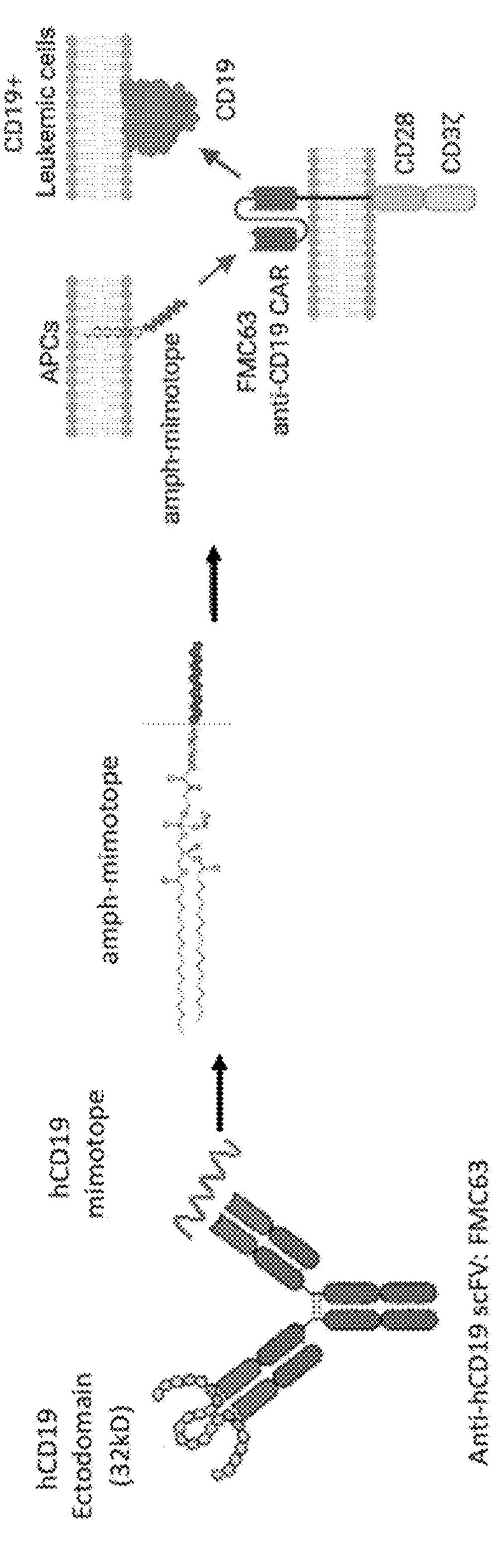
FIG. 3 is a schematic illustrating an amphiphilic mimotope ("amph-mimotope") vaccine concept to boost FMC63 anti-human CD19 (hCD19) CAR T cells. Specifically, an hCD19 mimotope is identified and operably linked to an albumin binding/membrane-inserting domain via a PEG molecule. Amph-mimotope coated APCs stimulate FMC63 anti-hCD19 CAR T cells to attack CD19+ leukemic cells.

To target a specific CAR (i.e., an anti-CD19 CAR), an amphiphile conjugate was developed comprising a peptide ligand that binds to an anti-CD19 CAR comprising a FMC63 scFv (SEQ ID NO: 41). The FMC63 scFV is derived from a murine monoclonal antibody that recognizes a conformational epitope on human CD19 and has been used to generate anti-CD19 CAR T cells in multiple human clinical trials (see, e.g., Porter, D., et al. (2011) *N Engl J Med,* 365(8): 725-733; Kockenderfer, Jn., et al. (2013) *Nat Rev Clin Oncol,* 10(5):267-276; Long, A H., et al. (2015) *Nat Med,* 21(6):581-90). Amino acid sequence for FMC63 scFv is identified by SEQ ID NO: 70. As shown in FIG. 3, short linear peptides (e.g., mimotopes) were developed that bind to the FMC63 variable region and can be linked to a phospholipid-polymer to form an amphiphile conjugate (amph-mimotope) for stimulation of anti-CD19 CAR T cells comprising a FMC63 scFv.

Figure 4:
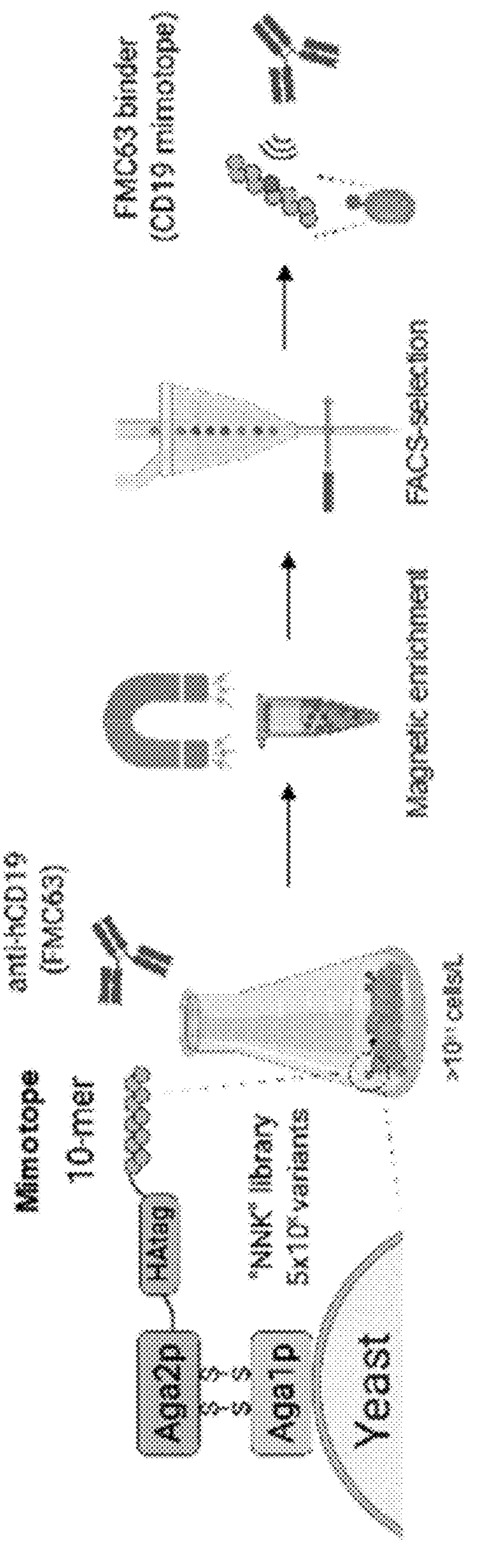
FIG. 4 is a schematic illustrating the yeast surface display screen used to identify CD19 mimotopes described herein. An NNK library (a library of 10-amino acid peptides comprising repeat NNK sequence, wherein N is any nucleotide (A,C,G,T) and K is the nucleotide G or T) is enriched for FMC63 binders using magnetic enrichment and FACS-selection.

Yeast surface display technology was used to identify peptide ligands that bind to FMC63. Broadly, PCR was performed with randomized primers and a yeast surface display plasmid to generate a randomized 10 amino acid peptide library. The yeast library was then selected for peptides which bind FMC63 using positive and negative selection by magnetic bead display and flow cytometry. Specifically, the library utilized degenerate codon NNK which encodes all 20 amino acids, one stop codon, and uses 32 codons. 'N' encodes any nucleotide (A,T,C,G) and K encodes nucleotides G or T. The library used a multi-site saturation mutagenesis approach wherein the NNK codon was repeated 10 times to generate a library with ~5×10e8 randomized peptides ("NNK" Library) (FIG. 4). The library was generated by first performing nested PCR using pCT-CON-2, a known yeast surface display vector, as template DNA with the NNK library primers; SEQ ID NO: 1 and SEQ ID NO: 2 (Table 1) where 'N' encodes (A,T,C,G) and 'M' encodes C or A, and wherein "MNN" correspond to the reverse-compliment of "NNK" (with K encoding G or T). Following amplification, the PCR product was purified, and a second round of amplification was performed using the mimotope PCR product and the primers: SEQ ID NO: 3 and SEQ ID NO:4 (Table 1). The PCR product was mixed with pCTCON2 vector (expressing Aga2p) and precipitated in Pellet Paint® using the manufacturer's protocol (Millipore Sigma). The PCR/vector DNA mixture was electroporated (expressing Aga2p) into competent yeast cells [EBY100] using previously described methods (Chen, T., et al. (2013) *Methods in Enzymology,* 523:303-326).

TABLE 1

Primer Sequences to Generate Yeast Display NNK Library

| | |
|---|---|
| SEQ ID NO: 1 | Mimotope Library Forward - 5'- AACTAGCAAAGGCAGCCCCATAAACAC- 3' |
| SEQ ID NO: 2 | Mimotope Lib R -5' - GATTTTGTTACATCTACACTGTTGTTATCAGATCTCGAGCT ATTAMNNMNNMNNMNNMNNMNNMNNMNNMNNMNNGCTAGCC GACCCTCCGCC - 3' |
| SEQ ID NO: 3 | Min Cmyc EP Forward - 5'- GGCTCTGGTGGAGGCGGTAGCGGAGGCGGAGGGTCGGCTAG C - 3' |
| SEQ ID NO: 4 | Min Cmyc EP Reverse - 5' - GATTTTGTTACATCTACACTGTTGTTATCAGATCTCGAGCT ATTA - 3' |

Figure 5:
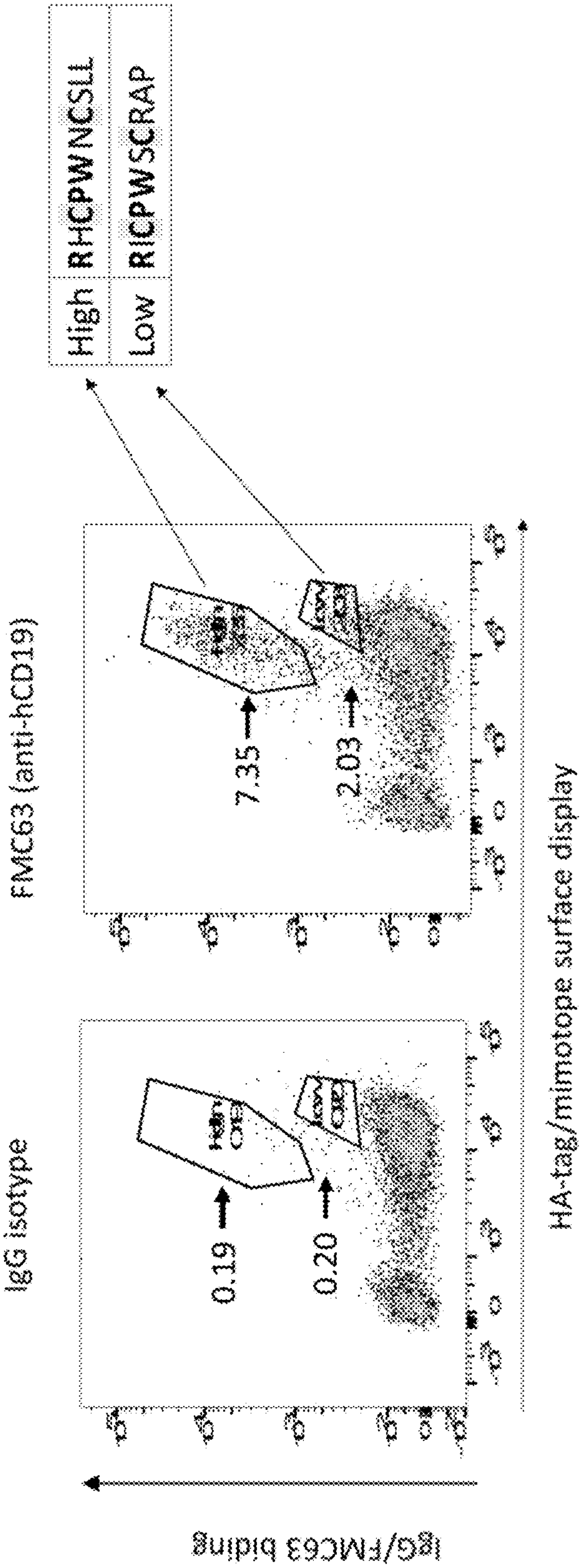
FIG. 5 provides a FACS plot demonstrating successful isolation of high-affinity and low-affinity FMC63 anti-hCD19 binding yeast populations from the NNK library after two rounds of MACS enrichment and two rounds of FACS enrichment. The high affinity mimotope and low affinity mimotope represented in FIG. 5 have amino acid sequences set forth in SEQ ID NOs: 5 and 6 respectively.

To identify FMC63 mimotopes for binding to FCM63 scFv at sufficient affinity that could trigger CAR-T activation, enrichment of FMC63 binding mimotopes generated by the "NNK" library was performed. Specifically, FMC63 IgG and the corresponding isotype control antibody (IgG2a with kappa light chain) were biotinylated. The biotinylated antibodies were incubated with the yeast library containing 5×10e9, total yeast cells (10× diversity of the NNK library to reduce clone loss). The yeast were enriched using known methods (Chen, T., et al. (2013) *Methods in Enzymology,* 523:303-326). Specifically, enrichment was performed using streptavidin-coated microbeads for four rounds of magnetic activated cell sorting (MACS) selection using first bare beads to deplete non-specific binders, a second and third round using IgG isotype control beads, and a fourth round using FMC63 IgG coated beads. Following MACS selection, two rounds of FACS were performed. Yeast were stained with 5 μM of biotinylated FMC63 IgG antibody followed by staining using streptavidin-PE conjugates to enrich yeast cells expressing mimotopes that specifically bind to the antigen-binding domain of FMC63 antibody. The enrichment yielded two populations of mimotopes with a high and low micromolar affinity (Kd) (FIG. 5). Clones were isolated following FACS analysis and sanger sequencing revealed two sequences (high-affinity mimotope: RHCPWNCSLL (SEQ ID NO: 5), and low-affinity mimotope: RICPWSCRAP (SEQ ID NO: 6)).

Example 2: Evaluation of Mimotope Structure and Binding Affinity

To assess what residues were essential for binding to FMC63, sequence and peptide structure analysis was conducted. Specifically, when the high-affinity: RHCPWNCSLL (SEQ ID NO: 5), and low-affinity: RICPWSCRAP (SEQ ID NO: 6) mimotopes were compared, a sequence pattern (motif) for binding to FMC63 was observed. Both sequences contained Cys residues at the 3rd and 7th position, Pro at the 4th position, Trp at the 5th position, and Arg at the 1st position (FIG. 5 and Table 2). The presence of two Cys residues on the same mimotope indicates the formation of an intra-peptidyl disulfide bridge. The Pro residue suggests the possibility of introducing a kink that would facilitate the formation of a loop structure. To determine formation of a loop structure, structural simulation was performed. Specifically, simulation was carried out using PEP-FOLD3. The 10-mer mimotope sequence was used as direct input and all settings were kept in default. The high-affinity (RHCPWNCSLL (SEQ ID NO:5) mimotope demonstrated a "curved" alpha-helix (data not shown).

TABLE 2

Mimotope Sequences to FMC63 CAR Selected from Yeast Display NNK Library

| SEQ ID NO: | Sequence |
|---|---|
| 5 | RHCPWNCSLL |
| 6 | RICPWSCRAP |
| 7 | $RX_1CPWX_2CX_3X_4X_5$ |

Figure 6:
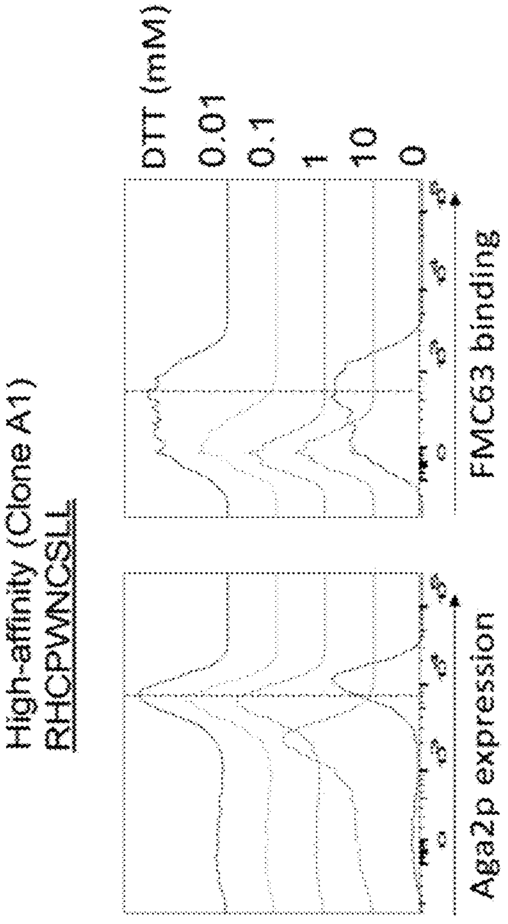
FIG. 6 provides graphs summarizing FACS analysis of yeast expressing a high-affinity mimotope (RHCPWNCSLL; SEQ ID NO: 5) following treatment with increasing concentration of dithiothreitol (DTT); the retention of Aga2p on the yeast surface (left panel) and binding of the mimotope to FMC63 IgG (right panel) were measured by FACS analysis.

To determine the formation of an intra-peptidyl disulfide bridge formed by the two Cys residues, mimotope expressing yeast were treated in reducing conditions and binding of the mimotope to FMC63 IgG was measured. Specifically, high-affinity mimotope-expressing RHCPWNCSLL (SEQ ID NO: 5) yeast cells were treated with dithiothreitol (DTT) (dithiothreitol) at mild reducing conditions (0.01-10 mM) for 30 minutes at room temperature. Similarly, control cells expressing Aga2p (connected to the yeast surface by disulfide bridge) were treated with DTT. Following treatment, cells were labelled with biotinylated Aga2p or FMC63 and binding was measured by flow cytometry. At mild reducing conditions, Aga2p was maintained on the yeast surface while mimotope binding to FMC63 was abolished (FIG. 6). The inhibition of mimotope binding to FMC63 following treatment with a reducing agent reaffirms the formation of the disulfide bond and its importance for binding.

Figure 7:
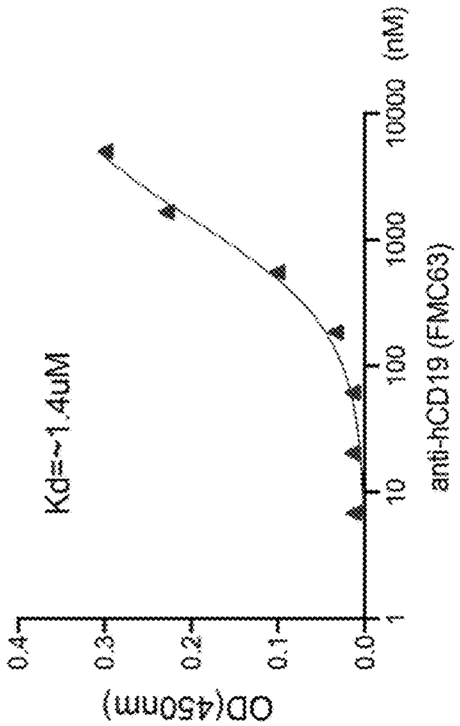
FIG. 7 provides a graph depicting the absolute binding affinity ($K_d$) of the chemically synthesized high-affinity mimotope (RHCPWNCSLL; SEQ ID NO: 5) to FMC63 IgG using ELISA.

Next, the affinity of the RHCPWNCSLL (SEQ ID NO: 5) mimotope to FMC63 was determined. Briefly, yeast cells expressing the mimotope were incubated with FMC63 IgG and affinity was measured by ELISA to be around 1.4 μM (FIG. 7). This affinity demonstrates successful binding to FMC63.

Example 3: In Vitro Response of Anti-CD19 CAR T Cells to Amph-Mimotope

As discussed in Example 1, small peptides are normally rapidly dispersed into the blood after parenteral injection, but binding of amphiphile peptides to endogenous albumin, which constitutively traffics from blood to lymph, can retarget these molecules to lymph nodes. To target the mimotopes for T cell activation, an amph-mimotope was generated using previously described methods (Ma, L., et al. (2019) *Science* 365:162-168). Specifically, DSPE-PEG2000 was conjugated onto the N-terminus of a synthesized cyclic mimotope RHCPWNCSLL (SEQ ID NO: 5). N-terminal Lysine (azido)-modified peptides were dissolved in H2O and mixed with 2 equivalents DBCO-PEG2000-DSPE (Avanti) and the mixture was agitated in the dark at 25° C. for 24 hours. Bioconjugations were judged to be essentially complete by HPLC analysis. Peptide amphiphiles were characterized by MALDI-TOF mass spectrometry. The peptide conjugates were then diluted in 10×ddH2O and lyophilized into powder, re-dissolved in H2O and stored at −80° C.

Figure 8B:
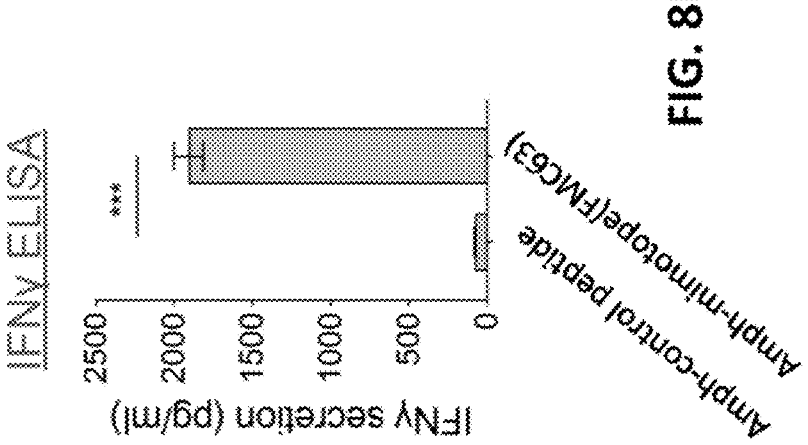
FIG. 8B provides a graph demonstrating in vitro activation of FMC63 anti-hCD19 CAR-T cells by co-culture with (RHCPWNCSLL) (SEQ ID NO: 5) amph-mimotope coated K562 cells; secretion of IFNγ from the anti-CD19 CAR T cells was measured by ELISA. ***p<0.001.
Figure 8A:
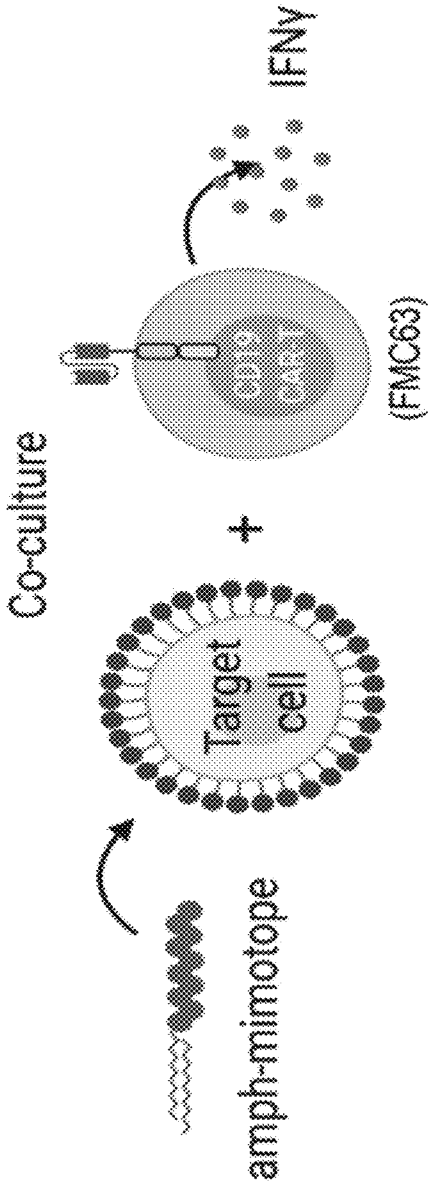
FIG. 8A is a schematic illustrating amph-mimotope coated target cells activating FMC63 anti-hCD19 CAR T cells to secrete IFNγ.

To determine the effect of the CD19 amph-mimotope on chimeric antigen receptor (CAR) T cells, in vitro stimulation of CAR-T cells was assessed after co-culture with antigen presenting cells (APCs) providing the amph-mimotope (FIG. 8A). Specifically, K562 cells were pelleted at 1,000×g for 3 minutes and washed with PBS twice to remove residual protein. The cell pellet was then resuspended at $1\times10^6$ cells/mL in PBS containing amph-mimotope (RHCPWNCSLL; SEQ ID NO: 5) at 10 μM and incubated at 37° C. for 30 minutes. The labeling reaction was stopped by pelleting cells and washing with PBS. To mimic antigen presenting cells in lymph nodes, K562 cells were decorated with amph-mimotope, and then co-cultured at an effector to target (E:T) ratio of 10:1 with FMC63 expressing CAR-T cells (hCD19-CAR; SEQ ID NO: 78) for 24 hours. The hCD19-CAR was generated in part from a previously reported CAR (Pegram, H., et al. (2012) *Blood* 119:18 (4133-4141) and is composed of a human CD8 signal peptide (SEQ ID NO: 87), FMC63 scFV (SEQ ID NO: 70), murine CD8 hinge (SEQ ID NO: 74), a murine CD8 transmembrane domain (SEQ ID NO: 75), a murine CD28 costimulatory domain (SEQ ID NO: 76) and a murine CD3ζ intracellular domain (SEQ ID NO: 77). The overall CAR is provided in SEQ ID NO: 78. After co-culture, cells were pelleted at 2,000×g for 5 minutes, and the supernatant was harvested for IFNγ ELISA and processed following the manufacturer's protocol (Human IFNγ ELISA MAX™ Deluxe (Biolegend)). Compared to amphiphile only control, amph-mimotope significantly activated CAR-T cells when measured by IFNγ secretion (FIG. 8B). Overall, these results indicate that the amphiphilic ligand mimotope conjugates are capable of stimulating FMC63 anti-hCD19 CAR-T cells in vitro.

Example 4: Generation of Enhanced Affinity Library

Figures 9A, 9B:
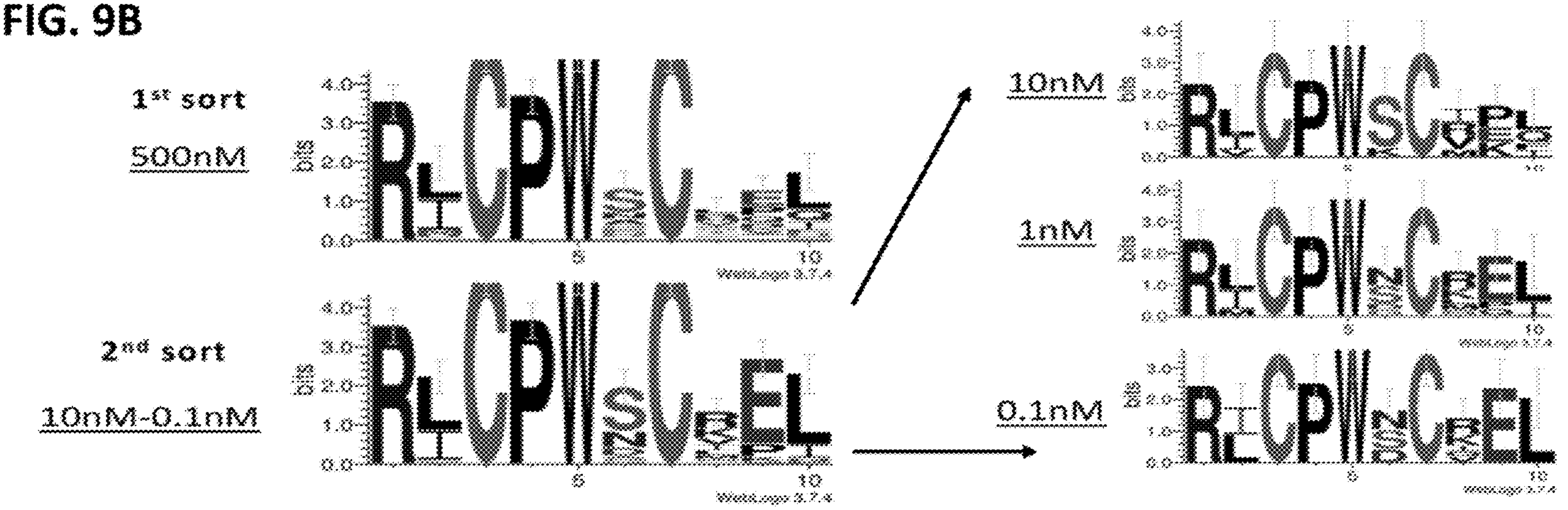
FIG. 9A is a schematic showing selection of consensus sequence $RX_1CPWX_2CX_3X_4X_5$ (SEQ ID NO: 7) based on high and low affinity FMC63-binding mimotopes (SEQ ID NOs: 5 and 6 respectively) for generating a pattern-fixed yeast display library.
FIG. 9B shows the sequence pattern of FMC63-binding mimotopes identified from pattern-fixed library generated by MACS enrichments and two FACS isolations; the first isolation was carried out using 500 nM of biotinylated FMC63 IgG antibody and the second sort was carried out using a concentration of 10 nM, 1 nM, and 0.1 nM.

To further refine the mimotopes and enhance the binding affinity to FMC63, a focused library was generated based on the shared motif between the high and low affinity mimotopes (SEQ ID NOs: 5 and 6 respectively). Specifically, the shared residues were fixed, and additional residues were randomized to generate the "$RX_1CPWX_2CX_3X_4X_5$" (SEQ ID NO: 7) fixed-pattern library with $1.5\times10^8$ diversity (FIG. 9A). As in Example 1, a yeast library was generated using nested PCR and the primers in Table 3. Following library generation, four rounds of MACS enrichment were performed for FMC63 binding. First, cells are enriched using bare beads followed by two sequential sorts with isotype control IgG, followed by a final selection using biotinylated FMC63 IgG. To enhance stringency for high affinity binding the beads were used at a concentration of 0.5 beads/yeast cell for the second and third isolations. After MACS enrichment, FACS was performed with sequential reduction of biotinylated FMC63 concentration during FACS-enrichment, from 500 nM to 0.1 nM. Specifically, the first sort was carried out using 500 nM of biotinylated FMC63 IgG antibody, the second sort was carried out using 10 nM to 0.1 nM of biotinylated FMC63 IgG antibody, including 10 nM, 1 nM, or 0.1 nM of antibody. Each isolation uncovered consensus motifs for binding to FMC63 IgG. Specifically, using 500 nM in the first sort, the consensus sequence R(I,L,M,V,R)CPW(A,E,H,S,D,N)C(L,R,A,M,S,V,I,K)(S,V,Q,I,P,K,E,H)(L,I,R,H,Q,W) (SEQ ID NO: 48) was identified (Table 4).

The consensus sequences identified in the second sort include those shown in Table 5. Using 10 nM of antibody, the consensus sequence, R(L,I,V)CPW(S,K)C(R,I,V,M)(E,K,P)(L,Q,F,I) (SEQ ID NO: 49) was identified; using 1 nM of antibody the consensus sequence R(L,I,M)CPW(S,N,D,G)C(L,M,S,R,K)(E,Q,P)(L,I) (SEQ ID NO: 50) was identified; and using 0.1 nM of antibody identified the consensus sequence, R(L,I)CPW(N,S,D)C(Q,I,V,K,R)EL (SEQ ID NO: 51). This method recovered consensus motifs that are essential for high-affinity binding to FMC63 while identifying mimotopes of varying affinities (FIG. 91B).

TABLE 3

| Primer Sequences to Prepare Yeast Display Pattern-Fixed Library | |
|---|---|
| SEQ ID NO: 1 | Mimotope Library Forward-<br>5'-AACTAGCAAAGGCAGCCCCATAAACAC-3' |
| SEQ ID NO: 8 | hCD19Fixed Lib R:<br>5'-GATTTTGTTACATCTACACTGTTGTTATCAGATCTCGAGCTATTAMNNMNNMNNACAMNNCCACGGACAMNNACGGCTAGCCGACCCTCCGCCTC-3' |
| SEQ ID NO: 3 | Min Cmyc EP Forward-<br>5'-GGCTCTGGTGGAGGCGGTAGCGGAGGCGGAGGGTCGGCTAGC-3' |
| SEQ ID NO: 4 | Min Cmyc EP Reverse-<br>5'-GATTTTGTTACATCTACACTGTTGTTATCAGATCTCGAGCTATTA-3' |

TABLE 4

Mimotope Sequences to FMC63 CAR Selected in First Sort

| SEQ ID NO | Sequence |
|---|---|
| | Sort with 500 nM FMC63 IgG |
| 22 | RICPWACLSL |
| 23 | RLCPWECRVL |
| 24 | RLCPWACRQL |
| 25 | RLCPWHCAII |
| 26 | RLCPWSCMPR |
| 27 | RLCPWDCLIL |
| 9 | RMCPWSCRPH |
| 28 | RICPWNCSKL |
| 29 | RVCPWSCVEQ |
| 30 | RLCPWNCIHW |
| 11 | RRCPWSCKKQ |
| 48 | R(I, L, M, V, R)CPW(A, E, H, S, D, N) C(L, R, A, M, S, V, I, K)(S, V, Q, I, P, K, E, H)(L, I, R, H, Q, W) |

TABLE 5

Mimotope Sequences to FMC63 CAR Selected in Second Sort

| SEQ ID NO | Sequence |
|---|---|
| Sort with 10 nM FMC63 IgG | |
| 31 | RLCPWKCREL |
| 32 | RLCPWSCIKL |
| 33 | RLCPWSCVEQ |
| 34 | RICPWSCRPL |
| 35 | RLCPWSCIPF |
| 14 | RVCPWSCMPI |
| 36 | RICPWSCVKQ |
| 49 | R(L, I, V)CPW(S, K) C(R, I, V, M)(E, K, P) (L, Q, F, I) |
| Sort with 1 nM FMC63 IgG | |
| 37 | RLCPWSCLEI |
| 38 | RICPWSCMEL |
| 39 | RLCPWNCSEL |
| 40 | RLCPWNCRQL |
| 41 | RICPWDCKPI |
| 42 | RMCPWNCREL |
| 16 | RLCPWSCREL |
| 43 | RICPWGCKEL |
| 50 | R(L, I, M)CPW (S, N, D, G)C(L, M, S, R, K)(E, Q, P)(L, I) |
| Sort with 0.1 nM FMC63 IgG | |
| 44 | RLCPWNCQEL |
| 45 | RICPWSCIEL |
| 46 | RICPWSCVEL |
| 18 | RICPWNCKEL |
| 17 | RLCPWNCREL |
| 19 | RLCPWDCREL |
| 21 | RICPWSCREL |
| 47 | RLCPWDCKEL |
| 51 | R(L, I)CPW(N, S, D) C(Q, I, V, K, R)EL |

Example 5: Characterization of High Affinity Binding to FMC63

Figure 10A:
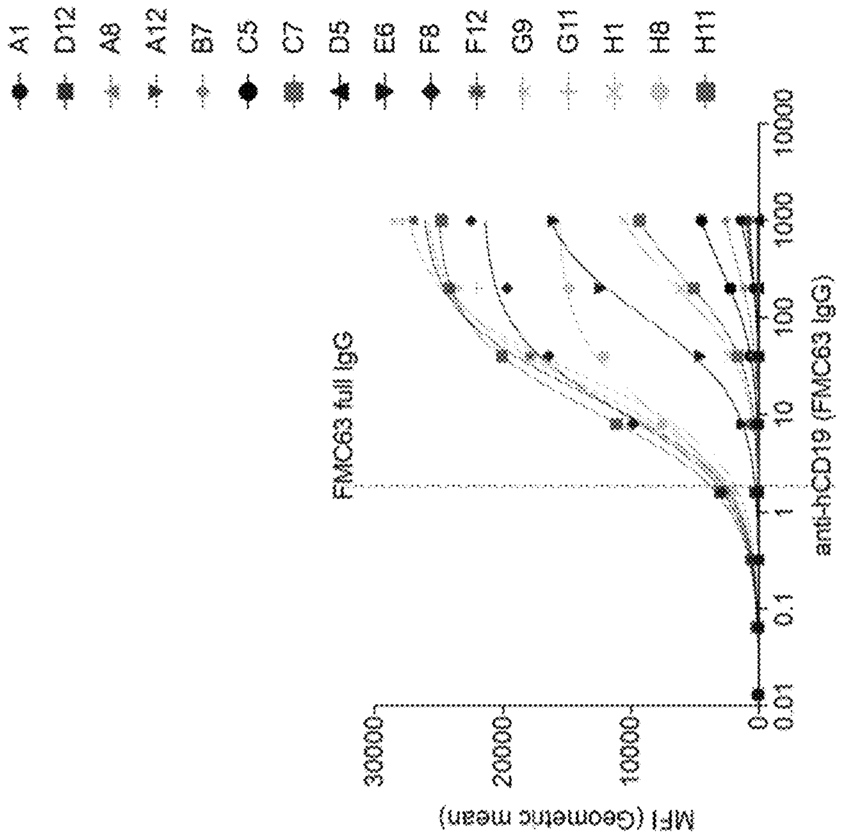
FIGS. 10A & 10B provide graphs showing binding of yeast clones expressing the indicated mimotopes to biotinylated FMC63 IgG (FIG. 10A) or biotinylated FMC63 scFv (FIG. 10B) at increasing concentration (0.01-1000 nM).
Figure 10B:
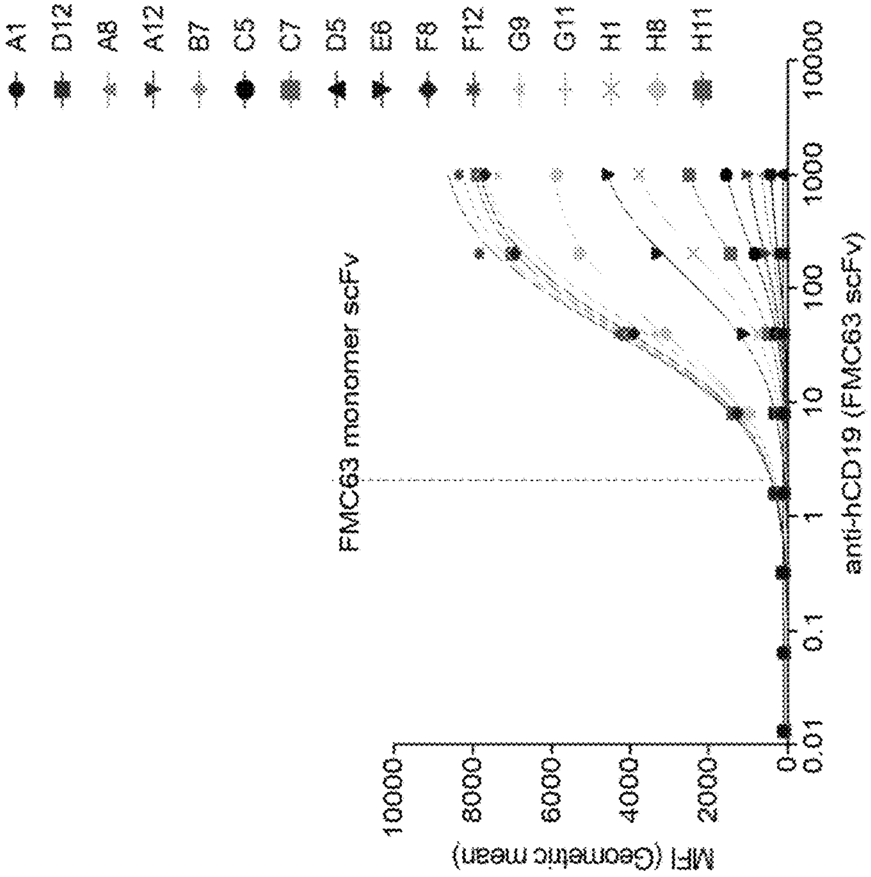

Identifying specific mimotope clones of varying affinities will provide flexibility in treatments. In order to validate specific sequences, clones were isolated and measured for their affinity to FMC63. Specifically, a subset of mimotope clones were selected from the fixed library sequence described in Example 5. Clones were stained with (0.01-1000 nM) biotinylated FMC63 IgG and their Kd was determined using mean fluorescence intensity (MFI) based on FACS staining (FIG. 10A). Given the FDA-approved CAR is an scFV derived from the parental IgG, mimotope binding to FMC63-scFv monomer was tested using biotinylated FMC63 scFV to measure Kd by FACS (FIG. 10B). A similar trend of mimotope binding was observed between FMC63 IgG and scFV (Table 6) with slightly reduced affinity to scFv which was most likely due to reduced valency by switching to monovalent scFv. This screen positively identified mimotope clones with varying affinities to FMC63 which may be used for a tailored vaccine approach.

TABLE 6

Binding Affinity of FMC63 CAR Mimotopes

| Clone | SEQ ID NO | Sequence | FMC63 IgG Kd (nM) | scFv Kd (nM) |
|---|---|---|---|---|
| A1 | 5 | RHCPWNCSLL | >1000 | >1000 |
| D12 | 6 | RICPWSCRAP | >1000 | >1000 |
| A8 | 9 | RMCPWSCRPH | 397 | >1000 |
| B7 | 10 | RICPWSCMVV | 376 | >1000 |
| A12 | 11 | RRCPWSCKKQ | 540 | 240 |
| C5 | 12 | RMCPWSCYEL | 322 | 238 |
| C7 | 13 | RLCPWACQEQ | 252 | 219 |
| H1 | 14 | RVCPWSCMPI | 199 | 178.1 |
| E6 | 15 | RLCPWSCVPI | 102 | 125.9 |
| G9 | 16 | RLCPWSCREL | 25.72 | 50.65 |
| G11 | 17 | RLCPWNCREL | 18.17 | 38.44 |
| F12 | 18 | RICPWNCKEL | 15.64 | 41.95 |
| F8 | 19 | RLCPWDCREL | 10.58 | 41.54 |
| H8 | 20 | RICPWACVEL | 9.5 | 38.92 |
| H11 | 21 | RICPWSCREL | 10.29 | 38.65 |

Figure 11:
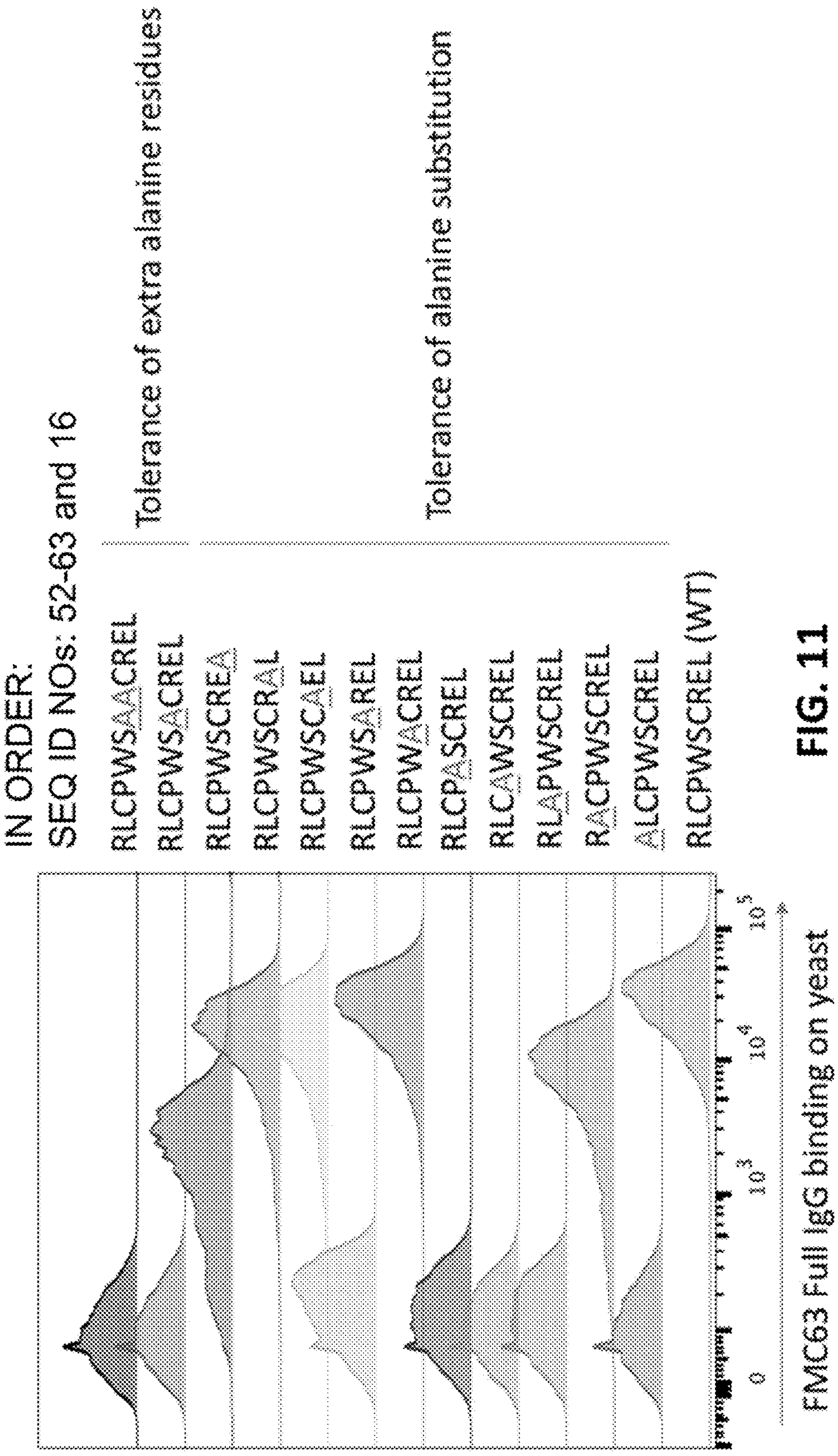
FIG. 11 provides a graph showing flow cytometry analysis of alanine scanning mutagenesis for RLCPWSCREL (SEQ ID NO: 16) where each amino acid position was mutated to an alanine, or additional alanine residues (one or two) were added. Flow cytometry analysis was performed to evaluate binding to the FMC63 IgG antibody.

Example 6: Alanine Scan to Evaluate Individual Amino Acid Positions to FMC63 Binding to the Mimotope To determine the effect of amino acid position on binding to FMC63, an alanine mutagenesis experiment was performed were each amino acid was mutated to alanine and binding to FMC63 was assessed. Specifically, a representative mimotope, RLCPWSCREL (SEQ ID NO: 16), was mutated at each amino acid position to generate an alanine (SEQ ID NOs: 54-63) (Table 7). To assess the tolerance of additional alanine residues, one alanine or two alanine residues were inserted between the two cysteine residues (SEQ ID NOs: 52 and 53) to determine the impact the loop structure had on mimotope binding to FMC63. To generate mutations, two complementary oligos with the codon replaced at the desired site were denatured at 95° C. and annealed by slow cooling to 25° C. (decreasing by 0.5° C./second). The annealed oligos were treated with T4 PNK (T4 Polynucleotide Kinase) to add a terminal phosphate, and then ligated into digested pCT-CON2 vector. Positive clones having the correct oligo inserted were tested and transformed into competent EBY100 yeast cells. Following generation of mutated clones, flow cytometry was performed by staining the yeast with 5 μM FMC63 IgG antibody to measure binding of the mimotope (FIG. 11). The addition of alanine residues between the cysteine sites abolished mimotope binding to FMC63 confirming importance of a short constrained loop structure for binding. Similarly, mutations to alanine at the identified consensus sequence sites ($X_1$, $X_2$, $X_3$, $X_4$, and $X_5$ of $RX_1CPWX_2CX_3X_4X_5$; SEQ ID NO: 7) reduced mimotope binding. This screen identified residue positions that may be important to FMC63 binding.

TABLE 7

Mimotope Variants Evaluated for FMC63 Binding

| SEQ ID NO: | Sequence |
|---|---|
| 52 | RLCPWSAACREL |
| 53 | RLCPWSACREL |
| 54 | RLCPWSCREA |
| 55 | RLCPWSCRAL |
| 56 | RLCPWSCAEL |
| 57 | RLCPWSAREL |
| 58 | RLCPWACREL |
| 59 | RLCPASCREL |
| 60 | RLCAWSCREL |
| 61 | RLAPWSCREL |
| 62 | RACPWSCREL |
| 63 | ALCPWSCREL |
| 16 | RLCPWSCREL |

Example 7: Generation and Characterization of Mouse 1D3 Mimotope Library

To identify mimotopes capable of binding anti-mouse CD19 CAR (clone 1D3 scFv; SEQ ID NO: 79), a similar approach for library generation used to generate mimotopes for FMC63 was used. To identify mimotopes which bind 1D3, the yeast display library generated in Example 1 was screened for binding to clone 1D3. Specifically, a library was generated using nested PCR and the primers in Table 1. Yeast were then subjected to three rounds of magnetic activated cell sorting (MACS) selection using bare beads, control beads coated with isotype control IgG, and a positive enrichment using anti-mCD19 IgG coated beads. Flow cytometry was performed for three rounds of enrichment using 5 μM, 5 μM, and 0.5 μM of biotinylated 1D3 antibody or isotype control (FIG. 12). For each round of enrichment, the top 0.5-1% of yeast were sorted. Following enrichment, isolated clones were subjected to Sanger sequencing. For the high affinity binding isolated clones, 45 out of 48 clones sequenced encoded the mimotope SKLKGKSGPE (SEQ ID NO: 64). For the low affinity isolated clones, 44 out of 48 sequenced encoded the mimotope QNTCHIHVST (SEQ ID NO: 65). To further characterize the mimotope affinity, absolute binding affinity was measured by ELISA. Specifically, three mimotopes were selected for screening (Table 8).

Of the selected sequences, two fusion mimotopes were chemically synthesized. Specifically, two mimotopes were fused to form a 20 amino acid peptide (Table 9). The clones in Table 9 were measured for affinity using ELISA with anti-mCD19 IgG (1D3) (FIG. 13). Mimotopes for 1D3 showed high affinity binding. Fusion mimotopes bound at a higher affinity than that of the 10 amino acid mimotope. The different sequences for the fusion mimotope may bind differently creating an avidity effect. The mimotope library approach and enrichment was able to identify mimotopes which bind anti-mCD19 similar to that of the anti-hCD19 approach.

TABLE 8

Mimotope Sequences to 1D3 CAR Selected from Yeast Display NNK Library

| SEQ ID NO | Clone | Sequence |
|---|---|---|
| 64 | H1 | SKLKGKSGPE |
| 66 | C11 | FHWFINVPPF |
| 67 | E2 | IRVLMSRVFA |

TABLE 9

Mimotope Multimers Evaluated for Binding to 1D3

| SEQ ID NO | Mimotopes | Sequence |
|---|---|---|
| 64 | H1 | SKLKGKSGPE |
| 68 | H1 + C11 | SKLKGKSGPEFHWFINVPPF |
| 69 | H1 + E2 | SKLKGKSGPEIRVLMSRVFA |

Example 8: Flanking Residues Improved Mimotope Binding Affinity to FMC63

It was further evaluated if addition of flanking residues to the terminus of a FMC63-binding mimotope would increase its binding affinity to FMC63, e.g., by increasing the mimotope surface area available for engaging in protein-protein interactions with FMC63. Specifically, the F12 mimotope identified in Example 5 (SEQ ID NO: 18) having 3-17 flanking residues at its N-terminus were evaluated for binding affinity to FMC63 IgG. The F12 mimotope was prepared with three flanking residues that were non-glycine residues ("SAS"), as glycine generally does not reduce the free energy of protein-protein binding interactions. Additional Ser-Gly residues (between 3 and 15 additional residues) were included to further extend the N-terminal flanking region. Sequences of the F12 mimotope having N-terminal flanking residues used to evaluate binding affinity are shown in Table 10.

Figure 14:
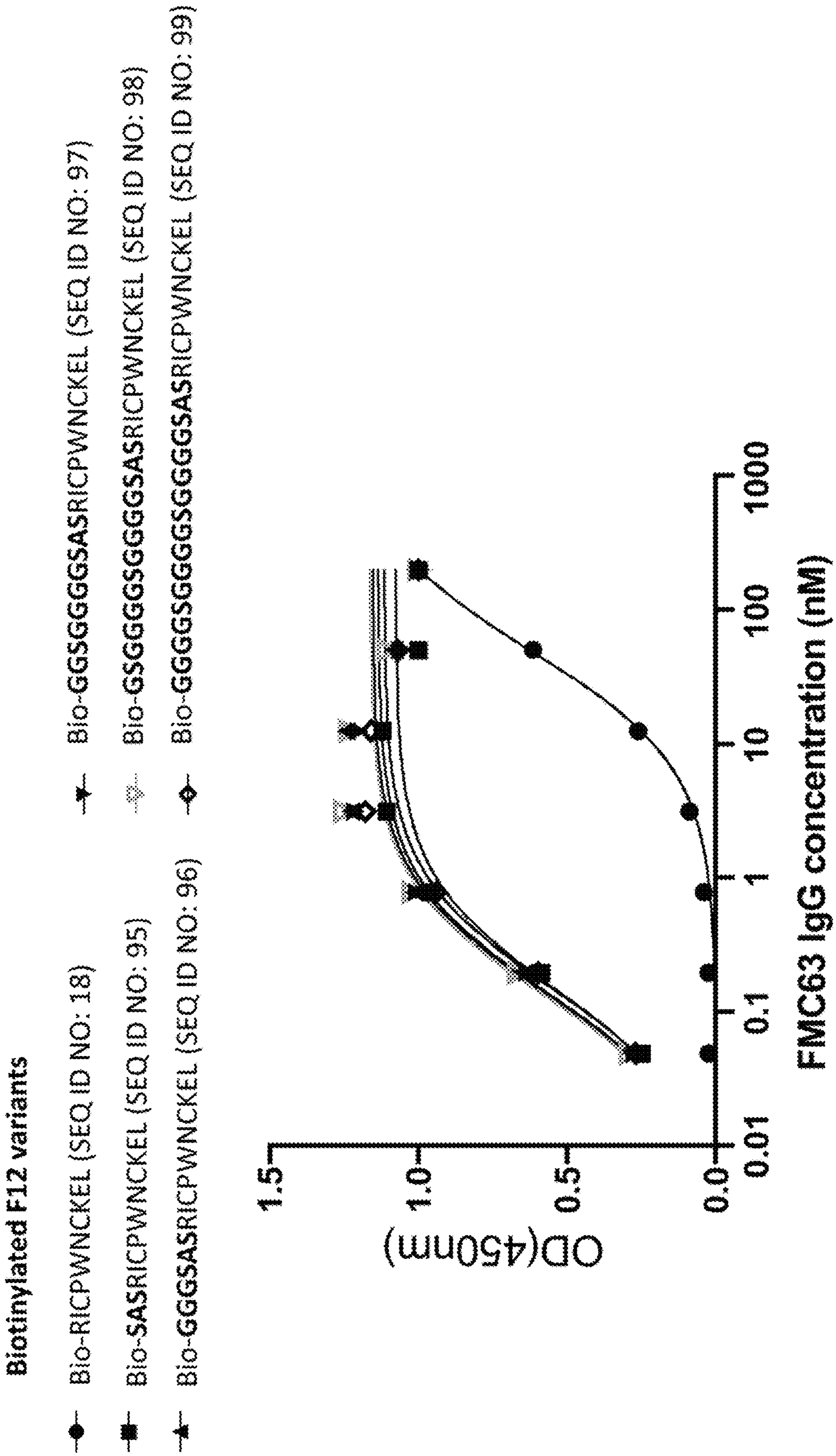
FIG. 14 provides a graph depicting binding of biotinylated ("Bio") mimotopes derived from F12 with N-terminal flanking residues to FMC63 IgG as measured by ELISA. The flanking residues are indicated in bold. Comparison is made to F12 without flanking residues.

To measure binding affinity the extended mimotope sequences were biotinylated on their N-terminus and loaded onto streptavidin coated plate for ELISA assay to determine their binding affinities to FMC63 IgG. As shown in FIG. 14, the addition of three non-glycine residues at the N-terminus of the F12 mimotope substantially improved binding affinity. The addition of Ser-Gly residues to these flanking residues resulted in substantially equivalent binding affinity as having only the three non-glycine residues. The binding affinity measured for the extended mimotope sequences is provided in Table 10.

TABLE 10

FMC63 binding affinity of F12 variants with N-terminal flanking residues

| SEQ ID NO | No. of flanking residues | Sequence | Kd (nM) |
|---|---|---|---|
| 18 | 0 | RICPWNCKEL | 48.49 |
| 95 | 3 | SASRICPWNCKEL | 0.1469 |
| 96 | 6 | GGGSASRICPWNCKEL | 0.1405 |
| 97 | 10 | GGSGGGGSASRICPWNCKEL | 0.1392 |
| 98 | 14 | GSGGGGSGGGGSASRICPWNCKEL | 0.1338 |
| 99 | 17 | GGGGSGGGGSGGGGSASRICPWNCKEL | 0.1533 |

Example 9: Kinetic Screening for Flanking Residues that Improve Mimotope Binding Affinity to FMC63

Having determined the addition of flanking residues improved binding affinity of the F12 mimotope (SEQ ID NO: 18) to FMC63 as described in Example 8, a library was prepared composed of yeast clones expressing the F12 mimotope with N- and/or C-terminal flanking residues. The library was screened to identify extended F12 mimotope sequences with optimal FMC63 binding affinity.

Briefly, a yeast display library was generated using a pCTCON-2 yeast surface display vector according to Example 1. The vector was prepared to encode the following sequence: Aga2p-$(GGGGS)_3$AS-mimotope (SEQ ID NO: 144), wherein the mimotope contained F12 (SEQ ID NO: 18) with N-terminal and/or C-terminal flanking residues:

(i) $X_{10}$-RICPWNCKEL-$X_{10}$ (SEQ ID NO: 145);

(ii) $X_6$-RICPWNCKEL-$X_{10}$ (SEQ ID NO: 146);

(iii) RICPWNCKEL-$X_{10}$ (SEQ ID NO: 147);

(iv) $X_3$RICPWNCKEL-$X_6$ (SEQ ID NO: 148); or (v) RICPWNCKEL-$X_6$ (SEQ ID NO: 149), and wherein "X" was any amino acid residue encoded by an "NNK" codon. The vector DNA mixture was electroporated into competent yeast cells (EBY100). The resulting library had a diversity of about $3\times10^8$.

Following library generation, three rounds of negative selection using magnetic beads was performed. The first round of negative selection depleted the population of non-specific binders using bare beads. The second and third round of negative selection depleted the population of non-specific binders using beads coated with isotype control IgG. The yeast display library was then selected for binders to FMC63. The library was first subjected to a single round of magnetic beads enrichment, as described in Example 1. However, rather than using beads coated with biotinylated FMC63 IgG, a biotinylated monovalent FMC63 scFv was used for coating the beads to limit enrichment to higher affinity binders. The bead-enriched yeast population was expanded, induced, and subjected to flow-based sorting using a kinetic competition approach. For kinetic sorting, the yeast display library is first incubated with biotinylated FMC63 scFV, washed, and then incubated with a large excess of unlabeled bivalent FMC63 scFV-Fc. As the yeast clones had strong starting affinity (i.e., each clone expressing mimotope containing the F12 sequence), the competition allows for elimination of weaker binders or binders with rapid dissociation kinetics, and allowed for isolation of yeast clones with highest binding affinity and/or slow dissociation.

Briefly, a 30× diversity of the bead-enriched population was stained with 10 nM of biotinylated FMC63 scFv for 30 minutes on ice, washed twice, then incubated with unlabeled 200 nM bivalent FMC63 scFv-Fc at room temperature. The yeast population was then stained with streptavidin-PE and HA-BV421 and subjected to FACS enrichment. The 5% of yeast population with the highest degree of binding to labeled FMC63 scFv was collected. The FACS enrichment was repeated for two additional rounds. The yeast population from the final FACS enrichment was subjected to sequencing. The mimotope sequences encoded by isolated clones are SEQ ID NOs: 100-108 shown in Table 11.

Figure 15:
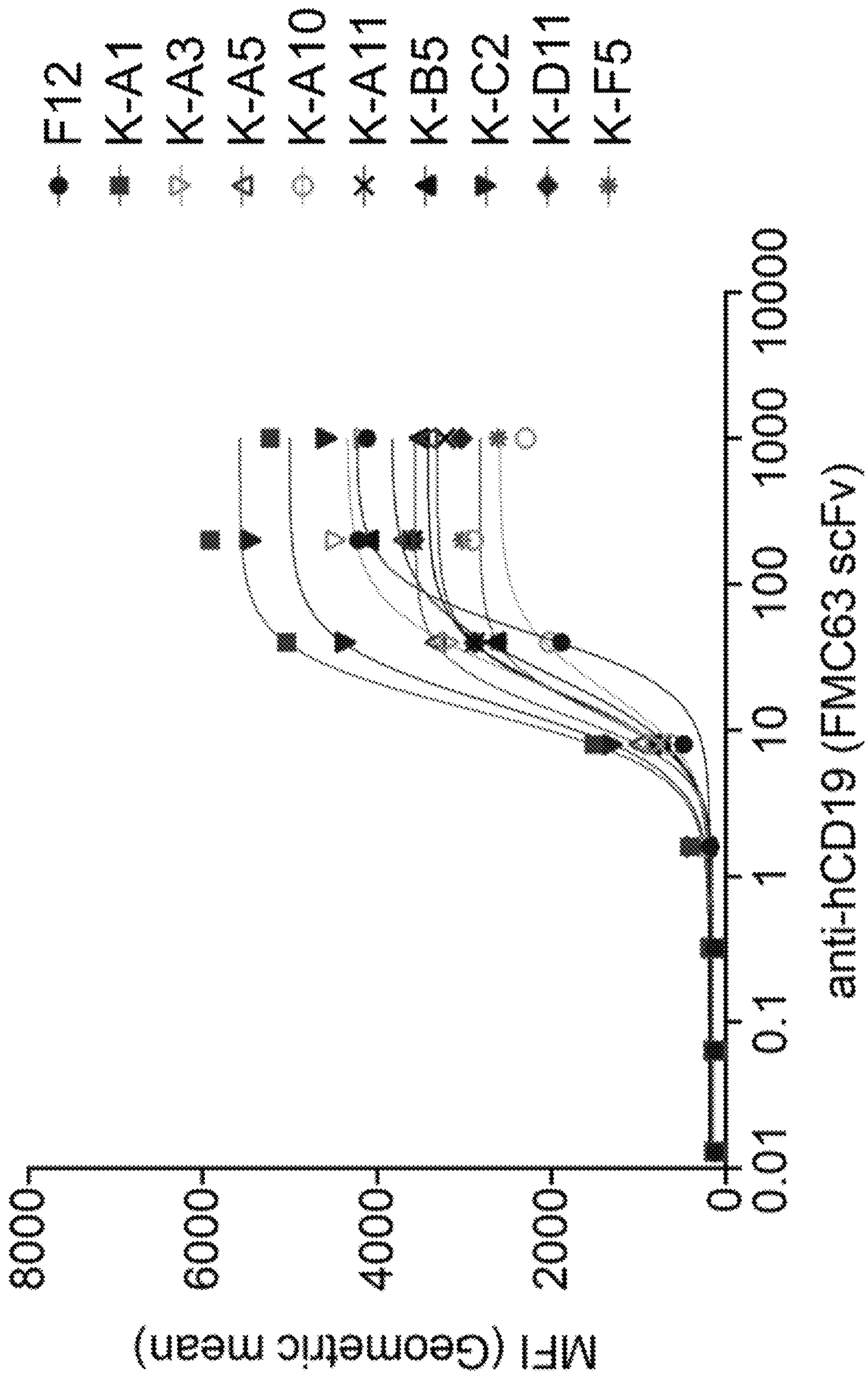
FIG. 15 provides a graph depicting binding of the indicated yeast clones to FMC63 scFv as measured by ELISA. The yeast clones were identified by kinetic sorting of a yeast display library based on the F12 mimotope and express the mimotopes in Table 11. Comparison is made to yeast clone expressing the F12 mimotope.

The binding affinity of the isolated yeast clones to FMC63 was determined. Briefly, the yeast clones were incubated with biotinylated FMC63 scFv followed by streptavidin-PE staining and flow cytometry analysis. The affinity was measured by the median florescence intensity (MFI) as shown in FIG. 15. The binding affinity of each clone was increased relative to the F12 parent mimotope sequence used to develop the library.

Figure 16:
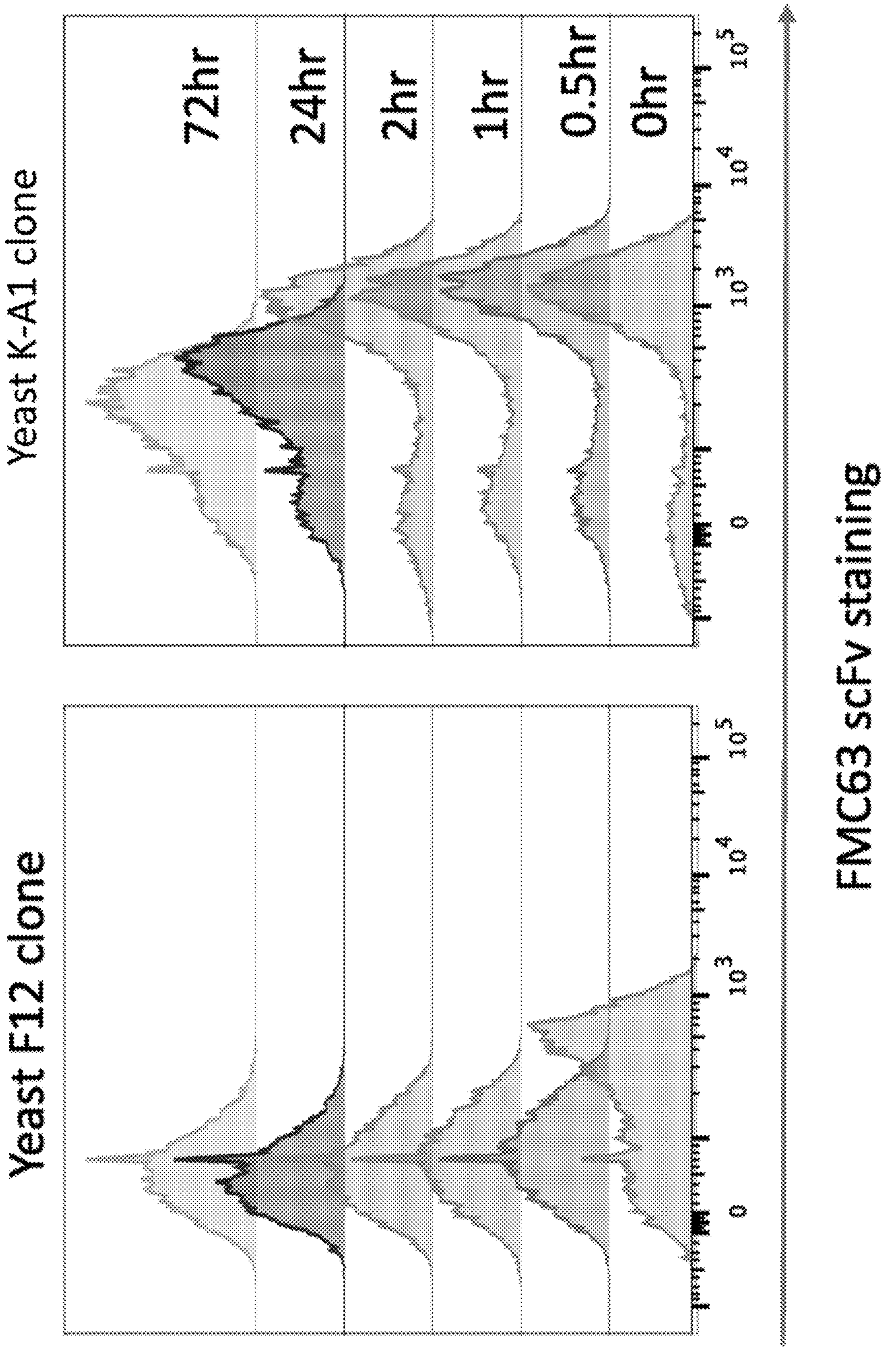
FIG. 16 provides histograms measuring FMC63 scFv bound to yeast clones expressing an F12 mimotope (SEQ ID NO: 18) or an K-A1 mimotope having the sequence of SEQ ID NO: 100 as measured by flow cytometry. The yeast clones were labeled with the scFv, washed, and incubated for 0-72 hours as indicated prior to analysis.

The dissociation kinetics following binding of the mimotopes to FMC63 were also investigated. Briefly, yeast clone expressing F12 (SEQ ID NO: 18) or K-A1 (SEQ ID NO: 100) were incubated with labeled FMC63 scFv. The yeast were then washed, and incubated for 0-72 hours prior to analysis of the degree of FMC63 scFv labeling by flow cytometry. As shown in FIG. 16, yeast clone expressing F12 had lost FMC63 labeling by 0.5 hours. However, the yeast clone expressing K-A1 retained FMC63 even up to 72 hours, indicating slower dissociation kinetics compared to F12.

Together, these results indicate the kinetic sorting of the yeast display library encoding F12 with N-terminal and/or C-terminal flanking residues provided mimotope variants with higher binding affinity for FMC63 and slower dissociation rates.

TABLE 11

Binding affinity of identified F12 variants for FMC63 scFv

| SEQ ID NO | Clone Name | No. of N-terminal flanking residues | No. of C-terminal flanking residues | Sequence | Kd (nM) |
|---|---|---|---|---|---|
| 18 | F12 | 0 | 0 | RICPWNCKEL | 45.48 |
| 100 | K-A1 | 6 | 10 | PRKHSGRICPWNCKELDNPPFIFGNR | 13.69 |
| 101 | K-A3 | 0 | 9 | RICPWNCKELPTPYMMFDM | 22.1 |

TABLE 11-continued

| Binding affinity of identified F12 variants for FMC63 scFv | | | | | |
|---|---|---|---|---|---|
| SEQ ID NO | Clone Name | No. of N-terminal flanking residues | No. of C-terminal flanking residues | Sequence | Kd (nM) |
| 102 | K-A5 | 3 | 6 | PLSRICPWNCKELYWLPQR | 12.84 |
| 103 | K-A10 | 10 | 10 | AKRRERDYVGRICPWNCKELHPDTRHRIPV | 18.71 |
| 104 | K-A11 | 0 | 6 | RICPWNCKELYWLPDE | 16.81 |
| 105 | K-B5 | 3 | 6 | PPPRICPWNCKELPLDWPW | 23.81 |
| 106 | K-C2 | 0 | 10 | RICPWNCKELPSPPRIFGNR | 14.75 |
| 107 | K-D11 | 3 | 6 | AGTRICPWNCKELYWLPDE | 15.95 |
| 108 | K-F5 | 3 | 6 | QFQRICPWNCKELYWLPDQ | 13.2 |

Example 10: Design of Bivalent Amph-Mimotopes and Evaluation for Boosting CAR T Cell Proliferation In Vivo Bivalent formats of the amph-mimotopes described in Example 3 were investigated. As depicted in FIG. 17A, CAR molecules on the CAR T cell surface are generally present in dimeric form (see, e.g., Lindner, et al (2020) *Science Advances* 6:eaaz3223). This allows CAR T cells to respond to target cells even when the CAR binds to the target antigen with a low affinity (e.g., micromolar). Without wishing to be bound by theory, it was thought that an amph-mimotope displaying two copies of the mimotope would have improved binding affinity to the dimerized CAR through an avidity effect.

Briefly, a bivalent amph-mimotope was constructed to have a DSPE lipid tail connected via a lysine residue to two PEG linkers, each attached to the terminus of a mimotope as shown in FIG. 17B. The DSPE head group was attached to the lysine amino acid via its carboxyl group, and the α-amine and ε-amine of the lysine were each attached to one of the PEG linkers. As shown in FIG. 17C, the PEG linker contained either 4 or 8 ethylene glycol units (i.e., PEG4 or PEG8). The PEG was appended to the N-terminus of the mimotope of SEQ ID NO: 96.

It was evaluated whether amph-mimotope vaccines would induce proliferation of CAR T cells in vivo. The amph-mimotope constructs evaluated included:

(i) monovalent amph-mimotope referred to as “Amph-K-A1” which contained the mimotope sequence GGGSASPRKHSGRICPWNCKELDNPPFIFGNR (SEQ ID NO: 128); and (ii) monovalent amph-mimotope referred to as “Amph-K-C2” contained the mimotope sequence GGGSAS-RICPWNCKELPSPPRIFGNR (SEQ ID NO: 129).

The mimotope sequence of Amph-K-A1 corresponds to K-A1 identified in Table 11 (SEQ ID NO: 100) with flanking residues at the N-terminus having the sequence GGGSAS (SEQ ID NO: 109). The mimotope sequence of Amph-K-C2 corresponds to K-C2 identified in Table 11 (SEQ ID NO: 106) with the N-terminal flanking residues of SEQ ID NO: 109.

The monovalent amph-mimotopes Amph-K-A1 and Amph-K-C2 were constructed as described in Example 3 by conjugating the mimotope sequence to DSPE-PEG2k. Additionally, the bivalent mimotopes as described above and shown in FIG. 17C were also investigated.

Figure 18A:
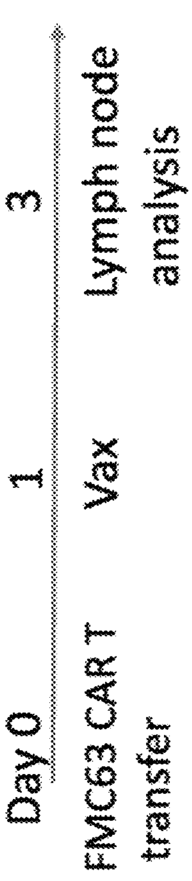
FIG. 18A depicts a timeline for administration of CD45.1+ donor FMC63 CAR T cells to CD45.2+ recipient mice on Day 0, followed by administration of amph-mimotope or bivalent amph-mimotope on Day 1, and analysis of CAR T cell proliferation in lymph nodes harvested on Day 3 measured by cell trace violet dilution.

The experimental timeline is shown in FIG. 18A. $CD45.1^+$ donor FMC63 CAR T cells were prepared as described in Example 3 and labeled with cell trace violet according to manufacturer's protocol. $2\times10^6$ CAR T cells were administered into $CD45.2^+$ recipient mice via tail vein injection on Day 0. The following day, recipient mice were vaccinated by subcutaneous injection at the tail base with the following vaccine formulation:

(i) 10 ug of monovalent amph-mimotope (Amph-K-A1 or Amph-K-C2)+25 μg of cyclic-di-GMP in 1×PBS; or (ii) 20 ug of amph-Bi-F12-mimotope (PEG4 or PEG8)+25 μg of cyclic-di-GMP in 1×PBS.

Figure 18B:
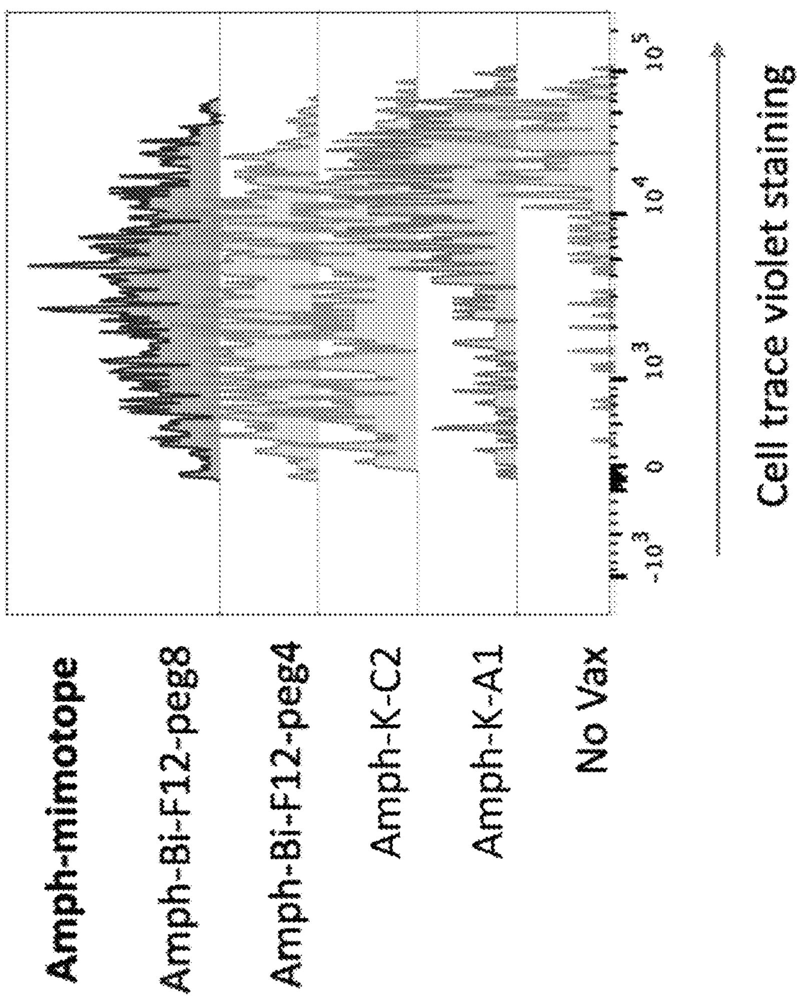
FIG. 18B provides histograms measuring the proliferation of FMC63 CAR T cells isolated from mice on Day 3 as depicted in FIG. 18A. The mice were administered amph-mimotope containing a mimotope with the sequence set forth in SEQ ID NO: 128 or 129 (Amph-K-A1 or Amph-K-C2 respectively) or the bivalent mimotopes depicted in FIG. 17C (amph-bi-F12-peg8 or amph-bi-F12-peg4). Control mice were administered no amph-mimotope.

The volume of the formulation was 100 μL total, and the mice were administered 50 μL per each site of the tail base. Control mice received no vaccination. At 48 hours post-vaccination, recipient mice were euthanized and inguinal LNs were isolated for FACS analysis of CAR T proliferation. As shown in FIG. 18B, proliferation of CAR T cells in vivo as measured by cell violet dilution was observed for both bivalent constructs, as well as the Amph-K-C2 monovalent construct containing the K-C2 mimotope.

Figure 19A:
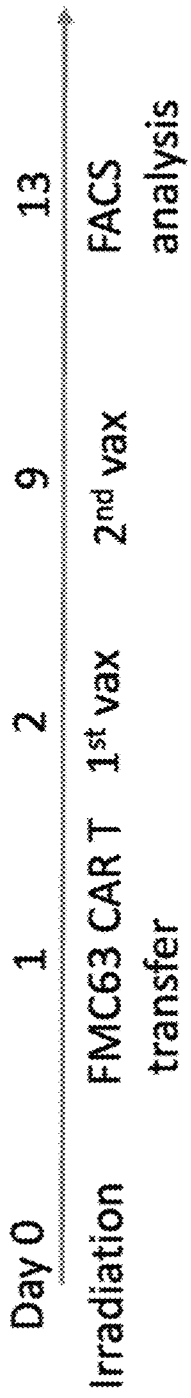
FIG. 19A depicts a timeline for administration of CD45.1+ donor FMC63 CAR T cells to CD45.2+ recipient mice on Day 1 following lymphodepletion on day 0. The mice were further administered a first dose of amph-mimotope or bivalent amph-mimotope on Day 2 and a second dose on Day 9. Peripheral blood was obtained from the mice on Day 13 and expansion of CD45.1+ CAR T cells were quantified by flow cytometry.

A direct comparison was made in a long-term in vivo boosting study between Amph-K-C2 and and bivalent constructs containing two copies of the F12 mimotope prepared as described above (having a PEG4 or PEG8 linker). The experimental timeline is shown in FIG. 19A. Briefly, $CD45.2^+$ recipient mice received lymphodepeletion preconditioning (sublethal irradiation, 500cGy) on day 0. The mice were then administered $1\times10^6$ $CD45.1^+$ donor FMC63 CAR T cells on day 1, followed by two vaccinations on day 2 and day 9 using the following formulation:

(i) 10 ug of monovalent amph-mimotope (Amph-K-C2)+25 μg of cyclic-di-GMP in 1×PBS; or (ii) 20 ug of amph-Bi-F12-mimotope (PEG4 or PEG8)+25 μg of cyclic-di-GMP in 1×PBS.

Figure 19B:
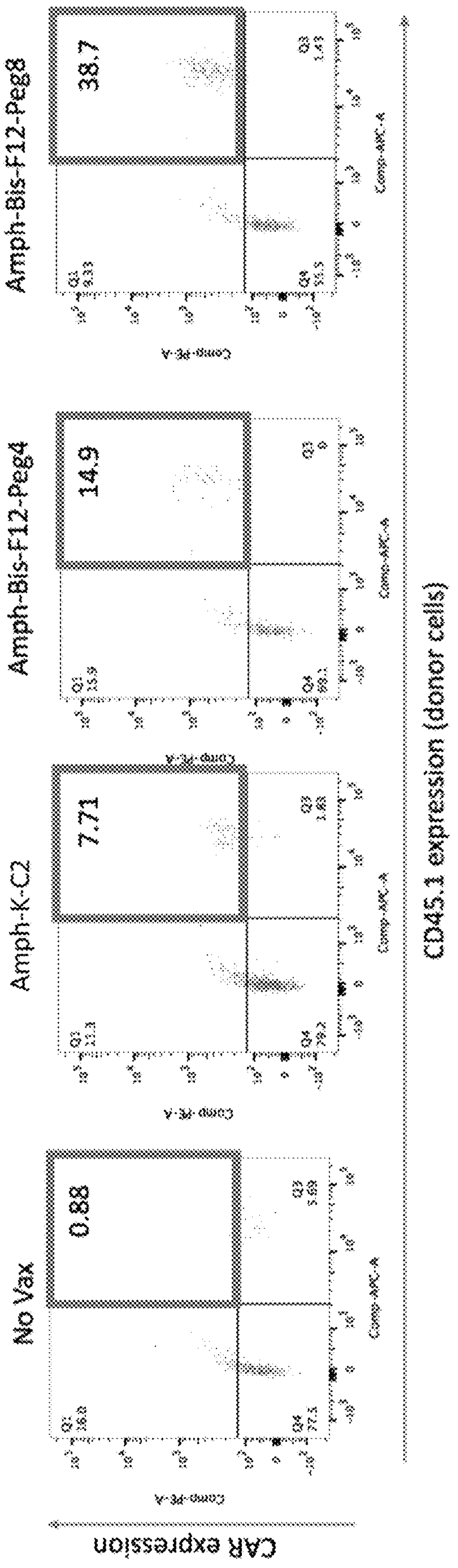
FIG. 19B provides plots measuring the percentage of total T cells expressing CD45.1 and FMC63 CAR in peripheral blood isolated on day 13 from mice treated according to FIG. 19A. The treatment groups were administered Amph-K-C2 (monovalent amph-mimotope containing SEQ ID NO: 129) or the bivalent mimotopes depicted in FIG. 17C (amph-bi-F12-peg8 or amph-bi-F12-peg4). Control mice received no vaccination.

Control mice received no vaccination. On day 13, peripheral blood was collected for analysis of CAR T expansion in response to amph-mimotope vaccine boosting by flow cytometry. CAR T cells were defined as $CD45.1^+CAR^+$ cells and were quantified as proportion of total CD8+ T cells. As shown in FIG. 19B, each of the amph-mimotope constructs provided for expansion of CAR T cell in vivo compared to control mice, with bivalent amph-mimotope having a PEG8 linker resulting in the highest level of proliferation.

EQUIVALENTS

Those skilled in the art will recognize or be able to ascertain, using no more than routine experimentation, many equivalents of the specific embodiments described herein described herein. Such equivalents are intended to be encompassed by the following claims.

SEQUENCE LISTING

| Name/ Identifier | Sequence | SEQ ID NO |
|---|---|---|
| Primer-mimotope library forward | AACTAGCAAAGGCAGCCCCATAAACAC | 1 |
| Primer-mimotope library reverse | GATTTTGTTACATCTACACTGTTGTTATCAGATCTCGAGCTAT TAMNNMNNMNNMNNMNNMNNMNNMNNMNNMNNGCTAGCCGACC CTCCGCC | 2 |
| Primer-Min Cmyc EP forward | GGCTCTGGTGGAGGCGGTAGCGGAGGCGGAGGGTCGGCTAGC | 3 |
| Primer-Min Cmyc EP reverse | GATTTTGTTACATCTACACTGTTGTTATCAGATCTCGAGCTAT TA | 4 |
| FMC63 Mimotope (A1) | RHCPWNCSLL | 5 |
| FMC63 Mimotope (D12) | RICPWSCRAP | 6 |
| FMC63 Mimotope Consensus | $RX_1CPWX_2CX_3X_4X_5$ | 7 |
| Primer-hCD19 Fixed Library Reverse | GATTTTGTTACATCTACACTGTTGTTATCAGATCTCGAGCTAT TAMNNMNNMNNACAMNNCCACGGACAMNNACGGCTAGCCGACC CTCCGCCTC | 8 |
| FMC63 Mimotope(A8) | R126MCPWSCRPH | 9 |
| FMC63 Mimotope(B7) | RICPWSCMVV | 10 |
| FMC63 Mimotope(A12) | RRCPWSCKKQ | 11 |
| FMC63 Mimotope(C5) | RMCPWSCYEL | 12 |
| FMC63 Mimotope(C7) | RLCPWACQEQ | 13 |
| FMC63 Mimotope(H1) | RVCPWSCMPI | 14 |
| FMC63 Mimotope(E6) | RLCPWSCVPI | 15 |
| FMC63 Mimotope(G9) | RLCPWSCREL | 16 |
| FMC63 Mimotope(G11) | RLCPWNCREL | 17 |
| FMC63 Mimotope(F12) | RICPWNCKEL | 18 |
| FMC63 Mimotope(F8) | RLCPWDCREL | 19 |
| FMC63 Mimotope(H8) | RICPWACVEL | 20 |
| FMC63 Mimotope(H11) | RICPWSCREL | 21 |
| FMC63 Mimotope | RICPWACLSL | 22 |

-continued

SEQUENCE LISTING

| Name/ Identifier | Sequence | SEQ ID NO |
|---|---|---|
| FMC63 Mimotope | RLCPWECRVL | 23 |
| FMC63 Mimotope | RLCPWACRQL | 24 |
| FMC63 Mimotope | RLCPWHCAII | 25 |
| FMC63 Mimotope | RLCPWSCMPR | 26 |
| FMC63 Mimotope | RLCPWDCLIL | 27 |
| FMC63 Mimotope | RICPWNCSKL | 28 |
| FMC63 Mimotope | RVCPWSCVEQ | 29 |
| FMC63 Mimotope | RLCPWNCIHW | 30 |
| FMC63 Mimotope | RLCPWKCREL | 31 |
| FMC63 Mimotope | RLCPWSCIKL | 32 |
| FMC63 Mimotope | RLCPWSCVEQ | 33 |
| FMC63 Mimotope | RICPWSCRPL | 34 |
| FMC63 Mimotope | RLCPWSCIPF | 35 |
| FMC63 Mimotope | RICPWSCVKQ | 36 |
| FMC63 Mimotope | RLCPWSCLEI | 37 |
| FMC63 Mimotope | RICPWSCMEL | 38 |
| FMC63 Mimotope | RLCPWNCSEL | 39 |
| FMC63 Mimotope | RLCPWNCRQL | 40 |
| FMC63 Mimotope | RICPWDCKPI | 41 |
| FMC63 Mimotope | RMCPWNCREL | 42 |
| FMC63 Mimotope | RICPWGCKEL | 43 |
| FMC63 Mimotope | RLCPWNCQEL | 44 |
| FMC63 Mimotope | RICPWSCIEL | 45 |
| FMC63 Mimotope | RICPWSCVEL | 46 |
| FMC63 Mimotope | RLCPWDCKEL | 47 |
| FMC63 Mimotope Consensus | R(I, L, M, V, R)CPW(A, E, H, S, D, N)C(L, R, A, M, S, V, I, K)(S, V, Q, I, P, K, E, H)(L, I, R, H, Q, W) | 48 |
| FMC63 Mimotope Consensus | R(L, I, V)CPW(S, K)C(R, I, V, M)(E, K, P)(L, Q, F, I) | 49 |
| FMC63 Mimotope Consensus | R(L, I, M)CPW(S, N, D, G)C(L, M, S, R, K)(E, Q, P)(L, I) | 50 |
| FMC63 Mimotope Consensus | R(L, I)CPW(N, S, D)C(Q, I, V, K, R)EL | 51 |
| FMC63 Mimotope Mutant | RLCPWS**AA**CREL | 52 |
| FMC63 Mimotope Mutant | RLCPWS**A**CREL | 53 |
| FMC63 Mimotope Mutant | RLCPWSCRE**A** | 54 |

-continued

| SEQUENCE LISTING | | |
|---|---|---|
| Name/ Identifier | Sequence | SEQ ID NO |
| FMC63 Mimotope Mutant | RLCPWSCR**A**L | 55 |
| FMC63 Mimotope Mutant | RLCPWSC**A**EL | 56 |
| FMC63 Mimotope Mutant | RLCPWS**A**REL | 57 |
| FMC63 Mimotope Mutant | RLCPW**A**CREL | 58 |
| FMC63 Mimotope Mutant | RLCP**A**SCREL | 59 |
| FMC63 Mimotope Mutant | RLC**A**WSCREL | 60 |
| FMC63 Mimotope Mutant | RL**A**PWSCREL | 61 |
| FMC63 Mimotope Mutant | R**A**CPWSCREL | 62 |
| FMC63 Mimotope Mutant | **A**LCPWSCREL | 63 |
| ID3 Mimotope | SKLKGKSGPE | 64 |
| ID3 Mimotope | QNTCHIHVST | 65 |
| ID3 Mimotope | FHWFINVPPF | 66 |
| ID3 Mimotope | IRVLMSRVFA | 67 |
| ID3 Mimotope Multimer | SKLKGKSGPEFHWFINVPPF | 68 |
| ID3 Mimotope Multimer | SKLKGKSGPEIRVLMSRVFA | 69 |
| FMC63 scFv | DIQMTQTTSSLSASLGDRVTISCRASQDISKYLNWYQQKPDGT VKLLIYHTSRLHSGVPSRFSGSGSGTDYSLTISNLEQEDIATY FCQQGNTLPYTFGGGTKLEITGGGGSGGGGSGGGGSEVKLQES GPGLVAPSQSLSVTCTVSGVSLPDYGVSWIRQPPRKGLEWLGV IWGSETTYYNSALKSRLTIIKDNSKSQVFLKMNSLQTDDTAIY YCAKHYYYGGSYAMDYWGQGTSVTVSS | 70 |
| FMC63 VH | DIQMTQTTSSLSASLGDRVTISCRASQDISKYLNWYQQKPDGT VKLLIYHTSRLHSGVPSRFSGSGSGTDYSLTISNLEQEDIATY FCQQGNTLPYTFGGGTKLEIT | 71 |
| FMC63 VL | EVKLQESGPGLVAPSQSLSVTCTVSGVSLPDYGVSWIRQPPRK GLEWLGVIWGSETTYYNSALKSRLTIIKDNSKSQVFLKMNSLQ TDDTAIYYCAKHYYYGGSYAMDYWGQGTSVTVSS | 72 |
| FMC63 scFv linker | GGGGSGGGGSGGGGS | 73 |
| Mouse CD8 hinge | TTTKPVLRTPSPVHPTGTSQPQRPEDCRPRGSVKGTGLDFACD | 74 |
| Mouse CD8 transmembrane | IYIWAPLAGICVALLLSLIITLI | 75 |
| Mouse CD28 costimulatory domain | IYIWAPLAGICVALLLSLIITLINSRRNRLLQSDYMNMTPRRP GLTRKPYQPYAPARDFAAYRP | 76 |
| Mouse CD3ζ intracellular domain | RAKFSRSAETAANLQDPNQLYNELNLGRREEYDVLEKKRARDP EMGGKQQRRRNPQEGVYNALQKDKMAEAYSEIGTKGERRRGKG HDGLYQGLSTATKDTYDALHMQTLAPR | 77 |

-continued

SEQUENCE LISTING

| Name/ Identifier | Sequence | SEQ ID NO |
|---|---|---|
| FMC63 hybrid CAR | MALPVTALLLPLALLLHAARPEQKLISEEDLDIQMTQTTSSLS ASLGDRVTISCRASQDISKYLNWYQQKPDGTVKLLIYHTSRLH SGVPSRFSGSGSGTDYSLTISNLEQEDIATYFCQQGNTLPYTF GGGTKLEITGGGGSGGGGSGGGGSEVKLQESGPGLVAPSQSLS VTCTVSGVSLPDYGVSWIRQPPRKGLEWLGVIWGSETTYYNSA LKSRLTIIKDNSKSQVFLKMNSLQTDDTAIYYCAKHYYYGGSY AMDYWGQGTSVTVSSTTTKPVLRTPSPVHPTGTSQPQRPEDCR PRGSVKGTGLDFACDIYIWAPLAGICVALLLSLIITLINSRRN RLLQSDYMNMTPRRPGLTRKPYQPYAPARDFAAYRPRAKFSRS AETAANLQDPNQLYNELNLGRREEYDVLEKKRARDPEMGGKQQ RRRNPQEGVYNALQKDKMAEAYSEIGTKGERRRGKGHDGLYQG LSTATKDTYDALHMQTLAPR | 78 |
| 1D3 scFv | DIQMTQSPASLSTSLGETVTIQCQASEDIYSGLAWYQQKPGKS PQLLIYGASDLQDGVPSRFSGSGSGTQYSLKITSMQTEDEGVY FCQQGLTYPRTFGGGTKLELKGGGGSGGGGSGGGGSEVQLQQS GAELVRPGTSVKLSCKVSGDTITFYYMHFVKQRPGQGLEWIGR IDPEDESTKYSEKFKNKATLTADTSSNTAYLKLSSLTSEDTAT YFCIYGGYYFDYWGQGVMVTVSS | 79 |
| 1D3 VH | DIQMTQSPASLSTSLGETVTIQCQASEDIYSGLAWYQQKPGKS PQLLIYGASDLQDGVPSRFSGSGSGTQYSLKITSMQTEDEGVY FCQQGLTYPRTFGGGTKLELK | 80 |
| 1D3 VL | GGGGSGGGGSGGGGS | 81 |
| 1D3 linker | EVQLQQSGAELVRPGTSVKLSCKVSGDTITFYYMHFVKQRPGQ GLEWIGRIDPEDESTKYSEKFKNKATLTADTSSNTAYLKLSSL TSEDTATYFCIYGGYYFDYWGQGVMVTVSS | 82 |
| (Aga2p)-(HA)-(Gly4Ser)3-(NNK)10 (aa) | MQLLRCFSIFSVIASVLAQELTTICEQIPSPTLESTPYSLSTT TILANGKAMQGVFEYYKSVTFVSNCGSHPSTTSKGSPINTQYV FKDNSSTIEGRYPYDVPDYALQASGGGGSGGGGSGGGGSASNN NNNNNNNN | 83 |
| (Aga2p)-(HA)-(Gly4Ser)3-(NNK)10 (DNA) | ATGCAGTTACTTCGCTGTTTTTCAATATTTTCTGTTATTGCTT CAGTTTTAGCACAGGAACTGACAACTATATGCGAGCAAATCCC CTCACCAACTTTAGAATCGACGCCGTACTCTTTGTCAACGACT ACTATTTTGGCCAACGGGAAGGCAATGCAAGGAGTTTTTGAAT ATTACAAATCAGTAACGTTTGTCAGTAATTGCGGTTCTCACCC CTCAACAACTAGCAAAGGCAGCCCCATAAACACACAGTATGTT TTTAAGGACAATAGCTCGACGATTGAAGGTAGATACCCATACG ACGTTCCAGACTACGCTCTGCAGGCTAGTGGTGGAGGAGGCTC TGGTGGAGGCGGTAGCGGAGGCGGAGGGTCGGCTAGCNNKNNK NNKNNKNNKNNKNNKNNKNNKNNK | 84 |
| (Aga2p)-(HA)-(Gly4Ser)3-(RXCPWXCXXX)10 (aa) | MQLLRCFSIFSVIASVLAQELTTICEQIPSPTLESTPYSLSTT TILANGKAMQGVFEYYKSVTFVSNCGSHPSTTSKGSPINTQYV FKDNSSTIEGRYPYDVPDYALQASGGGGSGGGGSGGGGSASRX CPWXCXXX | 85 |
| for (Aga2p)-(HA)-(Gly4Ser)3-(RXCPWXCXXX)10 (dna) | ATGCAGTTACTTCGCTGTTTTTCAATATTTTCTGTTATTGCTT CAGTTTTAGCACAGGAACTGACAACTATATGCGAGCAAATCCC CTCACCAACTTTAGAATCGACGCCGTACTCTTTGTCAACGACT ACTATTTTGGCCAACGGGAAGGCAATGCAAGGAGTTTTTGAAT ATTACAAATCAGTAACGTTTGTCAGTAATTGCGGTTCTCACCC CTCAACAACTAGCAAAGGCAGCCCCATAAACACACAGTATGTT TTTAAGGACAATAGCTCGACGATTGAAGGTAGATACCCATACG ACGTTCCAGACTACGCTCTGCAGGCTAGTGGTGGAGGAGGCTC TGGTGGAGGCGGTAGCGGAGGCGGAGGGTCGGCTAGCCGTNNK TGTCCGTGGNNKTGTNNKNNKNNK | 86 |
| Human CD8 Signal peptide | MALPVTALLLPLALLLHAARP | 87 |
| FMC63 VH nucleotide | GACATCCAGATGACACAGACTACATCCTCCCTGTCTGCCTCTC TGGGAGACAGAGTCACCATCAGTTGCAGGGCAAGTCAGGACAT TTCCAAGTATCTTAATTGGTATCAGCAGAAACCAGATGGAACT GTTAAACTCCTGATCTACCATACATCAAGATTACACTCAGGAG TCCCATCAAGGTTCAGTGGCAGTGGGTCTGGAACAGATTATTC TCTCACCATTAGCAACCTGGAGCAAGAAGATATTGCCACTTAC TTTTGCCAACAGGGTAATACGCTTCCGTACACGTTCGGAGGGG GGACCAAGCTGGAGATCACA | 88 |

-continued

SEQUENCE LISTING

| Name/ Identifier | Sequence | SEQ ID NO |
|---|---|---|
| FMC63 VL nucleotide | GAGGTGAAACTGCAGGAGTCAGGACCTGGCCTGGTGGCGCCCTCACAGAGCCTGTCCGTCACATGCACTGTCTCAGGGGTCTCATTACCCGACTATGGTGTAAGCTGGATTCGCCAGCCTCCACGAAAGGGTCTGGAGTGGCTGGGAGTAATATGGGGTAGTGAAACCACATACTATAATTCAGCTCTCAAATCCAGACTGACCATCATCAAGGACAACTCCAAGAGCCAAGTTTTCTTAAAAATGAACAGTCTGCAAACTGATGACACAGCCATTTACTACTGTGCCAAACATTATTACTACGGTGGTAGCTATGCTATGGACTACTGGGGCCAAGGAACCTCAGTCACCGTCTCCTCA | 89 |
| Human CD8 signal peptide nucleotide | ACTACTACCAAGCCAGTGCTGCGAACTCCCTCACCTGTGCACCCTACCGGGACATCTCAGCCCCAGAGACCAGAAGATTGTCGGCCCCGTGGCTCAGTGAAGGGGACCGGATTGGACTTCGCCTGTGAT | 90 |
| Mouse CD8 hinge nucleotide | ATTTACATCTGGGCACCCTTGGCCGGAATCTGCGTGGCCCTTCTGCTGTCCTTGATCATCACTCTCATC | 91 |
| Mouse CD8 transmembrane domain nucleotide | AATAGTAGAAGGAACAGACTCCTTCAAAGTGACTACATGAACATGACTCCCCGGAGGCCTGGGCTCACTCGAAAGCCTTACCAGCCCTACGCCCCTGCCAGAGACTTTGCAGCGTACCGCCCC | 92 |
| Mouse CD3zeta signaling domain nucleotide | AGAGCAAAATTCAGCAGGAGTGCAGAGACTGCTGCCAACCTGCAGGACCCCAACCAGCTCTACAATGAGCTCAATCTAGGGCGAAGAGAGGAATATGACGTCTTGGAGAAGAAGCGGGCTCGGGACCCAGAGATGGGAGGCAAACAGCAGAGGAGGAGGAACCCCCAGGAAGGCGTATACAATGCACTGCAGAAAGACAAGATGGCAGAAGCCTACAGTGAGATCGGCACAAAAGGCGAGAGGCGGAGAGGCAAGGGGCACGATGGCCTTTACCAGGGTCTCAGCACTGCCACCAAGGACACCTATGATGCCCTGCATATGCAGACCCTGGCCCCTCGC | 93 |
| FMC63 linker nucleotide | GGTGGCGGTGGCTCGGGCGGTGGTGGGTCGGGTGGCGGCGGATCT | 94 |
| F12 derivative | SASRICPWNCKEL | 95 |
| F12 derivative | GGGSASRICPWNCKEL | 96 |
| F12 derivative | GGSGGGGSASRICPWNCKEL | 97 |
| F12 derivative | GSGGGGSGGGGSASRICPWNCKEL | 98 |
| F12 derivative | GGGGSGGGGSGGGGSASRICPWNCKEL | 99 |
| FMC63 mimotope (A1) | PRKHSGRICPWNCKELDNPPFIFGNR | 100 |
| FMC63 mimotope (A3) | RICPWNCKELPTPYMMFDM | 101 |
| FMC63 mimotope (A5) | PLSRICPWNCKELYWLPQR | 102 |
| FMC63 mimotope (A10) | AKRRERDYVGRICPWNCKELHPDTRHRIPV | 103 |
| FMC63 mimotope (A11) | RICPWNCKELYWLPDE | 104 |
| FMC63 mimotope (B5) | PPPRICPWNCKELPLDWPW | 105 |
| FMC63 mimotope (C2) | RICPWNCKELPSPPRIFGNR | 106 |
| FMC63 mimotope (D11) | AGTRICPWNCKELYWLPDE | 107 |
| FMC63 mimotope (F5) | QFQRICPWNCKELYWLPDQ | 108 |
| N-terminal flanking residues (FRs) | GGGSAS | 109 |

-continued

SEQUENCE LISTING

| Name/ Identifier | Sequence | SEQ ID NO |
|---|---|---|
| N-terminal FRs | GGSGGGGSAS | 110 |
| N-terminal FRs | GSGGGGSGGGGSAS | 111 |
| N-terminal FRs | GGGGSGGGGSGGGGSAS | 112 |
| N-terminal FRs | PRKHSG | 113 |
| N-terminal FRs | AKRRERDYVG | 114 |
| C-terminal FRs | DNPPFIFGNR | 115 |
| C-terminal FRs | PTPYMMFDM | 116 |
| C-terminal FRs | YWLPQR | 117 |
| C-terminal FRs | HPDTRHRIPV | 118 |
| C-terminal FRs | YWLPDE | 119 |
| C-terminal FRs | PLDWPW | 120 |
| C-terminal FRs | PSPPRIFGNR | 121 |
| C-terminal FRs | YWLPX$_1$X$_2$ X$_1$ = any amino acid; or X$_1$ = D or Q X$_2$ = any amino acid; or X$_2$ = Q, E, or R | 122 |
| C-terminal FRs | YWLPDQ | 123 |
| (Aga2p)-(HA)-(Gly4Ser)3 (aa) | MQLLRCFSIFSVIASVLAQELTTICEQIPSPTLESTPYSLSTT TILANGKAMQGVFEYYKSVTFVSNCGSHPSTTSKGSPINTQYV FKDNSSTIEGRYPYDVPDYALQASGGGGSGGGGSGGGGSAS | 124 |
| (Aga2p)-(HA)-(Gly4Ser)3 (DNA) | ATGCAGTTACTTCGCTGTTTTTCAATATTTTCTGTTATTGCTT CAGTTTTAGCACAGGAACTGACAACTATATGCGAGCAAATCCC CTCACCAACTTTAGAATCGACGCCGTACTCTTTGTCAACGACT ACTATTTTGGCCAACGGGAAGGCAATGCAAGGAGTTTTTGAAT ATTACAAATCAGTAACGTTTGTCAGTAATTGCGGTTCTCACCC CTCAACAACTAGCAAAGGCAGCCCCATAAACACACAGTATGTT TTTAAGGACAATAGCTCGACGATTGAAGGTAGATACCCATACG ACGTTCCAGACTACGCTCTGCAGGCTAGTGGTGGAGGAGGCTC TGGTGGAGGCGGTAGCGGAGGCGGAGGGTCGGCTAGC | 125 |
| (Aga2p)-(HA)-(Gly4Ser)3-(XXCXXXCXXX) (aa) | MQLLRCFSIFSVIASVLAQELTTICEQIPSPTLESTPYSLSTT TILANGKAMQGVFEYYKSVTFVSNCGSHPSTTSKGSPINTQYV FKDNSSTIEGRYPYDVPDYALQASGGGGSGGGGSGGGGSASXX CXXXCXXX X = any amino acid residue | 126 |
| (Aga2p)-(HA)-(Gly4Ser)3-(XXCXXXCXXX) (dna) | ATGCAGTTACTTCGCTGTTTTTCAATATTTTCTGTTATTGCTT CAGTTTTAGCACAGGAACTGACAACTATATGCGAGCAAATCCC CTCACCAACTTTAGAATCGACGCCGTACTCTTTGTCAACGACT ACTATTTTGGCCAACGGGAAGGCAATGCAAGGAGTTTTTGAAT ATTACAAATCAGTAACGTTTGTCAGTAATTGCGGTTCTCACCC CTCAACAACTAGCAAAGGCAGCCCCATAAACACACAGTATGTT TTTAAGGACAATAGCTCGACGATTGAAGGTAGATACCCATACG ACGTTCCAGACTACGCTCTGCAGGCTAGTGGTGGAGGAGGCTC TGGTGGAGGCGGTAGCGGAGGCGGAGGGTCGGCTAGCNNKNNK TGYNNKNNKNNKTGYNNKNNKNNK X= any amino acid residue; T = pyrimidine | 127 |
| Mimotope of Amph-K-A1 | GGGSASPRKHSGRICPWNCKELDNPPFIFGNR | 128 |
| Mimotope of Amph-K-C2 | GGGSASRICPWNCKELPSPPRIFGNR | 129 |
| N-terminal FRs | GGGSASPRKHSG | 130 |

The invention claimed is:

1. A method of activating anti-CD19 CAR T cells or increasing proliferation of anti-CD19 CAR T cells in a subject, comprising administering an amphiphilic ligand conjugate, wherein the amphiphilic ligand conjugate comprises:

an anti-CD19 CAR ligand or a multimer thereof; and a lipid operably linked to the ligand or the multimer, wherein the anti-CD19 CAR ligand comprises a peptide comprising a sequence motif, wherein the sequence motif binds an anti-CD19 CAR antigen recognition domain, wherein the anti-CD19 CAR antigen recognition domain comprises an antigen recognition domain derived from FMC63, and wherein binding of the sequence motif to the anti-CD19 CAR antigen recognition domain activates a T cell expressing a CAR comprising the anti-CD19 CAR antigen recognition domain, wherein:

(1) the sequence motif comprises the amino acid sequence [Arg-Xaa1-Cys-Pro-Trp-Xaa2-Cys-Xaa3-Xaa4-Xaa5] (SEQ ID NO: 7), wherein the peptide is capable of forming an intra-peptidyl disulfide bridge;

wherein Xaa1 is selected from Ile, Leu, Met, Val, and Arg;

wherein Xaa2 is selected from Ala, Glu, His, Ser, Asp, and Asn;

wherein Xaa3 is selected from Leu, Arg, Ala, Met, Ser, Val, Ile, and Lys;

wherein Xaa4 is selected from Ser, Val, Gln, Ile, Pro, Lys, Glu, and His; and wherein Xaa5 is selected from Leu, Ile, Arg, His, Gln, and Trp;

(2) the sequence motif comprises [Arg-Xaa1-Cys-Pro-Trp-Xaa2-Cys-Xaa3-Xaa4-Xaa5] (SEQ ID NO: 131), wherein the peptide is capable of forming an intra-peptidyl disulfide bridge;

wherein Xaa1 is selected from Leu, Ile, and Val;

wherein Xaa2 is Ser or Lys;

wherein Xaa3 is selected from Arg, Ile, Val, and Met;

wherein Xaa4 is selected from Glu, Lys, and Pro; and wherein Xaa5 is selected from Leu, Gln, Phe, and Ile;

(3) the sequence motif comprises [Arg-Xaa1-Cys-Pro-Trp-Xaa2-Cys-Xaa3-Xaa4-Xaa5] (SEQ ID NO: 132), wherein the peptide is capable of forming an intra-peptidyl disulfide bridge;

wherein Xaa1 is selected from Leu, Ile, and Met;

wherein Xaa2 is selected from Ser, Asn, Asp, and Gly;

wherein Xaa3 is selected from Leu, Met, Ser, Arg, and Lys;

wherein Xaa4 is selected from Glu, Gln, and Pro; and wherein Xaa5 is Leu or Ile;

(4) the sequence motif comprises [Arg-Xaa1-Cys-Pro-Trp-Xaa2-Cys-Xaa3-Glu-Leu] (SEQ ID NO: 133), wherein the peptide is capable of forming an intra-peptidyl disulfide bridge;

wherein Xaa1 is Leu or Ile;

wherein Xaa2 is selected from Ser, Asn, and Asp; and wherein Xaa3 is selected from Gln, Ile, Val, Lys, and Arg; or (5) the sequence motif comprises an amino acid sequence selected from: RHCPWNCSLL (SEQ ID NO: 5), RICPWSCRAP (SEQ ID NO: 6), and SEQ ID NOs: 10, 12-15, and 20.

2. A method of stimulating an immune response to a target cell population or a target tissue expressing CD19 in a subject, the method comprising administering to the subject anti-CD19 CAR T cells and an amphiphilic ligand conjugate, wherein the amphiphilic ligand conjugate comprises:

an anti-CD19 CAR ligand or a multimer thereof; and a lipid operably linked to the ligand or the multimer, wherein the anti-CD19 CAR ligand comprises a peptide comprising a sequence motif, wherein the sequence motif binds an anti-CD19 CAR antigen recognition domain, wherein the anti-CD19 CAR antigen recognition domain comprises an antigen recognition domain derived from FMC63, and wherein binding of the sequence motif to the anti-CD19 CAR antigen recognition domain activates a T cell expressing a CAR comprising the anti-CD19 CAR antigen recognition domain, wherein:

(1) the sequence motif comprises the amino acid sequence [Arg-Xaa1-Cys-Pro-Trp-Xaa2-Cys-Xaa3-Xaa4-Xaa5] (SEQ ID NO: 7), wherein the peptide is capable of forming an intra-peptidyl disulfide bridge;

wherein Xaa1 is selected from Ile, Leu, Met, Val, and Arg;

wherein Xaa2 is selected from Ala, Glu, His, Ser, Asp, and Asn;

wherein Xaa3 is selected from Leu, Arg, Ala, Met, Ser, Val, Ile, and Lys;

wherein Xaa4 is selected from Ser, Val, Gln, Ile, Pro, Lys, Glu, and His; and wherein Xaa5 is selected from Leu, Ile, Arg, His, Gln, and Trp;

(2) the sequence motif comprises [Arg-Xaa1-Cys-Pro-Trp-Xaa2-Cys-Xaa3-Xaa4-Xaa5] (SEQ ID NO: 131), wherein the peptide is capable of forming an intra-peptidyl disulfide bridge;

wherein Xaa1 is selected from Leu, Ile, and Val;

wherein Xaa2 is Ser or Lys;

wherein Xaa3 is selected from Arg, Ile, Val, and Met;

wherein Xaa4 is selected from Glu, Lys, and Pro; and wherein Xaa5 is selected from Leu, Gln, Phe, and Ile;

(3) the sequence motif comprises [Arg-Xaa1-Cys-Pro-Trp-Xaa2-Cys-Xaa3-Xaa4-Xaa5] (SEQ ID NO: 132), wherein the peptide is capable of forming an intra-peptidyl disulfide bridge;

wherein Xaa1 is selected from Leu, Ile, and Met;

wherein Xaa2 is selected from Ser, Asn, Asp, and Gly;

wherein Xaa3 is selected from Leu, Met, Ser, Arg, and Lys;

wherein Xaa4 is selected from Glu, Gln, and Pro; and wherein Xaa5 is Leu or Ile;

(4) the sequence motif comprises [Arg-Xaa1-Cys-Pro-Trp-Xaa2-Cys-Xaa3-Glu-Leu] (SEQ ID NO: 133), wherein the peptide is capable of forming an intra-peptidyl disulfide bridge;

wherein Xaa1 is Leu or Ile;

wherein Xaa2 is selected from Ser, Asn, and Asp; and wherein Xaa3 is selected from Gln, Ile, Val, Lys, and Arg; or (5) the sequence motif comprises an amino acid sequence selected from: RHCPWNCSLL (SEQ ID NO: 5), RICPWSCRAP (SEQ ID NO: 6), and SEQ ID NOs: 10, 12-15, and 20.

3. A method of inducing an anti-tumor response in a subject with cancer, comprising administering to the subject an amphiphilic ligand conjugate, wherein the subject is receiving or has received anti-CD19 CAR T cells, and wherein the amphiphilic ligand conjugate comprises:

an anti-CD19 CAR ligand or a multimer thereof; and a lipid operably linked to the ligand or the multimer, wherein the anti-CD19 CAR ligand comprises a peptide comprising a sequence motif, wherein the sequence motif binds an anti-CD19 CAR antigen recognition domain, wherein the anti-CD19 CAR antigen recognition domain comprises an antigen recognition domain derived from FMC63, and wherein binding of the sequence motif to the anti-CD19 CAR antigen recognition domain activates a T cell expressing a CAR comprising the anti-CD19 CAR antigen recognition domain, wherein:

(1) the sequence motif comprises the amino acid sequence [Arg-Xaa1-Cys-Pro-Trp-Xaa2-Cys-Xaa3-Xaa4-Xaa5] (SEQ ID NO: 7), wherein the peptide is capable of forming an intra-peptidyl disulfide bridge;

wherein Xaa1 is selected from Ile, Leu, Met, Val, and Arg;

wherein Xaa2 is selected from Ala, Glu, His, Ser, Asp, and Asn;

wherein Xaa3 is selected from Leu, Arg, Ala, Met, Ser, Val, Ile, and Lys;

wherein Xaa4 is selected from Ser, Val, Gln, Ile, Pro, Lys, Glu, and His; and wherein Xaa5 is selected from Leu, Ile, Arg, His, Gln, and Trp;

(2) the sequence motif comprises [Arg-Xaa1-Cys-Pro-Trp-Xaa2-Cys-Xaa3-Xaa4-Xaa5] (SEQ ID NO: 131), wherein the peptide is capable of forming an intra-peptidyl disulfide bridge;

wherein Xaa1 is selected from Leu, Ile, and Val;

wherein Xaa2 is Ser or Lys;

wherein Xaa3 is selected from Arg, Ile, Val, and Met;

wherein Xaa4 is selected from Glu, Lys, and Pro; and wherein Xaa5 is selected from Leu, Gln, Phe, and Ile;

(3) the sequence motif comprises [Arg-Xaa1-Cys-Pro-Trp-Xaa2-Cys-Xaa3-Xaa4-Xaa5] (SEQ ID NO: 132), wherein the peptide is capable of forming an intra-peptidyl disulfide bridge;

wherein Xaa1 is selected from Leu, Ile, and Met;

wherein Xaa2 is selected from Ser, Asn, Asp, and Gly;

wherein Xaa3 is selected from Leu, Met, Ser, Arg, and Lys;

wherein Xaa4 is selected from Glu, Gln, and Pro; and wherein Xaa5 is Leu or Ile;

(4) the sequence motif comprises [Arg-Xaa1-Cys-Pro-Trp-Xaa2-Cys-Xaa3-Glu-Leu] (SEQ ID NO: 133), wherein the peptide is capable of forming an intra-peptidyl disulfide bridge;

wherein Xaa1 is Leu or Ile;

wherein Xaa2 is selected from Ser, Asn, and Asp; and wherein Xaa3 is selected from Gln, Ile, Val, Lys, and Arg; or (5) the sequence motif comprises an amino acid sequence selected from: RHCPWNCSLL (SEQ ID NO: 5), RICPWSCRAP (SEQ ID NO: 6), and SEQ ID NOs: 10, 12-15, and 20.

4. The method of claim 1, wherein the anti-CD19 antigen recognition domain comprises an scFv.

5. The method of claim 1, wherein the two cysteine residues of the sequence motif are capable of forming an intra-peptidyl disulfide bridge.

6. The method of claim 1, wherein the antigen recognition domain comprises a heavy chain variable sequence (VH) having the sequence of SEQ ID NO: 71 and a light chain variable sequence (VL) having the sequence of SEQ ID NO: 72.

7. The method of claim 1, wherein the sequence motif comprises an amino acid sequence selected from: RICPWACLSL (SEQ ID NO: 22); RLCPWECRVL (SEQ ID NO: 23); RLCPWACRQL (SEQ ID NO: 24); RLCPWHCAII (SEQ ID NO: 25); RLCPWSCMPR (SEQ ID NO: 26); RLCPWDCLIL (SEQ ID NO: 27); RMCPWSCRPH (SEQ ID NO: 9); RICPWNCSKL (SEQ ID NO: 28); RVCPWSCVEQ (SEQ ID NO: 29); RLCPWNCIHW (SEQ ID NO: 30); or RRCPWSCKKQ (SEQ ID NO: 11).

8. The method of claim 1, wherein the sequence motif comprises an amino acid sequence selected from: RLCPWKCREL (SEQ ID NO: 31); RLCPWSCIKL (SEQ ID NO: 32); RLCPWSCVEQ (SEQ ID NO: 33); RICPWSCRPL (SEQ ID NO: 34); RLCPWSCIPF (SEQ ID NO: 35); RVCPWSCMPI (SEQ ID NO: 14); and RICPWSCVKQ (SEQ ID NO: 36).

9. The method of claim 1, wherein the sequence motif comprises RLCPWSCLEI (SEQ ID NO: 37); RICPWSCMEL (SEQ ID NO: 38); RLCPWNCSEL (SEQ ID NO: 39); RLCPWNCRQL (SEQ ID NO: 40); RICPWDCKPI (SEQ ID NO: 41) RMCPWNCREL (SEQ ID NO: 42); RLCPWSCREL (SEQ ID NO: 16); or RICPWGCKEL (SEQ ID NO: 43).

10. The method of claim 1, wherein the sequence motif comprises RLCPWNCQEL (SEQ ID NO: 44); RICPWSCIEL (SEQ ID NO: 45); RICPWSCVEL (SEQ ID NO: 46); RICPWNCKEL (SEQ ID NO: 18); RLCPWNCREL (SEQ ID NO: 17); RLCPWDCREL (SEQ ID NO: 19); RICPWSCREL (SEQ ID NO: 21); or RLCPWDCKEL (SEQ ID NO: 47).

11. The method of claim 1, wherein the peptide comprises an amino acid sequence from N-terminus to C-terminus represented by the formula:

$$[A]_x\text{-}[M]_y\text{-}[B]_z;$$

wherein A, if present, is any amino acid residue, optionally an amino acid residue other than glycine;

wherein M is one or more of the sequence motifs;

wherein B, if present, is any amino acid residue, optionally an amino acid residue other than glycine;

x and z are each integers from 1-20;

y is an integer from 1-5; and wherein either A is present or B is present, or both A and B are present.

12. The method of claim 11, wherein (i) A is present and x is 1; (ii) A is present, wherein x is 2-20, and wherein A is the same or different amino acid residue; (iii) wherein B is present and z is 1; (iv) wherein B is present, wherein z is 2-20, and wherein B is the same or different amino acid residue; and/or (v) wherein M is the same or different sequence motifs, and y is 2, 3, 4 or 5.

13. The method of claim 11, wherein A comprises an amino acid sequence selected from: SAS; GGGSAS (SEQ ID NO: 109); GGSGGGGSAS (SEQ ID NO: 110); GSGGGGSGGGGSAS (SEQ ID NO: 111); GGGGSGGGGSGGGGSAS (SEQ ID NO: 112); PRKHSG (SEQ ID NO: 113); GGGSASPRKHSG (SEQ ID NO: 130); PLS; AKRRERDYVG (SEQ ID NO: 114); PPP; AGT; QFQ; and a combination thereof.

14. The method of claim 11, wherein (i) B comprises an amino acid sequence represented by the formula:

```
                                        (SEQ ID NO: 122)
            [Tyr-Trp-Leu-Pro-Xaa3-Xaa4],
```

wherein Xaa3 is any amino acid residue, optionally D or Q; and wherein Xaa4 is any amino acid residue, optionally E, Q, or R;

(ii) B comprises an amino acid sequence selected from: YWLPQR (SEQ ID NO: 117), YWLPDE (SEQ ID NO: 119), and YWLPDQ (SEQ ID NO: 123); or (iii) B comprises an amino acid sequence selected from: DNPPFIFGNR (SEQ ID NO: 115), PTPYMMFDM (SEQ ID NO: 116), HPDTRHRIPV (SEQ ID NO: 118), PLDWPW (SEQ ID NO: 120), PSPPRIFGNR (SEQ ID NO: 121); and a combination thereof.

15. The method of claim 11, wherein the peptide binds to the CAR antigen-recognition domain with (i) an increased binding affinity ($K_D$) relative to a peptide without either A and/or and B amino acid residues of about 1.1, 1.2, 1.3, 1.4, 1.5, 1.6, 1.7, 1.8, 1.9, or 2-fold; and/or (ii) a substantially reduced dissociation rate relative to a peptide without either A and/or B amino acid residues.

16. The method of claim 11, wherein the peptide comprises an amino acid sequence selected from SEQ ID NOs: 95-108, and 128-129.

17. The method of claim 1, wherein the anti-CD19 CAR ligand is operably linked to the lipid via a linker.

18. The method of claim 1, comprising the multimer of anti-CD19 CAR ligands, wherein the multimer is a dimer, trimer, or tetramer, and wherein the anti-CD19 CAR ligands of the multimer are the same or different.

19. The method of claim 18, wherein the multimer is a dimer comprising a first anti-CD19 CAR ligand and a second anti-CD19 CAR ligand, wherein the first anti-CD19 CAR ligand and the second anti-CD19 CAR ligand are the same or different, wherein the first anti-CD19 CAR ligand is operably linked to the lipid via a first linker, wherein the second anti-CD19 CAR ligand is operably linked to the lipid via a second linker, and wherein the first linker and the second linker are operably linked to the lipid via a heterotrifunctional compound or lysine.

20. The method of claim 19, wherein (i) the first linker and the second linker are each selected from: a hydrophilic polymer, a string of hydrophilic amino acids, a polysaccharide, or a combination thereof; and/or (ii) the first linker and the second linker each comprise "N" consecutive polyethylene glycol units, and wherein N is at least 4, 5, 6, 7, 8, 9, or 10.

21. The method of claim 19, wherein the lipid is 1,2-distearoyl-sn-glycero-3-phosphoethanolamine (DSPE), and wherein the first linker and the second linker are a polyethylene glycol polymer selected from PEG4 and PEG8.

22. The method of claim 1, wherein the amphiphilic ligand is administered in combination with an adjuvant.

23. The method of claim 1, wherein the lipid is an albumin-binding lipid comprising a hydrophobic tail, wherein the hydrophobic tail is capable of inserting into cell membrane.

* * * * *

SEQUENCE LISTING

<160> NUMBER OF SEQ ID NOS: 155

<210> SEQ ID NO 1
<211> LENGTH: 27
<212> TYPE: DNA
<213> ORGANISM: Artificial Sequence
<220> FEATURE:
<223> OTHER INFORMATION: Synthetic: Primer mimotope library forward

<400> SEQUENCE: 1
aactagcaaa ggcagcccca taaacac 27

<210> SEQ ID NO 2
<211> LENGTH: 93
<212> TYPE: DNA
<213> ORGANISM: Artificial Sequence
<220> FEATURE:
<223> OTHER INFORMATION: Synthetic: Primer mimotope library reverse
<220> FEATURE:
<221> NAME/KEY: misc_feature
<222> LOCATION: (47)..(48)
<223> OTHER INFORMATION: n is a, c, g, or t
<220> FEATURE:
<221> NAME/KEY: misc_feature
<222> LOCATION: (50)..(51)
<223> OTHER INFORMATION: n is a, c, g, or t
<220> FEATURE:
<221> NAME/KEY: misc_feature
<222> LOCATION: (53)..(54)
<223> OTHER INFORMATION: n is a, c, g, or t
<220> FEATURE:
<221> NAME/KEY: misc_feature
<222> LOCATION: (56)..(57)
<223> OTHER INFORMATION: n is a, c, g, or t
<220> FEATURE:
<221> NAME/KEY: misc_feature
<222> LOCATION: (59)..(60)
<223> OTHER INFORMATION: n is a, c, g, or t
<220> FEATURE:
<221> NAME/KEY: misc_feature
<222> LOCATION: (62)..(63)
<223> OTHER INFORMATION: n is a, c, g, or t
<220> FEATURE:
<221> NAME/KEY: misc_feature
<222> LOCATION: (65)..(66)
<223> OTHER INFORMATION: n is a, c, g, or t
<220> FEATURE:
<221> NAME/KEY: misc_feature
<222> LOCATION: (68)..(69)
<223> OTHER INFORMATION: n is a, c, g, or t
<220> FEATURE:
<221> NAME/KEY: misc_feature
<222> LOCATION: (71)..(72)
<223> OTHER INFORMATION: n is a, c, g, or t
<220> FEATURE:
<221> NAME/KEY: misc_feature
<222> LOCATION: (74)..(75)
<223> OTHER INFORMATION: n is a, c, g, or t

<400> SEQUENCE: 2
gattttgtta catctacact gttgttatca gatctcgagc tattamnnmn nmnnmnnmnn 60
mnnmnnmnnm nnmnngctag ccgaccctcc gcc 93

<210> SEQ ID NO 3
<211> LENGTH: 42
<212> TYPE: DNA
<213> ORGANISM: Artificial Sequence
<220> FEATURE:
<223> OTHER INFORMATION: Synthetic: Primer Min Cmyc EP forward

<400> SEQUENCE: 3
ggctctggtg gaggcggtag cggaggcgga gggtcggcta gc 42

<210> SEQ ID NO 4
<211> LENGTH: 45
<212> TYPE: DNA
<213> ORGANISM: Artificial Sequence
<220> FEATURE:
<223> OTHER INFORMATION: Synthetic: Primer Min Cmyc EP reverse

<400> SEQUENCE: 4
gattttgtta catctacact gttgttatca gatctcgagc tatta 45

<210> SEQ ID NO 5
<211> LENGTH: 10
<212> TYPE: PRT
<213> ORGANISM: Artificial Sequence
<220> FEATURE:
<223> OTHER INFORMATION: Synthetic: FMC63 Mimotope (A1)

<400> SEQUENCE: 5

Arg His Cys Pro Trp Asn Cys Ser Leu Leu
1 5 10

<210> SEQ ID NO 6
<211> LENGTH: 10
<212> TYPE: PRT
<213> ORGANISM: Artificial Sequence
<220> FEATURE:
<223> OTHER INFORMATION: Synthetic: FMC63 Mimotope (D12)

<400> SEQUENCE: 6

Arg Ile Cys Pro Trp Ser Cys Arg Ala Pro
1 5 10

<210> SEQ ID NO 7
<211> LENGTH: 10
<212> TYPE: PRT
<213> ORGANISM: Artificial Sequence
<220> FEATURE:
<223> OTHER INFORMATION: Synthetic: FMC63 Mimotope Consensus
<220> FEATURE:
<221> NAME/KEY: misc_feature
<223> OTHER INFORMATION: See specification as filed for detailed
description of substitutions and preferred embodiments
<220> FEATURE:
<221> NAME/KEY: misc_feature
<222> LOCATION: (2)..(2)
<223> OTHER INFORMATION: Xaa is selected from Ile, Leu, Met, Val, and
Arg
<220> FEATURE:
<221> NAME/KEY: misc_feature
<222> LOCATION: (6)..(6)
<223> OTHER INFORMATION: Xaa is selected from Ala, Glu, His, Ser, Asp,
and Asn
<220> FEATURE:
<221> NAME/KEY: misc_feature
<222> LOCATION: (8)..(8)
<223> OTHER INFORMATION: Xaa is selected from Leu, Arg, Ala, Met, Ser,
Val, Ile, and Lys
<220> FEATURE:
<221> NAME/KEY: misc_feature
<222> LOCATION: (9)..(9)
<223> OTHER INFORMATION: Xaa is selected from Ser, Val, Gln, Ile, Pro,
Lys, Glu, and His
<220> FEATURE:
<221> NAME/KEY: misc_feature
<222> LOCATION: (10)..(10)
<223> OTHER INFORMATION: Xaa is selected from Leu, Ile, Arg, His, Gln,
and Trp

<400> SEQUENCE: 7

Arg Xaa Cys Pro Trp Xaa Cys Xaa Xaa Xaa 1 5 10

<210> SEQ ID NO 8
<211> LENGTH: 95
<212> TYPE: DNA
<213> ORGANISM: Artificial Sequence
<220> FEATURE:
<223> OTHER INFORMATION: Synthetic: Primer - hCD19 Fixed Library Reverse
<220> FEATURE:
<221> NAME/KEY: misc_feature
<222> LOCATION: (47)..(48)
<223> OTHER INFORMATION: n is a, c, g, or t
<220> FEATURE:
<221> NAME/KEY: misc_feature
<222> LOCATION: (50)..(51)
<223> OTHER INFORMATION: n is a, c, g, or t
<220> FEATURE:
<221> NAME/KEY: misc_feature
<222> LOCATION: (53)..(54)
<223> OTHER INFORMATION: n is a, c, g, or t
<220> FEATURE:
<221> NAME/KEY: misc_feature
<222> LOCATION: (59)..(60)
<223> OTHER INFORMATION: n is a, c, g, or t
<220> FEATURE:
<221> NAME/KEY: misc_feature
<222> LOCATION: (71)..(72)
<223> OTHER INFORMATION: n is a, c, g, or t

<400> SEQUENCE: 8
gattttgtta catctacact gttgttatca gatctcgagc tattamnnmn nmnnacamnn 60
ccacggacam nnacggctag ccgaccctcc gcctc 95

<210> SEQ ID NO 9
<211> LENGTH: 10
<212> TYPE: PRT
<213> ORGANISM: Artificial Sequence
<220> FEATURE:
<223> OTHER INFORMATION: Synthetic: FMC63 Mimotope(A8)

<400> SEQUENCE: 9

Arg Met Cys Pro Trp Ser Cys Arg Pro His
1 5 10

<210> SEQ ID NO 10
<211> LENGTH: 10
<212> TYPE: PRT
<213> ORGANISM: Artificial Sequence
<220> FEATURE:
<223> OTHER INFORMATION: Synthetic: FMC63 Mimotope (B7)

<400> SEQUENCE: 10

Arg Ile Cys Pro Trp Ser Cys Met Val Val
1 5 10

<210> SEQ ID NO 11
<211> LENGTH: 10
<212> TYPE: PRT
<213> ORGANISM: Artificial Sequence
<220> FEATURE:
<223> OTHER INFORMATION: Synthetic: FMC63 Mimotope(A12)

<400> SEQUENCE: 11

Arg Arg Cys Pro Trp Ser Cys Lys Lys Gln
1 5 10

<210> SEQ ID NO 12
<211> LENGTH: 10
<212> TYPE: PRT

<213> ORGANISM: Artificial Sequence
<220> FEATURE:
<223> OTHER INFORMATION: Synthetic: FMC63 Mimotope(C5)

<400> SEQUENCE: 12

Arg Met Cys Pro Trp Ser Cys Tyr Glu Leu
1               5                   10

<210> SEQ ID NO 13
<211> LENGTH: 10
<212> TYPE: PRT
<213> ORGANISM: Artificial Sequence
<220> FEATURE:
<223> OTHER INFORMATION: Synthetic: FMC63 Mimotope(C7)

<400> SEQUENCE: 13

Arg Leu Cys Pro Trp Ala Cys Gln Glu Gln
1               5                   10

<210> SEQ ID NO 14
<211> LENGTH: 10
<212> TYPE: PRT
<213> ORGANISM: Artificial Sequence
<220> FEATURE:
<223> OTHER INFORMATION: Synthetic: FMC63 Mimotope (H1)

<400> SEQUENCE: 14

Arg Val Cys Pro Trp Ser Cys Met Pro Ile
1               5                   10

<210> SEQ ID NO 15
<211> LENGTH: 10
<212> TYPE: PRT
<213> ORGANISM: Artificial Sequence
<220> FEATURE:
<223> OTHER INFORMATION: Synthetic: FMC63 Mimotope(E6)

<400> SEQUENCE: 15

Arg Leu Cys Pro Trp Ser Cys Val Pro Ile
1               5                   10

<210> SEQ ID NO 16
<211> LENGTH: 10
<212> TYPE: PRT
<213> ORGANISM: Artificial Sequence
<220> FEATURE:
<223> OTHER INFORMATION: Synthetic: FMC63 Mimotope(G9)

<400> SEQUENCE: 16

Arg Leu Cys Pro Trp Ser Cys Arg Glu Leu
1               5                   10

<210> SEQ ID NO 17
<211> LENGTH: 10
<212> TYPE: PRT
<213> ORGANISM: Artificial Sequence
<220> FEATURE:
<223> OTHER INFORMATION: Synthetic: FMC63 Mimotope(G11)

<400> SEQUENCE: 17

Arg Leu Cys Pro Trp Asn Cys Arg Glu Leu
1               5                   10

<210> SEQ ID NO 18
<211> LENGTH: 10
<212> TYPE: PRT
<213> ORGANISM: Artificial Sequence
<220> FEATURE:
<223> OTHER INFORMATION: Synthetic: FMC63 Mimotope(F12)

<400> SEQUENCE: 18

Arg Ile Cys Pro Trp Asn Cys Lys Glu Leu
1 5 10

<210> SEQ ID NO 19
<211> LENGTH: 10
<212> TYPE: PRT
<213> ORGANISM: Artificial Sequence
<220> FEATURE:
<223> OTHER INFORMATION: Synthetic: FMC63 Mimotope(F8)

<400> SEQUENCE: 19

Arg Leu Cys Pro Trp Asp Cys Arg Glu Leu
1 5 10

<210> SEQ ID NO 20
<211> LENGTH: 10
<212> TYPE: PRT
<213> ORGANISM: Artificial Sequence
<220> FEATURE:
<223> OTHER INFORMATION: Synthetic: FMC63 Mimotope(H8)

<400> SEQUENCE: 20

Arg Ile Cys Pro Trp Ala Cys Val Glu Leu
1 5 10

<210> SEQ ID NO 21
<211> LENGTH: 10
<212> TYPE: PRT
<213> ORGANISM: Artificial Sequence
<220> FEATURE:
<223> OTHER INFORMATION: Synthetic: FMC63 Mimotope(H11)

<400> SEQUENCE: 21

Arg Ile Cys Pro Trp Ser Cys Arg Glu Leu
1 5 10

<210> SEQ ID NO 22
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 22

Arg Ile Cys Pro Trp Ala Cys Leu Ser Leu
1 5 10

<210> SEQ ID NO 23
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 23

Arg Leu Cys Pro Trp Glu Cys Arg Val Leu
1 5 10

<210> SEQ ID NO 24
<211> LENGTH: 10
<212> TYPE: PRT
<213> ORGANISM: Artificial Sequence
<220> FEATURE:

<223> OTHER INFORMATION: Synthetic: FMC63 Mimotope

<400> SEQUENCE: 24

Arg Leu Cys Pro Trp Ala Cys Arg Gln Leu
1 5 10

<210> SEQ ID NO 25
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 25

Arg Leu Cys Pro Trp His Cys Ala Ile Ile
1 5 10

<210> SEQ ID NO 26
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 26

Arg Leu Cys Pro Trp Ser Cys Met Pro Arg
1 5 10

<210> SEQ ID NO 27
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 27

Arg Leu Cys Pro Trp Asp Cys Leu Ile Leu
1 5 10

<210> SEQ ID NO 28
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 28

Arg Ile Cys Pro Trp Asn Cys Ser Lys Leu
1 5 10

<210> SEQ ID NO 29
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 29

Arg Val Cys Pro Trp Ser Cys Val Glu Gln
1 5 10

<210> SEQ ID NO 30
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 30

Arg Leu Cys Pro Trp Asn Cys Ile His Trp
1 5 10

<210> SEQ ID NO 31
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 31

Arg Leu Cys Pro Trp Lys Cys Arg Glu Leu
1 5 10

<210> SEQ ID NO 32
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 32

Arg Leu Cys Pro Trp Ser Cys Ile Lys Leu
1 5 10

<210> SEQ ID NO 33
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 33

Arg Leu Cys Pro Trp Ser Cys Val Glu Gln
1 5 10

<210> SEQ ID NO 34
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 34

Arg Ile Cys Pro Trp Ser Cys Arg Pro Leu
1 5 10

<210> SEQ ID NO 35
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 35

Arg Leu Cys Pro Trp Ser Cys Ile Pro Phe
1 5 10

<210> SEQ ID NO 36
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 36

Arg Ile Cys Pro Trp Ser Cys Val Lys Gln
1 5 10

<210> SEQ ID NO 37
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 37

Arg Leu Cys Pro Trp Ser Cys Leu Glu Ile
1 5 10

<210> SEQ ID NO 38
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 38

Arg Ile Cys Pro Trp Ser Cys Met Glu Leu
1 5 10

<210> SEQ ID NO 39
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 39

Arg Leu Cys Pro Trp Asn Cys Ser Glu Leu
1 5 10

<210> SEQ ID NO 40
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 40

Arg Leu Cys Pro Trp Asn Cys Arg Gln Leu
1 5 10

<210> SEQ ID NO 41
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 41

Arg Ile Cys Pro Trp Asp Cys Lys Pro Ile
1 5 10

<210> SEQ ID NO 42
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 42

Arg Met Cys Pro Trp Asn Cys Arg Glu Leu
1 5 10

<210> SEQ ID NO 43
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 43

Arg Ile Cys Pro Trp Gly Cys Lys Glu Leu
1 5 10

<210> SEQ ID NO 44
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 44

Arg Leu Cys Pro Trp Asn Cys Gln Glu Leu
1 5 10

<210> SEQ ID NO 45
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 45

Arg Ile Cys Pro Trp Ser Cys Ile Glu Leu
1 5 10

<210> SEQ ID NO 46
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 46

Arg Ile Cys Pro Trp Ser Cys Val Glu Leu
1 5 10

<210> SEQ ID NO 47
<211> LENGTH: 10
<212> TYPE: PRT
<213> ORGANISM: Artificial Sequence
<220> FEATURE:
<223> OTHER INFORMATION: Synthetic: FMC63 Mimotope

<400> SEQUENCE: 47

Arg Leu Cys Pro Trp Asp Cys Lys Glu Leu
1 5 10

<210> SEQ ID NO 48
<211> LENGTH: 10
<212> TYPE: PRT
<213> ORGANISM: Artificial Sequence
<220> FEATURE:
<223> OTHER INFORMATION: Synthetic: FMC63 Mimotope Consensus
<220> FEATURE:
<221> NAME/KEY: misc_feature
<223> OTHER INFORMATION: See specification as filed for detailed

```
      description of substitutions and preferred embodiments
<220> FEATURE:
<221> NAME/KEY: misc_feature
<222> LOCATION: (2)..(2)
<223> OTHER INFORMATION: X is I, L, M, V, or R
<220> FEATURE:
<221> NAME/KEY: misc_feature
<222> LOCATION: (6)..(6)
<223> OTHER INFORMATION: X is A, E, H, S, D, or N
<220> FEATURE:
<221> NAME/KEY: misc_feature
<222> LOCATION: (8)..(8)
<223> OTHER INFORMATION: X is L, R, A, M, S, V, I, or K
<220> FEATURE:
<221> NAME/KEY: misc_feature
<222> LOCATION: (9)..(9)
<223> OTHER INFORMATION: X is S, V, Q, I, P, K, E, or H
<220> FEATURE:
<221> NAME/KEY: misc_feature
<222> LOCATION: (10)..(10)
<223> OTHER INFORMATION: X is L, I, R, H, Q, or W

<400> SEQUENCE: 48

Arg Xaa Cys Pro Trp Xaa Cys Xaa Xaa Xaa
1               5                   10


<210> SEQ ID NO 49
<211> LENGTH: 10
<212> TYPE: PRT
<213> ORGANISM: Artificial Sequence
<220> FEATURE:
<223> OTHER INFORMATION: Synthetic: FMC63 Mimotope Consensus
<220> FEATURE:
<221> NAME/KEY: misc_feature
<223> OTHER INFORMATION: See specification as filed for detailed
      description of substitutions and preferred embodiments
<220> FEATURE:
<221> NAME/KEY: misc_feature
<222> LOCATION: (2)..(2)
<223> OTHER INFORMATION: X is L, I, or V
<220> FEATURE:
<221> NAME/KEY: misc_feature
<222> LOCATION: (6)..(6)
<223> OTHER INFORMATION: X is S or K
<220> FEATURE:
<221> NAME/KEY: misc_feature
<222> LOCATION: (8)..(8)
<223> OTHER INFORMATION: X is R, I, V or M
<220> FEATURE:
<221> NAME/KEY: misc_feature
<222> LOCATION: (9)..(9)
<223> OTHER INFORMATION: X is E, K or P
<220> FEATURE:
<221> NAME/KEY: misc_feature
<222> LOCATION: (10)..(10)
<223> OTHER INFORMATION: X is L, Q, F or I

<400> SEQUENCE: 49

Arg Xaa Cys Pro Trp Xaa Cys Xaa Xaa Xaa
1               5                   10


<210> SEQ ID NO 50
<211> LENGTH: 10
<212> TYPE: PRT
<213> ORGANISM: Artificial Sequence
<220> FEATURE:
<223> OTHER INFORMATION: Synthetic: FMC63 Mimotope Consensus
<220> FEATURE:
<221> NAME/KEY: misc_feature
<223> OTHER INFORMATION: See specification as filed for detailed
      description of substitutions and preferred embodiments
<220> FEATURE:
<221> NAME/KEY: misc_feature
<222> LOCATION: (2)..(2)
<223> OTHER INFORMATION: X is L, I or M
```

<220> FEATURE:
<221> NAME/KEY: misc_feature
<222> LOCATION: (6)..(6)
<223> OTHER INFORMATION: X is S, N, D or G
<220> FEATURE:
<221> NAME/KEY: misc_feature
<222> LOCATION: (8)..(8)
<223> OTHER INFORMATION: X is L, M, S, R or K
<220> FEATURE:
<221> NAME/KEY: misc_feature
<222> LOCATION: (9)..(9)
<223> OTHER INFORMATION: X is E, Q or P
<220> FEATURE:
<221> NAME/KEY: misc_feature
<222> LOCATION: (10)..(10)
<223> OTHER INFORMATION: X is L or I

<400> SEQUENCE: 50

Arg Xaa Cys Pro Trp Xaa Cys Xaa Xaa Xaa
1 5 10

<210> SEQ ID NO 51
<211> LENGTH: 10
<212> TYPE: PRT
<213> ORGANISM: Artificial Sequence
<220> FEATURE:
<223> OTHER INFORMATION: Synthetic: FMC63 Mimotope Consensus
<220> FEATURE:
<221> NAME/KEY: misc_feature
<223> OTHER INFORMATION: See specification as filed for detailed description of substitutions and preferred embodiments
<220> FEATURE:
<221> NAME/KEY: misc_feature
<222> LOCATION: (2)..(2)
<223> OTHER INFORMATION: X is L or I
<220> FEATURE:
<221> NAME/KEY: misc_feature
<222> LOCATION: (6)..(6)
<223> OTHER INFORMATION: X is N, S or D
<220> FEATURE:
<221> NAME/KEY: misc_feature
<222> LOCATION: (8)..(8)
<223> OTHER INFORMATION: X is Q, I, V, K or R

<400> SEQUENCE: 51

Arg Xaa Cys Pro Trp Xaa Cys Xaa Glu Leu
1 5 10

<210> SEQ ID NO 52
<211> LENGTH: 12
<212> TYPE: PRT
<213> ORGANISM: Artificial Sequence
<220> FEATURE:
<223> OTHER INFORMATION: Synthetic: FMC63 Mimotope Mutant

<400> SEQUENCE: 52

Arg Leu Cys Pro Trp Ser Ala Ala Cys Arg Glu Leu
1 5 10

<210> SEQ ID NO 53
<211> LENGTH: 11
<212> TYPE: PRT
<213> ORGANISM: Artificial Sequence
<220> FEATURE:
<223> OTHER INFORMATION: Synthetic: FMC63 Mimotope Mutant

<400> SEQUENCE: 53

Arg Leu Cys Pro Trp Ser Ala Cys Arg Glu Leu
1 5 10

<210> SEQ ID NO 54

<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 54

Arg Leu Cys Pro Trp Ser Cys Arg Glu Ala
1 5 10

<210> SEQ ID NO 55
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 55

Arg Leu Cys Pro Trp Ser Cys Arg Ala Leu
1 5 10

<210> SEQ ID NO 56
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 56

Arg Leu Cys Pro Trp Ser Cys Ala Glu Leu
1 5 10

<210> SEQ ID NO 57
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 57

Arg Leu Cys Pro Trp Ser Ala Arg Glu Leu
1 5 10

<210> SEQ ID NO 58
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 58

Arg Leu Cys Pro Trp Ala Cys Arg Glu Leu
1 5 10

<210> SEQ ID NO 59
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 59

Arg Leu Cys Pro Ala Ser Cys Arg Glu Leu
1 5 10

<210> SEQ ID NO 60
<211> LENGTH: 10

```
<212> TYPE: PRT
<213> ORGANISM: Artificial Sequence
<220> FEATURE:
<223> OTHER INFORMATION: Synthetic: FMC63 Mimotope Mutant

<400> SEQUENCE: 60

Arg Leu Cys Ala Trp Ser Cys Arg Glu Leu
1               5                   10


<210> SEQ ID NO 61
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 61

Arg Leu Ala Pro Trp Ser Cys Arg Glu Leu
1               5                   10


<210> SEQ ID NO 62
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 62

Arg Ala Cys Pro Trp Ser Cys Arg Glu Leu
1               5                   10


<210> SEQ ID NO 63
<211> LENGTH: 10
<212> TYPE: PRT
<213> ORGANISM: Artificial Sequence
<220> FEATURE:
<223> OTHER INFORMATION: Synthetic: FMC63 Mimotope Mutant

<400> SEQUENCE: 63

Ala Leu Cys Pro Trp Ser Cys Arg Glu Leu
1               5                   10


<210> SEQ ID NO 64
<211> LENGTH: 10
<212> TYPE: PRT
<213> ORGANISM: Artificial Sequence
<220> FEATURE:
<223> OTHER INFORMATION: Synthetic: ID3 Mimotope

<400> SEQUENCE: 64

Ser Lys Leu Lys Gly Lys Ser Gly Pro Glu
1               5                   10


<210> SEQ ID NO 65
<211> LENGTH: 10
<212> TYPE: PRT
<213> ORGANISM: Artificial Sequence
<220> FEATURE:
<223> OTHER INFORMATION: Synthetic: ID3 Mimotope

<400> SEQUENCE: 65

Gln Asn Thr Cys His Ile His Val Ser Thr
1               5                   10


<210> SEQ ID NO 66
<211> LENGTH: 10
<212> TYPE: PRT
```

<213> ORGANISM: Artificial Sequence
<220> FEATURE:
<223> OTHER INFORMATION: Synthetic: ID3 Mimotope

<400> SEQUENCE: 66

Phe His Trp Phe Ile Asn Val Pro Pro Phe
1 5 10

<210> SEQ ID NO 67
<211> LENGTH: 10
<212> TYPE: PRT
<213> ORGANISM: Artificial Sequence
<220> FEATURE:
<223> OTHER INFORMATION: Synthetic: ID3 Mimotope

<400> SEQUENCE: 67

Ile Arg Val Leu Met Ser Arg Val Phe Ala
1 5 10

<210> SEQ ID NO 68
<211> LENGTH: 20
<212> TYPE: PRT
<213> ORGANISM: Artificial Sequence
<220> FEATURE:
<223> OTHER INFORMATION: Synthetic: ID3 Mimotope Multimer

<400> SEQUENCE: 68

Ser Lys Leu Lys Gly Lys Ser Gly Pro Glu Phe His Trp Phe Ile Asn
1 5 10 15

Val Pro Pro Phe
20

<210> SEQ ID NO 69
<211> LENGTH: 20
<212> TYPE: PRT
<213> ORGANISM: Artificial Sequence
<220> FEATURE:
<223> OTHER INFORMATION: Synthetic: ID3 Mimotope Multimer

<400> SEQUENCE: 69

Ser Lys Leu Lys Gly Lys Ser Gly Pro Glu Ile Arg Val Leu Met Ser
1 5 10 15

Arg Val Phe Ala
20

<210> SEQ ID NO 70
<211> LENGTH: 242
<212> TYPE: PRT
<213> ORGANISM: Artificial Sequence
<220> FEATURE:
<223> OTHER INFORMATION: Synthetic: FMC63 scFv

<400> SEQUENCE: 70

Asp Ile Gln Met Thr Gln Thr Thr Ser Ser Leu Ser Ala Ser Leu Gly
1 5 10 15

Asp Arg Val Thr Ile Ser Cys Arg Ala Ser Gln Asp Ile Ser Lys Tyr
20 25 30

Leu Asn Trp Tyr Gln Gln Lys Pro Asp Gly Thr Val Lys Leu Leu Ile
35 40 45

Tyr His Thr Ser Arg Leu His Ser Gly Val Pro Ser Arg Phe Ser Gly
50 55 60

Ser Gly Ser Gly Thr Asp Tyr Ser Leu Thr Ile Ser Asn Leu Glu Gln
65 70 75 80

-continued

```
Glu Asp Ile Ala Thr Tyr Phe Cys Gln Gln Gly Asn Thr Leu Pro Tyr
                85                  90                  95

Thr Phe Gly Gly Gly Thr Lys Leu Glu Ile Thr Gly Gly Gly Gly Ser
            100                 105                 110

Gly Gly Gly Gly Ser Gly Gly Gly Gly Ser Glu Val Lys Leu Gln Glu
        115                 120                 125

Ser Gly Pro Gly Leu Val Ala Pro Ser Gln Ser Leu Ser Val Thr Cys
    130                 135                 140

Thr Val Ser Gly Val Ser Leu Pro Asp Tyr Gly Val Ser Trp Ile Arg
145                 150                 155                 160

Gln Pro Pro Arg Lys Gly Leu Glu Trp Leu Gly Val Ile Trp Gly Ser
                165                 170                 175

Glu Thr Thr Tyr Tyr Asn Ser Ala Leu Lys Ser Arg Leu Thr Ile Ile
            180                 185                 190

Lys Asp Asn Ser Lys Ser Gln Val Phe Leu Lys Met Asn Ser Leu Gln
        195                 200                 205

Thr Asp Asp Thr Ala Ile Tyr Tyr Cys Ala Lys His Tyr Tyr Tyr Gly
    210                 215                 220

Gly Ser Tyr Ala Met Asp Tyr Trp Gly Gln Gly Thr Ser Val Thr Val
225                 230                 235                 240

Ser Ser
```

<210> SEQ ID NO 71
<211> LENGTH: 107
<212> TYPE: PRT
<213> ORGANISM: Artificial Sequence
<220> FEATURE:
<223> OTHER INFORMATION: Synthetic: FMC63 VH

<400> SEQUENCE: 71

```
Asp Ile Gln Met Thr Gln Thr Thr Ser Ser Leu Ser Ala Ser Leu Gly
1               5                   10                  15

Asp Arg Val Thr Ile Ser Cys Arg Ala Ser Gln Asp Ile Ser Lys Tyr
            20                  25                  30

Leu Asn Trp Tyr Gln Gln Lys Pro Asp Gly Thr Val Lys Leu Leu Ile
        35                  40                  45

Tyr His Thr Ser Arg Leu His Ser Gly Val Pro Ser Arg Phe Ser Gly
    50                  55                  60

Ser Gly Ser Gly Thr Asp Tyr Ser Leu Thr Ile Ser Asn Leu Glu Gln
65                  70                  75                  80

Glu Asp Ile Ala Thr Tyr Phe Cys Gln Gln Gly Asn Thr Leu Pro Tyr
                85                  90                  95

Thr Phe Gly Gly Gly Thr Lys Leu Glu Ile Thr
            100                 105
```

<210> SEQ ID NO 72
<211> LENGTH: 120
<212> TYPE: PRT
<213> ORGANISM: Artificial Sequence
<220> FEATURE:
<223> OTHER INFORMATION: Synthetic: FMC63 VL

<400> SEQUENCE: 72

```
Glu Val Lys Leu Gln Glu Ser Gly Pro Gly Leu Val Ala Pro Ser Gln
1               5                   10                  15

Ser Leu Ser Val Thr Cys Thr Val Ser Gly Val Ser Leu Pro Asp Tyr
            20                  25                  30
```

-continued

Gly Val Ser Trp Ile Arg Gln Pro Pro Arg Lys Gly Leu Glu Trp Leu
        35                  40                  45

Gly Val Ile Trp Gly Ser Glu Thr Thr Tyr Tyr Asn Ser Ala Leu Lys
    50                  55                  60

Ser Arg Leu Thr Ile Ile Lys Asp Asn Ser Lys Ser Gln Val Phe Leu
65                  70                  75                  80

Lys Met Asn Ser Leu Gln Thr Asp Asp Thr Ala Ile Tyr Tyr Cys Ala
                85                  90                  95

Lys His Tyr Tyr Tyr Gly Gly Ser Tyr Ala Met Asp Tyr Trp Gly Gln
            100                 105                 110

Gly Thr Ser Val Thr Val Ser Ser
        115                 120

<210> SEQ ID NO 73
<211> LENGTH: 15
<212> TYPE: PRT
<213> ORGANISM: Artificial Sequence
<220> FEATURE:
<223> OTHER INFORMATION: Synthetic: FMC63 scFv linker

<400> SEQUENCE: 73

Gly Gly Gly Gly Ser Gly Gly Gly Gly Ser Gly Gly Gly Gly Ser
1               5                   10                  15

<210> SEQ ID NO 74
<211> LENGTH: 43
<212> TYPE: PRT
<213> ORGANISM: Mus musculus
<220> FEATURE:
<221> NAME/KEY: misc_feature
<222> LOCATION: (1)..(43)
<223> OTHER INFORMATION: Mouse CD8 hinge

<400> SEQUENCE: 74

Thr Thr Thr Lys Pro Val Leu Arg Thr Pro Ser Pro Val His Pro Thr
1               5                   10                  15

Gly Thr Ser Gln Pro Gln Arg Pro Glu Asp Cys Arg Pro Arg Gly Ser
            20                  25                  30

Val Lys Gly Thr Gly Leu Asp Phe Ala Cys Asp
        35                  40

<210> SEQ ID NO 75
<211> LENGTH: 23
<212> TYPE: PRT
<213> ORGANISM: Mus musculus
<220> FEATURE:
<221> NAME/KEY: misc_feature
<222> LOCATION: (1)..(23)
<223> OTHER INFORMATION: Mouse CD8 transmembrane

<400> SEQUENCE: 75

Ile Tyr Ile Trp Ala Pro Leu Ala Gly Ile Cys Val Ala Leu Leu Leu
1               5                   10                  15

Ser Leu Ile Ile Thr Leu Ile
            20

<210> SEQ ID NO 76
<211> LENGTH: 64
<212> TYPE: PRT
<213> ORGANISM: Mus musculus
<220> FEATURE:
<221> NAME/KEY: misc_feature
<222> LOCATION: (1)..(64)
<223> OTHER INFORMATION: Mouse CD28 costimulatory domain

<400> SEQUENCE: 76

Ile Tyr Ile Trp Ala Pro Leu Ala Gly Ile Cys Val Ala Leu Leu Leu
1 5 10 15

Ser Leu Ile Ile Thr Leu Ile Asn Ser Arg Arg Asn Arg Leu Leu Gln
20 25 30

Ser Asp Tyr Met Asn Met Thr Pro Arg Arg Pro Gly Leu Thr Arg Lys
35 40 45

Pro Tyr Gln Pro Tyr Ala Pro Ala Arg Asp Phe Ala Ala Tyr Arg Pro
50 55 60

<210> SEQ ID NO 77
<211> LENGTH: 113
<212> TYPE: PRT
<213> ORGANISM: Mus musculus
<220> FEATURE:
<221> NAME/KEY: misc_feature
<222> LOCATION: (1)..(113)
<223> OTHER INFORMATION: Mouse CD3-Zeta intracellular domain

<400> SEQUENCE: 77

Arg Ala Lys Phe Ser Arg Ser Ala Glu Thr Ala Ala Asn Leu Gln Asp
1 5 10 15

Pro Asn Gln Leu Tyr Asn Glu Leu Asn Leu Gly Arg Arg Glu Glu Tyr
20 25 30

Asp Val Leu Glu Lys Lys Arg Ala Arg Asp Pro Glu Met Gly Gly Lys
35 40 45

Gln Gln Arg Arg Arg Asn Pro Gln Glu Gly Val Tyr Asn Ala Leu Gln
50 55 60

Lys Asp Lys Met Ala Glu Ala Tyr Ser Glu Ile Gly Thr Lys Gly Glu
65 70 75 80

Arg Arg Arg Gly Lys Gly His Asp Gly Leu Tyr Gln Gly Leu Ser Thr
85 90 95

Ala Thr Lys Asp Thr Tyr Asp Ala Leu His Met Gln Thr Leu Ala Pro
100 105 110

Arg

<210> SEQ ID NO 78
<211> LENGTH: 493
<212> TYPE: PRT
<213> ORGANISM: Artificial Sequence
<220> FEATURE:
<223> OTHER INFORMATION: Synthetic: FMC63 hybrid CAR

<400> SEQUENCE: 78

Met Ala Leu Pro Val Thr Ala Leu Leu Leu Pro Leu Ala Leu Leu Leu
1 5 10 15

His Ala Ala Arg Pro Glu Gln Lys Leu Ile Ser Glu Glu Asp Leu Asp
20 25 30

Ile Gln Met Thr Gln Thr Thr Ser Ser Leu Ser Ala Ser Leu Gly Asp
35 40 45

Arg Val Thr Ile Ser Cys Arg Ala Ser Gln Asp Ile Ser Lys Tyr Leu
50 55 60

Asn Trp Tyr Gln Gln Lys Pro Asp Gly Thr Val Lys Leu Leu Ile Tyr
65 70 75 80

His Thr Ser Arg Leu His Ser Gly Val Pro Ser Arg Phe Ser Gly Ser
85 90 95

Gly Ser Gly Thr Asp Tyr Ser Leu Thr Ile Ser Asn Leu Glu Gln Glu

```
            100                 105                 110

Asp Ile Ala Thr Tyr Phe Cys Gln Gln Gly Asn Thr Leu Pro Tyr Thr
        115                 120                 125

Phe Gly Gly Gly Thr Lys Leu Glu Ile Thr Gly Gly Gly Gly Ser Gly
    130                 135                 140

Gly Gly Gly Ser Gly Gly Gly Gly Ser Glu Val Lys Leu Gln Glu Ser
145                 150                 155                 160

Gly Pro Gly Leu Val Ala Pro Ser Gln Ser Leu Ser Val Thr Cys Thr
                165                 170                 175

Val Ser Gly Val Ser Leu Pro Asp Tyr Gly Val Ser Trp Ile Arg Gln
            180                 185                 190

Pro Pro Arg Lys Gly Leu Glu Trp Leu Gly Val Ile Trp Gly Ser Glu
        195                 200                 205

Thr Thr Tyr Tyr Asn Ser Ala Leu Lys Ser Arg Leu Thr Ile Ile Lys
    210                 215                 220

Asp Asn Ser Lys Ser Gln Val Phe Leu Lys Met Asn Ser Leu Gln Thr
225                 230                 235                 240

Asp Asp Thr Ala Ile Tyr Tyr Cys Ala Lys His Tyr Tyr Tyr Gly Gly
                245                 250                 255

Ser Tyr Ala Met Asp Tyr Trp Gly Gln Gly Thr Ser Val Thr Val Ser
            260                 265                 270

Ser Thr Thr Thr Lys Pro Val Leu Arg Thr Pro Ser Pro Val His Pro
        275                 280                 285

Thr Gly Thr Ser Gln Pro Gln Arg Pro Glu Asp Cys Arg Pro Arg Gly
    290                 295                 300

Ser Val Lys Gly Thr Gly Leu Asp Phe Ala Cys Asp Ile Tyr Ile Trp
305                 310                 315                 320

Ala Pro Leu Ala Gly Ile Cys Val Ala Leu Leu Leu Ser Leu Ile Ile
                325                 330                 335

Thr Leu Ile Asn Ser Arg Arg Asn Arg Leu Leu Gln Ser Asp Tyr Met
            340                 345                 350

Asn Met Thr Pro Arg Arg Pro Gly Leu Thr Arg Lys Pro Tyr Gln Pro
        355                 360                 365

Tyr Ala Pro Ala Arg Asp Phe Ala Ala Tyr Arg Pro Arg Ala Lys Phe
    370                 375                 380

Ser Arg Ser Ala Glu Thr Ala Ala Asn Leu Gln Asp Pro Asn Gln Leu
385                 390                 395                 400

Tyr Asn Glu Leu Asn Leu Gly Arg Arg Glu Glu Tyr Asp Val Leu Glu
                405                 410                 415

Lys Lys Arg Ala Arg Asp Pro Glu Met Gly Gly Lys Gln Gln Arg Arg
            420                 425                 430

Arg Asn Pro Gln Glu Gly Val Tyr Asn Ala Leu Gln Lys Asp Lys Met
        435                 440                 445

Ala Glu Ala Tyr Ser Glu Ile Gly Thr Lys Gly Glu Arg Arg Arg Gly
    450                 455                 460

Lys Gly His Asp Gly Leu Tyr Gln Gly Leu Ser Thr Ala Thr Lys Asp
465                 470                 475                 480

Thr Tyr Asp Ala Leu His Met Gln Thr Leu Ala Pro Arg
                485                 490
```

<210> SEQ ID NO 79
<211> LENGTH: 238
<212> TYPE: PRT
<213> ORGANISM: Artificial Sequence

```
<220> FEATURE:
<223> OTHER INFORMATION: Synthetic: 1D3 scFv

<400> SEQUENCE: 79

Asp Ile Gln Met Thr Gln Ser Pro Ala Ser Leu Ser Thr Ser Leu Gly
1               5                   10                  15

Glu Thr Val Thr Ile Gln Cys Gln Ala Ser Glu Asp Ile Tyr Ser Gly
            20                  25                  30

Leu Ala Trp Tyr Gln Gln Lys Pro Gly Lys Ser Pro Gln Leu Leu Ile
        35                  40                  45

Tyr Gly Ala Ser Asp Leu Gln Asp Gly Val Pro Ser Arg Phe Ser Gly
    50                  55                  60

Ser Gly Ser Gly Thr Gln Tyr Ser Leu Lys Ile Thr Ser Met Gln Thr
65                  70                  75                  80

Glu Asp Glu Gly Val Tyr Phe Cys Gln Gln Gly Leu Thr Tyr Pro Arg
                85                  90                  95

Thr Phe Gly Gly Gly Thr Lys Leu Glu Leu Lys Gly Gly Gly Gly Ser
            100                 105                 110

Gly Gly Gly Gly Ser Gly Gly Gly Gly Ser Glu Val Gln Leu Gln Gln
        115                 120                 125

Ser Gly Ala Glu Leu Val Arg Pro Gly Thr Ser Val Lys Leu Ser Cys
    130                 135                 140

Lys Val Ser Gly Asp Thr Ile Thr Phe Tyr Tyr Met His Phe Val Lys
145                 150                 155                 160

Gln Arg Pro Gly Gln Gly Leu Glu Trp Ile Gly Arg Ile Asp Pro Glu
                165                 170                 175

Asp Glu Ser Thr Lys Tyr Ser Glu Lys Phe Lys Asn Lys Ala Thr Leu
            180                 185                 190

Thr Ala Asp Thr Ser Ser Asn Thr Ala Tyr Leu Lys Leu Ser Ser Leu
        195                 200                 205

Thr Ser Glu Asp Thr Ala Thr Tyr Phe Cys Ile Tyr Gly Gly Tyr Tyr
    210                 215                 220

Phe Asp Tyr Trp Gly Gln Gly Val Met Val Thr Val Ser Ser
225                 230                 235


<210> SEQ ID NO 80
<211> LENGTH: 107
<212> TYPE: PRT
<213> ORGANISM: Artificial Sequence
<220> FEATURE:
<223> OTHER INFORMATION: Synthetic: 1D3 VH

<400> SEQUENCE: 80

Asp Ile Gln Met Thr Gln Ser Pro Ala Ser Leu Ser Thr Ser Leu Gly
1               5                   10                  15

Glu Thr Val Thr Ile Gln Cys Gln Ala Ser Glu Asp Ile Tyr Ser Gly
            20                  25                  30

Leu Ala Trp Tyr Gln Gln Lys Pro Gly Lys Ser Pro Gln Leu Leu Ile
        35                  40                  45

Tyr Gly Ala Ser Asp Leu Gln Asp Gly Val Pro Ser Arg Phe Ser Gly
    50                  55                  60

Ser Gly Ser Gly Thr Gln Tyr Ser Leu Lys Ile Thr Ser Met Gln Thr
65                  70                  75                  80

Glu Asp Glu Gly Val Tyr Phe Cys Gln Gln Gly Leu Thr Tyr Pro Arg
                85                  90                  95

Thr Phe Gly Gly Gly Thr Lys Leu Glu Leu Lys
```

100 105

<210> SEQ ID NO 81
<211> LENGTH: 15
<212> TYPE: PRT
<213> ORGANISM: Artificial Sequence
<220> FEATURE:
<223> OTHER INFORMATION: Synthetic: 1D3 VL

<400> SEQUENCE: 81

Gly Gly Gly Gly Ser Gly Gly Gly Gly Ser Gly Gly Gly Gly Ser
1 5 10 15

<210> SEQ ID NO 82
<211> LENGTH: 116
<212> TYPE: PRT
<213> ORGANISM: Artificial Sequence
<220> FEATURE:
<223> OTHER INFORMATION: Synthetic: 1D3 linker

<400> SEQUENCE: 82

Glu Val Gln Leu Gln Gln Ser Gly Ala Glu Leu Val Arg Pro Gly Thr
1 5 10 15

Ser Val Lys Leu Ser Cys Lys Val Ser Gly Asp Thr Ile Thr Phe Tyr
20 25 30

Tyr Met His Phe Val Lys Gln Arg Pro Gly Gln Gly Leu Glu Trp Ile
35 40 45

Gly Arg Ile Asp Pro Glu Asp Glu Ser Thr Lys Tyr Ser Glu Lys Phe
50 55 60

Lys Asn Lys Ala Thr Leu Thr Ala Asp Thr Ser Ser Asn Thr Ala Tyr
65 70 75 80

Leu Lys Leu Ser Ser Leu Thr Ser Glu Asp Thr Ala Thr Tyr Phe Cys
85 90 95

Ile Tyr Gly Gly Tyr Tyr Phe Asp Tyr Trp Gly Gln Gly Val Met Val
100 105 110

Thr Val Ser Ser
115

<210> SEQ ID NO 83
<211> LENGTH: 137
<212> TYPE: PRT
<213> ORGANISM: Artificial Sequence
<220> FEATURE:
<223> OTHER INFORMATION: Synthetic: (Aga2p)-(HA)-(Gly4Ser)3-(NNK)10 (aa)

<400> SEQUENCE: 83

Met Gln Leu Leu Arg Cys Phe Ser Ile Phe Ser Val Ile Ala Ser Val
1 5 10 15

Leu Ala Gln Glu Leu Thr Thr Ile Cys Glu Gln Ile Pro Ser Pro Thr
20 25 30

Leu Glu Ser Thr Pro Tyr Ser Leu Ser Thr Thr Thr Ile Leu Ala Asn
35 40 45

Gly Lys Ala Met Gln Gly Val Phe Glu Tyr Tyr Lys Ser Val Thr Phe
50 55 60

Val Ser Asn Cys Gly Ser His Pro Ser Thr Thr Ser Lys Gly Ser Pro
65 70 75 80

Ile Asn Thr Gln Tyr Val Phe Lys Asp Asn Ser Ser Thr Ile Glu Gly
85 90 95

Arg Tyr Pro Tyr Asp Val Pro Asp Tyr Ala Leu Gln Ala Ser Gly Gly
100 105 110

```
Gly Gly Ser Gly Gly Gly Gly Ser Gly Gly Gly Gly Ser Ala Ser Asn
        115                 120                 125

Asn Asn Asn Asn Asn Asn Asn Asn Asn
    130                 135


<210> SEQ ID NO 84
<211> LENGTH: 411
<212> TYPE: DNA
<213> ORGANISM: Artificial Sequence
<220> FEATURE:
<223> OTHER INFORMATION: Synthetic: (Aga2p)-(HA)-(Gly4Ser)3-(NNK)10
      (DNA)
<220> FEATURE:
<221> NAME/KEY: misc_feature
<222> LOCATION: (382)..(383)
<223> OTHER INFORMATION: n is a, c, g, or t
<220> FEATURE:
<221> NAME/KEY: misc_feature
<222> LOCATION: (385)..(386)
<223> OTHER INFORMATION: n is a, c, g, or t
<220> FEATURE:
<221> NAME/KEY: misc_feature
<222> LOCATION: (388)..(389)
<223> OTHER INFORMATION: n is a, c, g, or t
<220> FEATURE:
<221> NAME/KEY: misc_feature
<222> LOCATION: (391)..(392)
<223> OTHER INFORMATION: n is a, c, g, or t
<220> FEATURE:
<221> NAME/KEY: misc_feature
<222> LOCATION: (394)..(395)
<223> OTHER INFORMATION: n is a, c, g, or t
<220> FEATURE:
<221> NAME/KEY: misc_feature
<222> LOCATION: (397)..(398)
<223> OTHER INFORMATION: n is a, c, g, or t
<220> FEATURE:
<221> NAME/KEY: misc_feature
<222> LOCATION: (400)..(401)
<223> OTHER INFORMATION: n is a, c, g, or t
<220> FEATURE:
<221> NAME/KEY: misc_feature
<222> LOCATION: (403)..(404)
<223> OTHER INFORMATION: n is a, c, g, or t
<220> FEATURE:
<221> NAME/KEY: misc_feature
<222> LOCATION: (406)..(407)
<223> OTHER INFORMATION: n is a, c, g, or t
<220> FEATURE:
<221> NAME/KEY: misc_feature
<222> LOCATION: (409)..(410)
<223> OTHER INFORMATION: n is a, c, g, or t

<400> SEQUENCE: 84

atgcagttac ttcgctgttt ttcaatattt tctgttattg cttcagtttt agcacaggaa     60

ctgacaacta tatgcgagca aatcccctca ccaactttag aatcgacgcc gtactctttg    120

tcaacgacta ctattttggc caacgggaag gcaatgcaag gagtttttga atattacaaa    180

tcagtaacgt ttgtcagtaa ttgcggttct cacccctcaa caactagcaa aggcagcccc    240

ataaacacac agtatgtttt taaggacaat agctcgacga ttgaaggtag atacccatac    300

gacgttccag actacgctct gcaggctagt ggtggaggag gctctggtgg aggcggtagc    360

ggaggcggag ggtcggctag cnnknnknnk nnknnknnkn nknnknnknn k             411


<210> SEQ ID NO 85
<211> LENGTH: 137
<212> TYPE: PRT
<213> ORGANISM: Artificial Sequence
<220> FEATURE:
<223> OTHER INFORMATION: Synthetic: (Aga2p)-(HA)-(Gly4Ser)3-
```

```
      (RXCPWXCXXX)10 (aa)
<220> FEATURE:
<221> NAME/KEY: misc_feature
<222> LOCATION: (129)..(129)
<223> OTHER INFORMATION: Xaa can be any naturally occurring amino acid
<220> FEATURE:
<221> NAME/KEY: misc_feature
<222> LOCATION: (133)..(133)
<223> OTHER INFORMATION: Xaa can be any naturally occurring amino acid
<220> FEATURE:
<221> NAME/KEY: misc_feature
<222> LOCATION: (135)..(137)
<223> OTHER INFORMATION: Xaa can be any naturally occurring amino acid

<400> SEQUENCE: 85

Met Gln Leu Leu Arg Cys Phe Ser Ile Phe Ser Val Ile Ala Ser Val
1               5                   10                  15

Leu Ala Gln Glu Leu Thr Thr Ile Cys Glu Gln Ile Pro Ser Pro Thr
            20                  25                  30

Leu Glu Ser Thr Pro Tyr Ser Leu Ser Thr Thr Thr Ile Leu Ala Asn
        35                  40                  45

Gly Lys Ala Met Gln Gly Val Phe Glu Tyr Tyr Lys Ser Val Thr Phe
    50                  55                  60

Val Ser Asn Cys Gly Ser His Pro Ser Thr Thr Ser Lys Gly Ser Pro
65                  70                  75                  80

Ile Asn Thr Gln Tyr Val Phe Lys Asp Asn Ser Ser Thr Ile Glu Gly
                85                  90                  95

Arg Tyr Pro Tyr Asp Val Pro Asp Tyr Ala Leu Gln Ala Ser Gly Gly
            100                 105                 110

Gly Gly Ser Gly Gly Gly Gly Ser Gly Gly Gly Gly Ser Ala Ser Arg
        115                 120                 125

Xaa Cys Pro Trp Xaa Cys Xaa Xaa Xaa
    130                 135


<210> SEQ ID NO 86
<211> LENGTH: 411
<212> TYPE: DNA
<213> ORGANISM: Artificial Sequence
<220> FEATURE:
<223> OTHER INFORMATION: Synthetic: for (Aga2p)-(HA)-(Gly4Ser)3-
      (RXCPWXCXXX)10 (dna)
<220> FEATURE:
<221> NAME/KEY: misc_feature
<222> LOCATION: (385)..(386)
<223> OTHER INFORMATION: n is a, c, g, or t
<220> FEATURE:
<221> NAME/KEY: misc_feature
<222> LOCATION: (397)..(398)
<223> OTHER INFORMATION: n is a, c, g, or t
<220> FEATURE:
<221> NAME/KEY: misc_feature
<222> LOCATION: (403)..(404)
<223> OTHER INFORMATION: n is a, c, g, or t
<220> FEATURE:
<221> NAME/KEY: misc_feature
<222> LOCATION: (406)..(407)
<223> OTHER INFORMATION: n is a, c, g, or t
<220> FEATURE:
<221> NAME/KEY: misc_feature
<222> LOCATION: (409)..(410)
<223> OTHER INFORMATION: n is a, c, g, or t

<400> SEQUENCE: 86

atgcagttac ttcgctgttt ttcaatattt tctgttattg cttcagtttt agcacaggaa     60

ctgacaacta tatgcgagca aatcccctca ccaactttag aatcgacgcc gtactctttg    120

tcaacgacta ctattttggc caacgggaag gcaatgcaag gagtttttga atattacaaa    180
```

tcagtaacgt ttgtcagtaa ttgcggttct caccccctcaa caactagcaa aggcagcccc 240
ataaacacac agtatgtttt taaggacaat agctcgacga ttgaaggtag atacccatac 300
gacgttccag actacgctct gcaggctagt ggtggaggag gctctggtgg aggcggtagc 360
ggaggcggag ggtcggctag ccgtnnktgt ccgtggnnkt gtnnknnknn k 411

<210> SEQ ID NO 87
<211> LENGTH: 21
<212> TYPE: PRT
<213> ORGANISM: Homo sapiens
<220> FEATURE:
<221> NAME/KEY: misc_feature
<222> LOCATION: (1)..(21)
<223> OTHER INFORMATION: Human CD8 Signal peptide

<400> SEQUENCE: 87

Met Ala Leu Pro Val Thr Ala Leu Leu Leu Pro Leu Ala Leu Leu Leu
1 5 10 15

His Ala Ala Arg Pro
20

<210> SEQ ID NO 88
<211> LENGTH: 321
<212> TYPE: DNA
<213> ORGANISM: Artificial Sequence
<220> FEATURE:
<223> OTHER INFORMATION: Synthetic: FMC63 VH nucleotide

<400> SEQUENCE: 88
gacatccaga tgacacagac tacatcctcc ctgtctgcct ctctgggaga cagagtcacc 60
atcagttgca gggcaagtca ggacatttcc aagtatctta attggtatca gcagaaacca 120
gatggaactg ttaaactcct gatctaccat acatcaagat tacactcagg agtcccatca 180
aggttcagtg gcagtgggtc tggaacagat tattctctca ccattagcaa cctggagcaa 240
gaagatattg ccacttactt ttgccaacag ggtaatacgc ttccgtacac gttcggaggg 300
gggaccaagc tggagatcac a 321

<210> SEQ ID NO 89
<211> LENGTH: 360
<212> TYPE: DNA
<213> ORGANISM: Artificial Sequence
<220> FEATURE:
<223> OTHER INFORMATION: Synthetic: FMC63 VL nucleotide

<400> SEQUENCE: 89
gaggtgaaac tgcaggagtc aggacctggc ctggtggcgc cctcacagag cctgtccgtc 60
acatgcactg tctcaggggt ctcattaccc gactatggtg taagctggat tcgccagcct 120
ccacgaaagg gtctggagtg gctgggagta atatggggta gtgaaaccac atactataat 180
tcagctctca aatccagact gaccatcatc aaggacaact ccaagagcca agttttctta 240
aaaatgaaca gtctgcaaac tgatgacaca gccatttact actgtgccaa acattattac 300
tacggtggta gctatgctat ggactactgg ggccaaggaa cctcagtcac cgtctcctca 360

<210> SEQ ID NO 90
<211> LENGTH: 129
<212> TYPE: DNA
<213> ORGANISM: Homo sapiens
<220> FEATURE:
<221> NAME/KEY: misc_feature
<222> LOCATION: (1)..(129)

<223> OTHER INFORMATION: Human CD8 signal peptide nucleotide

<400> SEQUENCE: 90
actactacca agccagtgct gcgaactccc tcacctgtgc accctaccgg gacatctcag 60
ccccagagac cagaagattg tcggccccgt ggctcagtga aggggaccgg attggacttc 120
gcctgtgat 129

<210> SEQ ID NO 91
<211> LENGTH: 69
<212> TYPE: DNA
<213> ORGANISM: Mus musculus
<220> FEATURE:
<221> NAME/KEY: misc_feature
<222> LOCATION: (1)..(69)
<223> OTHER INFORMATION: Mouse CD8 hinge nucleotide

<400> SEQUENCE: 91
atttacatct gggcaccctt ggccggaatc tgcgtggccc ttctgctgtc cttgatcatc 60
actctcatc 69

<210> SEQ ID NO 92
<211> LENGTH: 123
<212> TYPE: DNA
<213> ORGANISM: Mus musculus
<220> FEATURE:
<221> NAME/KEY: misc_feature
<222> LOCATION: (1)..(123)
<223> OTHER INFORMATION: Mouse CD8 transmembrane domain nucleotide

<400> SEQUENCE: 92
aatagtagaa ggaacagact ccttcaaagt gactacatga acatgactcc ccggaggcct 60
gggctcactc gaaagcctta ccagccctac gcccctgcca gagactttgc agcgtaccgc 120
ccc 123

<210> SEQ ID NO 93
<211> LENGTH: 339
<212> TYPE: DNA
<213> ORGANISM: Mus musculus
<220> FEATURE:
<221> NAME/KEY: misc_feature
<222> LOCATION: (1)..(339)
<223> OTHER INFORMATION: Mouse CD3zeta signaling domain nucleotide

<400> SEQUENCE: 93
agagcaaaat tcagcaggag tgcagagact gctgccaacc tgcaggaccc caaccagctc 60
tacaatgagc tcaatctagg gcgaagagag gaatatgacg tcttggagaa gaagcgggct 120
cgggacccag agatgggagg caaacagcag aggaggagga acccccagga aggcgtatac 180
aatgcactgc agaaagacaa gatggcagaa gcctacagtg agatcggcac aaaaggcgag 240
aggcggagag gcaaggggca cgatggcctt taccagggtc tcagcactgc caccaaggac 300
acctatgatg ccctgcatat gcagaccctg gcccctcgc 339

<210> SEQ ID NO 94
<211> LENGTH: 45
<212> TYPE: DNA
<213> ORGANISM: Artificial Sequence
<220> FEATURE:
<223> OTHER INFORMATION: Synthetic: FMC63 linker nucleotide

<400> SEQUENCE: 94
ggtggcggtg gctcgggcgg tggtgggtcg ggtggcggcg gatct 45

<210> SEQ ID NO 95
<211> LENGTH: 13
<212> TYPE: PRT
<213> ORGANISM: Artificial Sequence
<220> FEATURE:
<223> OTHER INFORMATION: Synthetic: F12 derivative

<400> SEQUENCE: 95

```
Ser Ala Ser Arg Ile Cys Pro Trp Asn Cys Lys Glu Leu
1               5                   10
```

<210> SEQ ID NO 96
<211> LENGTH: 16
<212> TYPE: PRT
<213> ORGANISM: Artificial Sequence
<220> FEATURE:
<223> OTHER INFORMATION: Synthetic: F12 derivative

<400> SEQUENCE: 96

```
Gly Gly Gly Ser Ala Ser Arg Ile Cys Pro Trp Asn Cys Lys Glu Leu
1               5                   10                  15
```

<210> SEQ ID NO 97
<211> LENGTH: 20
<212> TYPE: PRT
<213> ORGANISM: Artificial Sequence
<220> FEATURE:
<223> OTHER INFORMATION: Synthetic: F12 derivative

<400> SEQUENCE: 97

```
Gly Gly Ser Gly Gly Gly Gly Ser Ala Ser Arg Ile Cys Pro Trp Asn
1               5                   10                  15

Cys Lys Glu Leu
            20
```

<210> SEQ ID NO 98
<211> LENGTH: 24
<212> TYPE: PRT
<213> ORGANISM: Artificial Sequence
<220> FEATURE:
<223> OTHER INFORMATION: Synthetic: F12 derivative

<400> SEQUENCE: 98

```
Gly Ser Gly Gly Gly Gly Ser Gly Gly Gly Gly Ser Ala Ser Arg Ile
1               5                   10                  15

Cys Pro Trp Asn Cys Lys Glu Leu
            20
```

<210> SEQ ID NO 99
<211> LENGTH: 27
<212> TYPE: PRT
<213> ORGANISM: Artificial Sequence
<220> FEATURE:
<223> OTHER INFORMATION: Synthetic: F12 derivative

<400> SEQUENCE: 99

```
Gly Gly Gly Gly Ser Gly Gly Gly Gly Ser Gly Gly Gly Gly Ser Ala
1               5                   10                  15

Ser Arg Ile Cys Pro Trp Asn Cys Lys Glu Leu
            20                  25
```

<210> SEQ ID NO 100
<211> LENGTH: 26
<212> TYPE: PRT

<213> ORGANISM: Artificial Sequence
<220> FEATURE:
<223> OTHER INFORMATION: Synthetic: FMC63 mimotope (A1)

<400> SEQUENCE: 100

```
Pro Arg Lys His Ser Gly Arg Ile Cys Pro Trp Asn Cys Lys Glu Leu
1               5                   10                  15

Asp Asn Pro Pro Phe Ile Phe Gly Asn Arg
            20                  25
```

<210> SEQ ID NO 101
<211> LENGTH: 19
<212> TYPE: PRT
<213> ORGANISM: Artificial Sequence
<220> FEATURE:
<223> OTHER INFORMATION: Synthetic: FMC63 mimotope (A3)

<400> SEQUENCE: 101

```
Arg Ile Cys Pro Trp Asn Cys Lys Glu Leu Pro Thr Pro Tyr Met Met
1               5                   10                  15

Phe Asp Met
```

<210> SEQ ID NO 102
<211> LENGTH: 19
<212> TYPE: PRT
<213> ORGANISM: Artificial Sequence
<220> FEATURE:
<223> OTHER INFORMATION: Synthetic: FMC63 mimotope (A5)

<400> SEQUENCE: 102

```
Pro Leu Ser Arg Ile Cys Pro Trp Asn Cys Lys Glu Leu Tyr Trp Leu
1               5                   10                  15

Pro Gln Arg
```

<210> SEQ ID NO 103
<211> LENGTH: 30
<212> TYPE: PRT
<213> ORGANISM: Artificial Sequence
<220> FEATURE:
<223> OTHER INFORMATION: Synthetic: FMC63 mimotope (A10)

<400> SEQUENCE: 103

```
Ala Lys Arg Arg Glu Arg Asp Tyr Val Gly Arg Ile Cys Pro Trp Asn
1               5                   10                  15

Cys Lys Glu Leu His Pro Asp Thr Arg His Arg Ile Pro Val
            20                  25                  30
```

<210> SEQ ID NO 104
<211> LENGTH: 16
<212> TYPE: PRT
<213> ORGANISM: Artificial Sequence
<220> FEATURE:
<223> OTHER INFORMATION: Synthetic: FMC63 mimotope (A11)

<400> SEQUENCE: 104

```
Arg Ile Cys Pro Trp Asn Cys Lys Glu Leu Tyr Trp Leu Pro Asp Glu
1               5                   10                  15
```

<210> SEQ ID NO 105
<211> LENGTH: 19
<212> TYPE: PRT
<213> ORGANISM: Artificial Sequence
<220> FEATURE:
<223> OTHER INFORMATION: Synthetic: FMC63 mimotope (B5)

<400> SEQUENCE: 105

Pro Pro Pro Arg Ile Cys Pro Trp Asn Cys Lys Glu Leu Pro Leu Asp
1 5 10 15

Trp Pro Trp

<210> SEQ ID NO 106
<211> LENGTH: 20
<212> TYPE: PRT
<213> ORGANISM: Artificial Sequence
<220> FEATURE:
<223> OTHER INFORMATION: Synthetic: FMC63 mimotope (C2)

<400> SEQUENCE: 106

Arg Ile Cys Pro Trp Asn Cys Lys Glu Leu Pro Ser Pro Pro Arg Ile
1 5 10 15

Phe Gly Asn Arg
20

<210> SEQ ID NO 107
<211> LENGTH: 19
<212> TYPE: PRT
<213> ORGANISM: Artificial Sequence
<220> FEATURE:
<223> OTHER INFORMATION: Synthetic: FMC63 mimotope (D11)

<400> SEQUENCE: 107

Ala Gly Thr Arg Ile Cys Pro Trp Asn Cys Lys Glu Leu Tyr Trp Leu
1 5 10 15

Pro Asp Glu

<210> SEQ ID NO 108
<211> LENGTH: 19
<212> TYPE: PRT
<213> ORGANISM: Artificial Sequence
<220> FEATURE:
<223> OTHER INFORMATION: Synthetic: FMC63 mimotope (F5)

<400> SEQUENCE: 108

Gln Phe Gln Arg Ile Cys Pro Trp Asn Cys Lys Glu Leu Tyr Trp Leu
1 5 10 15

Pro Asp Gln

<210> SEQ ID NO 109
<211> LENGTH: 6
<212> TYPE: PRT
<213> ORGANISM: Artificial Sequence
<220> FEATURE:
<223> OTHER INFORMATION: Synthetic: N-terminal flanking residues (FRs)

<400> SEQUENCE: 109

Gly Gly Gly Ser Ala Ser
1 5

<210> SEQ ID NO 110
<211> LENGTH: 10
<212> TYPE: PRT
<213> ORGANISM: Artificial Sequence
<220> FEATURE:
<223> OTHER INFORMATION: Synthetic: N-terminal FRs

<400> SEQUENCE: 110

Gly Gly Ser Gly Gly Gly Gly Ser Ala Ser
1 5 10

-continued

```
<210> SEQ ID NO 111
<211> LENGTH: 14
<212> TYPE: PRT
<213> ORGANISM: Artificial Sequence
<220> FEATURE:
<223> OTHER INFORMATION: Synthetic: N-terminal FRs

<400> SEQUENCE: 111

Gly Ser Gly Gly Gly Gly Ser Gly Gly Gly Gly Ser Ala Ser
1               5                   10


<210> SEQ ID NO 112
<211> LENGTH: 17
<212> TYPE: PRT
<213> ORGANISM: Artificial Sequence
<220> FEATURE:
<223> OTHER INFORMATION: Synthetic: N-terminal FRs

<400> SEQUENCE: 112

Gly Gly Gly Gly Ser Gly Gly Gly Gly Ser Gly Gly Gly Gly Ser Ala
1               5                   10                  15

Ser


<210> SEQ ID NO 113
<211> LENGTH: 6
<212> TYPE: PRT
<213> ORGANISM: Artificial Sequence
<220> FEATURE:
<223> OTHER INFORMATION: Synthetic: N-terminal FRs

<400> SEQUENCE: 113

Pro Arg Lys His Ser Gly
1               5


<210> SEQ ID NO 114
<211> LENGTH: 10
<212> TYPE: PRT
<213> ORGANISM: Artificial Sequence
<220> FEATURE:
<223> OTHER INFORMATION: Synthetic: N-terminal FRs

<400> SEQUENCE: 114

Ala Lys Arg Arg Glu Arg Asp Tyr Val Gly
1               5                   10


<210> SEQ ID NO 115
<211> LENGTH: 10
<212> TYPE: PRT
<213> ORGANISM: Artificial Sequence
<220> FEATURE:
<223> OTHER INFORMATION: Synthetic: C-terminal FRs

<400> SEQUENCE: 115

Asp Asn Pro Pro Phe Ile Phe Gly Asn Arg
1               5                   10


<210> SEQ ID NO 116
<211> LENGTH: 9
<212> TYPE: PRT
<213> ORGANISM: Artificial Sequence
<220> FEATURE:
<223> OTHER INFORMATION: Synthetic: C-terminal FRs

<400> SEQUENCE: 116

Pro Thr Pro Tyr Met Met Phe Asp Met
1               5
```

-continued

```
<210> SEQ ID NO 117
<211> LENGTH: 6
<212> TYPE: PRT
<213> ORGANISM: Artificial Sequence
<220> FEATURE:
<223> OTHER INFORMATION: Synthetic: C-terminal FRs

<400> SEQUENCE: 117

Tyr Trp Leu Pro Gln Arg
1               5


<210> SEQ ID NO 118
<211> LENGTH: 10
<212> TYPE: PRT
<213> ORGANISM: Artificial Sequence
<220> FEATURE:
<223> OTHER INFORMATION: Synthetic: C-terminal FRs

<400> SEQUENCE: 118

His Pro Asp Thr Arg His Arg Ile Pro Val
1               5                   10


<210> SEQ ID NO 119
<211> LENGTH: 6
<212> TYPE: PRT
<213> ORGANISM: Artificial Sequence
<220> FEATURE:
<223> OTHER INFORMATION: Synthetic: C-terminal FRs

<400> SEQUENCE: 119

Tyr Trp Leu Pro Asp Glu
1               5


<210> SEQ ID NO 120
<211> LENGTH: 6
<212> TYPE: PRT
<213> ORGANISM: Artificial Sequence
<220> FEATURE:
<223> OTHER INFORMATION: Synthetic: C-terminal FRs

<400> SEQUENCE: 120

Pro Leu Asp Trp Pro Trp
1               5


<210> SEQ ID NO 121
<211> LENGTH: 10
<212> TYPE: PRT
<213> ORGANISM: Artificial Sequence
<220> FEATURE:
<223> OTHER INFORMATION: Synthetic: C-terminal FRs

<400> SEQUENCE: 121

Pro Ser Pro Pro Arg Ile Phe Gly Asn Arg
1               5                   10


<210> SEQ ID NO 122
<211> LENGTH: 6
<212> TYPE: PRT
<213> ORGANISM: Artificial Sequence
<220> FEATURE:
<223> OTHER INFORMATION: Synthetic: C-terminal FRs
<220> FEATURE:
<221> NAME/KEY: misc_feature
<222> LOCATION: (5)..(5)
<223> OTHER INFORMATION: X  is any amino acid residue, optionally D or Q
<220> FEATURE:
<221> NAME/KEY: misc_feature
```

<222> LOCATION: (6)..(6)
<223> OTHER INFORMATION: X is any amino acid residue, optionally E, Q, or R

<400> SEQUENCE: 122

Tyr Trp Leu Pro Xaa Xaa
1 5

<210> SEQ ID NO 123
<211> LENGTH: 6
<212> TYPE: PRT
<213> ORGANISM: Artificial Sequence
<220> FEATURE:
<223> OTHER INFORMATION: Synthetic: C-terminal FRs

<400> SEQUENCE: 123

Tyr Trp Leu Pro Asp Gln
1 5

<210> SEQ ID NO 124
<211> LENGTH: 127
<212> TYPE: PRT
<213> ORGANISM: Artificial Sequence
<220> FEATURE:
<223> OTHER INFORMATION: Synthetic: (Aga2p)-(HA)-(Gly4Ser)3 (aa)

<400> SEQUENCE: 124

Met Gln Leu Leu Arg Cys Phe Ser Ile Phe Ser Val Ile Ala Ser Val
1 5 10 15

Leu Ala Gln Glu Leu Thr Thr Ile Cys Glu Gln Ile Pro Ser Pro Thr
20 25 30

Leu Glu Ser Thr Pro Tyr Ser Leu Ser Thr Thr Thr Ile Leu Ala Asn
35 40 45

Gly Lys Ala Met Gln Gly Val Phe Glu Tyr Tyr Lys Ser Val Thr Phe
50 55 60

Val Ser Asn Cys Gly Ser His Pro Ser Thr Thr Ser Lys Gly Ser Pro
65 70 75 80

Ile Asn Thr Gln Tyr Val Phe Lys Asp Asn Ser Ser Thr Ile Glu Gly
85 90 95

Arg Tyr Pro Tyr Asp Val Pro Asp Tyr Ala Leu Gln Ala Ser Gly Gly
100 105 110

Gly Gly Ser Gly Gly Gly Gly Ser Gly Gly Gly Gly Ser Ala Ser
115 120 125

<210> SEQ ID NO 125
<211> LENGTH: 381
<212> TYPE: DNA
<213> ORGANISM: Artificial Sequence
<220> FEATURE:
<223> OTHER INFORMATION: Synthetic: (Aga2p)-(HA)-(Gly4Ser)3 (DNA)

<400> SEQUENCE: 125
atgcagttac ttcgctgttt ttcaatattt tctgttattg cttcagtttt agcacaggaa 60
ctgacaacta tatgcgagca aatcccctca ccaactttag aatcgacgcc gtactctttg 120
tcaacgacta ctattttggc caacgggaag gcaatgcaag gagtttttga atattacaaa 180
tcagtaacgt ttgtcagtaa ttgcggttct cacccctcaa caactagcaa aggcagcccc 240
ataaacacac agtatgtttt taaggacaat agctcgacga ttgaaggtag atacccatac 300
gacgttccag actacgctct gcaggctagt ggtggaggag gctctggtgg aggcggtagc 360
ggaggcggag ggtcggctag c 381

```
<210> SEQ ID NO 126
<211> LENGTH: 137
<212> TYPE: PRT
<213> ORGANISM: Artificial Sequence
<220> FEATURE:
<223> OTHER INFORMATION: Synthetic: (Aga2p)-(HA)-(Gly4Ser)3-(XXCXXXCXXX)
      (aa)
<220> FEATURE:
<221> NAME/KEY: misc_feature
<222> LOCATION: (128)..(129)
<223> OTHER INFORMATION: Xaa can be any naturally occurring amino acid
<220> FEATURE:
<221> NAME/KEY: misc_feature
<222> LOCATION: (131)..(133)
<223> OTHER INFORMATION: Xaa can be any naturally occurring amino acid
<220> FEATURE:
<221> NAME/KEY: misc_feature
<222> LOCATION: (135)..(137)
<223> OTHER INFORMATION: Xaa can be any naturally occurring amino acid

<400> SEQUENCE: 126

Met Gln Leu Leu Arg Cys Phe Ser Ile Phe Ser Val Ile Ala Ser Val
1               5                   10                  15

Leu Ala Gln Glu Leu Thr Thr Ile Cys Glu Gln Ile Pro Ser Pro Thr
            20                  25                  30

Leu Glu Ser Thr Pro Tyr Ser Leu Ser Thr Thr Thr Ile Leu Ala Asn
        35                  40                  45

Gly Lys Ala Met Gln Gly Val Phe Glu Tyr Tyr Lys Ser Val Thr Phe
    50                  55                  60

Val Ser Asn Cys Gly Ser His Pro Ser Thr Thr Ser Lys Gly Ser Pro
65                  70                  75                  80

Ile Asn Thr Gln Tyr Val Phe Lys Asp Asn Ser Ser Thr Ile Glu Gly
                85                  90                  95

Arg Tyr Pro Tyr Asp Val Pro Asp Tyr Ala Leu Gln Ala Ser Gly Gly
            100                 105                 110

Gly Gly Ser Gly Gly Gly Gly Ser Gly Gly Gly Gly Ser Ala Ser Xaa
        115                 120                 125

Xaa Cys Xaa Xaa Xaa Cys Xaa Xaa Xaa
    130                 135


<210> SEQ ID NO 127
<211> LENGTH: 411
<212> TYPE: DNA
<213> ORGANISM: Artificial Sequence
<220> FEATURE:
<223> OTHER INFORMATION: Synthetic: (Aga2p)-(HA)-(Gly4Ser)3-(XXCXXXCXXX)
      (dna)
<220> FEATURE:
<221> NAME/KEY: misc_feature
<222> LOCATION: (382)..(383)
<223> OTHER INFORMATION: n is a, c, g, or t
<220> FEATURE:
<221> NAME/KEY: misc_feature
<222> LOCATION: (385)..(386)
<223> OTHER INFORMATION: n is a, c, g, or t
<220> FEATURE:
<221> NAME/KEY: misc_feature
<222> LOCATION: (391)..(392)
<223> OTHER INFORMATION: n is a, c, g, or t
<220> FEATURE:
<221> NAME/KEY: misc_feature
<222> LOCATION: (394)..(395)
<223> OTHER INFORMATION: n is a, c, g, or t
<220> FEATURE:
<221> NAME/KEY: misc_feature
<222> LOCATION: (397)..(398)
<223> OTHER INFORMATION: n is a, c, g, or t
```

<220> FEATURE:
<221> NAME/KEY: misc_feature
<222> LOCATION: (403)..(404)
<223> OTHER INFORMATION: n is a, c, g, or t
<220> FEATURE:
<221> NAME/KEY: misc_feature
<222> LOCATION: (406)..(407)
<223> OTHER INFORMATION: n is a, c, g, or t
<220> FEATURE:
<221> NAME/KEY: misc_feature
<222> LOCATION: (409)..(410)
<223> OTHER INFORMATION: n is a, c, g, or t

<400> SEQUENCE: 127
atgcagttac ttcgctgttt ttcaatattt tctgttattg cttcagtttt agcacaggaa 60
ctgacaacta tatgcgagca aatcccctca ccaactttag aatcgacgcc gtactctttg 120
tcaacgacta ctattttggc caacgggaag gcaatgcaag gagtttttga atattacaaa 180
tcagtaacgt ttgtcagtaa ttgcggttct cacccctcaa caactagcaa aggcagcccc 240
ataaacacac agtatgtttt taaggacaat agctcgacga ttgaaggtag atacccatac 300
gacgttccag actacgctct gcaggctagt ggtggaggag gctctggtgg aggcggtagc 360
ggaggcggag ggtcggctag cnnknnktgy nnknnknnkt gynnknnknn k 411

<210> SEQ ID NO 128
<211> LENGTH: 32
<212> TYPE: PRT
<213> ORGANISM: Artificial Sequence
<220> FEATURE:
<223> OTHER INFORMATION: Synthetic: Mimotope of Amph-K-A1

<400> SEQUENCE: 128

Gly Gly Gly Ser Ala Ser Pro Arg Lys His Ser Gly Arg Ile Cys Pro
1 5 10 15

Trp Asn Cys Lys Glu Leu Asp Asn Pro Pro Phe Ile Phe Gly Asn Arg
20 25 30

<210> SEQ ID NO 129
<211> LENGTH: 26
<212> TYPE: PRT
<213> ORGANISM: Artificial Sequence
<220> FEATURE:
<223> OTHER INFORMATION: Synthetic: Mimotope of Amph-K-C2

<400> SEQUENCE: 129

Gly Gly Gly Ser Ala Ser Arg Ile Cys Pro Trp Asn Cys Lys Glu Leu
1 5 10 15

Pro Ser Pro Pro Arg Ile Phe Gly Asn Arg
20 25

<210> SEQ ID NO 130
<211> LENGTH: 12
<212> TYPE: PRT
<213> ORGANISM: Artificial Sequence
<220> FEATURE:
<223> OTHER INFORMATION: Synthetic: N-terminal FRs

<400> SEQUENCE: 130

Gly Gly Gly Ser Ala Ser Pro Arg Lys His Ser Gly
1 5 10

<210> SEQ ID NO 131
<211> LENGTH: 10
<212> TYPE: PRT
<213> ORGANISM: Artificial Sequence

```
<220> FEATURE:
<223> OTHER INFORMATION: Synthetic: sequence motif
<220> FEATURE:
<221> NAME/KEY: misc_feature
<223> OTHER INFORMATION: See specification as filed for detailed
      description of substitutions and preferred embodiments
<220> FEATURE:
<221> NAME/KEY: misc_feature
<222> LOCATION: (2)..(2)
<223> OTHER INFORMATION: Xaa is selected from Leu, Ile, and Val
<220> FEATURE:
<221> NAME/KEY: misc_feature
<222> LOCATION: (6)..(6)
<223> OTHER INFORMATION: Xaa is Ser or Lys
<220> FEATURE:
<221> NAME/KEY: misc_feature
<222> LOCATION: (8)..(8)
<223> OTHER INFORMATION: Xaa is selected from Arg, Ile, Val, and Met
<220> FEATURE:
<221> NAME/KEY: misc_feature
<222> LOCATION: (9)..(9)
<223> OTHER INFORMATION: Xaa is selected from Glu, Lys, and Pro
<220> FEATURE:
<221> NAME/KEY: misc_feature
<222> LOCATION: (10)..(10)
<223> OTHER INFORMATION: Xaa is selected from Leu, Gln, Phe, and Ile

<400> SEQUENCE: 131

Arg Xaa Cys Pro Trp Xaa Cys Xaa Xaa Xaa
1               5                   10


<210> SEQ ID NO 132
<211> LENGTH: 10
<212> TYPE: PRT
<213> ORGANISM: Artificial Sequence
<220> FEATURE:
<223> OTHER INFORMATION: Synthetic: sequence motif
<220> FEATURE:
<221> NAME/KEY: misc_feature
<223> OTHER INFORMATION: See specification as filed for detailed
      description of substitutions and preferred embodiments
<220> FEATURE:
<221> NAME/KEY: misc_feature
<222> LOCATION: (2)..(2)
<223> OTHER INFORMATION: Xaa is selected from Leu, Ile, and Met
<220> FEATURE:
<221> NAME/KEY: misc_feature
<222> LOCATION: (6)..(6)
<223> OTHER INFORMATION: Xaa is selected from Ser, Asn, Asp, and Gly
<220> FEATURE:
<221> NAME/KEY: misc_feature
<222> LOCATION: (8)..(8)
<223> OTHER INFORMATION: Xaa is selected from Leu, Met, Ser, Arg, and
      Lys
<220> FEATURE:
<221> NAME/KEY: misc_feature
<222> LOCATION: (9)..(9)
<223> OTHER INFORMATION: Xaa is selected from Glu, Gln, and Pro
<220> FEATURE:
<221> NAME/KEY: misc_feature
<222> LOCATION: (10)..(10)
<223> OTHER INFORMATION: Xaa is Leu or Ile

<400> SEQUENCE: 132

Arg Xaa Cys Pro Trp Xaa Cys Xaa Xaa Xaa
1               5                   10


<210> SEQ ID NO 133
<211> LENGTH: 10
<212> TYPE: PRT
<213> ORGANISM: Artificial Sequence
<220> FEATURE:
<223> OTHER INFORMATION: Synthetic: sequence motif
<220> FEATURE:
<221> NAME/KEY: misc_feature
```

```
<223> OTHER INFORMATION: see specification as filed for detailed
      description of substitutions and preferred embodiments
<220> FEATURE:
<221> NAME/KEY: misc_feature
<222> LOCATION: (2)..(2)
<223> OTHER INFORMATION: Xaa is Leu or Ile
<220> FEATURE:
<221> NAME/KEY: misc_feature
<222> LOCATION: (6)..(6)
<223> OTHER INFORMATION: Xaa is selected from Ser, Asn, and Asp
<220> FEATURE:
<221> NAME/KEY: misc_feature
<222> LOCATION: (8)..(8)
<223> OTHER INFORMATION: Xaa is selected from Gln, Ile, Val, Lys, and
      Arg4

<400> SEQUENCE: 133

Arg Xaa Cys Pro Trp Xaa Cys Xaa Glu Leu
1               5                   10


<210> SEQ ID NO 134
<211> LENGTH: 60
<212> TYPE: DNA
<213> ORGANISM: Artificial Sequenc
<220> FEATURE:
<223> OTHER INFORMATION: Synthetic: w is 5-20
<220> FEATURE:
<221> NAME/KEY: misc_feature
<223> OTHER INFORMATION: see specification as filed for detailed
      description of substitutions and preferred embodiments
<220> FEATURE:
<221> NAME/KEY: misc_feature
<222> LOCATION: (1)..(60)
<223> OTHER INFORMATION: every "n", if present, is A, C, G, or T
<220> FEATURE:
<221> NAME/KEY: misc_feature
<222> LOCATION: (16)..(60)
<223> OTHER INFORMATION: "nnk" may or may not be present

<400> SEQUENCE: 134

nnknnknnkn nknnknnknn knnknnknnk nnknnknnkn nknnknnknn knnknnknnk     60


<210> SEQ ID NO 135
<211> LENGTH: 69
<212> TYPE: DNA
<213> ORGANISM: Artificial Sequence
<220> FEATURE:
<223> OTHER INFORMATION: Synthetic: polynucleotide sequence encoding
      variable peptide
<220> FEATURE:
<221> NAME/KEY: misc_feature
<223> OTHER INFORMATION: see specification as filed for detailed
      description of substitutions and preferred embodiments
<220> FEATURE:
<221> NAME/KEY: misc_feature
<222> LOCATION: (1)..(69)
<223> OTHER INFORMATION: every "n", if present, is a, t, g, or C
<220> FEATURE:
<221> NAME/KEY: misc_feature
<222> LOCATION: (4)..(21)
<223> OTHER INFORMATION: "nnk" may or may not be present
<220> FEATURE:
<221> NAME/KEY: misc_feature
<222> LOCATION: (28)..(45)
<223> OTHER INFORMATION: "nnk" may or may not be present
<220> FEATURE:
<221> NAME/KEY: misc_feature
<222> LOCATION: (52)..(69)
<223> OTHER INFORMATION: "nnk" may or may not be present

<400> SEQUENCE: 135

nnknnknnkn nknnknnknn ktgynnknnk nnknnknnkn nknnktgynn knnknnknnk     60

nnknnknnk                                                             69
```

-continued

<210> SEQ ID NO 136
<211> LENGTH: 45
<212> TYPE: DNA
<213> ORGANISM: Artificial Sequence
<220> FEATURE:
<223> OTHER INFORMATION: Synthetic: polynucleotide sequence encoding variable peptide
<220> FEATURE:
<221> NAME/KEY: misc_feature
<223> OTHER INFORMATION: see specification as filed for detailed description of substitutions and preferred embodiments
<220> FEATURE:
<221> NAME/KEY: misc_feature
<222> LOCATION: (1)..(45)
<223> OTHER INFORMATION: every "n" is a, t, g, or C
<220> FEATURE:
<221> NAME/KEY: misc_feature
<222> LOCATION: (7)..(12)
<223> OTHER INFORMATION: "nnk" may or may not be present
<220> FEATURE:
<221> NAME/KEY: misc_feature
<222> LOCATION: (25)..(30)
<223> OTHER INFORMATION: "nnk" may or may not be present
<220> FEATURE:
<221> NAME/KEY: misc_feature
<222> LOCATION: (37)..(45)
<223> OTHER INFORMATION: "nnk" may or may not be present

<400> SEQUENCE: 136
cgnnnknnkn nktgyccntg gnnknnknnk tgynnknnkn nknnk 45

<210> SEQ ID NO 137
<211> LENGTH: 25
<212> TYPE: DNA
<213> ORGANISM: Artificial Sequence
<220> FEATURE:
<223> OTHER INFORMATION: Synthetic: lipophilic-CpG oligonucleotide
<220> FEATURE:
<221> NAME/KEY: misc_feature
<223> OTHER INFORMATION: 5' lipophilic compound
<220> FEATURE:
<221> NAME/KEY: misc_feature
<222> LOCATION: (2)..(5)
<223> OTHER INFORMATION: "g" may or may not be present

<400> SEQUENCE: 137
gggggtccat gacgttcctg acgtt 25

<210> SEQ ID NO 138
<211> LENGTH: 12
<212> TYPE: DNA
<213> ORGANISM: Artificial Sequence
<220> FEATURE:
<223> OTHER INFORMATION: Synthetic: Lipid-linker

<400> SEQUENCE: 138
tttttttttt cg 12

<210> SEQ ID NO 139
<211> LENGTH: 12
<212> TYPE: DNA
<213> ORGANISM: Artificial Sequence
<220> FEATURE:
<223> OTHER INFORMATION: Synthetic: Lipid-linker

<400> SEQUENCE: 139
ggtttttttt cg 12

<210> SEQ ID NO 140

```
<211> LENGTH: 12
<212> TYPE: DNA
<213> ORGANISM: Artificial Sequence
<220> FEATURE:
<223> OTHER INFORMATION: Synthetic: Lipid-linker

<400> SEQUENCE: 140

ggggtttttt cg                                                        12


<210> SEQ ID NO 141
<211> LENGTH: 12
<212> TYPE: DNA
<213> ORGANISM: Artificial Sequence
<220> FEATURE:
<223> OTHER INFORMATION: Synthetic: Lipid-linker

<400> SEQUENCE: 141

ggggggtttt cg                                                        12


<210> SEQ ID NO 142
<211> LENGTH: 12
<212> TYPE: DNA
<213> ORGANISM: Artificial Sequence
<220> FEATURE:
<223> OTHER INFORMATION: Synthetic: Lipid-linker

<400> SEQUENCE: 142

ggggggggtt cg                                                        12


<210> SEQ ID NO 143
<211> LENGTH: 12
<212> TYPE: DNA
<213> ORGANISM: Artificial Sequence
<220> FEATURE:
<223> OTHER INFORMATION: Synthetic: Lipid-linker

<400> SEQUENCE: 143

gggggggggg cg                                                        12


<210> SEQ ID NO 144
<211> LENGTH: 17
<212> TYPE: PRT
<213> ORGANISM: Artificial Sequence
<220> FEATURE:
<223> OTHER INFORMATION: Synthetic
<220> FEATURE:
<221> NAME/KEY: misc_feature
<223> OTHER INFORMATION: 5' Aga2p

<400> SEQUENCE: 144

Gly Gly Gly Gly Ser Gly Gly Gly Gly Ser Gly Gly Gly Gly Ser Ala
1               5                   10                  15

Ser


<210> SEQ ID NO 145
<211> LENGTH: 30
<212> TYPE: PRT
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(30)
<223> OTHER INFORMATION: Every "X" is any amino acid residue encoded by
      an "NNK" codon

<400> SEQUENCE: 145
```

-continued

```
Xaa Xaa Xaa Xaa Xaa Xaa Xaa Xaa Xaa Xaa Arg Ile Cys Pro Trp Asn
1               5                   10                  15

Cys Lys Glu Leu Xaa Xaa Xaa Xaa Xaa Xaa Xaa Xaa Xaa Xaa
            20                  25                  30


<210> SEQ ID NO 146
<211> LENGTH: 26
<212> TYPE: PRT
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(26)
<223> OTHER INFORMATION: Every "X" is any amino acid residue encoded by
      an "NNK" codon

<400> SEQUENCE: 146

Xaa Xaa Xaa Xaa Xaa Xaa Arg Ile Cys Pro Trp Asn Cys Lys Glu Leu
1               5                   10                  15

Xaa Xaa Xaa Xaa Xaa Xaa Xaa Xaa Xaa Xaa
            20                  25


<210> SEQ ID NO 147
<211> LENGTH: 20
<212> TYPE: PRT
<213> ORGANISM: Artificial Sequence
<220> FEATURE:
<223> OTHER INFORMATION: Synthetic
<220> FEATURE:
<221> NAME/KEY: misc_feature
<222> LOCATION: (11)..(20)
<223> OTHER INFORMATION: "X" is any amino acid residue encoded by an
      "NNK" codon

<400> SEQUENCE: 147

Arg Ile Cys Pro Trp Asn Cys Lys Glu Leu Xaa Xaa Xaa Xaa Xaa Xaa
1               5                   10                  15

Xaa Xaa Xaa Xaa
            20


<210> SEQ ID NO 148
<211> LENGTH: 19
<212> TYPE: PRT
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(10)
<223> OTHER INFORMATION: Every "X" is any amino acid residue encoded by
      an "NNK" codon
<220> FEATURE:
<221> NAME/KEY: misc_feature
<222> LOCATION: (14)..(19)
<223> OTHER INFORMATION: Xaa can be any naturally occurring amino acid

<400> SEQUENCE: 148

Xaa Xaa Xaa Arg Ile Cys Pro Trp Asn Cys Lys Glu Leu Xaa Xaa Xaa
1               5                   10                  15

Xaa Xaa Xaa


<210> SEQ ID NO 149
<211> LENGTH: 16
<212> TYPE: PRT
<213> ORGANISM: Artificial Sequence
<220> FEATURE:
<223> OTHER INFORMATION: Synthetic
```

<220> FEATURE:
<221> NAME/KEY: misc_feature
<222> LOCATION: (11)..(16)
<223> OTHER INFORMATION: "X" is any amino acid residue encoded by an "NNK" codon

<400> SEQUENCE: 149

Arg Ile Cys Pro Trp Asn Cys Lys Glu Leu Xaa Xaa Xaa Xaa Xaa Xaa
1               5                   10                  15

<210> SEQ ID NO 150
<211> LENGTH: 120
<212> TYPE: DNA
<213> ORGANISM: Artificial Sequence
<220> FEATURE:
<223> OTHER INFORMATION: Synthetic: polynucleotide sequence encoding variable peptide
<220> FEATURE:
<221> NAME/KEY: misc_feature
<223> OTHER INFORMATION: see specification as filed for detailed description of substitutions and preferred embodiments
<220> FEATURE:
<221> NAME/KEY: misc_feature
<222> LOCATION: (1)..(60)
<223> OTHER INFORMATION: "nnk" may or may not be present
<220> FEATURE:
<221> NAME/KEY: misc_feature
<222> LOCATION: (1)..(120)
<223> OTHER INFORMATION: every "n", if present, is a, t, g, or c
<220> FEATURE:
<221> NAME/KEY: misc_feature
<222> LOCATION: (60)..(61)
<223> OTHER INFORMATION: sequence motif location
<220> FEATURE:
<221> NAME/KEY: misc_feature
<222> LOCATION: (61)..(120)
<223> OTHER INFORMATION: "nnk" may or may not be present

<400> SEQUENCE: 150
nnknnknnkn nknnknnknn knnknnknnk nnknnknnkn nknnknnknn knnknnknnk 60
nnknnknnkn nknnknnknn knnknnknnk nnknnknnkn nknnknnknn knnknnknnk 120

<210> SEQ ID NO 151
<211> LENGTH: 9
<212> TYPE: PRT
<213> ORGANISM: Artificial Sequence
<220> FEATURE:
<223> OTHER INFORMATION: Synthetic: Hemagglutinin

<400> SEQUENCE: 151

Tyr Pro Tyr Asp Val Pro Asp Tyr Ala
1               5

<210> SEQ ID NO 152
<211> LENGTH: 8
<212> TYPE: PRT
<213> ORGANISM: Artificial Sequence
<220> FEATURE:
<223> OTHER INFORMATION: Synthetic: FLAG

<400> SEQUENCE: 152

Asp Tyr Lys Asp Asp Asp Asp Lys
1               5

<210> SEQ ID NO 153
<211> LENGTH: 6
<212> TYPE: PRT
<213> ORGANISM: Artificial Sequence
<220> FEATURE:
<223> OTHER INFORMATION: Synthetic: c-Myc, polyhisitidine

```
<400> SEQUENCE: 153

His His His His His His
1               5


<210> SEQ ID NO 154
<211> LENGTH: 35
<212> TYPE: PRT
<213> ORGANISM: Artificial Sequence
<220> FEATURE:
<223> OTHER INFORMATION: Synthetic
<220> FEATURE:
<221> NAME/KEY: misc_feature
<223> OTHER INFORMATION: see specification as filed for detailed
      description of substitutions and preferred embodiments
<220> FEATURE:
<221> NAME/KEY: misc_feature
<223> OTHER INFORMATION: 5' AD-T1-L
<220> FEATURE:
<221> NAME/KEY: misc_feature
<223> OTHER INFORMATION: 3' T2
<220> FEATURE:
<221> NAME/KEY: misc_feature
<222> LOCATION: (1)..(35)
<223> OTHER INFORMATION: Xaa is an amino acid residue encoded by
      (A,T,G,C)(A,T,G,C)(G,T)
<220> FEATURE:
<221> NAME/KEY: misc_feature
<222> LOCATION: (7)..(11)
<223> OTHER INFORMATION: Xaa may or may not be present
<220> FEATURE:
<221> NAME/KEY: misc_feature
<222> LOCATION: (20)..(24)
<223> OTHER INFORMATION: Xaa may or may not be present
<220> FEATURE:
<221> NAME/KEY: misc_feature
<222> LOCATION: (31)..(35)
<223> OTHER INFORMATION: Xaa may or may not be present

<400> SEQUENCE: 154

Arg Xaa Xaa Xaa Xaa Xaa Xaa Xaa Xaa Xaa Xaa Cys Pro Trp Xaa Xaa
1               5                   10                  15

Xaa Xaa Xaa Xaa Xaa Xaa Xaa Xaa Cys Xaa Xaa Xaa Xaa Xaa Xaa Xaa
            20                  25                  30

Xaa Xaa Xaa
        35


<210> SEQ ID NO 155
<211> LENGTH: 35
<212> TYPE: PRT
<213> ORGANISM: Artificial Sequence
<220> FEATURE:
<223> OTHER INFORMATION: Synthetic
<220> FEATURE:
<221> NAME/KEY: misc_feature
<223> OTHER INFORMATION: see specification as filed for detailed
      description of substitutions and preferred embodiments
<220> FEATURE:
<221> NAME/KEY: misc_feature
<222> LOCATION: (1)..(35)
<223> OTHER INFORMATION: Xaa is an amino acid residue
<220> FEATURE:
<221> NAME/KEY: misc_feature
<222> LOCATION: (7)..(11)
<223> OTHER INFORMATION: Xaa may or may not be present
<220> FEATURE:
<221> NAME/KEY: misc_feature
<222> LOCATION: (20)..(24)
<223> OTHER INFORMATION: Xaa may or may not be present
<220> FEATURE:
<221> NAME/KEY: misc_feature
<222> LOCATION: (31)..(35)
<223> OTHER INFORMATION: Xaa may or may not be present
```

-continued

```
<400> SEQUENCE: 155

Arg Xaa Xaa Xaa Xaa Xaa Xaa Xaa Xaa Xaa Xaa Cys Pro Trp Xaa Xaa
1               5                   10                  15

Xaa Xaa Xaa Xaa Xaa Xaa Xaa Xaa Cys Xaa Xaa Xaa Xaa Xaa Xaa Xaa
            20                  25                  30

Xaa Xaa Xaa
        35
```